(12) United States Patent
Kim et al.

(10) Patent No.: US 7,529,333 B2
(45) Date of Patent: May 5, 2009

(54) SHIFT REGISTER

(75) Inventors: Binn Kim, Seoul (KR); Hae Yeol Kim, Gyeonggi-do (KR); Hyung Nyuck Cho, Incheon-si (KR); Soo Young Yoon, Gyeonggi-do (KR); Seung Chan Choi, Gyeongsangbuk-do (KR); Min Doo Chun, Seoul (KR); Yong Ho Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 184 days.

(21) Appl. No.: 11/586,642

(22) Filed: Oct. 26, 2006

(65) Prior Publication Data

US 2007/0104307 A1    May 10, 2007

(30) Foreign Application Priority Data

| Oct. 27, 2005 | (KR) | ...................... 10-2005-0101680 |
| Jun. 29, 2006 | (KR) | ...................... 10-2006-0059125 |
| Sep. 27, 2006 | (KR) | ...................... 10-2006-0094004 |

(51) Int. Cl.
  *G11C 19/00* (2006.01)
(52) U.S. Cl. .......................................... 377/64; 377/67
(58) Field of Classification Search ........................ None
  See application file for complete search history.

(56) References Cited

U.S. PATENT DOCUMENTS

| 5,517,542 | A  | * |  5/1996 | Huq ............................. 377/78 |
| 6,556,646 | B1 | * |  4/2003 | Yeo et al. ...................... 377/54 |
| 6,845,140 | B2 | * |  1/2005 | Moon et al. .................... 377/78 |
| 7,120,221 | B2 | * | 10/2006 | Moon ........................... 377/64 |
| 7,310,402 | B2 | * | 12/2007 | Wei et al. ...................... 377/64 |

* cited by examiner

*Primary Examiner*—Cassandra Cox
(74) *Attorney, Agent, or Firm*—Holland & Knight LLP

(57) ABSTRACT

A shift register includes first and second stages for sequentially outputting scan pulses to drive first and second gate lines. One of the first and second stages includes a pull-up switching device connected to an enabling node of the one of the first and second stages; a first pull-down switching device connected to a first disabling node of the one of the first and second stages; a second pull-down switching device connected to a second disabling node of the one of the first and second stages; and a node controller. The node controller of the first stage controls the logic state of each of the enabling node of the first stage, the first disabling node of the first stage and the first disabling node of the second stage. The node controller of the second stage controls the logic state of each of the enabling node of the second stage, the second disabling node of the second stage and the second disabling node of the first stage.

103 Claims, 52 Drawing Sheets

(a)

(b)

(c)

SHIFT REGISTER

This application claims the benefit of Korean Patent Application Nos. 2005-0101680, filed on Oct. 27, 2005, and 2006-0059125, filed on Jun. 29, 2006, and 2006-0094004, filed on Sep. 27, 2006, all three of which are hereby incorporated by reference in their entirety.

BACKGROUND OF THE INVENTION

1. Field of the Invention

Embodiments of the present invention relate to a liquid crystal display (LCD) device, and more particularly, to a shift register for an LCD device. Embodiments of the present invention are suitable for a wide scope of applications. In particular, an embodiment of the present invention is suitabe for providing a shift register with a reduced number of switching devices for low manufacturing costs.

2. Discussion of the Related Art

In general, a liquid crystal display (LCD) device displays an image by generating an electric field through a liquid crystal material to control light transmittance. The LCD device includes a liquid crystal panel with pixel areas in a matrix arrangement, and a driving circuit for driving the liquid crystal panel. In the liquid crystal panel, a plurality of gate lines and a plurality of data lines cross each other. Crossings of the gate lines and the data lines define pixel areas.

Pixel electrodes and a common electrode a formed on in the liquid crystal panel for applying the electric field to the respective pixel areas. Each of the pixel electrodes is connected to an associated one of the data lines via the source terminal and drain terminal of a switching device, such as a thin film transistor (TFT). The TFT is turned on in response to a scan pulse applied to the gate terminal thereof via an associated one of the gate lines, so as to supply a data signal on the associated data line to an associated one of the pixel electrodes.

The driving circuit includes a gate driver for driving the gate lines, a data driver for driving the data lines, a timing controller for supplying control signals for control of the gate driver and data driver, and a power supply for supplying various drive voltages to be used in the LCD device.

The gate driver sequentially supplies scan pulses to the gate lines to sequentially drive liquid crystal cells in the liquid crystal panel line-by-line. The gate driver includes a shift register for sequentially outputting the scan pulses. The data driver supplies pixel voltage signals respectively to ones of the data lines associated with a given one of the gate lines whenever a corresponding one of the scan pulses is supplied to the given gate line. Hence, the LCD device displays an image by adjusting light transmittance with an electric field applied between the pixel electrode and the common electrode according to the pixel voltage signal on a cell-by-cell basis.

The shift register has a plurality of stages arranged in a line. Each of the stages is connected to a corresponding one of the gate lines to supply a corresponding one of the scan pulses to the corresponding gate line. Each of the stages is enabled in response to the scan pulse from the previous stage and disabled in response to the scan pulse from the next stage.

In general, each stage includes a node controller for controlling a charging/discharging operation of an enabling node and disabling node, a pull-up switching device for outputting the scan pulse according to the state of the enabling node, and a pull-down switching device for outputting an OFF voltage according to the state of the disabling node.

Each stage outputs the OFF voltage for an entire frame period, except for one horizontal period (1H) during the frame period. Accordingly, the disabling node is held in its charged state much longer than the enabling node is held in its charged state. Hence, the pull-down switching device connected to the disabling node is kept turned on much longer than the pull-up switching device causing deterioratuion of the pull-down switching device.

A a shift register having a stage with two or more disabling nodes has been developed to solve this problem. In this shift register, the disabling nodes are alternately charged on a frame-by-frame basis. Such an arrangement prevents deterioration of the pull-down switching device connected to each of the disabling nodes.

FIG. 1 is a schematic description of a stage of a shift register in accordance with the related art. Referring to FIG. 1, the related art stage includes a node controller 105 for controlling a charging/discharging operation of an enabling node Q, the charging/discharging operation of a first disabling node QB1 and the charging/discharging operation of a second disabling node QB2, a pull-up switching device Tru for outputting a scan pulse Vout according to the state of the enabling node Q, a first pull-down switching device Trd1 for outputting an OFF voltage Vdc2 according to the state of the first disabling node QB1, and a second pull-down switching device Trd2 for outputting the OFF voltage Vdc2 according to the state of the second disabling node QB2.

When the stage is disabled, one of the first and second disabling nodes QB1 and QB2 is charged and the other is discharged. For example, when the first disabling node QB1 is charged and the second disabling node QB2 is discharged, the first pull-down switching device Trd1 with its gate terminal connected to the first disabling node QB1 is operated and the second pull-down switching device Trd2 with its gate terminal connected to the second disabling node QB2 is not operated. The second pull-down switching device Trd2 remains idle. Thus, deterioration of the pull-down switching devices Trd1 and Trd2 is prevented by alternately driving the first pull-down switching device Trd1 and the second pull-down switching device Trd2.

However, this structure increases the number of switching devices in the node controller 105 of the related art stage. The node controller 105 must have a large number of switching devices to control one enabling node Q and two disabling nodes QB1 and QB2. The use of a large number of switching devices increases the size of the stage and the manufacturing cost.

SUMMARY OF THE INVENTION

Accordingly, embodiments of the present invention are directed to a shift register that substantially obviates one or more problems due to limitations and disadvantages of the related art.

An object of the present invention is to provide a shift register having a reduced number of switching devices to reduce the size and manufacturing cost of the shift register.

Additional features and advantages of the invention will be set forth in the description of exemplary embodiments which follows, and in part will be apparent from the description of the exemplary embodiments, or may be learned by practice of the exemplary embodiments of the invention. These and other advantages of the invention will be realized and attained by the structure particularly pointed out in the written description of the exemplary embodiments and claims hereof as well as the appended drawings.

To achieve these and other advantages and in accordance with the purpose of the present invention, as embodied and broadly described, a shift register includes first and second stages for sequentially outputting scan pulses to drive first and second gate lines, one of the first and second stages comprising: a pull-up switching device connected to an enabling node of the one of the first and second stages; a first pull-down switching device connected to a first disabling node of the one of the first and second stages; a second pull-down switching device connected to a second disabling node of the one of the first and second stages; and a node controller, wherein the node controller of the first stage controls the logic state of each of the enabling node of the first stage, the first disabling node of the first stage and the first disabling node of the second stage, wherein the node controller of the second stage controls the logic state of each of the enabling node of the second stage, the second disabling node of the second stage and the second disabling node of the first stage.

In another aspect, a shift register includes a plurality of stages for sequentially outputting scan pulses to drive a plurality of conductive lines, one of the plurality of the stages includes a pull-up switching device connected to an enabling node of the one of the plurality of stages; a first pull-down switching device connected to a first disabling node of the one of the plurality of stages; a second pull-down switching device connected to a second disabling node of the one of the plurality of stages; and a node controller, wherein the node controller of a (2n−3)-th stage of the plurality of stages controls the logic state of each of the enabling node of the (2n−3)-th stage, the first disabling node of the (2n−3)-th stage and the first disabling node of a (2n−2)-th stage, the node controller of the (2n−2)-th stage controls the logic state of each of the enabling node of the (2n−2)-th stage, the second disabling node of the (2n−2)-th stage and the second disabling node of the (2n−3)-th stage, and n is a natural number greater than or equal to 2.

In another aspect, a shift register includes a plurality of stages for sequentially outputting scan pulses to drive a plurality of conductive lines, one of the plurality of the stages includes a pull-up switching device connected to an enabling node of the one of the plurality of stages; a first pull-down switching device connected to a first disabling node of the one of the plurality of stages; a second pull-down switching device connected to a second disabling node of the one of the plurality of stages; a third pull-down switching device connected to a third disabling node of the one of the plurality of stages; and a node controller, wherein the node controller of a (2n−3)-th stage of the plurality of stages controls the logic state of each of the enabling node of the (2n−3)-th stage, the first disabling node of the (2n−3)-th stage, the first disabling node of a (2n−2)-th stage, and the first disabling node of a (2n−1)-th stage, the node controller of the (2n−2)-th stage controls the logic state of each of the enabling node of the (2n−2)-th stage, the second disabling node of the (2n−2)-th stage, the second disabling node of the (2n−3)-th stage, and the second disabling node of the (2n−1)-th stage, the node controller of the (2n−1)-th stage controls the logic state of each of the enabling node of the (2n−1)-th stage, the third disabling node of the (2n−1)-th stage, the third disabling node of the (2n−2)-th stage, and the third disabling node of the (2n−3)-th stage, and n is a natural number greater than or equal to 2.

In another aspect, a shift register includes a plurality of stages for sequentially outputting scan pulses to drive a plurality of conductive lines, one of the plurality of stages includes a pull-up switching device connected to an enabling node of the one of the plurality of stages; a first pull-down switching device connected to a first disabling node of the one of the plurality of stages; a second pull-down switching device connected to a second disabling node of the one of the plurality of stages; and a node controller, wherein the node controller of an n-th stage of the plurality of stages controls the logic state of each of the enabling node of the n-th stage, the first disabling node of the n-th stage, the second disabling node of the n-th stage, the second disabling node of an (n−1)-th stage, and the first disabling node of an (n+1)-th stage, and n is a natural number greater than or equal to 2.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of embodiments of the present invention and are incorporated in and constitute a part of this application, illustrate embodiments of the present invention and together with the description serve to explain the principle of embodiments of the present invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or like parts.

In embodiments of the present invention, each of the switching devices, for example the pull-up switching devices and pull-down switching devices, may be any one of an N-type metal oxide semiconductor (MOS) transistor or a P-type MOS transistor. The exemplary embodiments of the present invention will hereinafter be described with N-type MOS transistors as switching devices.

Figure 1:
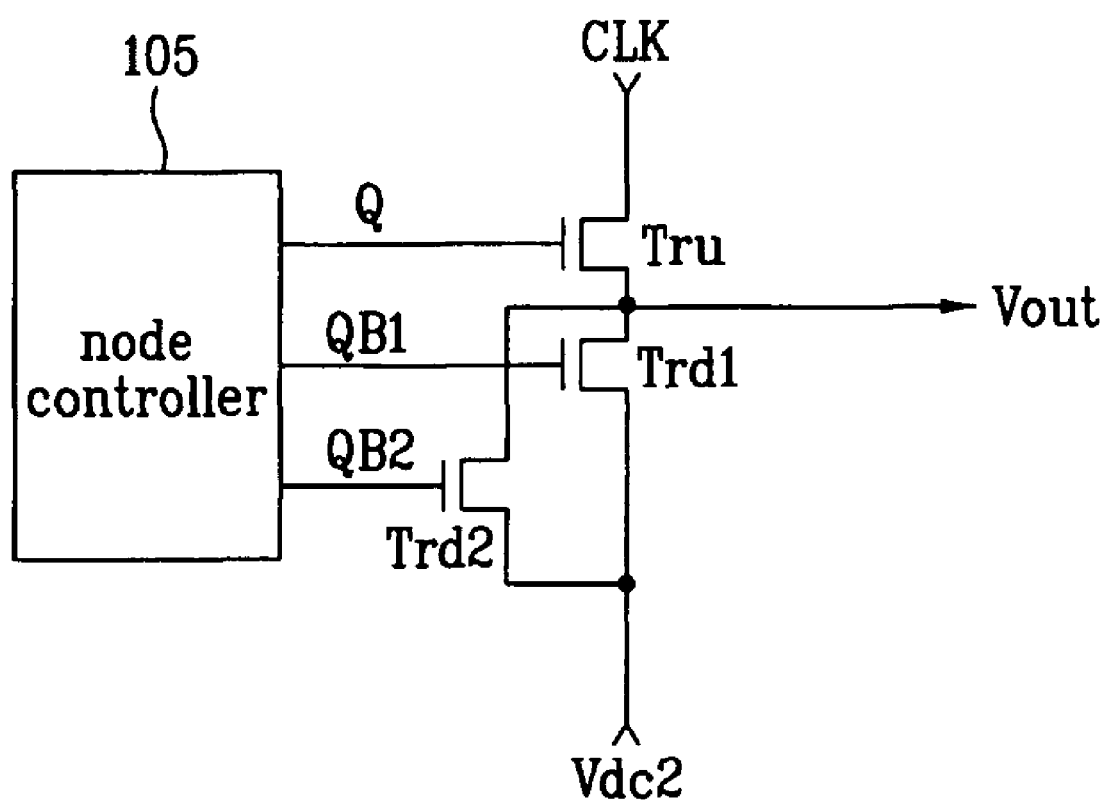
FIG. 1 is a schematic description of a stage of a shift register in accordance with the related art.
Figure 2:
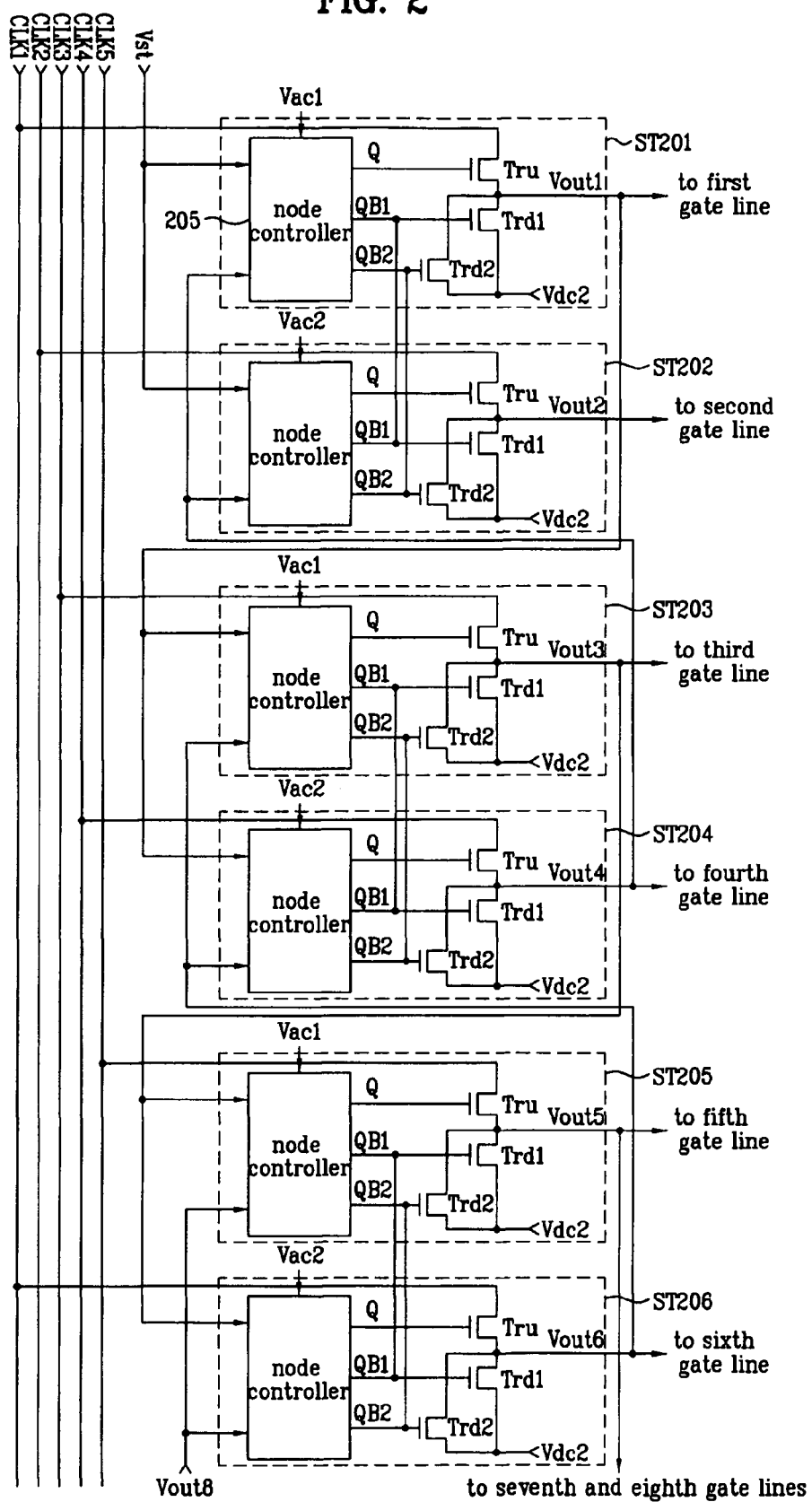
FIG. 2 is a schematic view of a first exemplary shift register according to an embodiment of the present invention.

FIG. 2 is a schematic view of a first exemplary shift register according to an embodiment of the present invention. Referring to FIG. 2, a shift register includes a plurality of stages ST201, ST202, ST203, . . . for driving a plurality of gate lines, each one of the gate line being a conductive line. Each of the stages ST201, ST202, ST203, . . . includes a node controller 205, a pull-up switching device Tru connected to an enabling node Q of the node controller 205, a first pull-down switching device Trd1 connected to a first disabling node QB1 of the node controller 205, and a second pull-down switching device Trd2 connected to a second disabling node QB2 of the node controller 205.

The first disabling node QB1 of the (2n−3)-th stage (where n is a natural number greater than or equal to 2) and the first disabling node QB1 of the (2n−2)-th stage are electrically connected to each other, and the second disabling node QB2 of the (2n−2)-th stage and the second disabling node QB2 of the (2n−3)-th stage are electrically connected to each other. Hence, the node controller 205 of the (2n−3)-th stage controls charging/discharging operation of the enabling node Q and of the first disabling node QB1 of the (2n−3)-th stage and the charging/discharging operation of the first disabling node QB1 of the (2n−2)-th stage. Moreover, the node controller 205 of the (2n−2)-th stage controls the charging/discharging operation of the enabling node Q and of the second disabling node QB2 of the (2n−2)-th stage and the charging/discharging operation of the second disabling node QB2 of the (2n−3)-th stage.

For example, the first disabling node QB1 of the third stage ST203 and the first disabling node QB1 of the fourth stage ST204 are electrically connected to each other, and the second disabling node QB2 of the fourth stage ST204 and the second disabling node QB2 of the third stage ST203 are electrically connected to each other. Hence, the node controller 205 of the third stage ST203 controls the charging/discharging operation of the enabling node Q and first disabling node QB1 of the third stage ST203 and the charging/discharging operation of the first disabling node QB1 of the fourth stage ST204. Similarly, the node controller 205 of the fourth stage ST204 controls the charging/discharging operation of the enabling node Q and second disabling node QB2 of the fourth stage ST204 and the charging/discharging operation of the second disabling node QB2 of the third stage ST203.

In an embodiment of the present invention, the node controller 205 of the (2n−3)-th stage controls the charging/discharging operation of the first disabling node QB1 of the (2n−3)-th stage and the charging/discharging operation of the first disabling node QB1 of the (2n−2)-th stage with a first alternating current (AC) voltage Vac1. The node controller 205 of the (2n−2)-th stage controls the charging/discharging operation of the second disabling node QB2 of the (2n−2)-th stage and the charging/discharging operation of the second disabling node QB2 of the (2n−3)-th stage with a second AC voltage Vac2. Thus, each of the node controllers 205 corresponding to the odd-numbered stages ST201, ST203, ST205, . . . , is supplied with the first AC voltage Vac1 and each of the node controllers 205 of the even-numbered stages ST202, ST204, ST206, . . . is supplied with the second AC voltage Vac2. Each of the first AC voltage Vac1 and the second AC voltage Vac2 varies on a frame-by-frame basis, and the first AC voltage Vac1 is 180° out of phase with the second AC voltage Vac2.

Each of the stages ST201, ST202, ST203, . . . receives a first direct current (DC) voltage Vdc1 (shown hereafter in FIG. 4) and charges the enabling node Q thereof with the received first DC voltage Vdc1, and receives a second DC voltage Vdc2 and outputs the received second DC voltage Vdc2 as an OFF voltage. Alternatively, each of the stages ST201, ST202, ST203, . . . may receive a scan pulse from the previous stage instead of the first DC voltage Vdc1 and charge the enabling node Q thereof with the received scan pulse. In an embodiment of the present invention, the first DC voltage Vdc1 is a positive voltage and the second DC voltage Vdc2 is a negative voltage.

Figure 3:
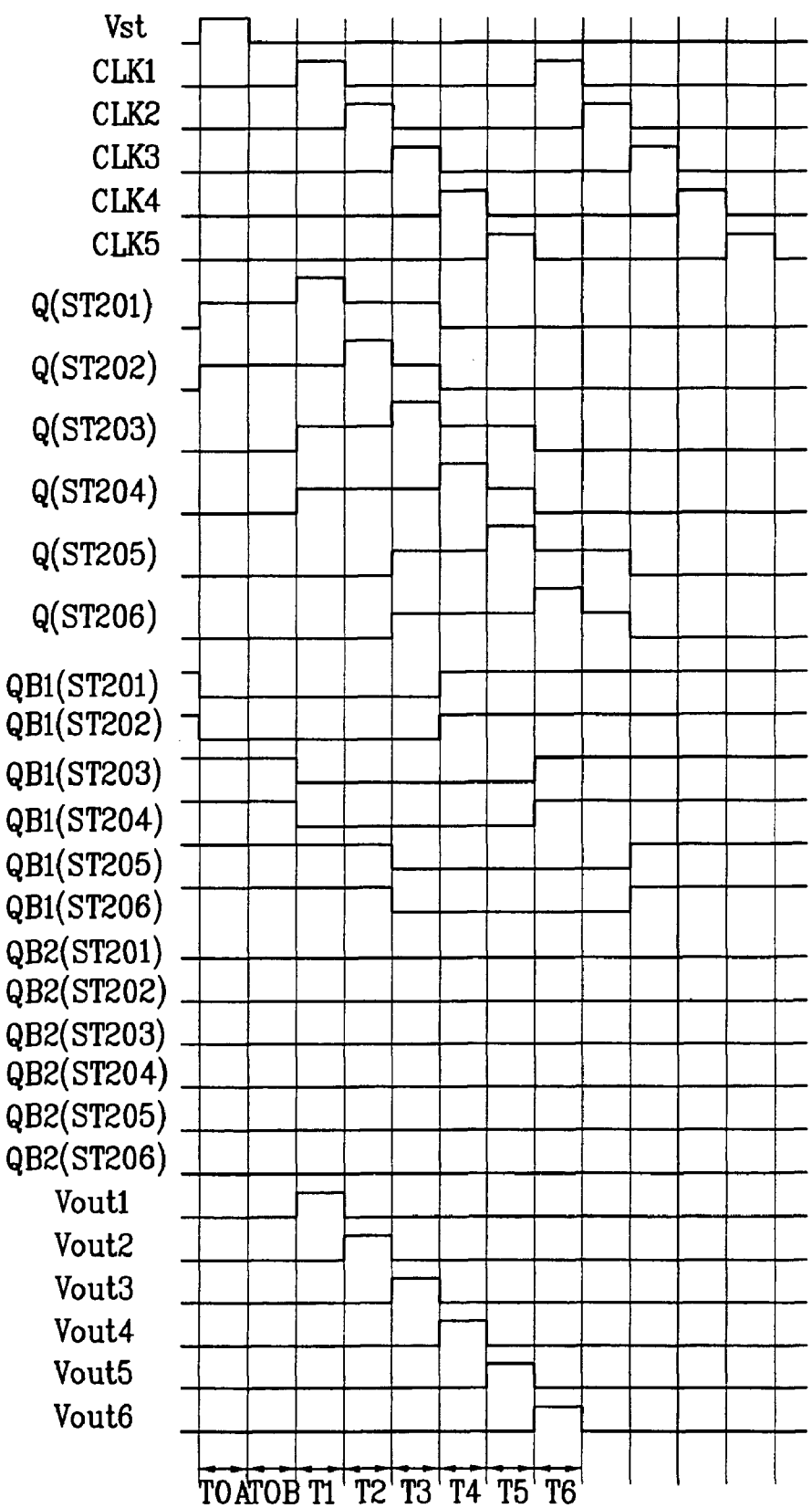
FIG. 3 shows an exemplary timing diagram of input signals into and output signals from respective stages of the shift register of FIG. 2.

FIG. 3 shows an exemplary timing diagram of input signals into and output signals from respective stages of the shift register of FIG. 2. Referring to FIG. 3, each of the stages ST201, ST202, ST203, . . . with the above-stated configuration receives a corresponding one of first to fifth clock pulses CLK1 to CLK5 and outputs the received clock pulse as a scan pulse. Each of the first to fifth clock pulses CLK1 to CLK5 is outputted after being phase-delayed by one pulse width from the preceding clock pulse, as shown in FIG. 3. The second clock pulse CLK2 is outputted after being phase-delayed by one pulse width from the first clock pulse CLK1, and the third clock pulse CLK3 is outputted after being phase-delayed by one pulse width from the second clock pulse CLK2. The fourth clock pulse CLK4 is outputted after being phase-delayed by one pulse width from the third clock pulse CLK3, the fifth clock pulse CLK5 is outputted after being phase-delayed by one pulse width from the fourth clock pulse CLK4, and the first clock pulse CLK1 is outputted after being phase-delayed by one pulse width from the fifth clock pulse CLK5.

The first to fifth clock pulses CLK1 to CLK5 are outputted sequentially and cyclically. The first to fifth clock pulses CLK1 to CLK5 are outputted sequentially from the first clock pulse CLK1 to the fifth clock pulse CLK5 and, thereafter, again from the first clock pulse CLK1 to the fifth clock pulse CLK5. Hence, the first clock pulse CLK1 is outputted in a period between the fifth clock pulse CLK5 and the second clock pulse CLK2. Each of these first to fifth clock pulses CLK1 to CLK5 is outputted continuously at a clock period. Thus, the first to fifth stages ST201 to ST205 output the first to fifth clock pulses CLK1 to CLK5 as first to fifth scan pulses Vout1 to Vout5, respectively.

Because each of the first to fifth clock pulses CLK1 to CLK5 is phase-delayed by one pulse width from the preceding clock pulse as stated previously, each of the scan pulses Vout1 to Vout5 from the first to fifth stages ST201 to ST205 is also outputted after being phase-delayed by one pulse width from the preceding scan pulse. For example, the scan pulses Vout1 to Vout5 are sequentially outputted. Then, the sixth stage ST206 outputs the first clock pulse CLK1 again as a sixth scan pulse Vout6. The first clock pulse CLK1 outputted from the sixth stage ST206 is a pulse delayed by one clock period from the first clock pulse CLK1 outputted from the first stage ST201.

Each the stages ST201, ST202, ST203, . . . must be enabled, respectively, to output the corresponding scan pulses. Similarly, each of the stages ST201, ST202, ST203, . . . must be disabled, respectively, to output the OFF voltages,. Each of the stages ST201, ST202, ST203, . . . is enabled in response to a scan pulse from an upstream stage and disabled in response to a scan pulse from a downstream stage.

In an embodiment of the present invention, the (2n−1)-th stage and the 2n-th stage are simultaneously enabled in response to the (2n−3)-th scan pulse from the (2n−3)-th stage and simultaneously disabled in response to the (2n+2)-th scan pulse from the (2n+2)-th stage. The enabled (2n−1)-th stage outputs the (2n−1)-th scan pulse and supplies it to the (2n+1)-th and (2n+2)-th stages, so as to enable the (2n+1)-th and (2n+2)-th stages simultaneously. Also, the enabled 2n-th stage outputs the 2n-th scan pulse and supplies it to the (2n−3)-th and (2n−2)-th stages, so as to disable the (2n−3)-th and (2n−2)-th stages simultaneously.

For example, the third stage ST203 and the fourth stage ST204 are simultaneously enabled in response to the first scan pulse Vout1 from the first stage ST201 and simultaneously disabled in response to the sixth scan pulse Vout6 from the sixth stage ST206. The enabled third stage ST203 outputs the third scan pulse Vout3 and supplies it to the fifth and sixth stages ST205 and ST206, thus enabling the fifth and sixth stages ST205 and ST206 simultaneously.

Moreover, the enabled fourth stage ST204 outputs the fourth scan pulse Vout4 and supplies it to the first and second stages ST201 and ST202, thus disabling the first and second stages ST201 and ST202 simultaneously. Because there is no first stage upstream from the first stage ST201 and there is no second stage upstream from the second stage ST202, the first and second stages ST201 and ST202 are enabled in response to a start pulse Vst from a timing controller. Hence, the second scan pulse Vout2 from the second stage ST202 is supplied only to the second gate line.

The start pulse Vst is outputted earlier than the first clock pulse CLK1. The start pulse Vst is outputted earlier than the first clock pulse CLK1 by two pulse widths. Also, the start pulse Vst is outputted only once per frame. For example, for every frame, the start pulse Vst is first outputted and the first to fifth clock pulses CLK1 to CLK5 are then outputted in respective order.

A time difference of two pulse widths is set between the start pulse Vst and the first clock pulse CLK1 to equalize the output characteristics of all the stages. Each of the odd-numbered stages ST201, ST203, ST205, . . . is enabled by a scan pulse from a second stage upstream therefrom and each of the even-numbered stages ST202, ST204, ST206, . . . is enabled by a scan pulse from a third stage upstream therefrom. By adjusting the start pulse Vst and the first clock pulse CLK1 such that they are outputted with the time difference of two pulse widths therebetween, the first stage ST201 can be operated as if it is enabled by a scan pulse from a second stage upstream therefrom and the second stage ST202 can be operated as if it is enabled by a scan pulse from a third stage upstream therefrom.

In another embodiment of the present invention, the start pulse Vst and the first clock pulse CLK1 may be adjusted such that they are outputted with a time difference of one pulse width therebetween.

Figure 4:
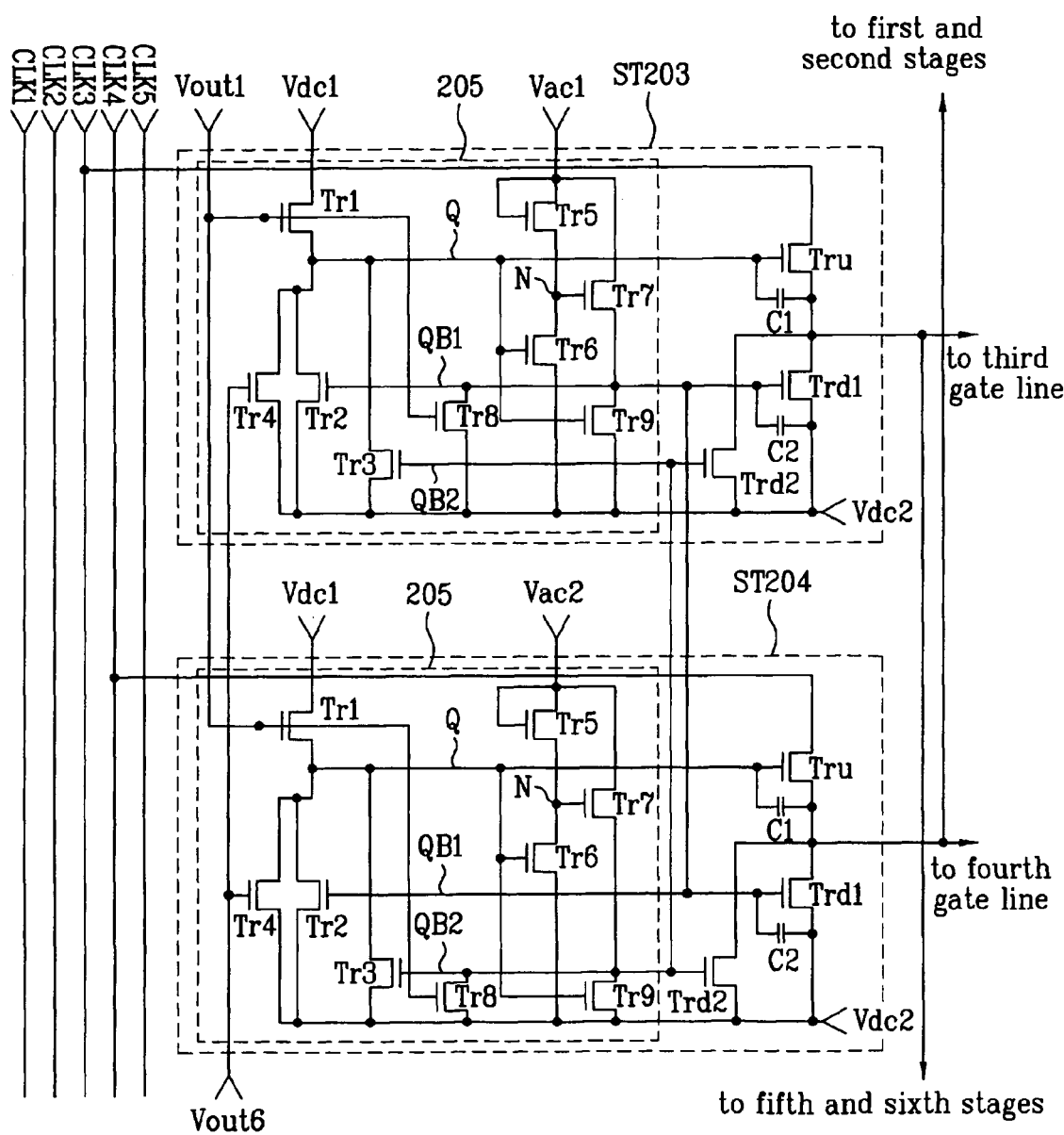
FIG. 4 is a schematic view of a first exemplary circuit configuration of node controllers for the third and fourth stages in FIG. 2 in accordance with an embodiment of the present invention.

FIG. 4 is a schematic view of a first exemplary circuit configuration of node controllers for the third and fourth stages in FIG. 2 in accordance with an embodiment of the present invention. Referring to FIG. 4, the odd-numbered stages, or (2n−1)-th stages, ST201, ST203, ST205, . . . and the even-numbered stages, or 2n-th stages, ST202, ST204, ST206, . . . have different circuit configurations. The node controller 205 of each of the odd-numbered stages ST201, ST203, ST205, . . . includes first to ninth switching devices Tr1 to Tr9.

The first switching device Tr1 of the (2n−1)-th stage charges the enabling node Q of the (2n−1)-th stage with the first DC voltage Vdc1 in response to the scan pulse from the (2n−3)-th stage. For example, the first switching device Tr1 of the third stage ST203 charges the enabling node Q of the third stage ST203 with the first DC voltage Vdc1 in response to the first scan pulse Vout1 from the first stage ST201. The first switching device Tr1 of the third stage ST203 has a gate terminal connected to the first stage ST201, a drain terminal connected to a power supply line which transfers the first DC voltage Vdc1, and a source terminal connected to the enabling node Q of the third stage ST203.

The second switching device Tr2 of the (2n−1)-th stage discharges the enabling node Q of the (2n−1)-th stage with the second DC voltage Vdc2 in response to the first AC voltage Vac1 supplied to the first disabling node QB1 of the (2n−1)-th stage. For example, the second switching device Tr2 of the third stage ST203 discharges the enabling node Q of the third stage ST203 with the second DC voltage Vdc2 in response to the first AC voltage Vac1 supplied to the first disabling node QB1 of the third stage ST203. The second switching device Tr2 of the third stage ST203 has a gate terminal connected to the first disabling node QB1 of the third stage ST203, a drain terminal connected to the enabling node Q of the third stage ST203, and a source terminal connected to a power supply line which transfers the second DC voltage Vdc2.

The third switching device Tr3 of the (2n−1)-th stage discharges the enabling node Q of the (2n−1)-th stage with the second DC voltage Vdc2 in response to the second AC voltage Vac2 supplied to the second disabling node QB2 of the (2n−1)-th stage through the 2n-th stage. For example, the third switching device Tr3 of the (2n−1)-th stage discharges the enabling node Q of the (2n−1)-th stage with the second DC voltage Vdc2 in response to the second AC voltage Vac2 supplied to the second disabling node QB2 of the (2n−1)-th stage. The state of the second disabling node QB2 of the (2n−1)-th stage is controlled by the node controller 205 of the 2n-th stage. For example, the third switching device Tr3 of the third stage ST203 discharges the enabling node Q of the third stage ST203 with the second DC voltage Vdc2 in response to the second AC voltage Vac2 supplied to the second disabling node QB2 of the third stage ST203 through the fourth stage ST204. The third switching device Tr3 of the third stage ST203 has a gate terminal connected to the second disabling node QB2 of the third stage ST203, a drain terminal connected to the enabling node Q of the third stage ST203, and a source terminal connected to the power supply line which transfers the second DC voltage Vdc2.

The fourth switching device Tr4 of the (2n−1)-th stage discharges the enabling node Q of the (2n−1)-th stage with the second DC voltage Vdc2 in response to the scan pulse from the (2n+2)-th stage. For example, the fourth switching device Tr4 of the third stage ST203 discharges the enabling node Q of the third stage ST203 with the second DC voltage Vdc2 in response to the sixth scan pulse Vout6 from the sixth stage ST206. The fourth switching device Tr4 of the third stage ST203 has a gate terminal connected to the sixth stage ST206, a drain terminal connected to the enabling node Q of the third stage ST203, and a source terminal connected to the power supply line which transfers the second DC voltage Vdc2.

The fifth switching device Tr5 of the (2n−1)-th stage is turned on or off in response to the first AC voltage Vac1, and charges a common node N of the (2n−1)-th stage with the first AC voltage Vac1 when being turned on. For example, the fifth switching device Tr5 of the third stage ST203 is turned on or off in response to the first AC voltage Vac1, and charges the common node N of the third stage ST203 with the first AC voltage Vac1 when being turned on. The fifth switching device Tr5 of the third stage ST203 has a gate terminal and drain terminal connected in common to a power supply line which transfers the first AC voltage Vac1, and a source terminal connected to the common node N of the third stage ST203.

The sixth switching device Tr6 of the (2n−1)-th stage discharges the common node N of the (2n−1)-th stage with the second DC voltage Vdc2 in response to the first DC voltage Vdc1 charged at the enabling node Q of the (2n−1)-th stage. For example, the sixth switching device Tr6 of the third stage ST203 discharges the common node N of the third stage ST203 with the second DC voltage Vdc2 in response to the first DC voltage Vdc1 charged at the enabling node Q of the third stage ST203. The sixth switching device Tr6 of the third stage ST203 has a gate terminal connected to the enabling node Q of the third stage ST203, a drain terminal connected to the common node N of the third stage ST203, and a source terminal connected to the power supply line which transfers the second DC voltage Vdc2.

The seventh switching device Tr7 of the (2n−1)-th stage charges the first disabling node QB1 of the (2n−1)-th stage and the first disabling node QB1 of the 2n-th stage with the first AC voltage Vac1 in response to the first AC voltage Vac1 supplied to the common node N of the (2n−1)-th stage. The seventh switching device Tr7 of the (2n−1)-th stage controls the state of the first disabling node QB1 of the (2n−1)-th stage and the state of the first disabling node QB1 of the 2n-th stage together. For example, the seventh switching device Tr7 of the third stage ST203 charges the first disabling node QB1 of the third stage ST203 and the first disabling node QB1 of the fourth stage ST204 with the first AC voltage Vac1 in response to the first AC voltage Vac1 supplied to the common node N of the third stage ST203. The seventh switching device Tr7 of the third stage ST203 has a gate terminal connected to the common node N of the third stage ST203, a drain terminal connected to the power supply line which transfers the first AC voltage Vac1, and a source terminal connected to the first disabling node QB1 of the third stage ST203.

The eighth switching device Tr8 of the (2n−1)-th stage discharges the first disabling node QB1 of the (2n−1)-th stage and the first disabling node QB1 of the 2n-th stage with the second DC voltage Vdc2 in response to the scan pulse from the (2n−3)-th stage. The eighth switching device Tr8 of the (2n−1)-th stage controls the state of the first disabling node QB1 of the (2n−1)-th stage and the state of the first disabling node QB1 of the 2n-th stage together. For example, the eighth switching device Tr8 of the third stage ST203 discharges the first disabling node QB1 of the third stage ST203 and the first disabling node QB1 of the fourth stage ST204 with the second DC voltage Vdc2 in response to the first scan pulse Vout1 from the first stage ST201. The eighth switching device Tr8 of the third stage ST203 has a gate terminal connected to the first stage ST201, a drain terminal connected to the first disabling node QB1 of the third stage ST203, and a source terminal connected to the power supply line which transfers the second DC voltage Vdc2.

The ninth switching device Tr9 of the (2n−1)-th stage discharges the first disabling node QB1 of the (2n−1)-th stage and the first disabling node QB1 of the 2n-th stage with the second DC voltage Vdc2 in response to the first DC voltage Vdc1 charged at the enabling node Q of the (2n−1)-th stage. The ninth switching device Tr9 of the (2n−1)-th stage controls the state of the first disabling node QB1 of the (2n−1)-th stage and the state of the first disabling node QB1 of the 2n-th stage together. For example, the ninth switching device Tr9 of the third stage ST203 discharges the first disabling node QB1 of the third stage ST203 and the first disabling node QB1 of the fourth stage ST204 with the second DC voltage Vdc2 in response to the first DC voltage Vdc1 charged at the enabling node Q of the third stage ST203. The ninth switching device Tr9 of the third stage ST203 has a gate terminal connected to the enabling node Q of the third stage ST203, a drain terminal connected to the first disabling node QB1 of the third stage ST203, and a source terminal connected to the power supply line which transfers the second DC voltage Vdc2.

On the other hand, the pull-up switching device Tru of the (2n−1)-th stage outputs the corresponding clock pulse as the (2n−1)-th scan pulse in response to the first DC voltage Vdc1 charged at the enabling node Q of the (2n−1)-th stage. Then, the pull-up switching device Tru of the (2n−1)-th stage supplies the (2n−1)-th scan pulse to the (2n−1)-th gate line and the (2n+1)-th and (2n+2)-th stages. The (2n−1)-th scan pulse outputted from the (2n−1)-th stage drives the (2n−1)-th gate line and enables the (2n+1)-th and (2n+2)-th stages simultaneously. For example, the pull-up switching device Tru of the third stage ST203 outputs the third clock pulse CLK3 as the third scan pulse Vout3 in response to the first DC voltage Vdc1 charged at the enabling node Q of the third stage ST203. Then, the pull-up switching device Tru of the third stage ST203 supplies the third scan pulse Vout3 to the third gate line, fifth stage ST205 and sixth stage ST206. The pull-up switching device Tru of the third stage ST203 has a gate terminal connected to the enabling node Q of the third stage ST203, a drain terminal connected to a clock transfer line which transfers the third clock pulse CLK3, and a source terminal connected in common to the third gate line, fifth stage ST205 and sixth stage ST206.

The first pull-down switching device Trd1 of the (2n−1)-th stage outputs the second DC voltage Vdc2 as the OFF voltage in response to the first AC voltage Vac1 charged at the first disabling node QB1 of the (2n−1)-th stage. Then, the first pull-down switching device Trd1 of the (2n−1)-th stage supplies the OFF voltage to the (2n−1)-th gate line and the (2n+1)-th and (2n+2)-th stages. For example, the first pull-down switching device Trd1 of the third stage ST203 outputs the second DC voltage Vdc2 as the OFF voltage in response to the first AC voltage Vac1 charged at the first disabling node QB1 of the third stage ST203 and then supplies the OFF voltage to the third gate line, fifth stage ST205 and sixth stage ST206. The first pull-down switching device Trd1 of the third stage ST203 has a gate terminal connected to the first disabling node QB1 of the third stage ST203, a source terminal connected to the power supply line which transfers the second DC voltage Vdc2, and a drain terminal connected in common to the third gate line, fifth stage ST205 and sixth stage ST206.

The second pull-down switching device Trd2 of the (2n−1)-th stage outputs the second DC voltage Vdc2 as the OFF voltage in response to the second AC voltage Vac2 charged at the second disabling node QB2 of the (2n−1)-th stage through the 2n-th stage. Then, the second pull-down switching device Trd2 of the (2n−1)-th stage supplies the OFF voltage to the (2n−1)-th gate line and the (2n+1)-th and (2n+2)-th stages. The second pull-down switching device Trd2 of the (2n−1)-th stage outputs the second DC voltage Vdc2 as the OFF voltage in response to the second AC voltage Vac2 supplied to the second disabling node QB2 of the (2n−1)-th stage.

The state of the second disabling node QB2 of the (2n−1)-th stage is controlled by the node controller 205 of the 2n-th stage. For example, the second pull-down switching device Trd2 of the third stage ST203 in FIG. 4 outputs the second DC voltage Vdc2 as the OFF voltage in response to the second AC voltage Vac2 charged at the second disabling node QB2 of the third stage ST203 and then supplies the OFF voltage to the third gate line, fifth stage ST205 and sixth stage ST206. The second pull-down switching device Trd2 of the third stage ST203 has a gate terminal connected to the second disabling node QB2 of the third stage ST203, a source terminal connected to the power supply line which transfers the second DC voltage Vdc2, and a drain terminal connected in common to the third gate line, fifth stage ST205 and sixth stage ST206.

The first and eighth switching devices Tr1 and Tr8 of the first stage ST201 are operated in response to the start pulse Vst from the timing controller, because there is no first stage upstream from the first stage ST201.

Still referring to FIG. 4, the node controller 205 of each of the even-numbered stages ST202, ST204, ST206, . . . includes first to ninth switching devices Tr1 to Tr9. The first switching device Tr1 of the 2n-th stage charges the enabling node Q of the 2n-th stage with the first DC voltage Vdc1 in response to the scan pulse from the (2n−3)-th stage. For example, the first switching device Tr1 of the fourth stage ST204 charges the enabling node Q of the fourth stage ST204 with the first DC voltage Vdc1 in response to the first scan pulse Vout1 from the first stage ST201. The first switching device Tr1 of the fourth stage ST204 has a gate terminal connected to the first stage ST201, a drain terminal connected to the power supply line which transfers the first DC voltage Vdc1, and a source terminal connected to the enabling node Q of the fourth stage ST204.

The second switching device Tr2 of the 2n-th stage discharges the enabling node Q of the 2n-th stage with the second DC voltage Vdc2 in response to the first AC voltage Vac1 supplied to the first disabling node QB1 of the 2n-th stage through the (2n−1)-th stage. The second switching device Tr2 of the 2n-th stage discharges the enabling node Q of the 2n-th stage with the second DC voltage Vdc2 in response to the first AC voltage Vac1 supplied to the first disabling node QB1 of the 2n-th stage. The state of the first disabling node QB1 of the 2n-th stage is controlled by the node controller 205 of the (2n−1)-th stage. For example, the second switching device Tr2 of the fourth stage ST204 in FIG. 4 discharges the enabling node Q of the fourth stage ST204 with the second DC voltage Vdc2 in response to the first AC voltage Vac1 supplied to the first disabling node QB1 of the fourth stage ST204 through the third stage ST203. The second switching device Tr2 of the fourth stage ST204 has a gate terminal connected to the first disabling node QB1 of the fourth stage ST204, a drain terminal connected to the enabling node Q of the fourth stage ST204, and a source terminal connected to the power supply line which transfers the second DC voltage Vdc2.

The third switching device Tr3 of the 2n-th stage discharges the enabling node Q of the 2n-th stage with the second DC voltage Vdc2 in response to the second AC voltage Vac2 supplied to the second disabling node QB2 of the 2n-th stage. For example, the third switching device Tr3 of the fourth stage ST204 discharges the enabling node Q of the fourth stage ST204 with the second DC voltage Vdc2 in response to the second AC voltage Vac2 supplied to the second disabling node QB2 of the fourth stage ST204. The third switching device Tr3 of the fourth stage ST204 has a gate terminal connected to the second disabling node QB2 of the fourth stage ST204, a drain terminal connected to the enabling node Q of the fourth stage ST204, and a source terminal connected to the power supply line which transfers the second DC voltage Vdc2.

The fourth switching device Tr4 of the 2n-th stage discharges the enabling node Q of the 2n-th stage with the second DC voltage Vdc2 in response to the scan pulse from the (2n+2)-th stage. For example, the fourth switching device Tr4 of the fourth stage ST204 in FIG. 4 discharges the enabling node Q of the fourth stage ST204 with the second DC voltage Vdc2 in response to the sixth scan pulse Vout6 from the sixth stage ST206. The fourth switching device Tr4 of the fourth stage ST204 has a gate terminal connected to the sixth stage ST206, a drain terminal connected to the enabling node Q of the fourth stage ST204, and a source terminal connected to the power supply line which transfers the second DC voltage Vdc2.

The fifth switching device Tr5 of the 2n-th stage is turned on or off in response to the second AC voltage Vac2, and charges a common node N of the 2n-th stage with the second AC voltage Vac2 when being turned on. For example, the fifth switching device Tr5 of the fourth stage ST204 is turned on or off in response to the second AC voltage Vac2, and charges the common node N of the fourth stage ST204 with the second AC voltage Vac2 when being turned on. The fifth switching device Tr5 of the fourth stage ST204 has a gate terminal and drain terminal connected in common to a power supply line which transfers the second AC voltage Vac2, and a source terminal connected to the common node N of the fourth stage ST204.

The sixth switching device Tr6 of the 2n-th stage discharges the common node N of the 2n-th stage with the second DC voltage Vdc2 in response to the first DC voltage Vdc1 charged at the enabling node Q of the 2n-th stage. For example, the sixth switching device Tr6 of the fourth stage ST204 discharges the common node N of the fourth stage ST204 with the second DC voltage Vdc2 in response to the first DC voltage Vdc1 charged at the enabling node Q of the fourth stage ST204. The sixth switching device Tr6 of the fourth stage ST204 has a gate terminal connected to the enabling node Q of the fourth stage ST204, a drain terminal connected to the common node N of the fourth stage ST204, and a source terminal connected to the power supply line which transfers the second DC voltage Vdc2.

The seventh switching device Tr7 of the 2n-th stage charges the second disabling node QB2 of the 2n-th stage and the second disabling node QB2 of the (2n−1)-th stage with the second AC voltage Vac2 in response to the second AC voltage Vac2 supplied to the common node N of the 2n-th stage. The seventh switching device Tr7 of the 2n-th stage controls the state of the second disabling node QB2 of the 2n-th stage and the state of the second disabling node QB2 of the (2n−1)-th stage together. For example, the seventh switching device Tr7 of the fourth stage ST204 charges the second disabling node QB2 of the fourth stage ST204 and the second disabling node QB2 of the third stage ST203 with the second AC voltage Vac2 in response to the second AC voltage Vac2 supplied to the common node N of the fourth stage ST204. The seventh switching device Tr7 of the fourth stage ST204 has a gate terminal connected to the common node N of the fourth stage ST204, a drain terminal connected to the power supply line which transfers the second AC voltage Vac2, and a source terminal connected to the second disabling node QB2 of the fourth stage ST204.

The eighth switching device Tr8 of the 2n-th stage discharges the second disabling node QB2 of the 2n-th stage and the second disabling node QB2 of the (2n−1)-th stage with the second DC voltage Vdc2 in response to the scan pulse from the (2n−3)-th stage. The eighth switching device Tr8 of the 2n-th stage controls the state of the second disabling node QB2 of the 2n-th stage and the state of the second disabling node QB2 of the (2n−1)-th stage together. For example, the eighth switching device Tr8 of the fourth stage ST204 discharges the second disabling node QB2 of the fourth stage ST204 and the second disabling node QB2 of the third stage ST203 with the second DC voltage Vdc2 in response to the first scan pulse Vout1 from the first stage ST201. To the eighth switching device Tr8 of the fourth stage ST204 has a gate terminal connected to the first stage ST201, a drain terminal connected to the second disabling node QB2 of the fourth stage ST204, and a source terminal connected to the power supply line which transfers the second DC voltage Vdc2.

The ninth switching device Tr9 of the 2n-th stage discharges the second disabling node QB2 of the 2n-th stage and the second disabling node QB2 of the (2n−1)-th stage with the second DC voltage Vdc2 in response to the first DC voltage Vdc1 charged at the enabling node Q of the 2n-th stage. The ninth switching device Tr9 of the 2n-th stage controls the state of the second disabling node QB2 of the 2n-th stage and the state of the second disabling node QB2 of the (2n−1)-th stage together. For example, the ninth switching device Tr9 of the fourth stage ST204 discharges the second disabling node QB2 of the fourth stage ST204 and the second disabling node QB2 of the third stage ST203 with the second DC voltage Vdc2 in response to the first DC voltage Vdc1 charged at the enabling node Q of the fourth stage ST204. The ninth switching device Tr9 of the fourth stage ST204 has a gate terminal connected to the enabling node Q of the fourth stage ST204, a drain terminal connected to the second disabling node QB2 of the fourth stage ST204, and a source terminal connected to the power supply line which transfers the second DC voltage Vdc2.

On the other hand, the pull-up switching device Tru of the 2n-th stage outputs the corresponding clock pulse as the 2n-th scan pulse in response to the first DC voltage Vdc1 charged at the enabling node Q of the 2n-th stage. Then, the pull-up switching device Tru of the 2n-th stage supplies the 2n-th scan pulse to the 2n-th gate line and the (2n−3)-th and (2n−2)-th stages. The 2n-th scan pulse outputted from the 2n-th stage drives the 2n-th gate line and disables the (2n−3)-th and (2n−2)-th stages simultaneously. For example, the pull-up switching device Tru of the fourth stage ST204 in FIG. 4 outputs the fourth clock pulse CLK4 as the fourth scan pulse Vout4 in response to the first DC voltage Vdc1 charged at the enabling node Q of the fourth stage ST204. Then, the pull-up switching device Tru of the fourth stage ST204 supplies the fourth scan pulse Vout4 to the fourth gate line, first stage ST201 and second stage ST202. The pull-up switching device Tru of the fourth stage ST204 has a gate terminal connected to the enabling node Q of the fourth stage ST204, a drain terminal connected to a clock transfer line which transfers the fourth clock pulse CLK4, and a source terminal connected in common to the fourth gate line, first stage ST201 and second stage ST202.

The first pull-down switching device Trd1 of the 2n-th stage outputs the second DC voltage Vdc2 as the OFF voltage in response to the first AC voltage Vac1 charged at the first disabling node QB1 of the 2n-th stage through the (2n−1)-th stage. Then, the first pull-down switching device Trd1 of the 2n-th stage supplies the OFF voltage to the 2n-th gate line and the (2n−3)-th and (2n−2)-th stages. The first pull-down switching device Trd1 of the 2n-th stage outputs the second DC voltage Vdc2 as the OFF voltage in response to the first AC voltage Vac1 charged at the first disabling node QB1 of the 2n-th stage. The state of the first disabling node QB1 of the 2n-th stage is controlled by the node controller 205 of the (2n−1)-th stage. For example, the first pull-down switching device Trd1 of the fourth stage ST204 in FIG. 4 outputs the second DC voltage Vdc2 as the OFF voltage in response to the first AC voltage Vac1 charged at the first disabling node QB1 of the fourth stage ST204 and then supplies the OFF voltage to the fourth gate line, first stage ST201 and second stage ST202. The first pull-down switching device Trd1 of the fourth stage ST204 has a gate terminal connected to the first disabling node QB1 of the fourth stage ST204, a source terminal connected to the power supply line which transfers the second DC voltage Vdc2, and a drain terminal connected in common to the fourth gate line, first stage ST201 and second stage ST202.

The second pull-down switching device Trd2 of the 2n-th stage outputs the second DC voltage Vdc2 as the OFF voltage in response to the second AC voltage Vac2 charged at the second disabling node QB2 of the 2n-th stage. Then, the second pull-down switching device Trd2 of the 2n-th stage supplies the OFF voltage to the 2n-th gate line and the (2n−3)-th and (2n−2)-th stages. For example, the second pull-down switching device Trd2 of the fourth stage ST204 outputs the second DC voltage Vdc2 as the OFF voltage in response to the second AC voltage Vac2 charged at the second disabling node QB2 of the fourth stage ST204 and then supplies the OFF voltage to the fourth gate line, first stage ST201 and second stage ST202.

The second pull-down switching device Trd2 of the fourth stage ST204 has a gate terminal connected to the second disabling node QB2 of the fourth stage ST204, a source terminal connected to the power supply line which transfers the second DC voltage Vdc2, and a drain terminal connected in common to the fourth gate line, first stage ST201 and second stage ST202.

The first and eighth switching devices Tr1 and Tr8 of the second stage ST202 are operated in response to the start pulse Vst from the timing controller, because there is no second stage upstream from the second stage ST202.

Figure 5:
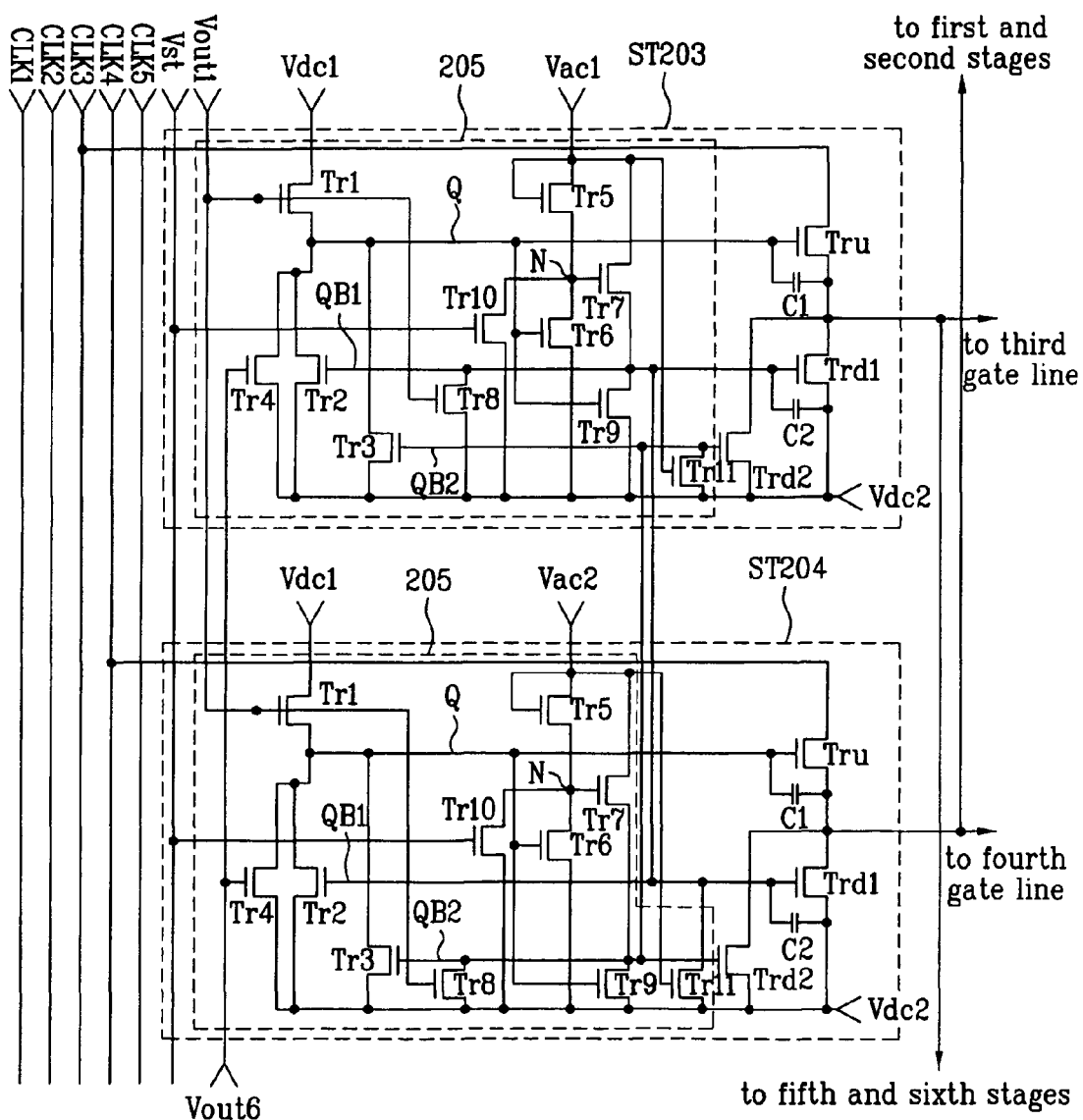
FIG. 5 is a schematic view of a second exemplary circuit configuration of node controllers for the third and fourth stages in FIG. 2 in accordance with another embodiment of the present invention.

FIG. 5 is a schematic view of a second exemplary circuit configuration of node controllers for the third and fourth stages in FIG. 2 in accordance with another embodiment of the present invention. Referring to FIG. 5, each of the third and fourth stages ST203 and ST204 shown in FIG. 5 further includes tenth and eleventh switching devices Tr10 and Tr11, in addition to the first to ninth switching devices Tr1 to Tr9 described above in reference to FIG. 4.

The tenth switching device Tr10 of each of the stages ST201, ST202, ST203, ... discharges the common node N of a corresponding one of the stages ST201, ST202, ST203, ... with the second DC voltage Vdc2 in response to the start pulse Vst from the timing controller. For example, the tenth switching device Tr10 of the third stage ST203 discharges the common node N of the third stage ST203 with the second DC voltage Vdc2 in response to the start pulse Vst from the timing controller. The tenth switching device Tr10 of the third stage ST203 has a gate terminal connected to the timing controller, a drain terminal connected to the common node N of the third stage ST203, and a source terminal connected to the power supply line which transfers the second DC voltage Vdc2. The tenth switching device Tr10 discharges (initializes) the common node N of the corresponding (2n−1)-th stage, in response to the start pulse Vst outputted once for every frame.

The eleventh switching device Tr11 of the (2n−1)-th stage (including the first stage ST201) is turned on or off in response to the first AC voltage Vac1, and discharges the second disabling node QB2 of the (2n−1)-th stage with the second DC voltage Vdc2 when being turned on. The eleventh switching device Tr11 of the (2n−1)-th stage directly discharges the second disabling node QB2 of the (2n−1)-th stage. Accordingly, the (2n−1)-th stage controls the state of the second disabling node QB2 thereof with the eleventh switching device Tr11 together with the node controller 205 of the 2n-th stage. For example, the eleventh switching device Tr11 of the third stage ST203 is turned on or off in response to the first AC voltage Vac1, and discharges the second disabling node QB2 of the third stage ST203 with the second DC voltage Vdc2 when being turned on. The eleventh switching device Tr11 has a gate terminal connected to the power supply line which transfers the first AC voltage Vac1, a drain terminal connected to the second disabling node QB2 of the third stage ST203, and a source terminal connected to the power supply line which transfers the second DC voltage Vdc2.

The eleventh switching device Tr11 of the 2n-th stage (including the second stage ST202) is turned on or off in response to the second AC voltage Vac2, and discharges the first disabling node QB1 of the 2n-th stage with the second DC voltage Vdc2 when being turned on. The eleventh switching device Tr11 of the 2n-th stage acts to directly discharge the first disabling node QB1 of the 2n-th stage. In other words, the 2n-th stage controls the state of the first disabling node QB1 thereof with the eleventh switching device Tr11 together with the node controller 205 of the (2n−1)-th stage. For example, the eleventh switching device Tr11 of the fourth stage ST204 in FIG. 5 is turned on or off in response to the second AC voltage Vac2, and discharges the first disabling node QB1 of the fourth stage ST204 with the second DC voltage Vdc2 when being turned on. The eleventh switching device Tr11 of the fourth stage ST204 has a gate terminal connected to the power supply line which transfers the second AC voltage Vac2, a drain terminal connected to the first disabling node QB1 of the fourth stage ST204, and a source terminal connected to the power supply line which transfers the second DC voltage Vdc2.

Figure 6:
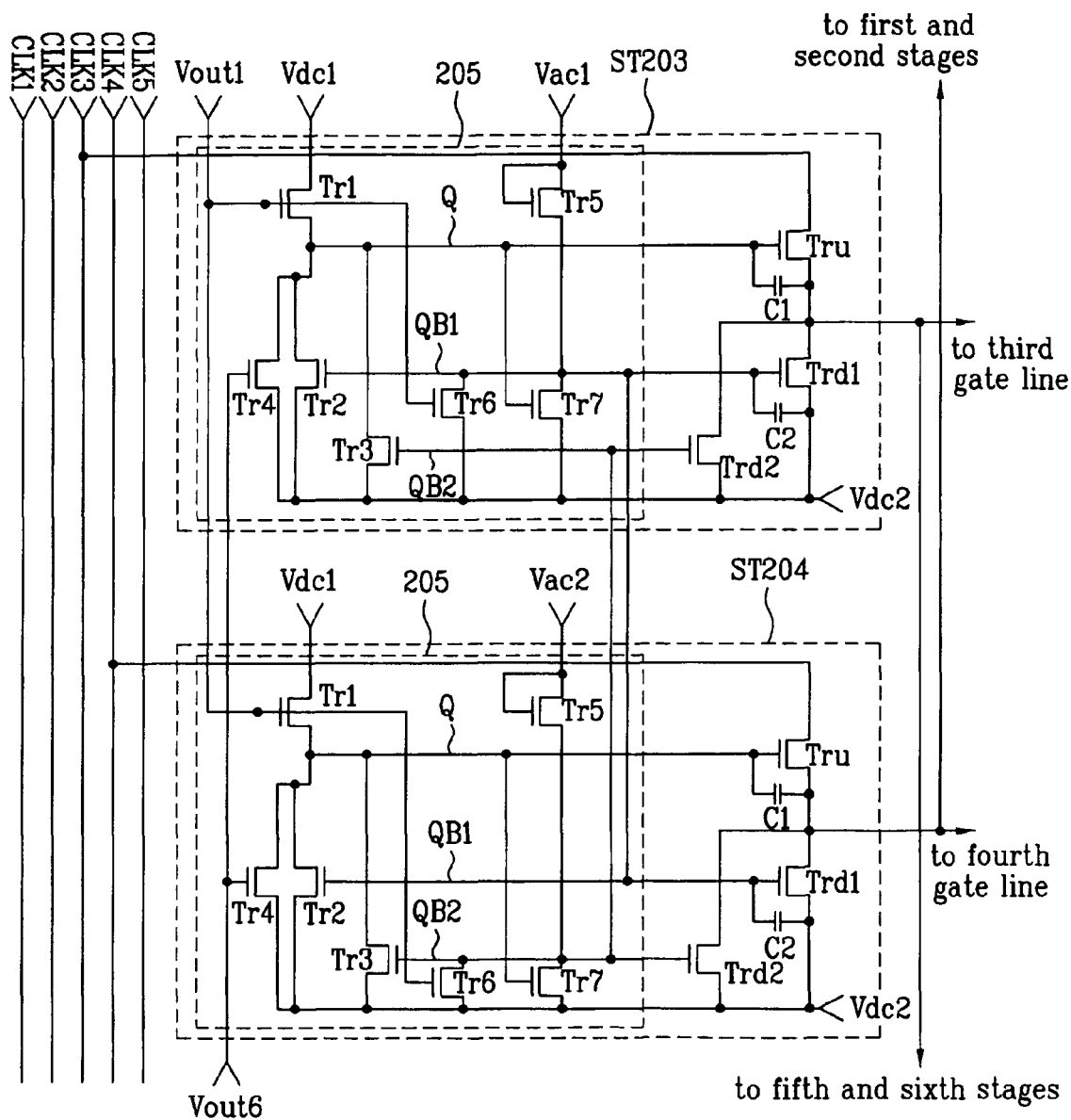
FIG. 6 is a schematic view of a third exemplary circuit configuration of node controllers for the third and fourth stages in FIG. 2 in accordance with another embodiment of the present invention.

FIG. 6 is a schematic view of a third exemplary circuit configuration of node controllers for the third and fourth stages in FIG. 2 in accordance with another embodiment of the present invention. Referring to FIG. 6, the node controller 205 of each of the odd-numbered stages ST201, ST203, ST205, . . . includes first to seventh switching devices Tr1 to Tr7. The first switching device Tr1 of the (2n−1)-th stage charges the enabling node Q of the (2n−1)-th stage with the first DC voltage Vdc1 in response to the scan pulse from the (2n−3)-th stage. For example, the first switching device Tr1 of the third stage ST203 in FIG. 6 charges the enabling node Q of the third stage ST203 with the first DC voltage Vdc1 in response to the first scan pulse Vout1 from the first stage ST201. The first switching device Tr1 of the third stage ST203 has a gate terminal connected to the first stage ST201, a drain terminal connected to a power supply line which transfers the first DC voltage Vdc1, and a source terminal connected to the enabling node Q of the third stage ST203.

The second switching device Tr2 of the (2n−1)-th stage discharges the enabling node Q of the (2n−1)-th stage with the second DC voltage Vdc2 in response to the first AC voltage Vac1 supplied to the first disabling node QB1 of the (2n−1)-th stage. For example, the second switching device Tr2 of the third stage ST203 discharges the enabling node Q of the third stage ST203 with the second DC voltage Vdc2 in response to the first AC voltage Vac1 supplied to the first disabling node QB1 of the third stage ST203. The second switching device Tr2 of the third stage ST203 has a gate terminal connected to the first disabling node QB1 of the third stage ST203, a drain terminal connected to the enabling node Q of the third stage ST203, and a source terminal connected to a power supply line which transfers the second DC voltage Vdc2.

The third switching device Tr3 of the (2n−1)-th stage discharges the enabling node Q of the (2n−1)-th stage with the second DC voltage Vdc2 in response to the second AC voltage Vac2 supplied to the second disabling node QB2 of the (2n−1)-th stage through the 2n-th stage. The third switching device Tr3 of the (2n−1)-th stage discharges the enabling node Q of the (2n−1)-th stage with the second DC voltage Vdc2 in response to the second AC voltage Vac2 supplied to the second disabling node QB2 of the (2n−1)-th stage. The state of the second disabling node QB2 of the (2n−1)-th stage is controlled by the node controller 205 of the 2n-th stage. For example, the third switching device Tr3 of the third stage ST203 in FIG. 6 discharges the enabling node Q of the third stage ST203 with the second DC voltage Vdc2 in response to the second AC voltage Vac2 supplied to the second disabling node QB2 of the third stage ST203 through the fourth stage ST204. The third switching device Tr3 of the third stage ST203 has a gate terminal connected to the second disabling node QB2 of the third stage ST203, a drain terminal connected to the enabling node Q of the third stage ST203, and a source terminal connected to the power supply line which transfers the second DC voltage Vdc2.

The fourth switching device Tr4 of the (2n−1)-th stage discharges the enabling node Q of the (2n−1)-th stage with the second DC voltage Vdc2 in response to the scan pulse from the (2n+2)-th stage. For example, the fourth switching device Tr4 of the third stage ST203 in FIG. 6 discharges the enabling node Q of the third stage ST203 with the second DC voltage Vdc2 in response to the sixth scan pulse Vout6 from the sixth stage ST206. The fourth switching device Tr4 of the third stage ST203 has a gate terminal connected to the sixth stage ST206, a drain terminal connected to the enabling node Q of the third stage ST203, and a source terminal connected to the power supply line which transfers the second DC voltage Vdc2.

The fifth switching device Tr5 of the (2n−1)-th stage is turned on or off in response to the first AC voltage Vac1, and charges the first disabling node QB1 of the (2n−1)-th stage and the first disabling node QB1 of the 2n-th stage with the first AC voltage Vac1 when being turned on. The fifth switching device Tr5 of the (2n−1)-th stage controls the state of the first disabling node QB1 of the (2n−1)-th stage and the state of the first disabling node QB1 of the 2n-th stage together. For example, the fifth switching device Tr5 of the third stage ST203 is turned on or off in response to the first AC voltage Vac1, and charges the first disabling node QB1 of the third stage ST203 and the first disabling node QB1 of the fourth stage ST204 with the first AC voltage Vac1 when being turned on. The fifth switching device Tr5 of the third stage ST203 has a gate terminal and drain terminal connected in common to a power supply line which transfers the first AC voltage Vac1, and a source terminal connected to the first disabling node QB1 of the third stage ST203.

The sixth switching device Tr6 of the (2n−1)-th stage discharges the first disabling node QB1 of the (2n−1)-th stage and the first disabling node QB1 of the 2n-th stage with the second DC voltage Vdc2 in response to the scan pulse from the (2n−3)-th stage. The sixth switching device Tr6 of the (2n−1)-th stage controls the state of the first disabling node QB1 of the (2n−1)-th stage and the state of the first disabling node QB1 of the 2n-th stage together. For example, the sixth switching device Tr6 of the third stage ST203 discharges the first disabling node QB1 of the third stage ST203 and the first disabling node QB1 of the fourth stage ST204 with the second DC voltage Vdc2 in response to the first scan pulse Vout1 from the first stage ST201. The sixth switching device Tr6 of the third stage ST203 has a gate terminal connected to the first stage ST201, a drain terminal connected to the first disabling node QB1 of the third stage ST203, and a source terminal connected to the power supply line which transfers the second DC voltage Vdc2.

The seventh switching device Tr7 of the (2n−1)-th stage discharges the first disabling node QB1 of the (2n−1)-th stage and the first disabling node QB1 of the 2n-th stage with the second DC voltage Vdc2 in response to the first DC voltage Vdc1 charged at the enabling node Q of the (2n−1)-th stage. The seventh switching device Tr7 of the (2n−1)-th stage controls the state of the first disabling node QB1 of the (2n−1)-th stage and the state of the first disabling node QB1 of the 2n-th stage together. For example, the seventh switching device Tr7 of the third stage ST203 discharges the first disabling node QB1 of the third stage ST203 and the first disabling node QB1 of the fourth stage ST204 with the second DC voltage Vdc2 in response to the first DC voltage Vdc1 charged at the enabling node Q of the third stage ST203. The seventh switching device Tr7 of the third stage ST203 has a gate terminal connected to the enabling node Q of the third stage ST203, a drain terminal connected to the first disabling node QB1 of the third stage ST203, and a source terminal connected to the power supply line which transfers the second DC voltage Vdc2.

Still referring to FIG. 6, the node controller 205 of each of the even-numbered stages ST202, ST204, ST206, . . . includes vorresponding first to seventh switching devices Tr1 to Tr7. The first switching device Tr1 of the 2n-th stage charges the enabling node Q of the 2n-th stage with the first DC voltage Vdc1 in response to the scan pulse from the (2n−3)-th stage. For example, the first switching device Tr1 of the fourth stage ST204 in FIG. 6 charges the enabling node Q of the fourth stage ST204 with the first DC voltage Vdc1 in response to the first scan pulse Vout1 from the first stage ST201. The first switching device Tr1 of the fourth stage ST204 has a gate terminal connected to the first stage ST201, a drain terminal connected to the power supply line which transfers the first DC voltage Vdc1, and a source terminal connected to the enabling node Q of the fourth stage ST204.

The second switching device Tr2 of the 2n-th stage discharges the enabling node Q of the 2n-th stage with the second DC voltage Vdc2 in response to the first AC voltage Vac1 supplied to the first disabling node QB1 of the 2n-th stage through the (2n−1)-th stage. The second switching device Tr2 of the 2n-th stage discharges the enabling node Q of the 2n-th stage with the second DC voltage Vdc2 in response to the first AC voltage Vac1 supplied to the first disabling node QB1 of the 2n-th stage. the state of the first disabling node QB1 of the 2n-th stage is controlled by the node controller 205 of the (2n−1)-th stage. For example, the second switching device Tr2 of the fourth stage ST204 in FIG. 6 discharges the enabling node Q of the fourth stage ST204 with the second DC voltage Vdc2 in response to the first AC voltage Vac1 supplied to the first disabling node QB1 of the fourth stage ST204 through the third stage ST203. The second switching device Tr2 of the fourth stage ST204 has a gate terminal connected to the first disabling node QB1 of the fourth stage ST204, a drain terminal connected to the enabling node Q of the fourth stage ST204, and a source terminal connected to the power supply line which transfers the second DC voltage Vdc2.

The third switching device Tr3 of the 2n-th stage discharges the enabling node Q of the 2n-th stage with the second DC voltage Vdc2 in response to the second AC voltage Vac2 supplied to the second disabling node QB2 of the 2n-th stage. For example, the third switching device Tr3 of the fourth stage ST204 in FIG. 6 discharges the enabling node Q of the fourth stage ST204 with the second DC voltage Vdc2 in response to the second AC voltage Vac2 supplied to the second disabling node QB2 of the fourth stage ST204. The third switching device Tr3 of the fourth stage ST204 has a gate terminal connected to the second disabling node QB2 of the fourth stage ST204, a drain terminal connected to the enabling node Q of the fourth stage ST204, and a source terminal connected to the power supply line which transfers the second DC voltage Vdc2.

The fourth switching device Tr4 of the 2n-th stage discharges the enabling node Q of the 2n-th stage with the second DC voltage Vdc2 in response to the scan pulse from the (2n+2)-th stage. For example, the fourth switching device Tr4 of the fourth stage ST204 in FIG. 6 discharges the enabling node Q of the fourth stage ST204 with the second DC voltage Vdc2 in response to the sixth scan pulse Vout6 from the sixth stage ST206. The fourth switching device Tr4 of the fourth stage ST204 has a gate terminal connected to the sixth stage ST206, a drain terminal connected to the enabling node Q of the fourth stage ST204, and a source terminal connected to the power supply line which transfers the second DC voltage Vdc2.

The fifth switching device Tr5 of the 2n-th stage is turned on or off in response to the second AC voltage Vac2, and charges the second disabling node QB2 of the 2n-th stage and the second disabling node QB2 of the (2n−1)-th stage with the second AC voltage Vac2 when being turned on. The fifth switching device Tr5 of the 2n-th stage controls the state of the second disabling node QB2 of the 2n-th stage and the state of the second disabling node QB2 of the (2n−1)-th stage together. For example, the fifth switching device Tr5 of the fourth stage ST204 in FIG. 6 is turned on or off in response to the second AC voltage Vac2, and charges the second disabling node QB2 of the fourth stage ST204 and the second disabling node QB2 of the third stage ST203 with the second AC voltage Vac2 when being turned on. The fifth switching device Tr5 of the fourth stage ST204 has a gate terminal and drain terminal connected in common to a power supply line which transfers the second AC voltage Vac2, and a source terminal connected to the second disabling node QB2 of the fourth stage ST204.

The sixth switching device Tr6 of the 2n-th stage discharges the second disabling node QB2 of the 2n-th stage and the second disabling node QB2 of the (2n−1)-th stage with the second DC voltage Vdc2 in response to the scan pulse from the (2n−3)-th stage. The sixth switching device Tr6 of the 2n-th stage controls the state of the second disabling node QB2 of the 2n-th stage and the state of the second disabling node QB2 of the (2n−1)-th stage together. For example, the sixth switching device Tr6 of the fourth stage ST204 in FIG. 6 discharges the second disabling node QB2 of the fourth stage ST204 and the second disabling node QB2 of the third stage ST203 with the second DC voltage Vdc2 in response to the first scan pulse Vout1 from the first stage ST201. The sixth switching device Tr6 of the fourth stage ST204 has a gate terminal connected to the first stage ST201, a drain terminal connected to the second disabling node QB2 of the fourth stage ST204, and a source terminal connected to the power supply line which transfers the second DC voltage Vdc2.

The seventh switching device Tr7 of the 2n-th stage discharges the second disabling node QB2 of the 2n-th stage and the second disabling node QB2 of the (2n−1)-th stage with the second DC voltage Vdc2 in response to the first DC voltage Vdc1 charged at the enabling node Q of the 2n-th stage. The seventh switching device Tr7 of the 2n-th stage controls the state of the second disabling node QB2 of the 2n-th stage and the state of the second disabling node QB2 of the (2n−1)-th stage together. For example, the seventh switching device Tr7 of the fourth stage ST204 in FIG. 6 discharges the second disabling node QB2 of the fourth stage ST204 and the second disabling node QB2 of the third stage ST203 with the second DC voltage Vdc2 in response to the first DC voltage Vdc1 charged at the enabling node Q of the fourth stage ST204. The seventh switching device Tr7 of the fourth stage ST204 has a gate terminal connected to the enabling node Q of the fourth stage ST204, a drain terminal connected to the second disabling node QB2 of the fourth stage ST204, and a source terminal connected to the power supply line which transfers the second DC voltage Vdc2.

The first and seventh switching devices Tr1 and Tr7 of each of the first and second stages ST201 and ST202 are operated in response to the start pulse Vst from the timing controller. Moreover, the pull-up switching device Tru, the first pull-down switching device Trd1 and the second pull-down switching device Trd2 are substantially similar to those described above in reference to FIG. 4, and a description thereof will thus be omitted.

Figure 7:
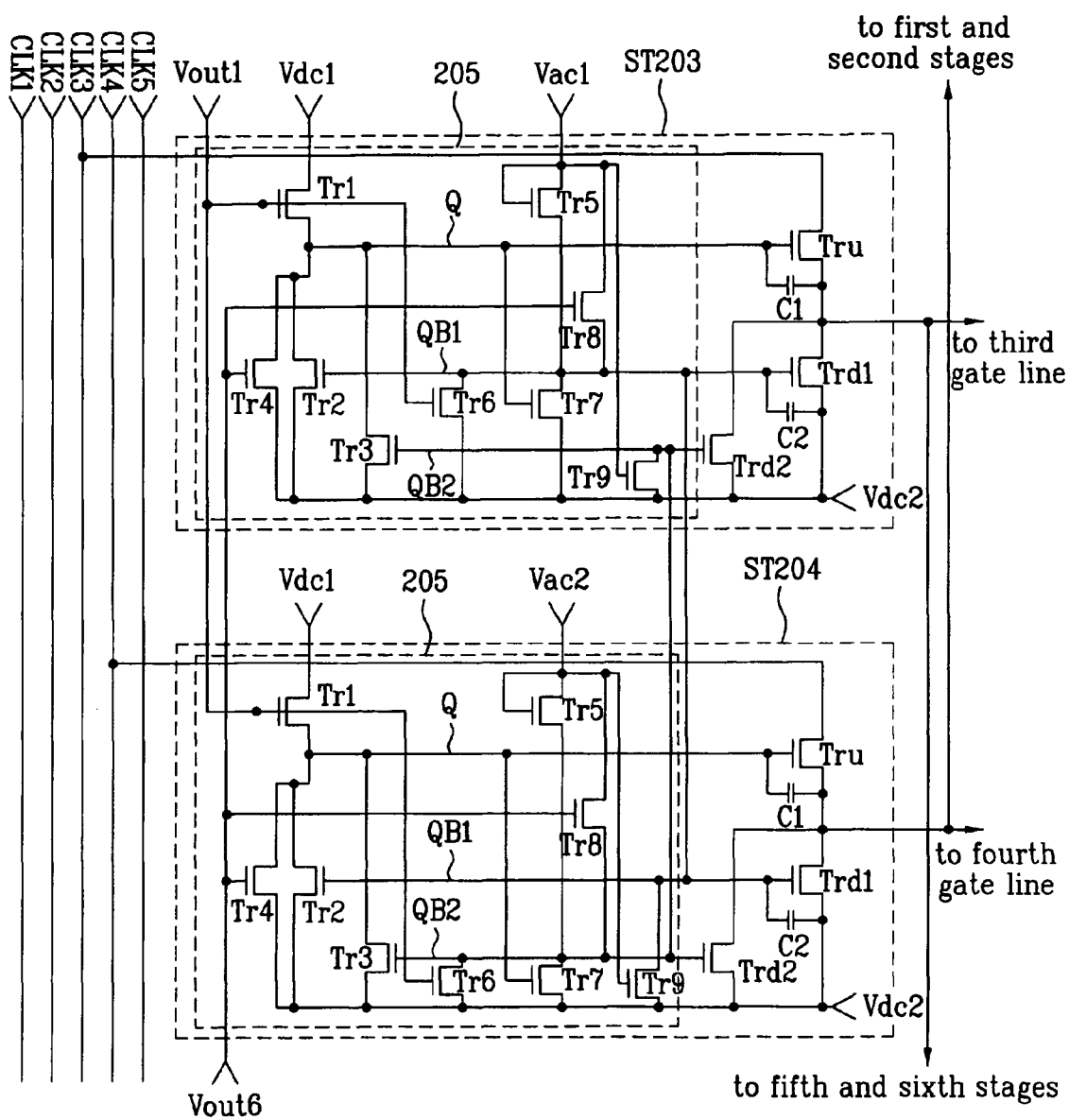
FIG. 7 is a schematic view of a fourth exemplary circuit configuration of node controllers for the third and fourth stages in FIG. 2 in accordance with another embodiment of the present invention.

FIG. 7 is a schematic view of a fourth exemplary circuit configuration of node controllers for the third and fourth stages in FIG. 2 in accordance with another embodiment of the present invention. Referring to FIG. 7, each of the third and fourth stages ST203 and ST204 further includes eighth and ninth switching devices Tr8 and Tr9, in addition to the first to seventh switching devices Tr1 to Tr7 described above in referenced to FIG. 6. The eighth switching device Tr8 of the (2n−1)-th stage charges or discharges the first disabling node QB1 of the (2n−1)-th stage and the first disabling node QB1 of the 2n-th stage with the first AC voltage Vac1 in response to the scan pulse from the (2n+2)-th stage. The eighth switching device Tr8 of the (2n−1)-th stage controls the state of the first disabling node QB1 of the (2n−1)-th stage and the state of the first disabling node QB1 of the 2n-th stage together. For example, the eighth switching device Tr8 of the third stage ST203 in FIG. 7 charges or discharges the first disabling node QB1 of the third stage ST203 and the first disabling node QB1 of the fourth stage ST204 with the first AC voltage Vac1 in response to the sixth scan pulse Vout6 from the sixth stage ST206. The eighth switching device Tr8 of the third stage ST203 has a gate terminal connected to the sixth stage ST206, a drain terminal connected to the power supply line which transfers the first AC voltage Vac1, and a source terminal connected to the first disabling node QB1 of the third stage ST203.

The ninth switching device Tr9 of the (2n−1)-th stage is turned on or off in response to the first AC voltage Vac1, and discharges the second disabling node QB2 of the (2n−1)-th stage with the second DC voltage Vdc2 when being turned on. For example, the ninth switching device Tr9 of the third stage ST203 in FIG. 7 is turned on or off in response to the first AC voltage Vac1, and discharges the second disabling node QB2 of the third stage ST203 with the second DC voltage Vdc2 when being turned on. For example, the ninth switching device Tr9 of the third stage ST203 has a gate terminal connected to the power supply line which transfers the first AC voltage Vac1, a drain terminal connected to the second disabling node QB2 of the third stage ST203, and a source terminal connected to the power supply line which transfers the second DC voltage Vdc2. The ninth switching device Tr9 of the third stage ST203 in FIG. 7 operates in a substantially similar manner as described above in reference to the eleventh switching device Tr11 of the third stage ST203 in FIG. 5.

Still referring to FIG. 7, the eighth switching device Tr8 of the 2n-th stage charges or discharges the second disabling node QB2 of the 2n-th stage and the second disabling node QB2 of the (2n−1)-th stage with the second AC voltage Vac2 in response to the scan pulse from the (2n+2)-th stage. The eighth switching device Tr8 of the 2n-th stage controls the state of the second disabling node QB2 of the 2n-th stage and the state of the second disabling node QB2 of the (2n−1)-th stage together. For example, the eighth switching device Tr8 of the fourth stage ST204 in FIG. 7 charges or discharges the second disabling node QB2 of the fourth stage ST204 and the second disabling node QB2 of the third stage ST203 with the second AC voltage Vac2 in response to the sixth scan pulse Vout6 from the sixth stage ST206. The eighth switching device Tr8 of the fourth stage ST204 has a gate terminal connected to the sixth stage ST206, a drain terminal connected to the power supply line which transfers the second AC voltage Vac2, and a source terminal connected to the second disabling node QB2 of the fourth stage ST204.

The ninth switching device Tr9 of the 2n-th stage is turned on or off in response to the second AC voltage Vac2, and discharges the first disabling node QB1 of the 2n-th stage with the second DC voltage Vdc2 when being turned on. For example, the ninth switching device Tr9 of the fourth stage ST204 in FIG. 7 is turned on or off in response to the second AC voltage Vac2, and discharges the first disabling node QB1 of the fourth stage ST204 with the second DC voltage Vdc2 when being turned on. The ninth switching device Tr9 of the fourth stage ST204 has a gate terminal connected to the power supply line which transfers the second AC voltage Vac2, a drain terminal connected to the first disabling node QB1 of the fourth stage ST204, and a source terminal connected to the power supply line which transfers the second DC voltage Vdc2.

The ninth switching device Tr9 of the fourth stage ST204 in FIG. 7 operates in a substantially similar manner as described above in reference to the eleventh switching device Tr11 of the fourth stage ST204 in FIG. 5.

Referring back to FIGS. 3 and 4, an operation of the shift register with the above-described configuration. First, a description will be given of an operation in a first initial pulse width time T0A of a first frame. During the first frame period, the first AC voltage Vac1 is positive and the second AC voltage Vac2 is negative. As shown in FIG. 3, during the first initial pulse width time T0A, only the start pulse Vst outputted from the timing controller is maintained at a high state and the clock pulses CLK1 to CLK5 are maintained at a low state. The start pulse Vst outputted from the timing controller is inputted to the first and second stages ST201 and ST202. The start pulse Vst is supplied to the gate terminals of the first switching device Tr1 and eighth switching device Tr8 of the first stage ST201. The first and eighth switching devices Tr1 and Tr8 are turned on and the first DC voltage Vdc1 is applied to the enabling node Q through the turned-on first switching device Tr1. Hence, the enabling node Q is charged to turn on the pull-up switching device Tru, the sixth switching device Tr6 and the ninth switching device Tr9, the gate terminals of which are connected to the charged enabling node Q.

Then, the second DC voltage Vdc2 is supplied to the first disabling node QB1 through the turned-on eighth and ninth switching devices Tr8 and Tr9. Hence, the first disabling node QB1 is discharged by the second DC voltage Vdc2. Thus, the second switching device Tr2 and the first pull-down switching device Trd1, the gate terminals of which are connected to the first disabling node QB1, are turned off.

Because the first AC voltage Vac1 remains positive during the first frame period, the fifth switching device Tr5 of the first stage ST201, which is supplied with the first AC voltage Vac1, remains ON during the first frame period. The first AC voltage Vac1 is supplied to the common node N of the first stage ST201 through the turned-on fifth switching device Tr5. The second DC voltage Vdc2, outputted through the turned-on sixth switching device Tr6, is also supplied to the common node N of the first stage ST201. For example, the positive, first AC voltage Vac1 and the negative, second DC voltage Vdc2 are simultaneously supplied to the common node N of the first stage ST201.

The sixth switching device Tr6 which supplies the second DC voltage Vdc2 has a channel width wider than that of the fifth switching device Tr5 which supplies the first AC voltage Vac1. In this regard, the common node N of the first stage ST201 is maintained at the second DC voltage Vdc2. Accordingly, the common node N is discharged, thus turning off the seventh switching device Tr7 of the first stage ST201 whose gate terminal is connected to the discharged common node N. Accordingly, the first stage ST201 charges the enabling node Q thereof and discharges the first disabling node QB1 thereof, in response to the start pulse Vst. Hence, the first stage ST201 is disabled.

Similarly, during this first initial pulse width time T0A, the second stage ST202 is also enabled in response to the start pulse Vst supplied thereto. The start pulse Vst is supplied to the gate terminals of the first switching device Tr1 and eighth switching device Tr8 of the second stage ST202. Hence, the first and eighth switching devices Tr1 and Tr8 are turned on and the first DC voltage Vdc1 is applied to the enabling node Q of the second stage ST202 through the turned-on first switching device Tr1. Accordingly, the enabling node Q is charged to turn on the pull-up switching device Tru, the sixth switching device Tr6 and the ninth switching device Tr9, the gate terminals of which are connected to the charged enabling node Q.

Then, the second DC voltage Vdc2 is supplied to the second disabling node QB2 of the second stage ST202 through the turned-on eighth and ninth switching devices Tr8 and Tr9. Hence, the second disabling node QB2 is discharged by the second DC voltage Vdc2. Thus, the third switching device Tr3 and the second pull-down switching device Trd2, the gate terminals of which are connected to the second disabling node QB2, are turned off.

On the other hand, because the second AC voltage Vac2 remains negative for the first frame period, the fifth switching device Tr5 of the second stage ST202, which is supplied with the second AC voltage Vac2, remains OFF for the first frame period.

The second DC voltage Vdc2, outputted through the turned-on sixth switching device Tr6, is supplied to the common node N of the second stage ST202. Accordingly, the common node N of the second stage ST202 is discharged by the second DC voltage Vdc2. Hence, the seventh switching device Tr7 of the second stage ST202, the gate terminal of which is connected to the discharged common node N, is turned off. Hence, during the first initial pulse width time T0A, the second stage ST202 charges the enabling node Q thereof and discharges the second disabling node QB2 thereof, in response to the start pulse Vst.

Because the first disabling node QB1 of the first stage ST201 and the first disabling node QB1 of the second stage ST202 are electrically connected to each other and the second disabling node QB2 of the first stage ST201 and the second disabling node QB2 of the second stage ST202 are electrically connected to each other, the second disabling node QB2 of the first stage ST201 gets into the same state as that of the second disabling node QB2 of the second stage ST202 and the first disabling node QB1 of the second stage ST202 gets into the same state as that of the first disabling node QB1 of the first stage ST201.

The second DC voltage Vdc2 supplied to the second disabling node QB2 of the second stage ST202 drives the second disabling node QB2 of the first stage ST201 into a discharged state. Also, the second DC voltage Vdc2 supplied to the first disabling node QB1 of the first stage ST201 drives the first disabling node QB1 of the second stage ST202 into a discharged state.

In other words, during the first initial pulse width time T0A, the first stage ST201 charges the enabling node Q thereof and discharges the first disabling node QB1 thereof and the first disabling node QB1 of the second stage ST202. Also, during the first initial pulse width time T0A, the second stage ST202 charges the enabling node Q thereof and discharges the second disabling node QB2 thereof and the second disabling node QB2 of the first stage ST201.

During the second initial pulse width time T0B, the start pulse Vst and all the clock pulses CLK1 to CLK5 are maintained at the low state. Thus, during the second initial pulse width time T0B, the first and second stages ST201 and ST202 remain enabled. Because the start pulse Vst makes a high to low state transition during the second initial pulse width time T0B, the first and eighth switching devices Tr1 and Tr8 of each of the first and second stages ST201 and ST202 are turned off, thereby causing the enabling node Q of each of the first and second stages ST201 and ST202 to float. Hence, the first DC voltage Vdc1 supplied to the enabling node Q of each of the first and second stages ST201 and ST202 during the first initial pulse width time T0A is maintained at the enabling node Q as it is.

During the first pulse width time T1, only the first clock pulse CLK1 changes into the high state and the remaining clock pulses are maintained at the low state.

Here, the enabling node Q of the first stage ST201 is kept charged by the first DC voltage Vdc1, applied thereto during the first initial pulse width time T0A, so that the pull-up switching device Tru of the first stage ST201 remains turned on. As the first clock pulse CLK1 is applied to the drain terminal of the turned-on pull-up switching device Tru, the first DC voltage Vdc1 charged at the enabling node Q of the first stage ST201 is amplified by bootstrapping.

Hence, the first clock pulse CLK1 applied to the drain terminal of the pull-up switching device Tru of the first stage ST201 is stably outputted through the source terminal of the pull-up switching device Tru. The outputted first clock pulse CLK1 is applied to the first gate line to function as the first scan pulse Vout1 to drive the first gate line.

During the first pulse width time T1, the first scan pulse Vout1 outputted from the first stage ST201 is also inputted to the third and fourth stages ST203 and ST204. For example, as shown in FIG. 4, the first scan pulse Vout1 is inputted to the gate terminals of the first and eighth switching devices Tr1 and Tr8 of the third stage ST203 and the gate terminals of the first and eighth switching devices Tr1 and Tr8 of the fourth stage ST204.

Accordingly, during the first pulse width time T1, the third and fourth stages ST203 and ST204 are enabled simultaneously. The third stage ST203 is operated in the same manner as the first stage ST201 in the above-stated first initial pulse width time T0A, and the fourth stage ST204 is operated in the same manner as the second stage ST202 in the above-stated first initial pulse width time T0A. The third stage ST203 charges the enabling node Q thereof and discharges the first disabling node QB1 thereof and the first disabling node QB1 of the fourth stage ST204. Also, the fourth stage ST204 charges the enabling node Q thereof and discharges the second disabling node QB2 thereof and the second disabling node QB2 of the third stage ST203.

During the second pulse width time T2, only the second clock pulse CLK2 is maintained at the high state and the remaining clock pulses are maintained at the low state, as shown in FIG. 3. This second clock pulse CLK2 is supplied to the enabled second stage ST202. For example, the second clock pulse CLK2 is supplied to the drain terminal of the pull-up switching device Tru of the second stage ST202. Hence, the pull-up switching device Tru of the second stage ST202 outputs the second clock pulse CLK2 as the second scan pulse Vout2. Then, the pull-up switching device Tru of the second stage ST202 supplies the second scan pulse Vout2 to the second gate line to drive the second gate line.

During the third pulse width time T3, only the third clock pulse CLK3 is maintained at the high state and the remaining clock pulses are maintained at the low state, as shown in FIG. 3. This third clock pulse CLK3 is supplied to the enabled third stage ST203. For example, the third clock pulse CLK3 is supplied to the drain terminal of the pull-up switching device Tru of the third stage ST203. Hence, the pull-up switching device Tru of the third stage ST203 outputs the third clock pulse CLK3 as the third scan pulse Vout3. Then, the pull-up switching device Tru of the third stage ST203 supplies the third scan pulse Vout3 to the third gate line, fifth stage ST205 and sixth stage ST206. The third scan pulse Vout3 drives the third gate line and enables the fifth and sixth stages ST205 and ST206 simultaneously.

During the fourth pulse width time T4, only the fourth clock pulse CLK4 is maintained at the high state and the remaining clock pulses are maintained at the low state, as shown in FIG. 3. This fourth clock pulse CLK4 is supplied to the enabled fourth stage ST204. For example, the fourth clock pulse CLK4 is supplied to the drain terminal of the pull-up switching device Tru of the fourth stage ST204. Hence, the pull-up switching device Tru of the fourth stage ST204 outputs the fourth clock pulse CLK4 as the fourth scan pulse Vout4. Then, the pull-up switching device Tru of the fourth stage ST204 supplies the fourth scan pulse Vout4 to the fourth gate line, first stage ST201 and second stage ST202. The fourth scan pulse Vout4 drives the fourth gate line and disables the first and second stages ST201 and ST202 simultaneously. This disabling operation will hereinafter be described in more detail.

During the fourth pulse width time T4, the fourth scan pulse Vout4 outputted from the fourth stage ST204 is supplied to the first stage ST201. For example, the fourth scan pulse Vout4 is supplied to the gate terminal of the fourth switching device Tr4 of the first stage ST201. Hence, the fourth switching device Tr4 is turned on and the second DC voltage Vdc2 is supplied to the enabling node Q of the first stage ST201 through the turned-on fourth switching device Tr4.

Accordingly, the enabling node Q is discharged to turn off the pull-up switching device Tru, the sixth switching device Tr6 and the ninth switching device Tr9 of the first stage ST201, the gate terminals of which are connected to the discharged enabling node Q. As the sixth switching device Tr6 is turned off, the first AC voltage Vac1 outputted through the fifth switching device Tr5 is supplied to the common node N of the first stage ST201. Hence, the common node N of the first stage ST201 is charged and the seventh switching device Tr7 of the first stage ST201, the gate terminal of which is connected to the charged common node N, is turned on.

Then, the first AC voltage Vac1 is supplied to the first disabling node QB1 of the first stage ST201 through the turned-on seventh switching device Tr7. Thus, the first disabling node QB1 of the first stage ST201 is charged and the first pull-down switching device Trd1 and second switching device Tr2 of the first stage ST201, the gate terminals of which are connected to the charged first disabling node QB1, are turned on. The second switching device Tr2 supplies the second DC voltage Vdc2 to the enabling node Q of the first stage ST201 to accelerate the discharging of the enabling node Q.

Hence, during the fourth pulse width time T4, the pull-up switching device Tru of the first stage ST201 is turned off and the first pull-down switching device Trd1 of the first stage ST201 is turned on, so that the first stage ST201 outputs the second DC voltage Vdc2 through the turned-on first pull-down switching device Trd1. This second DC voltage Vdc2 is supplied to the first gate line to function as the OFF voltage to make the first gate line inactive. Thus, the first stage ST201 discharges the enabling node Q thereof and charges the first disabling node QB1 thereof, in response to the fourth scan pulse Vout4. The first stage ST201 is disabled. The second disabling node QB2 of the first stage ST201 remains in its discharged state of the first initial pulse width time T0A.

Similarly, in this fourth pulse width time T4, the second stage ST202 is also disabled in response to the fourth scan pulse Vout4 supplied thereto, which will hereinafter be described in more detail. During the fourth pulse width time T4, the fourth scan pulse Vout4 outputted from the fourth stage ST204 is supplied to the second stage ST202. For example, the fourth scan pulse Vout4 is supplied to the gate terminal of the fourth switching device Tr4 of the second stage ST202. Hence, the fourth switching device Tr4 is turned on and the second DC voltage Vdc2 is supplied to the enabling node Q of the second stage ST202 through the turned-on fourth switching device Tr4. Accordingly, the enabling node Q is discharged tio turn off the pull-up switching device Tru, the sixth switching device Tr6 and the ninth switching device Tr9 of the second stage ST202, the gate terminals of which are connected to the discharged enabling node Q.

The fifth switching device Tr5 of the second stage ST202, supplied with the second AC voltage Vac2, remains OFF. Meanwhile, because the state of the first disabling node QB1 of the second stage ST202 is controlled by the node controller 205 of the first stage ST201, it is substantially similar to that of the first disabling node QB1 of the first stage ST201. Because the first disabling node QB1 of the first stage ST201 is charged during the fourth pulse width time T4 as stated above, the first disabling node QB1 of the second stage ST202 is charged, too. Also, because the state of the second disabling node QB2 of the first stage ST201 is controlled by the node controller 205 of the second stage ST202, it is substantially similar to that of the second disabling node QB2 of the second stage ST202.

Because the second disabling node QB2 of the second stage ST202 is still kept discharged during the fourth pulse width time T4, the second disabling node QB2 of the first stage ST201 is kept discharged during the fourth pulse width time T4, too. Hence, during the fourth pulse width time T4, the enabling node Q of each of the first and second stages ST201 and ST202 exhibits its discharged state, the first disabling node QB1 of each of the first and second stages ST201 and ST202 exhibits its charged state, and the second disabling node QB2 of each of the first and second stages ST201 and ST202 exhibits its discharged state. Accordingly, during the fourth pulse width time T4, the pull-up switching device Tru of each of the first and second stages ST201 and ST202 is turned off, the first pull-down switching device Trd1 of each of the first and second stages ST201 and ST202 is turned on, and the second pull-down switching device Trd2 of each of the first and second stages ST201 and ST202 is turned off. Hence, during the fourth pulse width time T4, the first stage ST201 supplies the second DC voltage Vdc2 as the OFF voltage to the first gate line, and the second stage ST202 supplies the second DC voltage Vdc2 as the OFF voltage to the second gate line.

Thereafter, in a fifth pulse width time T5, the enabled fifth stage ST205 outputs the fifth clock pulse CLK5 as the fifth scan pulse Vout5 and supplies the fifth scan pulse Vout5 to the fifth gate line, seventh stage and eighth stage. Thereafter, in a sixth pulse width time T6, the enabled sixth stage ST206 outputs the first clock pulse CLK1 as the sixth scan pulse Vout6 and supplies the sixth scan pulse Vout6 to the sixth gate line, third stage ST203 and fourth stage ST204. Accordingly, the remaining stages are operated.

Thereafter, during the period of a second frame, the first AC voltage Vac1 is negative and the second AC voltage Vac2 is positive. Hence, in a disabled period, the first disabling node QB1 of each of the stages ST201, ST202, ST203, . . . is discharged and the second disabling node QB2 thereof is charged. Thus, in the second frame period, the first pull-down switching device Trd1 of each of the stages ST201, ST202, ST203, . . . is turned off and the second pull-down switching device Trd2 thereof is turned on.

Another operation of the shift register will hereinafter be described. This description will be made with reference to FIGS. 3 and 6. First, a description will be given of an operation in a first initial pulse width time T0A of a first frame. In the first frame period, the first AC voltage Vac1 is positive and the second AC voltage Vac2 is negative. During the first initial pulse width time T0A, only the start pulse Vst outputted from the timing controller is maintained at a high state and the clock pulses CLK1 to CLK5 are maintained at a low state.

The start pulse Vst outputted from the timing controller is inputted to the first and second stages ST201 and ST202. The start pulse Vst is supplied to the gate terminals of the first switching device Tr1 and sixth switching device Tr6 of the first stage ST201.

Hence, the first and sixth switching devices Tr1 and Tr6 are turned on and the first DC voltage Vdc1 is applied to the enabling node Q through the turned-on first switching device Tr1. Accordingly, the enabling node Q is charged, thereby causing the pull-up switching device Tru and seventh switching device Tr7 with their gate terminals connected to the charged enabling node Q to be turned on.

Then, the second DC voltage Vdc2 is supplied to the first disabling node QB1 through the turned-on sixth and seventh switching devices Tr6 and Tr7. Hence, the first disabling node QB1 is discharged by the second DC voltage Vdc2, and the second switching device Tr2 and first pull-down switching device Trd1 with their gate terminals connected to the first disabling node QB1 are thus turned off. The turned-on second switching device Tr2 supplies the second DC voltage Vdc2 to the enabling node Q to accelerate the discharging of the enabling node Q.

Meanwhile, because the first AC voltage Vac1 remains positive for the first frame period, the fifth switching device Tr5 of the first stage ST201, which is supplied with the first AC voltage Vac1, is kept turned on for the first frame period. The first AC voltage Vac1 is supplied to the first disabling node QB1 of the first stage ST201 through the turned-on fifth switching device Tr5.

As described above, the second DC voltage Vdc2, outputted through the turned-on sixth and seventh switching devices Tr6 and Tr7, is also supplied to the first disabling node QB1 of the first stage ST201. For example, the positive, first AC voltage Vac1 and the negative, second DC voltage Vdc2 are simultaneously supplied to the first disabling node QB1 of the first stage ST201.

Because the switching devices, namely, Tr6 and Tr7 which supply the second DC voltage Vdc2 are greater in number than the switching device, namely, Tr5 which supplies the first AC voltage Vac1, the first disabling node QB1 of the first stage ST201 is maintained at the second DC voltage Vdc2. Accordingly, the first disabling node QB1 is discharged.

Hence, the first stage ST201 charges the enabling node Q thereof and discharges the first disabling node QB1 thereof, in response to the start pulse Vst. The first stage ST201 is enabled. Similarly, in this first initial pulse width time T0A, the second stage ST202 is also enabled in response to the start pulse Vst supplied thereto, which will hereinafter be described in more detail.

The start pulse Vst is supplied to the gate terminals of the first switching device Tr1 and sixth switching device Tr6 of the second stage ST202. Hence, the first and sixth switching devices Tr1 and Tr6 are turned on and the first DC voltage Vdc1 is applied to the enabling node Q of the second stage ST202 through the turned-on first switching device Tr1. Accordingly, the enabling node Q is charged, thereby causing the pull-up switching device Tru and seventh switching device Tr7 with their gate terminal connected to the charged enabling node Q to be turned on.

Then, the second DC voltage Vdc2 is supplied to the second disabling node QB2 of the second stage ST202 through the turned-on sixth and seventh switching devices Tr6 and Tr7. Hence, the second disabling node QB2 is discharged by the second DC voltage Vdc2, and the third switching device Tr3 and second pull-down switching device Trd2 with their gate terminals connected to the second disabling node QB2 are thus turned off.

On the other hand, because the second AC voltage Vac2 remains negative for the first frame period, the fifth switching device Tr5 of the second stage ST202, which is supplied with the second AC voltage Vac2, remains OFF for the first frame period. Hence, during the first initial pulse width time T0A, the second stage ST202 charges the enabling node Q thereof and discharges the second disabling node QB2 thereof, in response to the start pulse Vst.

Because the first disabling node QB1 of the first stage ST201 and the first disabling node QB1 of the second stage ST202 are electrically connected to each other and the second disabling node QB2 of the first stage ST201 and the second disabling node QB2 of the second stage ST202 are electrically connected to each other, the second disabling node QB2 of the first stage ST201 is driven into the same state as that of the second disabling node QB2 of the second stage ST202 and the first disabling node QB1 of the second stage ST202 is driven into the same state as that of the first disabling node QB1 of the first stage ST201.

The second disabling node QB2 of the first stage ST201 is driven into a discharged state by the second DC voltage Vdc2 supplied to the second disabling node QB2 of the second stage ST202. Also, the first disabling node QB1 of the second stage ST202 is driven into a discharged state by the second DC voltage Vdc2 supplied to the first disabling node QB1 of the first stage ST201. In other words, during the first initial pulse width time T0A, the first stage ST201 charges the enabling node Q thereof and discharges the first disabling node QB1 thereof and the first disabling node QB1 of the second stage ST202. Also, during the first initial pulse width time T0A, the second stage ST202 charges the enabling node Q thereof and discharges the second disabling node QB2 thereof and the second disabling node QB2 of the first stage ST201.

During the second initial pulse width time T0B, the start pulse Vst and all the clock pulses CLK1 to CLK5 are maintained at the low state. Thus, during the second initial pulse width time T0B, the first and second stages ST201 and ST202 remain enabled. Because the start pulse Vst makes a high to low state transition during the second initial pulse width time T0B, the first and sixth switching devices Tr1 and Tr6 of each of the first and second stages ST201 and ST202 are turned off, thereby causing the enabling node Q of each of the first and second stages ST201 and ST202 to float. Hence, the first DC voltage Vdc1 supplied to the enabling node Q of each of the first and second stages ST201 and ST202 during the first initial pulse width time T0A is maintained at the enabling node Q as it is.

During the first pulse width time T1, only the first clock pulse CLK1 is driven into the high state and the remaining clock pulses are maintained at the low state. Here, the enabling node Q of the first stage ST201 is kept charged by the first DC voltage Vdc1, applied thereto during the first initial pulse width time T0A, so that the pull-up switching device Tru of the first stage ST201 remains turned on. As the first clock pulse CLK1 is applied to the drain terminal of the turned-on pull-up switching device Tru, the first DC voltage Vdc1 charged at the enabling node Q of the first stage ST201 is amplified by bootstrapping. Hence, the first clock pulse CLK1 applied to the drain terminal of the pull-up switching device Tru of the first stage ST201 is stably outputted through the source terminal of the pull-up switching device Tru. The outputted first clock pulse CLK1 is applied to the first gate line to function as the first scan pulse Vout1 to drive the first gate line.

During the first pulse width time T1, the first scan pulse Vout1 outputted from the first stage ST201 is also inputted to the third and fourth stages ST203 and ST204. For example, as shown in FIG. 6, the first scan pulse Vout1 is inputted to the gate terminals of the first and sixth switching devices Tr1 and Tr6 of the third stage ST203 and the gate terminals of the first and sixth switching devices Tr1 and Tr6 of the fourth stage ST204. Accordingly, during the first pulse width time T1, the third and fourth stages ST203 and ST204 are enabled simultaneously. The third stage ST203 is operated in the same manner as the first stage ST201 in the above-stated first initial pulse width time T0A, and the fourth stage ST204 is operated in the same manner as the second stage ST202 in the above-stated first initial pulse width time T0A.

The third stage ST203 charges the enabling node Q thereof and discharges the first disabling node QB1 thereof and the first disabling node QB1 of the fourth stage ST204. Also, the fourth stage ST204 charges the enabling node Q thereof and discharges the second disabling node QB2 thereof and the second disabling node QB2 of the third stage ST203.

During the second pulse width time T2, only the second clock pulse CLK2 is maintained at the high state and the remaining clock pulses are maintained at the low state, as shown in FIG. 3. This second clock pulse CLK2 is supplied to the enabled second stage ST202. For example, the second clock pulse CLK2 is supplied to the drain terminal of the pull-up switching device Tru of the second stage ST202. Hence, the pull-up switching device Tru of the second stage ST202 outputs the second clock pulse CLK2 as the second scan pulse Vout2. Then, the pull-up switching device Tru of the second stage ST202 supplies the second scan pulse Vout2 to the second gate line to drive the second gate line.

During the third pulse width time T3, only the third clock pulse CLK3 is maintained at the high state and the remaining clock pulses are maintained at the low state, as shown in FIG. 3. This third clock pulse CLK3 is supplied to the enabled third stage ST203. For example, the third clock pulse CLK3 is supplied to the drain terminal of the pull-up switching device Tru of the third stage ST203. Hence, the pull-up switching device Tru of the third stage ST203 outputs the third clock pulse CLK3 as the third scan pulse Vout3. Then, the pull-up switching device Tru of the third stage ST203 supplies the third scan pulse Vout3 to the third gate line, fifth stage ST205 and sixth stage ST206. The third scan pulse Vout3 drives the third gate line and enables the fifth and sixth stages and ST206 simultaneously.

During the fourth pulse width time T4, only the fourth clock pulse CLK4 is maintained at the high state and the remaining clock pulses are maintained at the low state, as shown in FIG. 3. This fourth clock pulse CLK4 is supplied to the enabled fourth stage ST204. For example, the fourth clock pulse CLK4 is supplied to the drain terminal of the pull-up switching device Tru of the fourth stage ST204. Hence, the pull-up switching device Tru of the fourth stage ST204 outputs the fourth clock pulse CLK4 as the fourth scan pulse Vout4. Then, the pull-up switching device Tru of the fourth stage ST204 supplies the fourth scan pulse Vout4 to the fourth gate line, first stage ST201 and second stage ST202. The fourth scan pulse Vout4 drives the fourth gate line and disables the first and second stages ST201 and ST202 simultaneously. This disabling operation will hereinafter be described in more detail.

During the fourth pulse width time T4, the fourth scan pulse Vout4 outputted from the fourth stage ST204 is supplied to the first stage ST201. For example, the fourth scan pulse Vout4 is supplied to the gate terminal of the fourth switching device Tr4 of the first stage ST201. Hence, the fourth switching device Tr4 is turned on and the second DC voltage Vdc2 is supplied to the enabling node Q of the first stage ST201 through the turned-on fourth switching device Tr4. Accordingly, the enabling node Q is discharged and both the pull-up switching device Tru and seventh switching device Tr7 of the first stage ST201, the gate terminals of which are connected to the discharged enabling node Q, are turned off.

Meanwhile, because the fifth switching device Tr5 of the first stage ST201 is kept turned on for one frame period by the first AC voltage Vac1, the first AC voltage Vac1 is supplied to the first disabling node QB1 of the first stage ST201 through the turned-on fifth switching device Tr5. Thus, the first disabling node QB1 of the first stage ST201 is charged and the first pull-down switching device Trd1 and second switching device Tr2 of the first stage ST201, the gate terminals of which are connected to the charged first disabling node QB1, are turned on. The second switching device Tr2 supplies the second DC voltage Vdc2 to the enabling node Q of the first stage ST201 to accelerate the discharging of the enabling node Q.

Hence, during the fourth pulse width time T4, the pull-up switching device Tru of the first stage ST201 is turned off and the first pull-down switching device Trd1 of the first stage ST201 is turned on, so that the first stage ST201 outputs the second DC voltage Vdc2 through the turned-on first pull-down switching device Trd1. This second DC voltage Vdc2 is supplied to the first gate line to function as the OFF voltage to make the first gate line inactive.

In other words, the first stage ST201 discharges the enabling node Q thereof and charges the first disabling node QB1 thereof, in response to the fourth scan pulse Vout4. The first stage ST201 is disabled. The second disabling node QB2 of the first stage ST201 remains in its discharged state of the first initial pulse width time T0A.

Similarly, in this fourth pulse width time T4, the second stage ST202 is also disabled in response to the fourth scan pulse Vout4 supplied thereto, which will hereinafter be described in more detail.

During the fourth pulse width time T4, the fourth scan pulse Vout4 outputted from the fourth stage ST204 is supplied to the second stage ST202. For example, the fourth scan pulse Vout4 is supplied to the gate terminal of the fourth switching device Tr4 of the second stage ST202. Hence, the fourth switching device Tr4 is turned on and the second DC voltage Vdc2 is supplied to the enabling node Q of the second stage ST202 through the turned-on fourth switching device Tr4.

Accordingly, the enabling node Q is discharged and both the pull-up switching device Tru and seventh switching device Tr7 of the second stage ST202, the gate terminals of which are connected to the discharged enabling node Q, are turned off. The fifth switching device Tr5 of the second stage ST202, supplied with the second AC voltage Vac2, remains turned off.

Meanwhile, because the state of the first disabling node QB1 of the second stage ST202 is controlled by the node controller 205 of the first stage ST201, it is substantially similar to that of the first disabling node QB1 of the first stage ST201. Thus, because the first disabling node QB1 of the first stage ST201 is charged during the fourth pulse width time T4 as stated above, the first disabling node QB1 of the second stage ST202 is charged, too. Also, because the state of the second disabling node QB2 of the first stage ST201 is controlled by the node controller 205 of the second stage ST202, it is substantially similar to that of the second disabling node QB2 of the second stage ST202.

Thus, because the second disabling node QB2 of the second stage ST202 is still kept discharged during the fourth pulse width time T4, the second disabling node QB2 of the first stage ST201 is kept discharged during the fourth pulse width time T4, too.

Hence, during the fourth pulse width time T4, the enabling node Q of each of the first and second stages ST201 and ST202 exhibits its discharged state, the first disabling node QB1 of each of the first and second stages ST201 and ST202 exhibits its charged state, and the second disabling node QB2 of each of the first and second stages ST201 and ST202 exhibits its discharged state.

Accordingly, during the fourth pulse width time T4, the pull-up switching device Tru of each of the first and second stages ST201 and ST202 is turned off, the first pull-down switching device Trd1 of each of the first and second stages ST201 and ST202 is turned on, and the second pull-down switching device Trd2 of each of the first and second stages ST201 and ST202 is turned off. Hence, during the fourth pulse width time T4, the first stage ST201 supplies the second DC voltage Vdc2 as the OFF voltage to the first gate line, and the second stage ST202 supplies the second DC voltage Vdc2 as the OFF voltage to the second gate line.

Thereafter, in a fifth pulse width time T5, the enabled fifth stage ST205 outputs the fifth clock pulse CLK5 as the fifth scan pulse Vout5 and supplies the fifth scan pulse Vout5 to the fifth gate line, seventh stage and eighth stage. Thereafter, in a sixth pulse width time T6, the enabled sixth stage ST206 outputs the first clock pulse CLK1 as the sixth scan pulse Vout6 and supplies the sixth scan pulse Vout6 to the sixth gate line, third stage ST203 and fourth stage ST204. Hence, the remaining stages are driven accordingly.

Thereafter, during the period of a second frame, the first AC voltage Vac1 is negative and the second AC voltage Vac2 is positive. Hence, in a disabled period, the first disabling node QB1 of each of the stages ST201, ST202, ST203, . . . is discharged and the second disabling node QB2 thereof is charged. Thus, in the second frame period, the first pull-down switching device Trd1 of each of the stages ST201, ST202, ST203, . . . is turned off and the second pull-down switching device Trd2 thereof is turned on.

Figure 8:
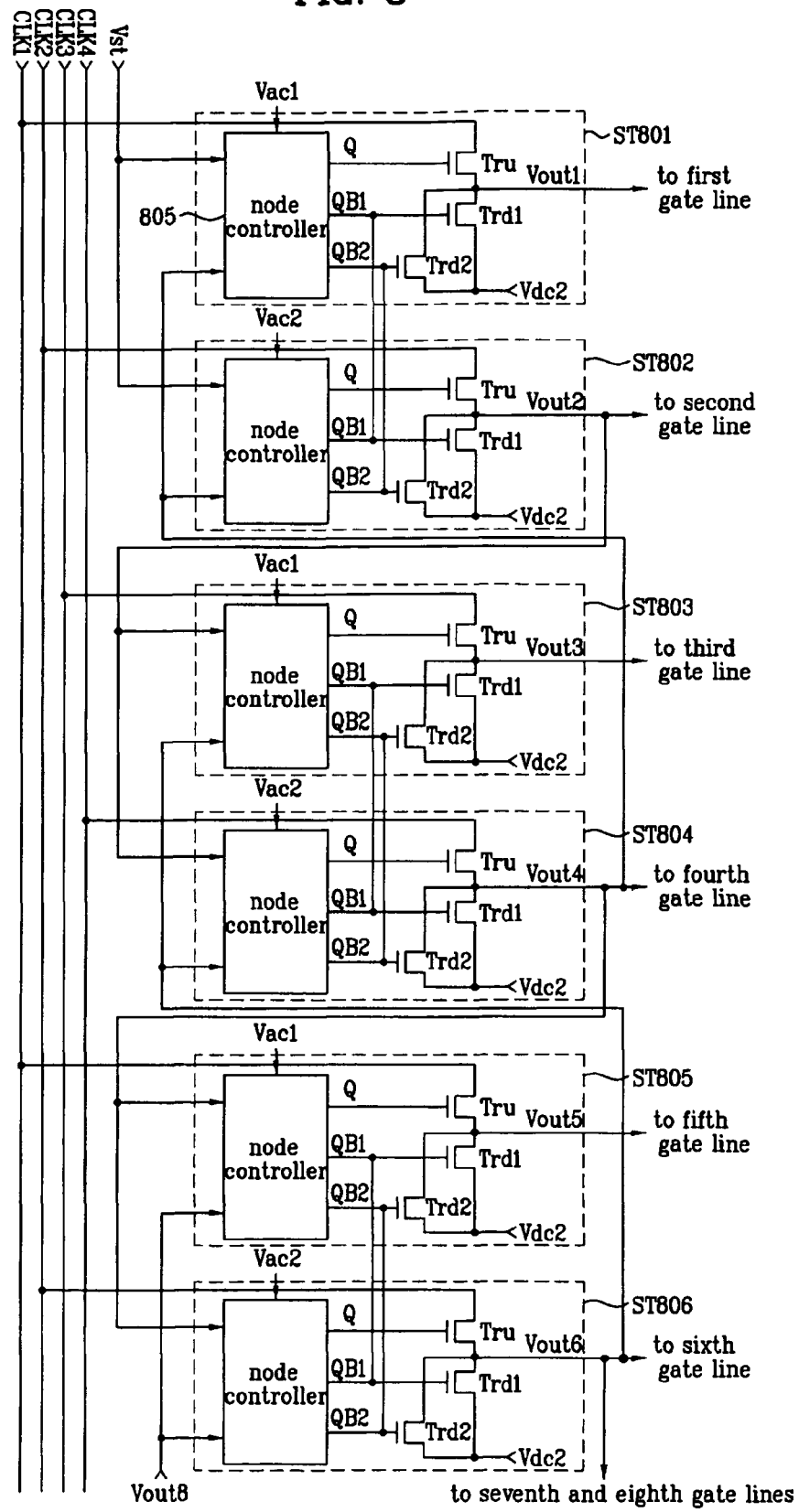
FIG. 8 is a schematic view of a second exemplary shift register according to another embodiment of the present invention.
Figure 9:
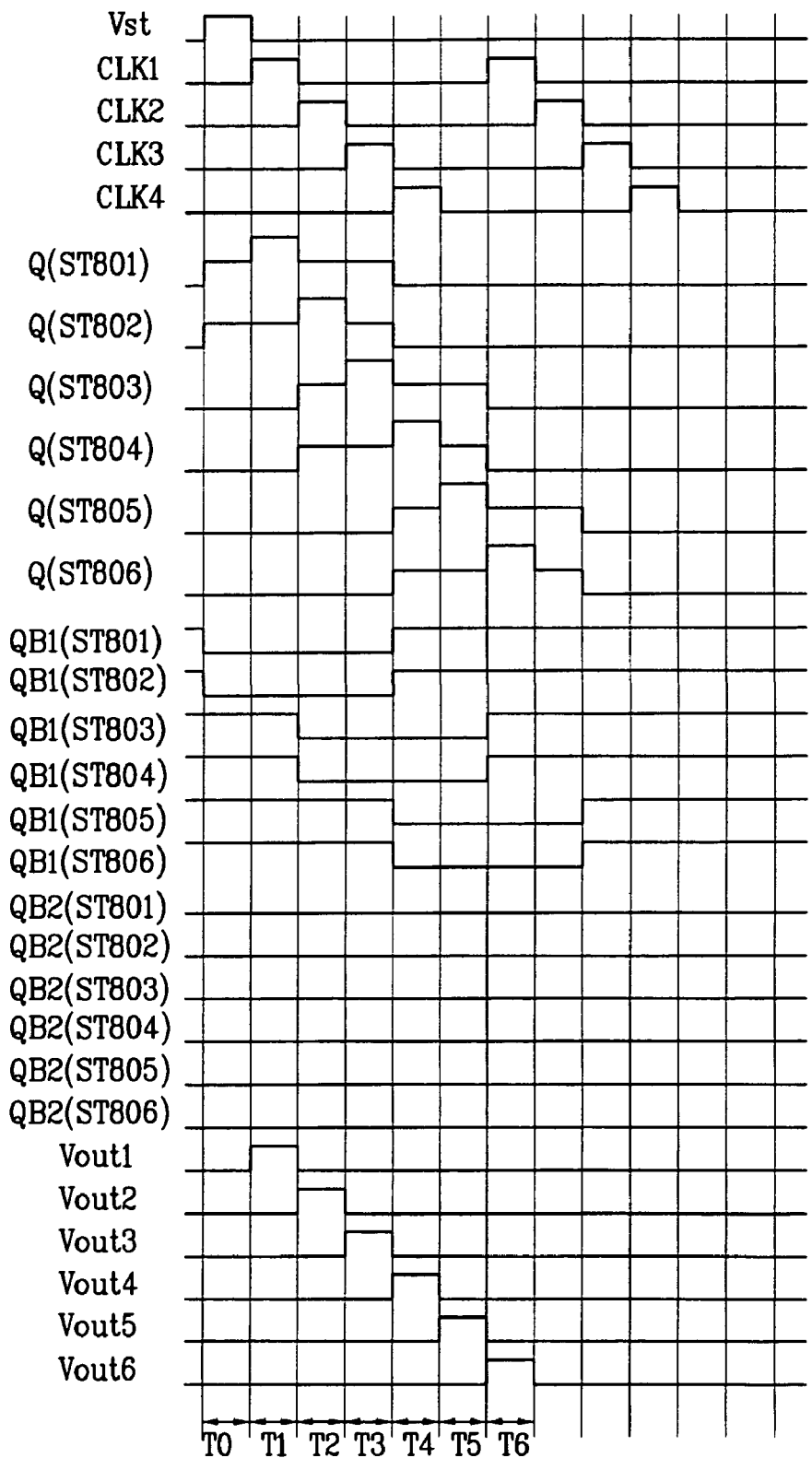
FIG. 9 shows an exemplary timing diagram of input signals into and output signals from respective stages of the shift register of FIG. 8.

FIG. 8 is a schematic view of a second exemplary shift register according to another embodiment of the present invention. FIG. 9 shows an exemplary timing diagram of input signals into and output signals from respective stages of the shift register of FIG. 8. Referring to FIG. 8, the shift register has a plurality of stages ST801, ST802, ST803, . . . , as shown in FIG. 8. Here, the configuration of each of the stages ST801, ST802, ST803, . . . is substantially similar to the description given above with reference to the first exemplary shift register, with the exception that the stages ST801, ST802, ST803, . . . are connected with one another in a different manner than that described above. Therefore, a description will hereinafter be given of only the connections among the ST801, ST802, ST803, . . . . In addition, the shift register is supplied with first to fourth clock pulses CLK1 to CLK4, although it may be of course supplied with five or more clock pulses.

The (2n−1)-th stage and the 2n-th stage are simultaneously enabled in response to the (2n−2)-th scan pulse from the (2n−2)-th stage and simultaneously disabled in response to the (2n+2)-th scan pulse from the (2n+2)-th stage. The enabled 2n-th stage outputs the 2n-th scan pulse and supplies it to the (2n+1)-th and (2n+2)-th stages, so as to enable the (2n+1)-th and (2n+2)-th stages simultaneously. The 2n-th stage also supplies the 2n-th scan pulse to the (2n−3)-th and (2n−2)-th stages, so as to disable the (2n−3)-th and (2n−2)-th stages simultaneously.

For example, the third stage ST803 and fourth stage ST804 in FIG. 8 are simultaneously enabled in response to the second scan pulse Vout2 from the second stage ST802 and simultaneously disabled in response to the sixth scan pulse Vout6 from the sixth stage ST806. The enabled fourth stage ST804 outputs the fourth scan pulse Vout4 and supplies it to the fifth and sixth stages ST805 and ST806, thus enabling the fifth and sixth stages ST805 and ST806 simultaneously. The fourth stage ST804 also supplies the fourth scan pulse Vout4 to the first and second stages ST801 and ST802, thus disabling the first and second stages ST801 and ST802 simultaneously. On the other hand, the first and second stages ST801 and ST802 are enabled in response to the start pulse Vst from the timing controller.

Figure 10:
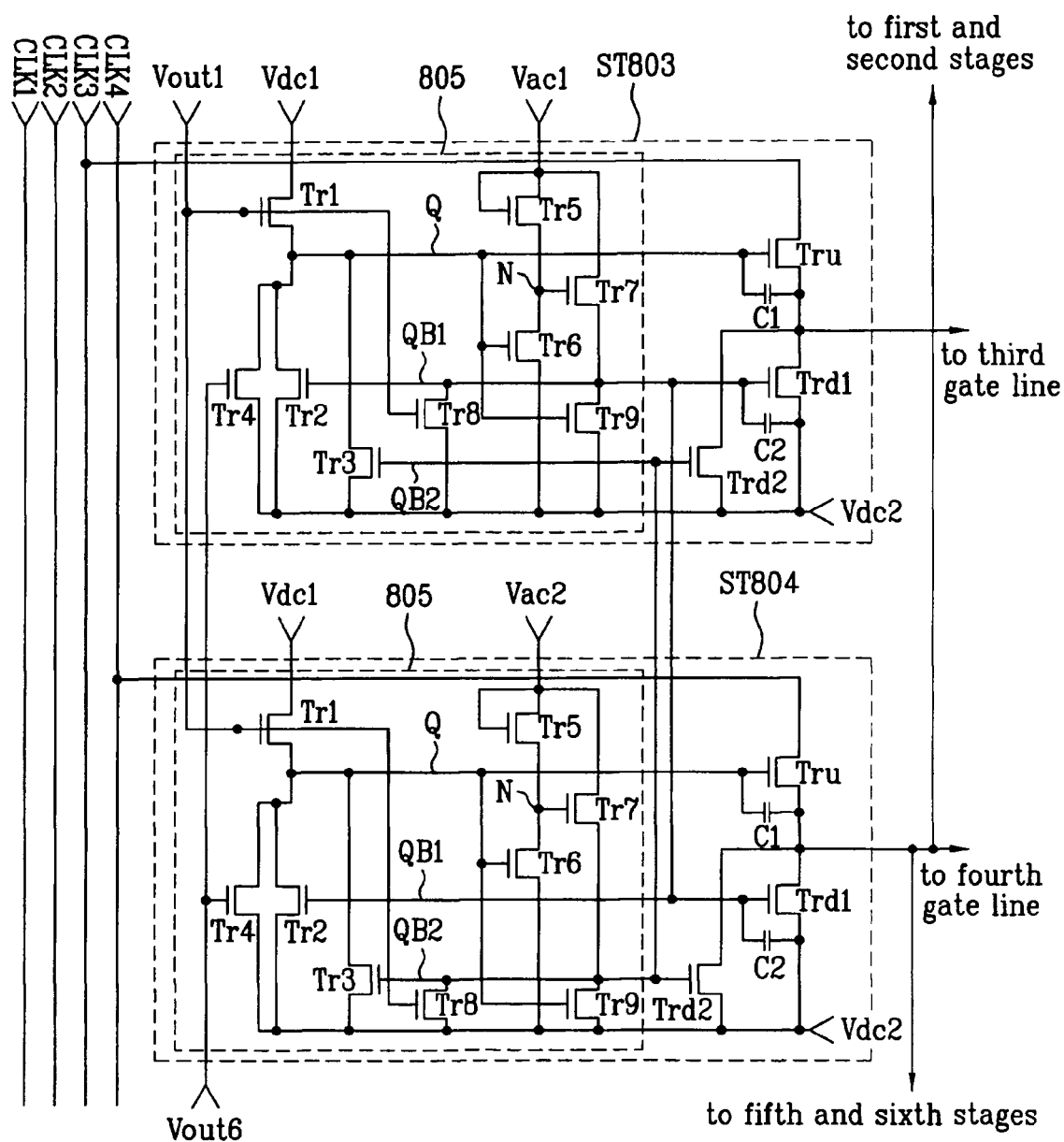
FIG. 10 is a schematic view of a first exemplary circuit configuration of node controllers for the third and fourth stages in FIG. 8 in accordance with an embodiment of the present invention.

FIG. 10 is a schematic view of a first exemplary circuit configuration of node controllers for the third and fourth stages in FIG. 8 in accordance with an embodiment of the present invention. Referring to FIG. 10, first to ninth switching devices Tr1 to Tr9, a pull-up switching device Tru, a first pull-down switching device Trd1 and a second pull-down switching device Trd2 shown in FIG. 10 are substantially similar to those shown in FIG. 4. For example, the first and eighth switching devices Tr1 and Tr8 of the (2n−1)-th stage and the first and eighth switching devices Tr1 and Tr8 of the 2n-th stage are operated in response to the scan pulse from the (2n−2)-th stage.

For example, the first and eighth switching devices Tr1 and Tr8 of the third stage ST803 in FIG. 10 and the first and eighth switching devices Tr1 and Tr8 of the fourth stage ST804 in FIG. 10 are operated in response to the second scan pulse Vout2 from the second stage ST802.

Also, the scan pulse outputted from the pull-up switching device Tru of the (2n−1)-th stage and the OFF voltage outputted from each of the first and second pull-down switching devices Trd1 and Trd2 of the (2n−1)-th stage are supplied to only the (2n−1)-th gate line. For example, the third scan pulse Vout3 outputted from the pull-up switching device Tru of the third stage ST803 and the OFF voltage outputted from each of the first and second pull-down switching devices Trd1 and Trd2 of the third stage ST803 are supplied to only the third gate line.

Also, the scan pulse outputted from the pull-up switching device Tru of the 2n-th stage and the OFF voltage outputted from each of the first and second pull-down switching devices Trd1 and Trd2 of the 2n-th stage are supplied to the 2n-th gate line, (2n+1)-th stage, (2n+2)-th stage, (2n−3)-th stage and (2n−2)-th stage. For example, the fourth scan pulse Vout4 outputted from the pull-up switching device Tru of the fourth stage ST804 and the OFF voltage outputted from each of the first and second pull-down switching devices Trd1 and Trd2 of the fourth stage ST804 are supplied to the fourth gate line, fifth stage ST805, sixth stage ST806, first stage ST801 and second stage ST802.

Figure 11:
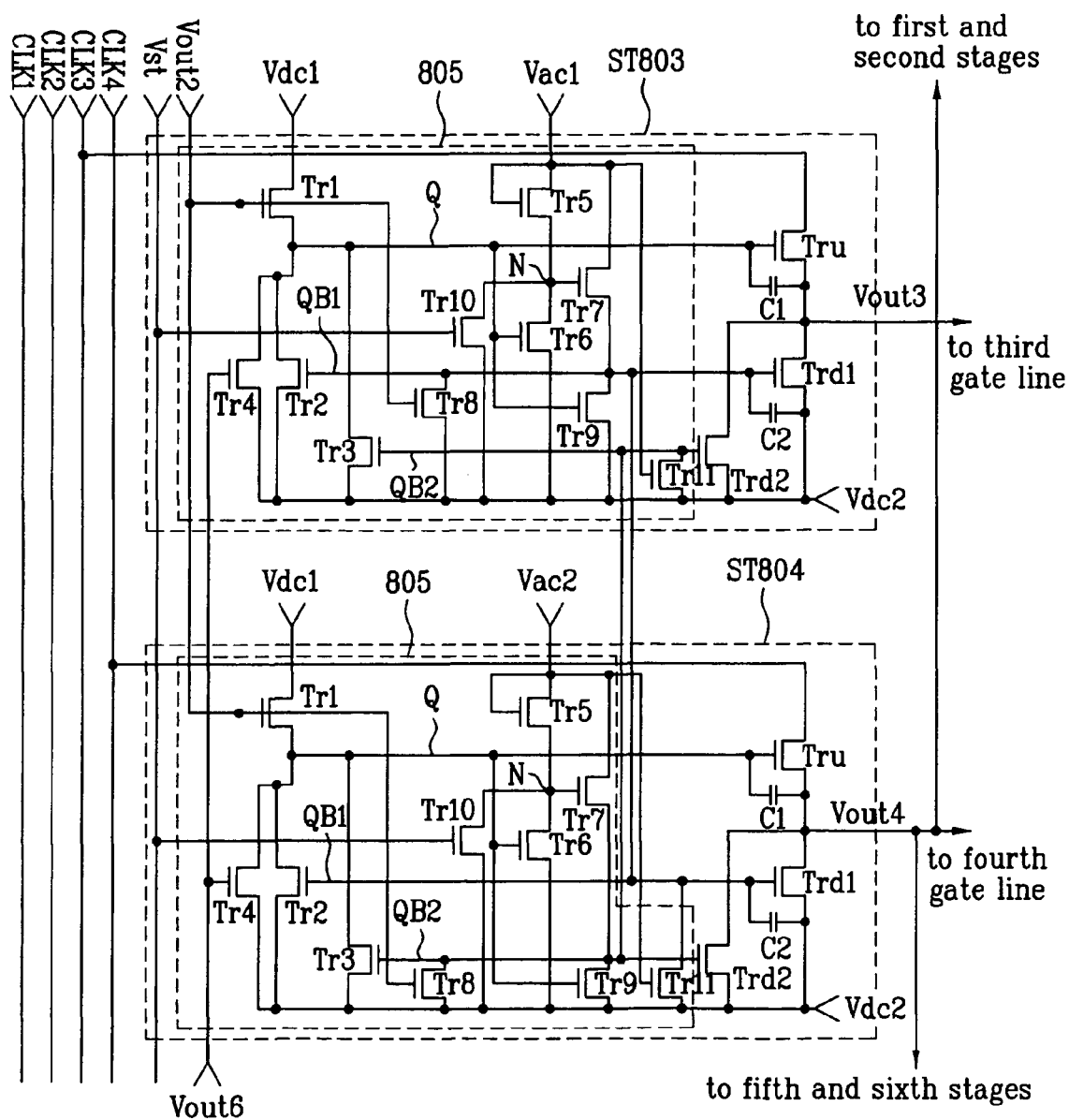
FIG. 11 is a schematic view of a second exemplary circuit configuration of node controllers for the third and fourth stages in FIG. 8 in accordance with another embodiment of the present invention.

FIG. 11 is a schematic view of a second exemplary circuit configuration of node controllers for the third and fourth stages in FIG. 8 in accordance with another embodiment of the present invention. Referring to FIG. 11, first to ninth switching devices Tr1 to Tr9, a pull-up switching device Tru, a first pull-down switching device Trd1 and a second pull-down switching device Trd2 shown in FIG. 11 are substantially similar to those shown in FIG. 10. Also, tenth and eleventh switching devices Tr10 and Tr11 shown in FIG. 11 are substantially similar to those shown in FIG. 5. As another alternative, each of the stages ST801, ST802, ST803, . . . of the shift register may have a circuit configuration as follows.

Figure 12:
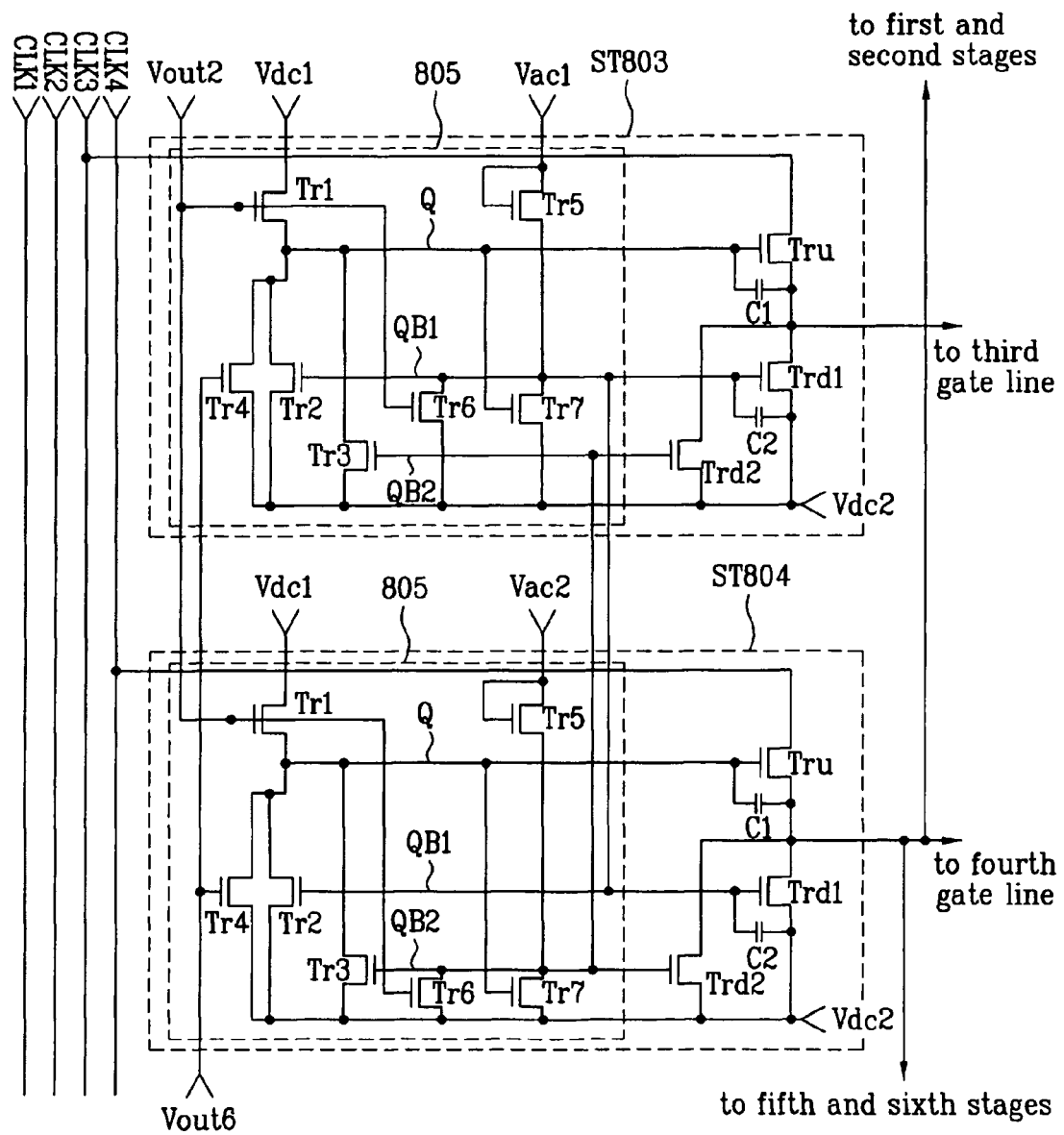
FIG. 12 is a schematic view of a third exemplary circuit configuration of node controllers for the third and fourth stages in FIG. 8 in accordance with another embodiment of the present invention.

FIG. 12 is a schematic view of a third exemplary circuit configuration of node controllers for the third and fourth stages in FIG. 8 in accordance with another embodiment of the present invention. Referring to FIG. 12, first to seventh switching devices Tr1 to Tr7, a pull-up switching device Tru, a first pull-down switching device Trd1 and a second pull-down switching device Trd2 shown in FIG. 12 are substantially similar to those shown in FIG. 6. For example, the first and sixth switching devices Tr1 and Tr6 of the (2n−1)-th stage and the first and sixth switching devices Tr1 and Tr6 of the 2n-th stage are operated in response to the scan pulse from the (2n−2)-th stage. The first and sixth switching devices Tr1 and Tr6 of the third stage ST803 and the first and sixth switching devices Tr1 and Tr6 of the fourth stage ST804 are operated in response to the second scan pulse Vout2 from the second stage ST802.

Also, the scan pulse outputted from the pull-up switching device Tru of the (2n−1)-th stage and the OFF voltage outputted from each of the first and second pull-down switching devices Trd1 and Trd2 of the (2n−1)-th stage are supplied to only the (2n−1)-th gate line. For example, the third scan pulse Vout3 outputted from the pull-up switching device Tru of the third stage ST803 and the OFF voltage outputted from each of the first and second pull-down switching devices Trd1 and Trd2 of the third stage ST803 are supplied to only the third gate line.

Also, the scan pulse outputted from the pull-up switching device Tru of the 2n-th stage and the OFF voltage outputted from each of the first and second pull-down switching devices Trd1 and Trd2 of the 2n-th stage are supplied to the 2n-th gate line, (2n+1)-th stage, (2n+2)-th stage, (2n−3)-th stage and (2n−2)-th stage. The fourth scan pulse Vout4 outputted from the pull-up switching device Tru of the fourth stage ST804 and the OFF voltage outputted from each of the first and second pull-down switching devices Trd1 and Trd2 of the fourth stage ST804 are supplied to the fourth gate line, fifth stage ST805, sixth stage ST806, first stage ST801 and second stage ST802.

Figure 13:
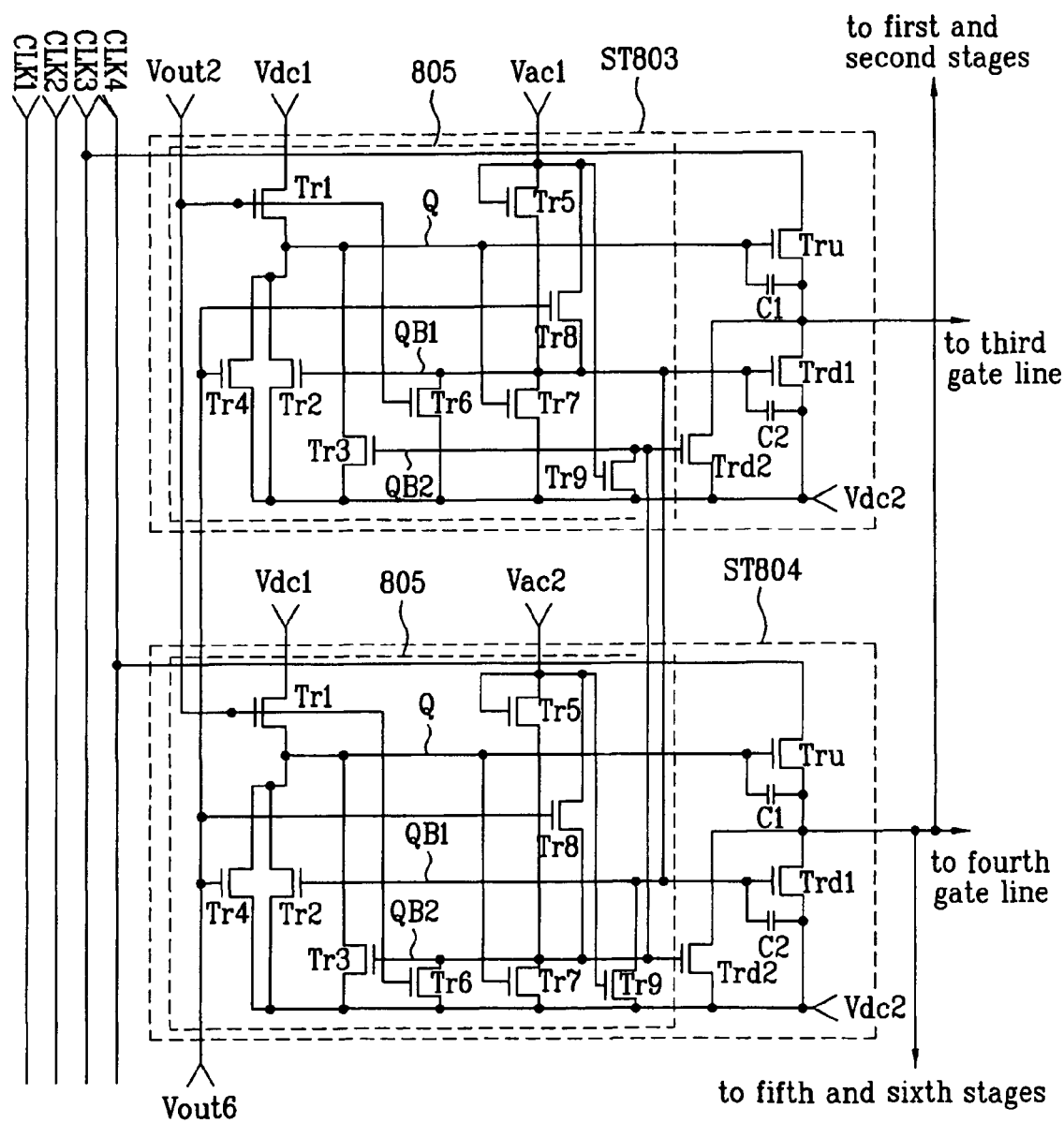
FIG. 13 is a schematic view of a fourth exemplary circuit configuration of node controllers for the third and fourth stages in FIG. 8 in accordance with another embodiment of the present invention.

FIG. 13 is a schematic view of a fourth exemplary circuit configuration of node controllers for the third and fourth stages in FIG. 8 in accordance with another embodiment of the present invention. Referring to FIG. 13, first to seventh switching devices Tr1 to Tr7, a pull-up switching device Tru, a first pull-down switching device Trd1 and a second pull-down switching device Trd2 shown in FIG. 13 are substantially similar to those shown in FIG. 12. Also, eighth and ninth switching devices Tr8 and Tr9 shown in FIG. 13 are substantially similar to those shown in FIG. 5.

On the other hand, each of the scan pulses Vout1, Vout3, Vout5, . . . outputted from the odd-numbered stages ST801, ST803, ST805, . . . is supplied to only a corresponding gate line (odd gate line). In contrast, each of the scan pulses Vout2, Vout4, Vout6, . . . outputted from the even-numbered stages ST802, ST804, ST806, . . . is supplied to upstream and downstream stages, as well as to a corresponding gate line (even gate line).

The output terminal (source terminal) of the pull-up switching device Tru of each of the odd-numbered stages ST801, ST803, ST805, . . . is connected to only the corresponding odd gate line. In contrast, the output terminal (source terminal) of the pull-up switching device Tru of each of the even-numbered stages ST802, ST804, ST806, . . . is connected to the upstream and downstream stages, as well as to the corresponding even gate line.

For this reason, the amount of load applied to the output terminal of the pull-up switching device Tru of each of the even-numbered stages ST802, ST804, ST806, . . . cannot help being larger than that applied to the output terminal of the pull-up switching device Tru of each of the odd-numbered stages ST801, ST803, ST805, . . . .

Hence, each of the scan pulses Vout2, Vout4, Vout6, . . . outputted from the even-numbered stages ST802, ST804, ST806, . . . may be subject to a larger distortion than that of each of the scan pulses Vout1, Vout3, Vout5, . . . outputted from the odd-numbered stages ST801, ST803, ST805, . . . .

Accordingly, there may be a level difference between each of the scan pulses Vout1, Vout3, Vout5, . . . supplied to the odd gate lines and each of the scan pulses Vout2, Vout4, Vout6, . . . supplied to the even gate lines, resulting in a degradation in image quality.

To avoid this, it is preferable to design the pull-up switching device Tru of each of the even-numbered stages ST802, ST804, ST806, . . . , having the larger amount of load, in such a manner that the size thereof is larger than that of the pull-up switching device Tru of each of the odd-numbered stages ST801, ST803, ST805, . . . .

Thus, it is preferable to design the pull-up switching device Tru of each of the even-numbered stages ST802, ST804, ST806, . . . such that the channel width thereof is wider than that of the pull-up switching device Tru of each of the odd-numbered stages ST801, ST803, ST805, . . . .

By doing so, it is possible to minimize a level difference between each of the scan pulses Vout2, Vout4, Vout6, . . . outputted from the pull-up switching devices Tru of the even-numbered stages ST802, ST804, ST806, . . . and each of the scan pulses Vout1, Vout3, Vout5, . . . outputted from the pull-up switching devices Tru of the odd-numbered stages ST801, ST803, ST805, . . . .

The channel width of the pull-up switching device Tru of each of the even-numbered stages ST802, ST804, ST806, . . . is wider by a factor a than that of the pull-up switching device Tru of each of the odd-numbered stages ST801, ST803, ST805, . . . .

Here, a has a value as follows:

$$0.1 * \{(\text{channel width of first switching device } Tr1)*2 + (\text{channel width of fourth switching device } Tr4)*2\} \le \alpha \le \{(\text{channel width of first switching device } Tr1)*2 + (\text{channel width of fourth switching device } Tr4)*2\}$$ [Equation 1]

Figure 14:
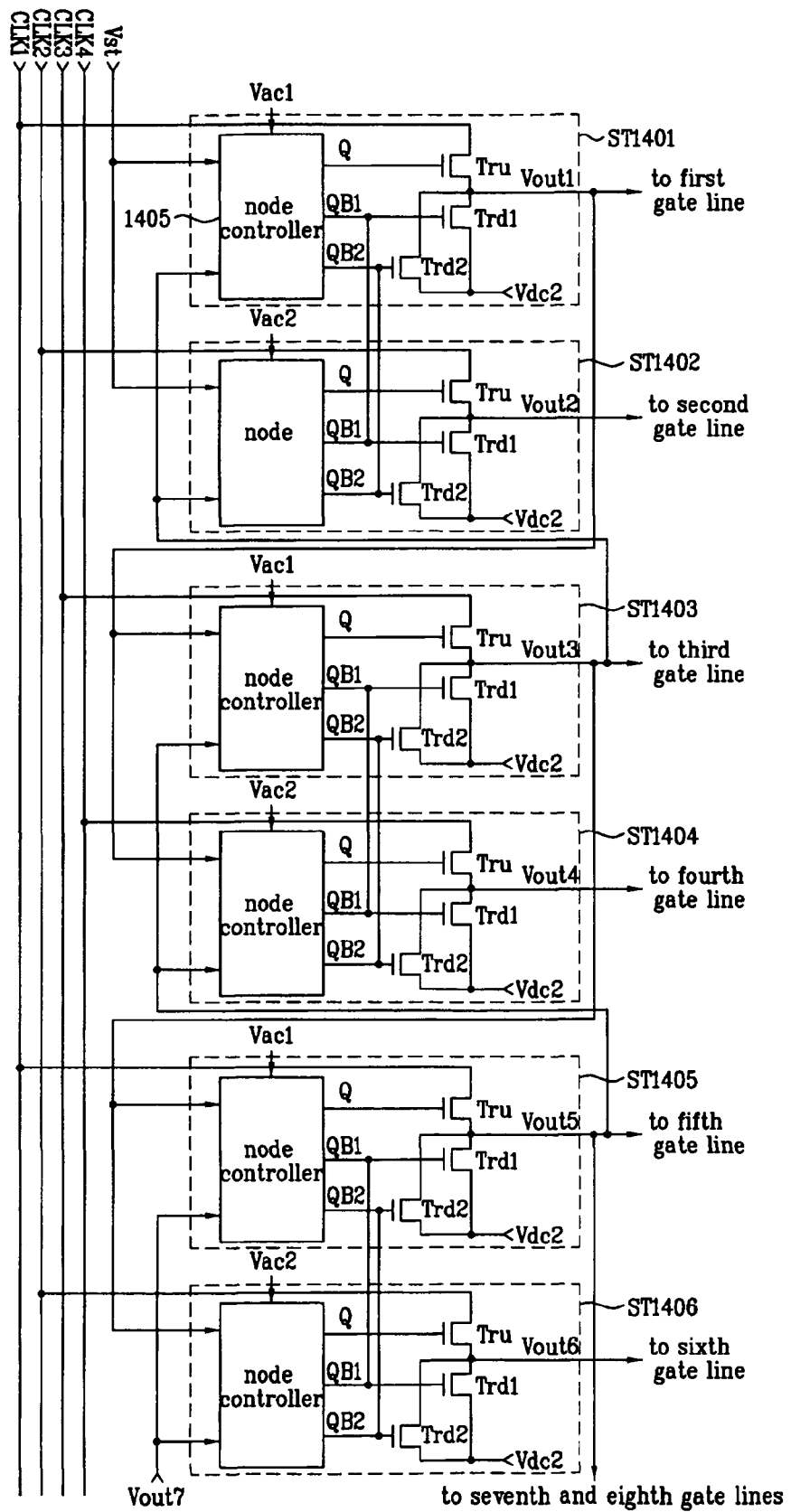
FIG. 14 is a schematic view of a third exemplary shift register according to another embodiment of the present invention.
Figure 15:
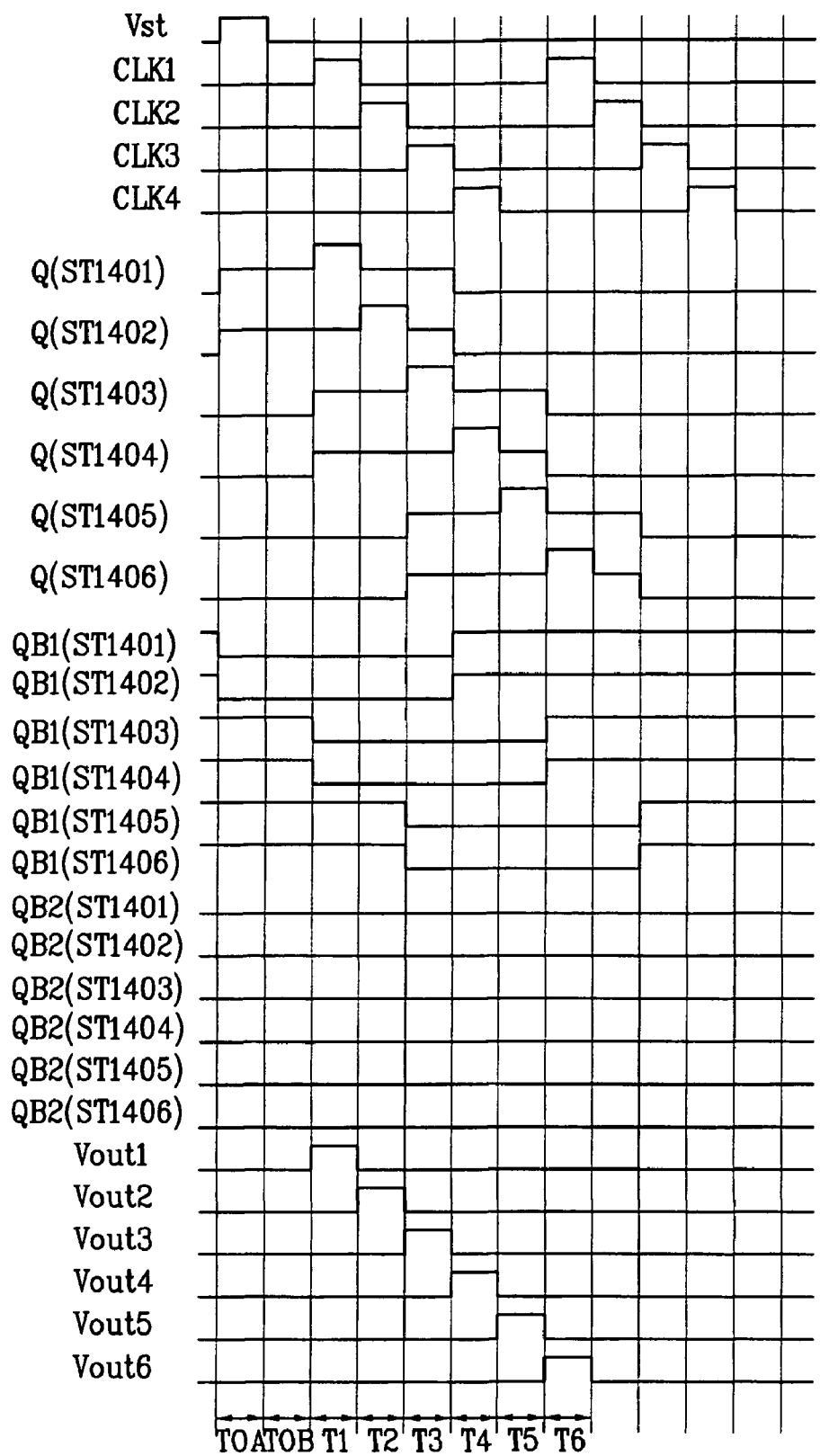
FIG. 15 shows an exemplary timing diagram of input signals into and output signals from respective stages of the shift register of FIG. 14.

FIG. 14 is a schematic view of a third exemplary shift register according to another embodiment of the present invention. FIG. 15 shows an exemplary timing diagram of input signals into and output signals from respective stages of the shift register of FIG. 14. Referring to FIG. 14, the shift register has a plurality of stages ST1401, ST1402, ST1403, . . . . Here, the configuration of each of the stages ST1401, ST1402, ST1403, . . . is substantially similar to the corresponding stages of the first exemplary shift register, with the exception that the stages ST1401, ST1402, ST1403, . . . are connected with one another in a different manner. Therefore, a description will hereinafter be given of only the connections among the ST1401, ST1402, ST1403, . . . . In addition, the shift register is supplied with first to fourth clock pulses CLK1 to CLK4, although it may be of course supplied with five or more clock pulses. Meanwhile, the start pulse Vst and the first clock pulse CLK1 which are supplied to the shift register are outputted with a time difference of two pulse widths therebetween, as shown in FIG. 15.

The (2n−1)-th stage and the 2n-th stage are simultaneously enabled in response to the (2n−3)-th scan pulse from the (2n−3)-th stage and simultaneously disabled in response to the (2n+1)-th scan pulse from the (2n+1)-th stage. The enabled (2n−1)-th stage outputs the (2n−1)-th scan pulse and supplies it to the (2n+1)-th and (2n+2)-th stages, so as to enable the (2n+1)-th and (2n+2)-th stages simultaneously. The (2n−1)-th stage also supplies the (2n−1)-th scan pulse to the (2n−3)-th and (2n−2)-th stages, so as to disable the (2n−3)-th and (2)-th stages simultaneously.

For example, the third stage ST1403 and fourth stage ST1404 in FIG. 14 are simultaneously enabled in response to the first scan pulse Vout1 from the first stage ST1401 and simultaneously disabled in response to the fifth scan pulse Vout5 from the fifth stage ST1405. The enabled third stage ST1403 outputs the third scan pulse Vout3 and supplies it to the fifth and sixth stages ST1405 and ST1406, thus enabling the fifth and sixth stages ST1405 and ST1406 simultaneously. The third stage ST1403 also supplies the third scan pulse Vout3 to the first and second stages ST1401 and ST1402, thus disabling the first and second stages ST1401 and ST1402 simultaneously. On the other hand, the first and second stages ST1401 and ST1402 are enabled in response to the start pulse Vst from the timing controller.

Figure 16:
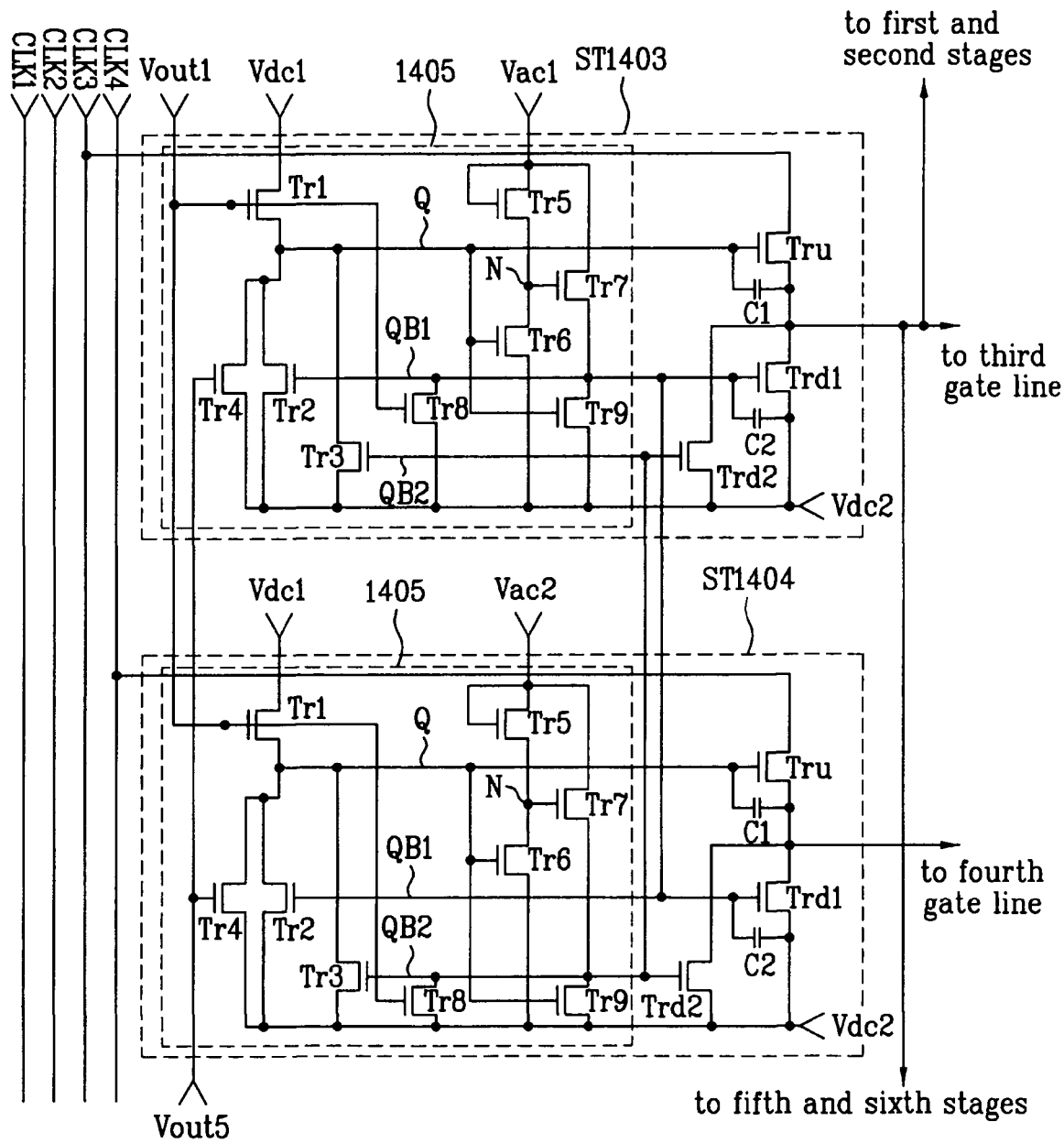
FIG. 16 is a schematic view of a first exemplary circuit configuration of node controllers for the third and fourth stages in FIG. 14 in accordance with an embodiment of the present invention.

FIG. 16 is a schematic view of a first exemplary circuit configuration of node controllers for the third and fourth stages in FIG. 14 in accordance with an embodiment of the present invention. Referring to FIG. 16, first to ninth switching devices Tr1 to Tr9, a pull-up switching device Tru, a first pull-down switching device Trd1 and a second pull-down switching device Trd2 shown in FIG. 16 are substantially similar to those shown in FIG. 4.

For example, the fourth switching device Tr4 of the (2n−1)-th stage and the fourth switching device Tr4 of the 2n-th stage are operated in response to the scan pulse from the (2n+1)-th stage. The fourth switching device Tr4 of the third stage ST1403 in FIG. 16 and the fourth switching device Tr4 of the fourth stage ST1404 in FIG. 16 are operated in response to the fifth scan pulse Vout5 from the fifth stage ST1405.

Also, the scan pulse outputted from the pull-up switching device Tru of the (2n−1)-th stage and the OFF voltage outputted from each of the first and second pull-down switching devices Trd1 and Trd2 of the (2n−1)-th stage are supplied to the (2n−1)-th gate line, (2n+1)-th stage, (2n+2)-th stage, (2n−3)-th stage and (2n−2)-th stage. For example, the third scan pulse Vout3 outputted from the pull-up switching device Tru of the third stage ST1403 in FIG. 16 and the OFF voltage outputted from each of the first and second pull-down switching devices Trd1 and Trd2 of the third stage ST1403 are supplied to the third gate line, fifth stage ST1405, sixth stage ST1406, first stage ST1401 and second stage ST1402.

Also, the scan pulse outputted from the pull-up switching device Tru of the 2n-th stage and the OFF voltage outputted from each of the first and second pull-down switching devices Trd1 and Trd2 of the 2n-th stage are supplied to only the 2n-th gate line. For example, the fourth scan pulse Vout4 outputted from the pull-up switching device Tru of the fourth stage ST1404 in FIG. 16 and the OFF voltage outputted from each of the first and second pull-down switching devices Trd1 and Trd2 of the fourth stage ST1404 are supplied to only the fourth gate line.

Figure 17:
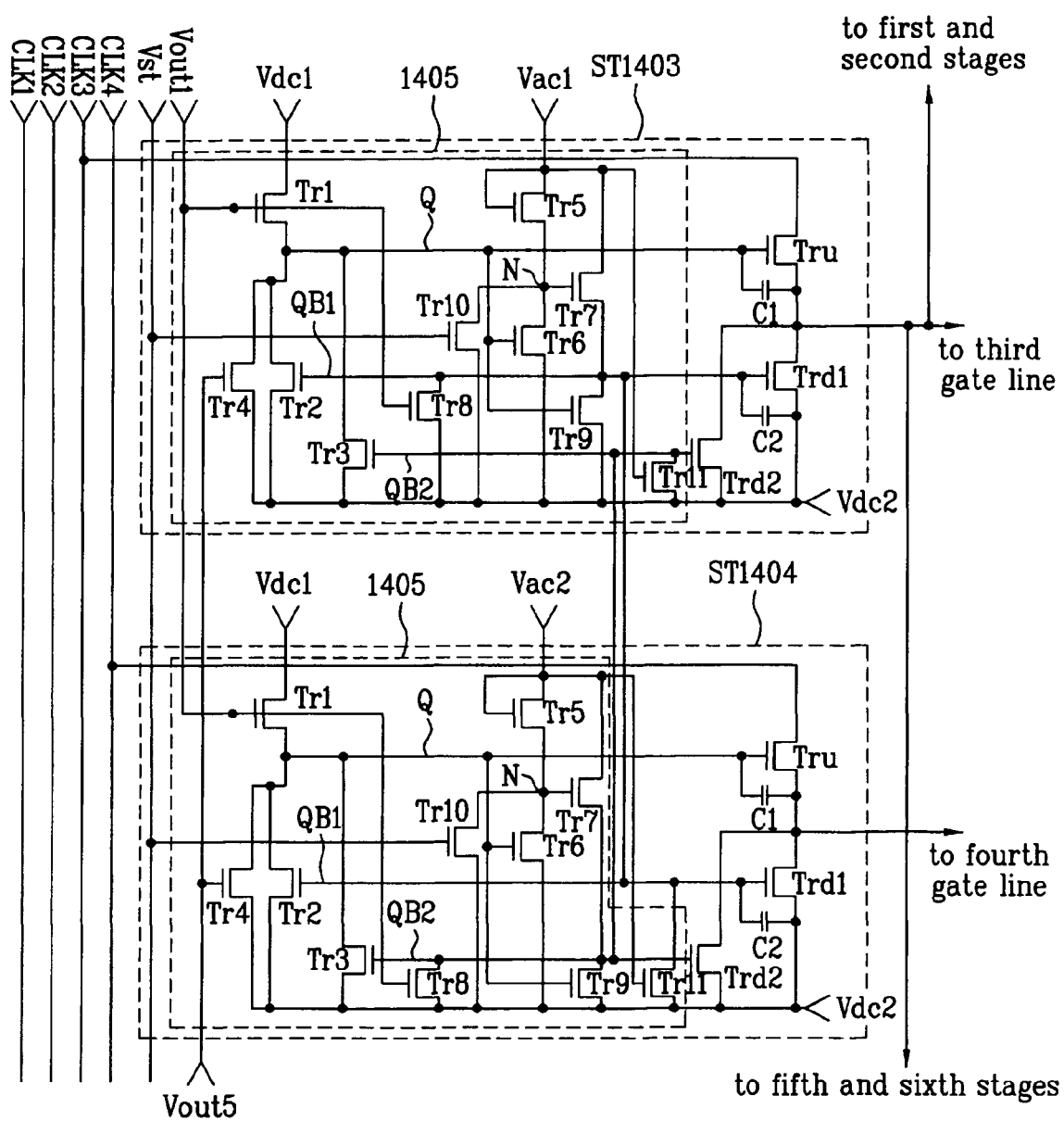
FIG. 17 is a schematic view of a second exemplary circuit configuration of node controllers for the third and fourth stages in FIG. 14 in accordance with another embodiment of the present invention.

FIG. 17 is a schematic view of a second exemplary circuit configuration of node controllers for the third and fourth stages in FIG. 14 in accordance with another embodiment of the present invention. Referring to FIG. 17, first to ninth switching devices Tr1 to Tr9, a pull-up switching device Tru, a first pull-down switching device Trd1 and a second pull-down switching device Trd2 shown in FIG. 17 are substantially similar to those shown in FIG. 16. Also, tenth and eleventh switching devices Tr10 and Tr11 shown in FIG. 17 are substantially similar to those shown in FIG. 5.

Figure 18:
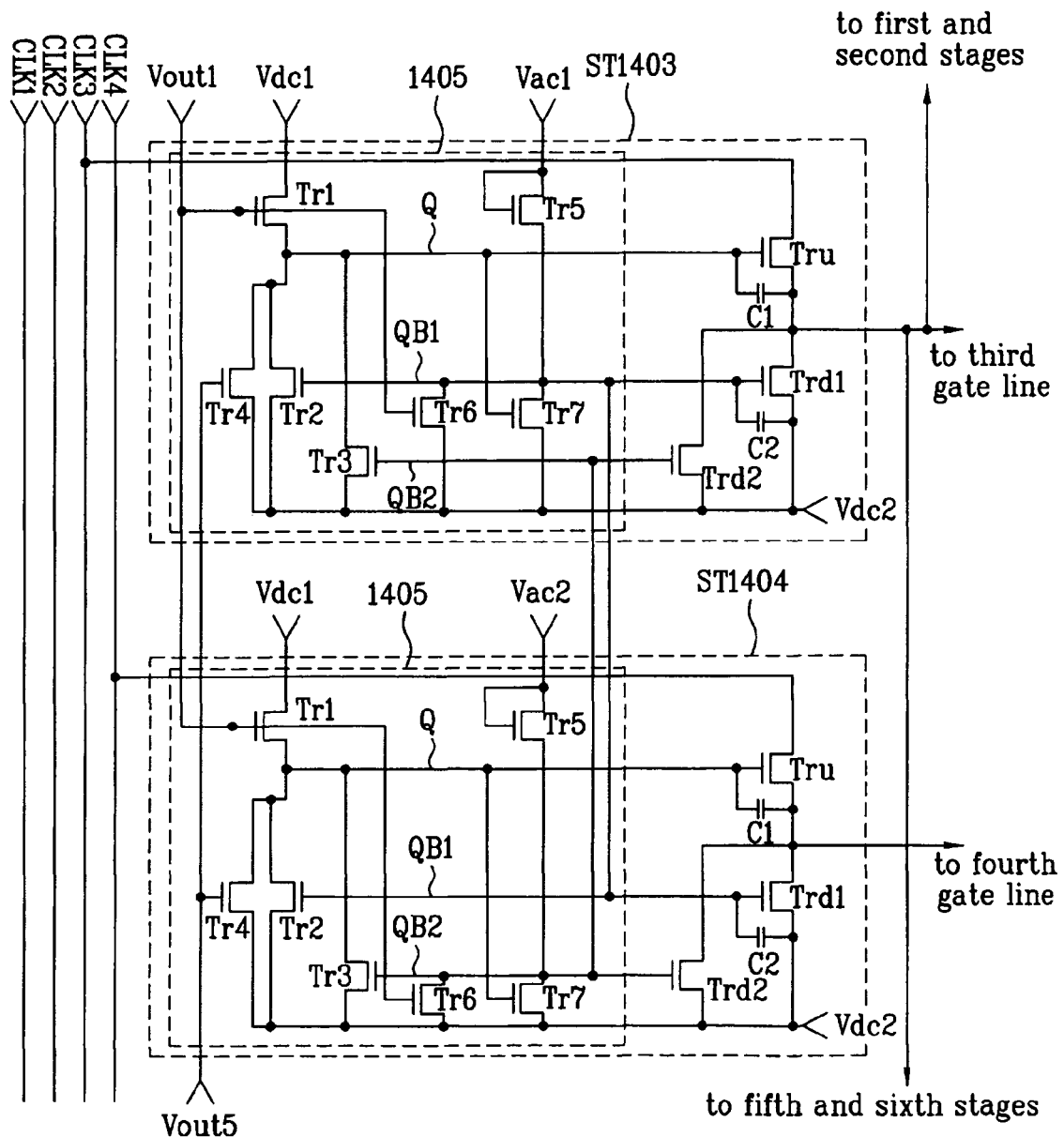
FIG. 18 is a schematic view of a third exemplary circuit configuration of node controllers for the third and fourth stages in FIG. 14 in accordance with another embodiment of the present invention.

FIG. 18 is a schematic view of a third exemplary circuit configuration of node controllers for the third and fourth stages in FIG. 14 in accordance with another embodiment of the present invention. Referring to FIG. 18, first to seventh switching devices Tr1 to Tr7, a pull-up switching device Tru, a first pull-down switching device Trd1 and a second pull-down switching device Trd2 shown in FIG. 18 are substantially similar to those shown in FIG. 6.

For example, the fourth switching device Tr4 of the (2n−1)-th stage and the fourth switching device Tr4 of the 2n-th stage are operated in response to the scan pulse from the (2n+1)-th stage. The fourth switching device Tr4 of the third stage ST1403 in FIG. 18 and the fourth switching device Tr4 of the fourth stage ST1404 in FIG. 18 are operated in response to the fifth scan pulse Vout5 from the fifth stage ST1405.

Also, the scan pulse outputted from the pull-up switching device Tru of the (2n−1)-th stage and the OFF voltage outputted from each of the first and second pull-down switching devices Trd1 and Trd2 of the (2n−1)-th stage are supplied to the (2n−1)-th gate line, (2n+1)-th stage, (2n+2)-th stage, (2n−3)-th stage and (2n−2)-th stage. For example, the third scan pulse Vout3 outputted from the pull-up switching device Tru of the third stage ST1403 in FIG. 18 and the OFF voltage outputted from each of the first and second pull-down switching devices Trd1 and Trd2 of the third stage ST1403 are supplied to the third gate line, fifth stage ST1405, sixth stage ST1406, first stage ST1401 and second stage ST1402.

Also, the scan pulse outputted from the pull-up switching device Tru of the 2n-th stage and the OFF voltage outputted from each of the first and second pull-down switching devices Trd1 and Trd2 of the 2n-th stage are supplied to only the 2n-th gate line. For example, the fourth scan pulse Vout4 outputted from the pull-up switching device Tru of the fourth stage ST1404 in FIG. 18 and the OFF voltage outputted from each of the first and second pull-down switching devices Trd1 and Trd2 of the fourth stage ST1404 are supplied to only the fourth gate line.

Figure 19:
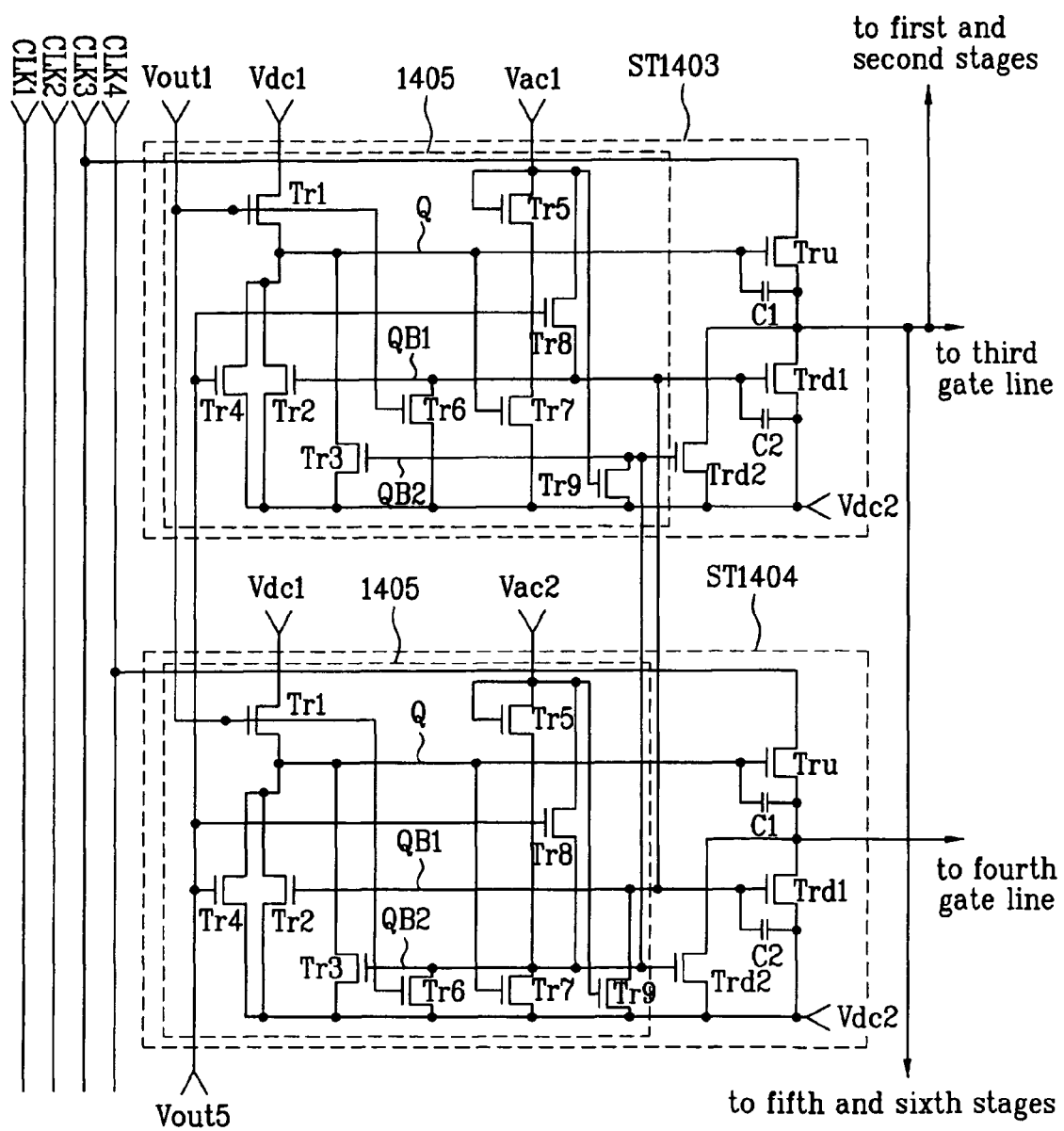
FIG. 19 is a schematic view of a fourth exemplary circuit configuration of node controllers for the third and fourth stages in FIG. 14 in accordance with another embodiment of the present invention.

FIG. 19 is a schematic view of a fourth exemplary circuit configuration of node controllers for the third and fourth stages in FIG. 14 in accordance with another embodiment of the present invention. Referring to FIG. 19, first to seventh switching devices Tr1 to Tr7, a pull-up switching device Tru, a first pull-down switching device Trd1 and a second pull-down switching device Trd2 shown in FIG. 19 are substantially similar to those shown in FIG. 18. Also, eighth and ninth switching devices Tr8 and Tr9 shown in FIG. 19 are substantially similar to those shown in FIG. 5.

For example, the eighth switching device Tr8 of each of the (2n−1)-th stage and 2n-th stage is operated in response to the (2n+1)-th scan pulse from the (2n+1)-th stage. The eighth switching device Tr8 of each of the third and fourth stages ST1403 and ST1404 in FIG. 19 is operated in response to the fifth scan pulse Vout5 from the fifth stage ST1405. Here, each of the scan pulses Vout2, Vout4, Vout6, . . . outputted from the even-numbered stages ST1402, ST1404, ST1406, . . . is supplied to only a corresponding gate line (even gate line). In contrast, each of the scan pulses Vout1, Vout3, Vout5, . . . outputted from the odd-numbered stages ST1401, ST1403, ST1405, . . . is supplied to upstream and downstream stages, as well as to a corresponding gate line (odd gate line).

The output terminal (source terminal) of the pull-up switching device Tru of each of the even-numbered stages ST1402, ST1404, ST1406, . . . is connected to only the corresponding even gate line. In contrast, the output terminal (source terminal) of the pull-up switching device Tru of each of the odd-numbered stages ST1401, ST1403, ST1405, . . . is connected to the upstream and downstream stages, as well as to the corresponding odd gate line.

For this reason, the amount of load applied to the output terminal of the pull-up switching device Tru of each of the odd-numbered stages ST1401, ST1403, ST1405, . . . cannot help being larger than that applied to the output terminal of the pull-up switching device Tru of each of the even-numbered stages ST1402, ST1404, ST1406, . . . . Hence, each of the scan pulses Vout1, Vout3, Vout5, . . . outputted from the odd-numbered stages ST1401, ST1403, ST1405, . . . may be subject to a larger distortion than that of each of the scan pulses Vout2, Vout4, Vout6, . . . outputted from the even-numbered stages ST1402, ST1404, ST1406, . . . . Accordingly, there may be a level difference between each of the scan pulses Vout2, Vout4, Vout6, . . . supplied to the even gate lines and each of the scan pulses Vout1, Vout3, Vout5, . . . supplied to the odd gate lines, resulting in a degradation in image quality.

To avoid this, it is preferable to design the pull-up switching device Tru of each of the odd-numbered stages ST1401, ST1403, ST1405, . . . , having the larger amount of load, in such a manner that the size thereof is larger than that of the pull-up switching device Tru of each of the even-numbered stages ST1402, ST1404, ST1406, . . . .

Thus, it is preferable to design the pull-up switching device Tru of each of the odd-numbered stages ST1401, ST1403, ST1405, . . . such that the channel width thereof is wider than that of the pull-up switching device Tru of each of the even-numbered stages ST1402, ST1404, ST1406, . . . . By doing so, it is possible to minimize a level difference between each of the scan pulses Vout1, Vout3, Vout5, . . . outputted from the pull-up switching devices Tru of the odd-numbered stages ST1401, ST1403, ST1405, . . . and each of the scan pulses Vout2, Vout4, Vout6, . . . outputted from the pull-up switching devices Tru of the even-numbered stages ST1402, ST1404, ST1406, . . . .

The channel width of the pull-up switching device Tru of each of the odd-numbered stages ST1401, ST1403, ST1405, . . . is wider by a factor α than that of the pull-up switching device Tru of each of the even-numbered stages ST1402, ST1404, ST1406, . . . .

Here, the value of α satisfies the following relation:

$$\{0.1 * (\text{channel width of first switching device } Tr1) * 2 + \quad \text{[Equation 2]}$$
$$(\text{channel width of fourth switching device } Tr4) * 2\} \le$$
$$\alpha \le \{(\text{channel width of first switching device } Tr1) * 2 +$$
$$(\text{channel width of fourth switching device } Tr4) * 2\}$$

Figure 20:
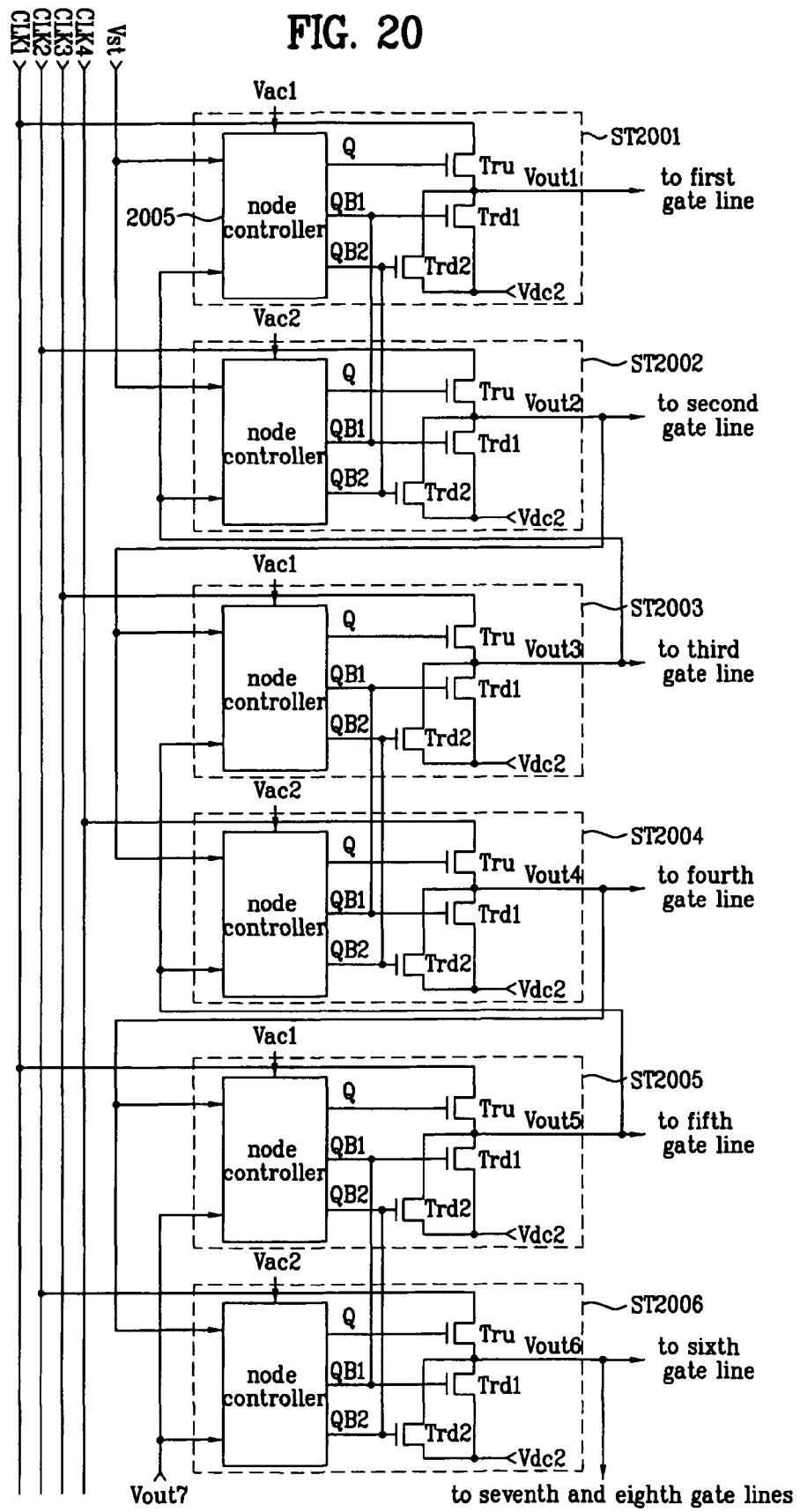
FIG. 20 is a schematic view of a fourth exemplary shift register according to another embodiment of the present invention.
Figure 21:
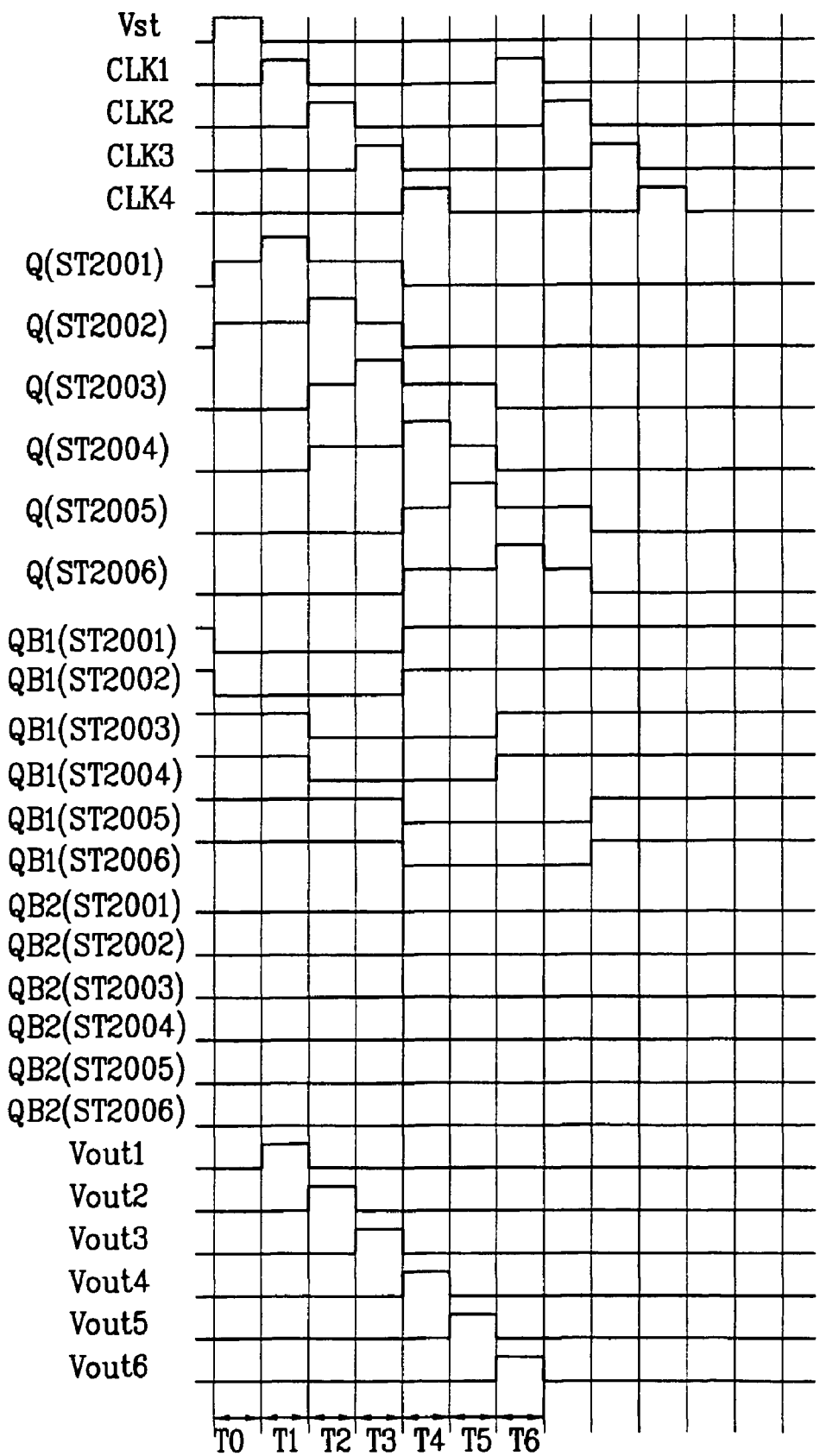
FIG. 21 shows an exemplary timing diagram of input signals into and output signals from respective stages of the shift register of FIG. 20.

FIG. 20 is a schematic view of a fourth exemplary shift register according to another embodiment of the present invention. FIG. 21 shows an exemplary timing diagram of input signals into and output signals from respective stages of the shift register of FIG. 20. Referring to FIG. 20, the shift register has a plurality of stages ST2001, ST2002, ST2003, . . . . Here, the configuration of each of the stages ST2001, ST2002, ST2003, . . . is substantially similar to the stages described in reference to the first exemplary shift register, with the exception that the stages ST2001, ST2002, ST2003, . . . are connected with one another in a different manner. Therefore, a description will hereinafter be given of only the connections among the ST2001, ST2002, ST2003, . . . . In addition, the shift register is supplied with first to fourth clock pulses CLK1 to CLK4, although it may be of course supplied with five or more clock pulses.

The (2n−1)-th stage and the 2n-th stage are simultaneously enabled in response to the (2n−2)-th scan pulse from the (2n−2)-th stage and simultaneously disabled in response to the (2n+1)-th scan pulse from the (2n+1)-th stage. The enabled (2n−1)-th stage outputs the (2n−1)-th scan pulse and supplies it to the (2n−3)-th and (2n−2)-th stages, so as to disable the (2n−3)-th and (2n−2)-th stages simultaneously. Also, the enabled 2n-th stage outputs the 2n-th scan pulse and supplies it to the (2n+1)-th and (2n+2)-th stages, so as to enable the (2n+1)-th and (2n+2)-th stages simultaneously.

For example, the third stage ST2003 and fourth stage ST2004 in FIG. 20 are simultaneously enabled in response to the second scan pulse Vout2 from the second stage ST2002 and simultaneously disabled in response to the fifth scan pulse Vout5 from the fifth stage ST2005. The enabled third stage ST2003 outputs the third scan pulse Vout3 and supplies it to the first and second stages ST2001 and ST2002, thus disabling the first and second stages ST2001 and ST2002 simultaneously. Also, the enabled fourth stage ST2004 outputs the fourth scan pulse Vout4 and supplies it to the fifth and sixth stages ST2005 and ST2006, thus enabling the fifth and sixth stages ST2005 and ST2006 simultaneously. On the other hand, the first and second stages ST2001 and ST2002 are enabled in response to the start pulse Vst from the timing controller.

Figure 22:
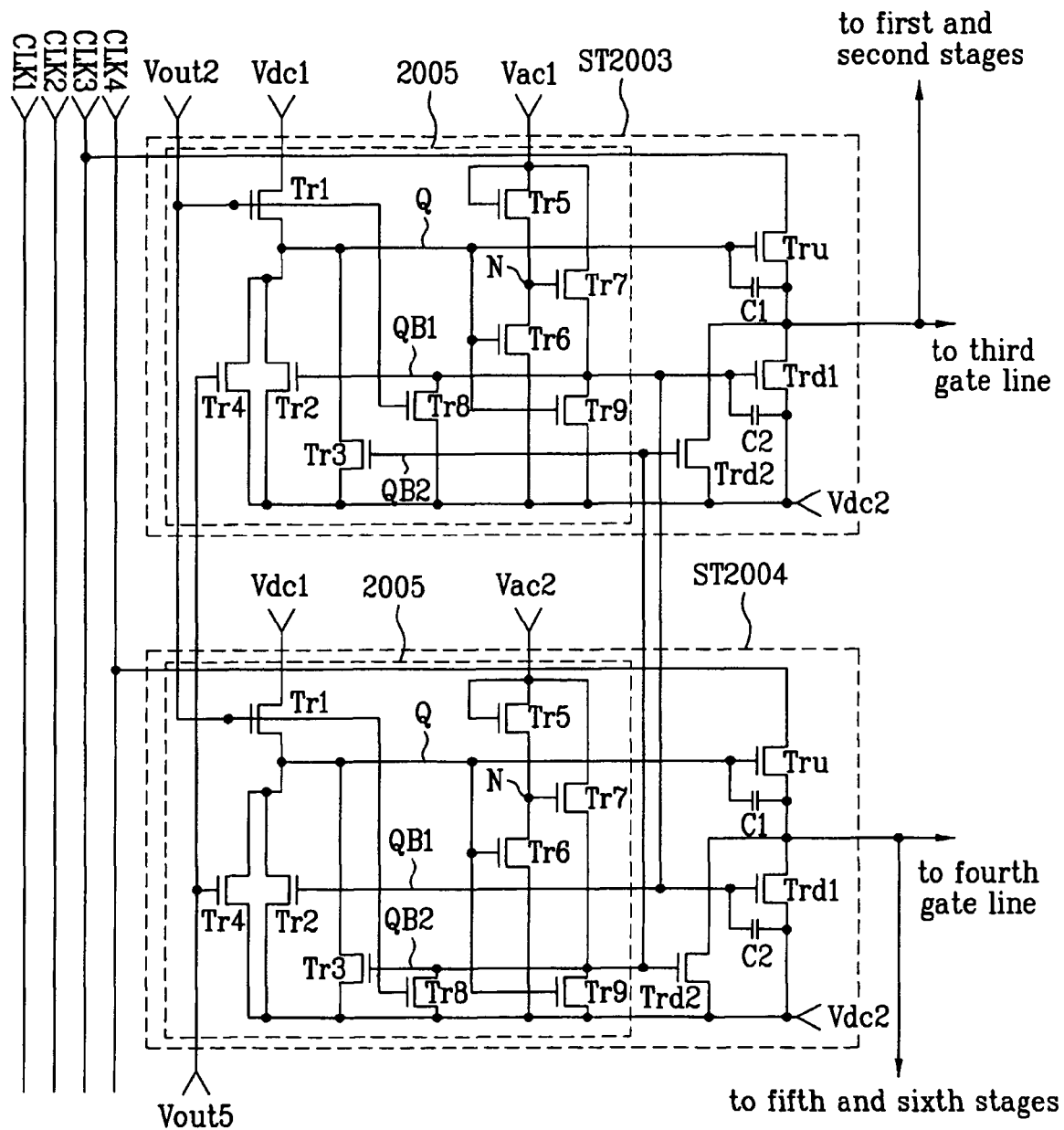
FIG. 22 is a schematic view of a first exemplary circuit configuration of node controllers for the third and fourth stages in FIG. 20 in accordance with an embodiment of the present invention.

FIG. 22 is a schematic view of a first exemplary circuit configuration of node controllers for the third and fourth stages in FIG. 20 in accordance with an embodiment of the present invention. Referring to FIG. 22, first to ninth switching devices Tr1 to Tr9, a pull-up switching device Tru, a first pull-down switching device Trd1 and a second pull-down switching device Trd2 shown in FIG. 22 are substantially similar to those shown in FIG. 4.

For example, the first and eighth switching devices Tr1 and Tr8 of the (2n−1)-th stage and the first and eighth switching devices Tr1 and Tr8 of the 2n-th stage are operated in response to the scan pulse from the (2n−2)-th stage. The first and eighth switching devices Tr1 and Tr8 of the third stage ST2003 in FIG. 22 and the first and eighth switching devices Tr1 and Tr8 of the fourth stage ST2004 in FIG. 22 are operated in response to the second scan pulse Vout2 from the second stage ST2002.

Also, the fourth switching device Tr4 of the (2n−1)-th stage and the fourth switching device Tr4 of the 2n-th stage are operated in response to the scan pulse from the (2n+1)-th stage. For example, the fourth switching device Tr4 of the third stage ST2003 in FIG. 22 and the fourth switching device Tr4 of the fourth stage ST2004 in FIG. 22 are operated in response to the fifth scan pulse Vout5 from the fifth stage ST2005.

Also, the scan pulse outputted from the pull-up switching device Tru of the (2n−1)-th stage and the OFF voltage outputted from each of the first and second pull-down switching devices Trd1 and Trd2 of the (2n−1)-th stage are supplied to the (2n−1)-th gate line, (2n−3)-th stage and (2n−2)-th stage. For example, the third scan pulse Vout3 outputted from the pull-up switching device Tru of the third stage ST2003 in FIG. 22 and the OFF voltage outputted from each of the first and second pull-down switching devices Trd1 and Trd2 of the third stage ST2003 are supplied to the third gate line, first stage ST2001 and second stage ST2002.

Also, the scan pulse outputted from the pull-up switching device Tru of the 2n-th stage and the OFF voltage outputted from each of the first and second pull-down switching devices Trd1 and Trd2 of the 2n-th stage are supplied to the 2n-th gate line, (2n+1)-th stage and (2n+2)-th stage. For example, the fourth scan pulse Vout4 outputted from the pull-up switching device Tru of the fourth stage ST2004 in FIG. 22 and the OFF voltage outputted from each of the first and second pull-down switching devices Trd1 and Trd2 of the fourth stage ST2004 are supplied to the fourth gate line, fifth stage ST2005 and sixth stage ST2006.

Figure 23:
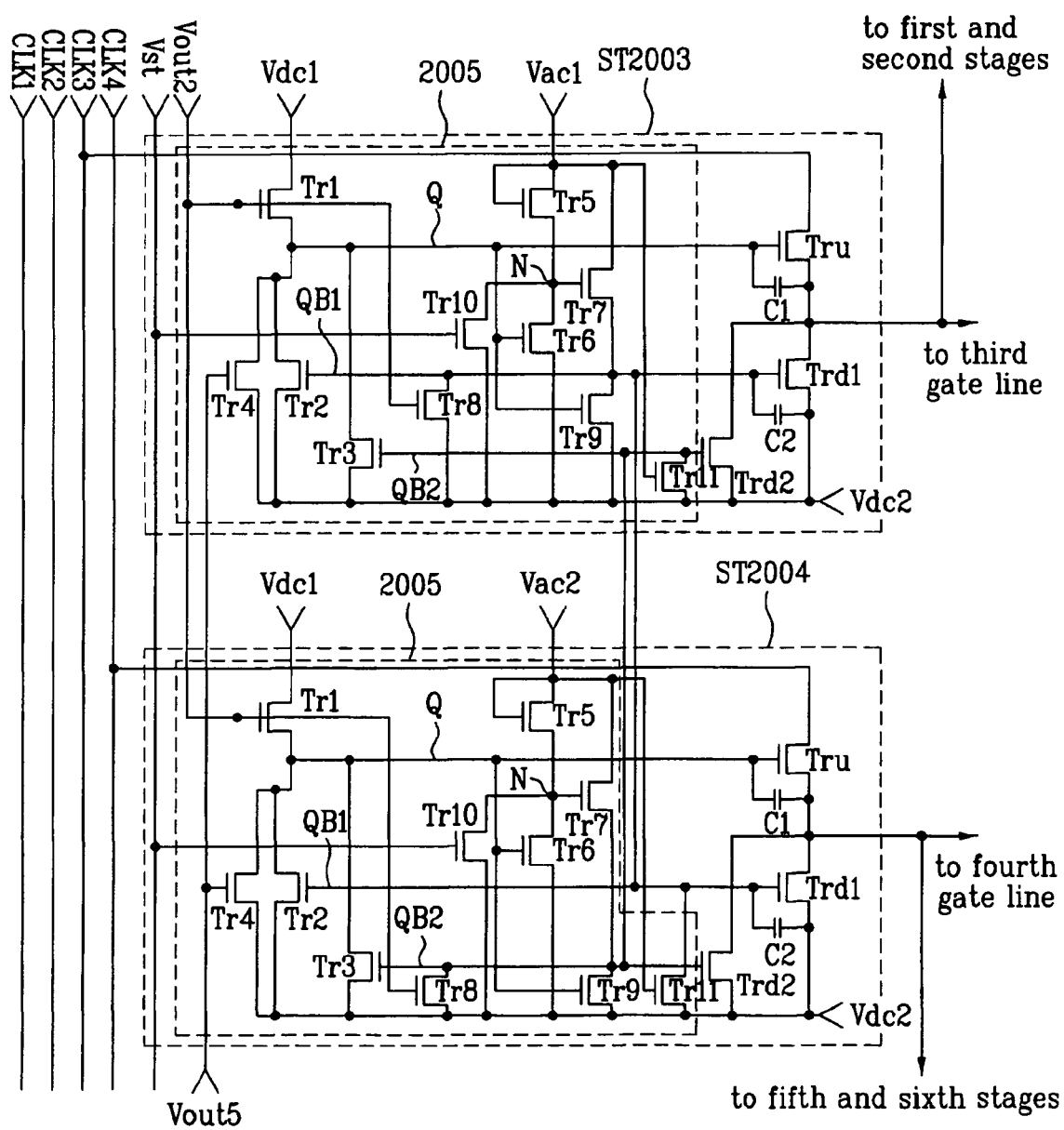
FIG. 23 is a schematic view of a second exemplary circuit configuration of node controllers for the third and fourth stages in FIG. 20 in accordance with another embodiment of the present invention.

FIG. 23 is a schematic view of a second exemplary circuit configuration of node controllers for the third and fourth stages in FIG. 20 in accordance with another embodiment of the present invention. Referring to FIG. 23, first to ninth switching devices Tr1 to Tr9, a pull-up switching device Tru, a first pull-down switching device Trd1 and a second pull-down switching device Trd2 shown in FIG. 23 are substantially similar to those shown in FIG. 22. Also, tenth and eleventh switching devices Tr10 and Tr11 shown in FIG. 23 are substantially similar to those shown in FIG. 5.

Figure 24:
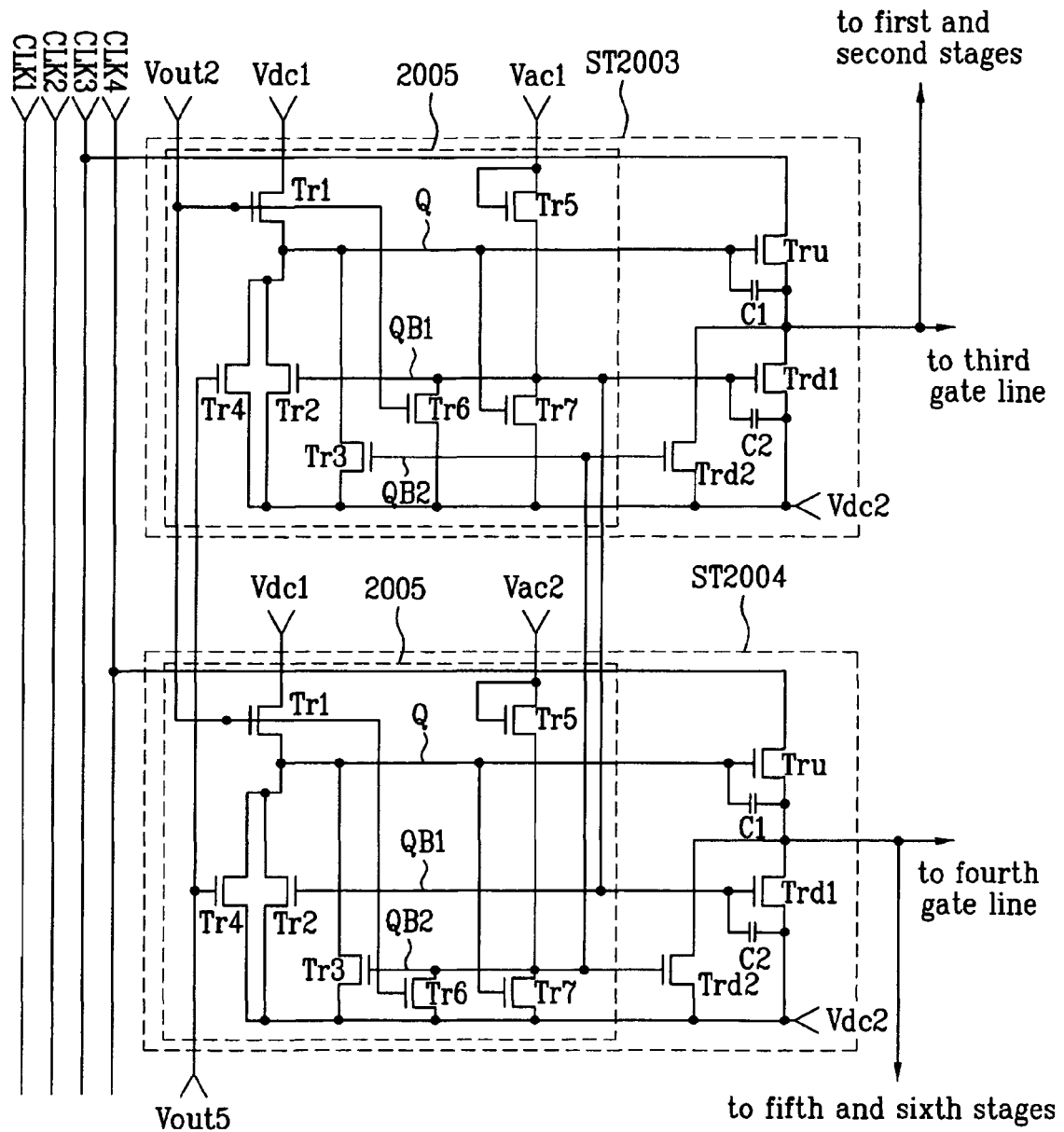
FIG. 24 is a schematic view of a third exemplary circuit configuration of node controllers for the third and fourth stages in FIG. 20 in accordance with another embodiment of the present invention.

FIG. 24 is a schematic view of a third exemplary circuit configuration of node controllers for the third and fourth stages in FIG. 20 in accordance with another embodiment of the present invention. Referring to FIG. 24, first to seventh switching devices Tr1 to Tr7, a pull-up switching device Tru, a first pull-down switching device Trd1 and a second pull-down switching device Trd2 shown in FIG. 24 are substantially similar to those shown in FIG. 6.

For example, the first and sixth switching devices Tr1 and Tr6 of the (2n−1)-th stage and the first and sixth switching devices Tr1 and Tr6 of the 2n-th stage are operated in response to the scan pulse from the (2n−2)-th stage. The first and sixth switching devices Tr1 and Tr6 of the third stage ST2003 in FIG. 24 and the first and sixth switching devices Tr1 and Tr6 of the fourth stage ST2004 in FIG. 24 are operated in response to the second scan pulse Vout2 from the second stage ST2002.

Also, the fourth switching device Tr4 of the (2n−1)-th stage and the fourth switching device Tr4 of the 2n-th stage are operated in response to the scan pulse from the (2n+1)-th stage. For example, the fourth switching device Tr4 of the third stage ST2003 in FIG. 24 and the fourth switching device Tr4 of the fourth stage ST2004 in FIG. 24 are operated in response to the fifth scan pulse Vout5 from the fifth stage ST2005.

Also, the scan pulse outputted from the pull-up switching device Tru of the (2n−1)-th stage and the OFF voltage outputted from each of the first and second pull-down switching devices Trd1 and Trd2 of the (2n−1)-th stage are supplied to the (2n−1)-th gate line, (2n−3)-th stage and (2n−2)-th stage. For example, the third scan pulse Vout3 outputted from the pull-up switching device Tru of the third stage ST2003 in FIG. 24 and the OFF voltage outputted from each of the first and second pull-down switching devices Trd1 and Trd2 of the third stage ST2003 are supplied to the third gate line, first stage ST2001 and second stage ST2002.

Also, the scan pulse outputted from the pull-up switching device Tru of the 2n-th stage and the OFF voltage outputted from each of the first and second pull-down switching devices Trd1 and Trd2 of the 2n-th stage are supplied to the 2n-th gate line, (2n+1)-th stage and (2n+2)-th stage. For example, the fourth scan pulse Vout4 outputted from the pull-up switching device Tru of the fourth stage ST2004 in FIG. 24 and the OFF voltage outputted from each of the first and second pull-down switching devices Trd1 and Trd2 of the fourth stage ST2004 are supplied to the fourth gate line, fifth stage ST2005 and sixth stage ST2006.

Figure 25:
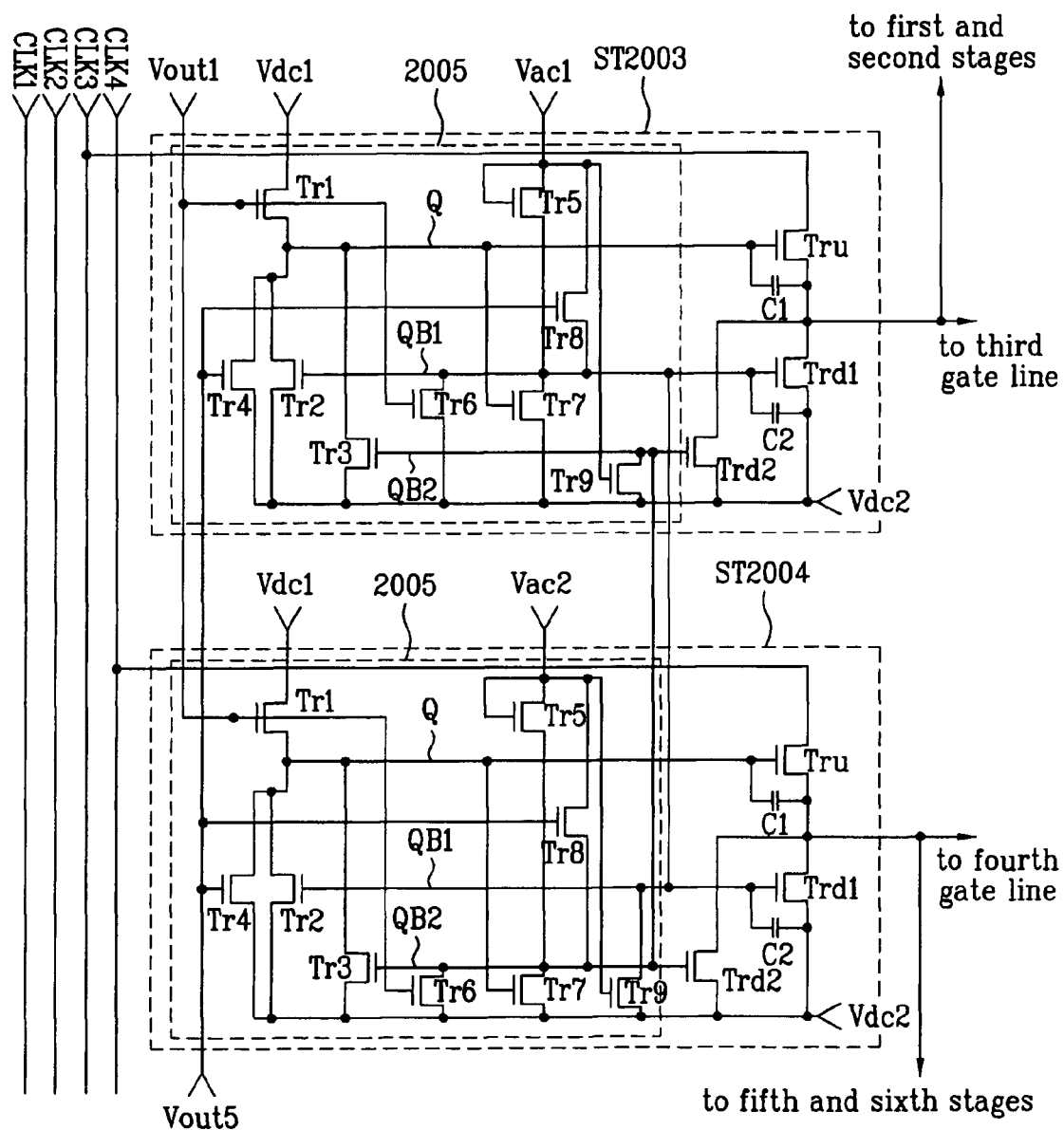
FIG. 25 is a schematic view of a fourth exemplary circuit configuration of node controllers for the third and fourth stages in FIG. 20 in accordance with another embodiment of the present invention.

FIG. 25 is a schematic view of a fourth exemplary circuit configuration of node controllers for the third and fourth stages in FIG. 20 in accordance with another embodiment of the present invention. Referring to FIG. 25, first to seventh switching devices Tr1 to Tr7, a pull-up switching device Tru, a first pull-down switching device Trd1 and a second pull-down switching device Trd2 shown in FIG. 25 are substantially similar to those shown in FIG. 24. Also, eighth and ninth switching devices Tr8 and Tr9 shown in FIG. 25 are substantially similar to those shown in FIG. 5.

For example, the eighth switching device Tr8 of the (2n−1)-th stage and the eighth switching device Tr8 of 2n-th stage are operated in response to the (2n+1)-th scan pulse from the (2n+1)-th stage. The eighth switching device Tr8 of the third stage ST2003 in FIG. 25 and the eighth switching device Tr8 of the fourth stage ST2004 in FIG. 25 are operated in response to the fifth scan pulse Vout5 from the fifth stage ST2005.

Figure 26:
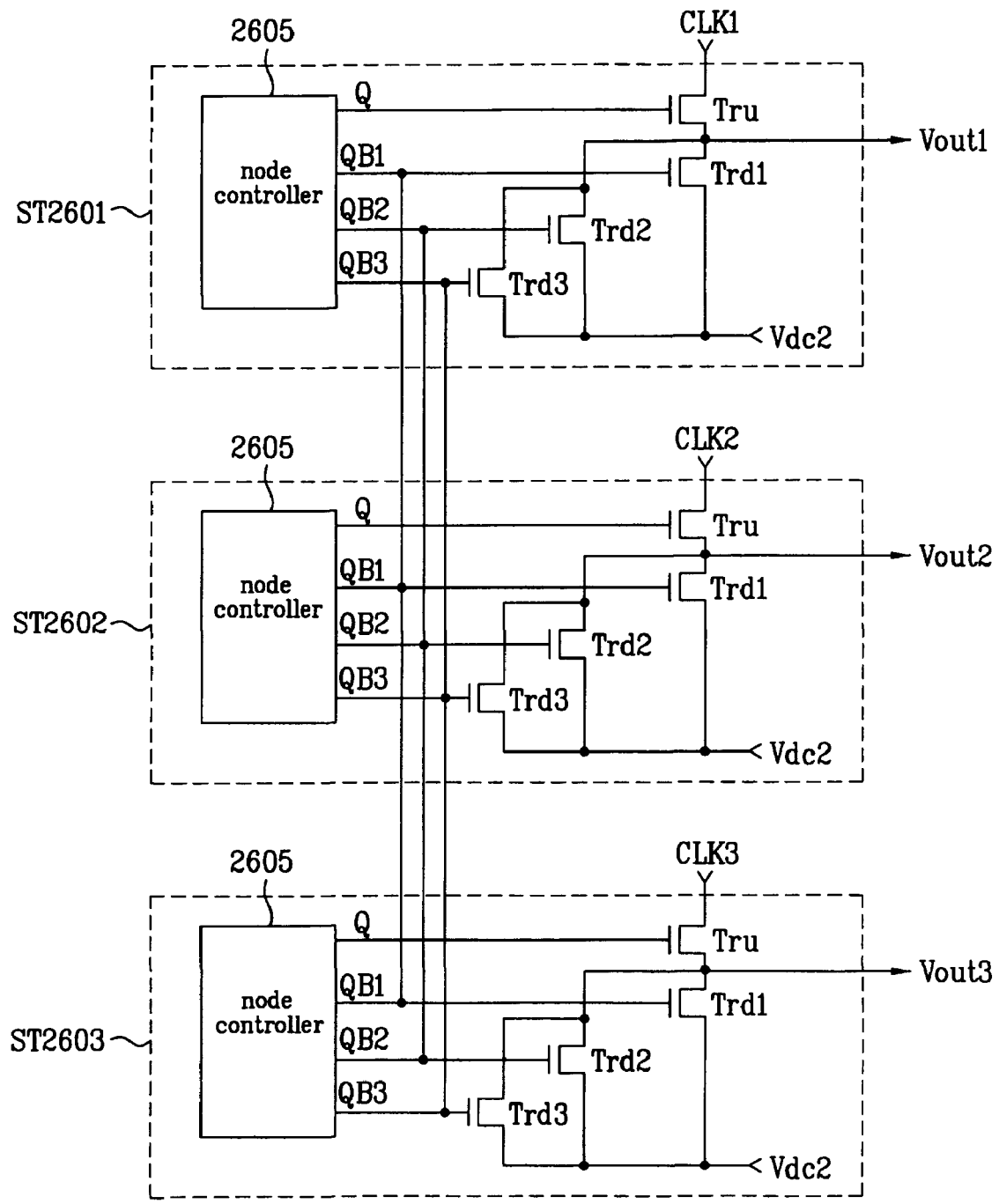
FIG. 26 is a schematic view of a fifth exemplary shift register according to another embodiment of the present invention.

FIG. 26 is a schematic view of a fifth exemplary shift register according to another embodiment of the present invention. Referring to FIG. 26, the shift register has a plurality of stages ST2601, ST2602, ST2603, . . . , the first to third stages ST2601 to ST2603. Each of the stages ST2601, ST2602, ST2603, . . . includes an enabling node Q, a pull-up switching device Tru connected to the enabling node Q, a first disabling node QB1, a first pull-down switching device Trd1 connected to the first disabling node QB1, a second disabling node QB2, a second pull-down switching device Trd2 connected to the second disabling node QB2, a third disabling node QB3, a third pull-down switching device Trd3 connected to the third disabling node QB3, and a node controller 2605. The node controller 2605 of the (2n−3)-th stage controls the charging/discharging operation of the enabling node Q and first disabling node QB1 of the (2n−3)-th stage, charging/discharging operation of the first disabling node QB1 of the (2n−2)-th stage and charging/discharging operation of the first disabling node QB1 of the (2n−1)-th stage.

Also, the node controller 2605 of the (2n−2)-th stage controls charging/discharging operation of the enabling node Q and second disabling node QB2 of the (2n−2)-th stage, charging/discharging operation of the second disabling node QB2 of the (2n−3)-th stage and charging/discharging operation of the second disabling node QB2 of the (2n−1)-th stage.

Also, the node controller 2605 of the (2n−1)-th stage controls charging/discharging operation of the enabling node Q and third disabling node QB3 of the (2n−1)-th stage, charging/discharging operation of the third disabling node QB3 of the (2n−2)-th stage and charging/discharging operation of the third disabling node QB3 of the (2n−3)-th stage.

For example, the node controller 2605 of the first stage ST2601 in FIG. 26 controls charging/discharging operation of the enabling node Q and first disabling node QB1 of the first stage ST2601, charging/discharging operation of the first disabling node QB1 of the second stage ST2602 and charging/discharging operation of the first disabling node QB1 of the third stage ST2603.

Also, the node controller 2605 of the second stage ST2602 controls charging/discharging operation of the enabling node Q and second disabling node QB2 of the second stage ST2602, charging/discharging operation of the second disabling node QB2 of the first stage ST2601 and charging/discharging operation of the second disabling node QB2 of the third stage ST2603.

Also, the node controller 2605 of the third stage ST2603 controls charging/discharging operation of the enabling node Q and third disabling node QB3 of the third stage ST2603, charging/discharging operation of the third disabling node QB3 of the first stage ST2601 and charging/discharging operation of the third disabling node QB3 of the second stage ST2602.

Hence, the three stages ST2601, ST2602 and ST2603 constitute one block and each of them is supplied with a three-phase AC voltage. Thus, in the (2n−3)-th frame, the node controller 2605 of the (2n−3)-th stage is supplied with a first AC voltage Vac1 and the node controller 2605 of each of the remaining (2n−2)-th and (2n−1)-th stages is supplied with a second AC voltage Vac2. Also, in the (2n−2)-th frame, the node controller 2605 of the (2n−2)-th stage is supplied with the first AC voltage Vac1 and the node controller 2605 of each of the remaining (2n−3)-th and (2n−1)-th stages is supplied with the second AC voltage Vac2. Also, in the (2n−1)-th frame, the node controller 2605 of the (2n−1)-th stage is supplied with the first AC voltage Vac1 and the node controller 2605 of each of the remaining (2n−3)-th and (2n−2)-th stages is supplied with the second AC voltage Vac2.

In the fifth exemplary shift register, each of the stages ST2601, ST2602, ST2603, . . . may have any one of the circuit configurations described above in reference to the first exemplary shift register.

Figure 27:
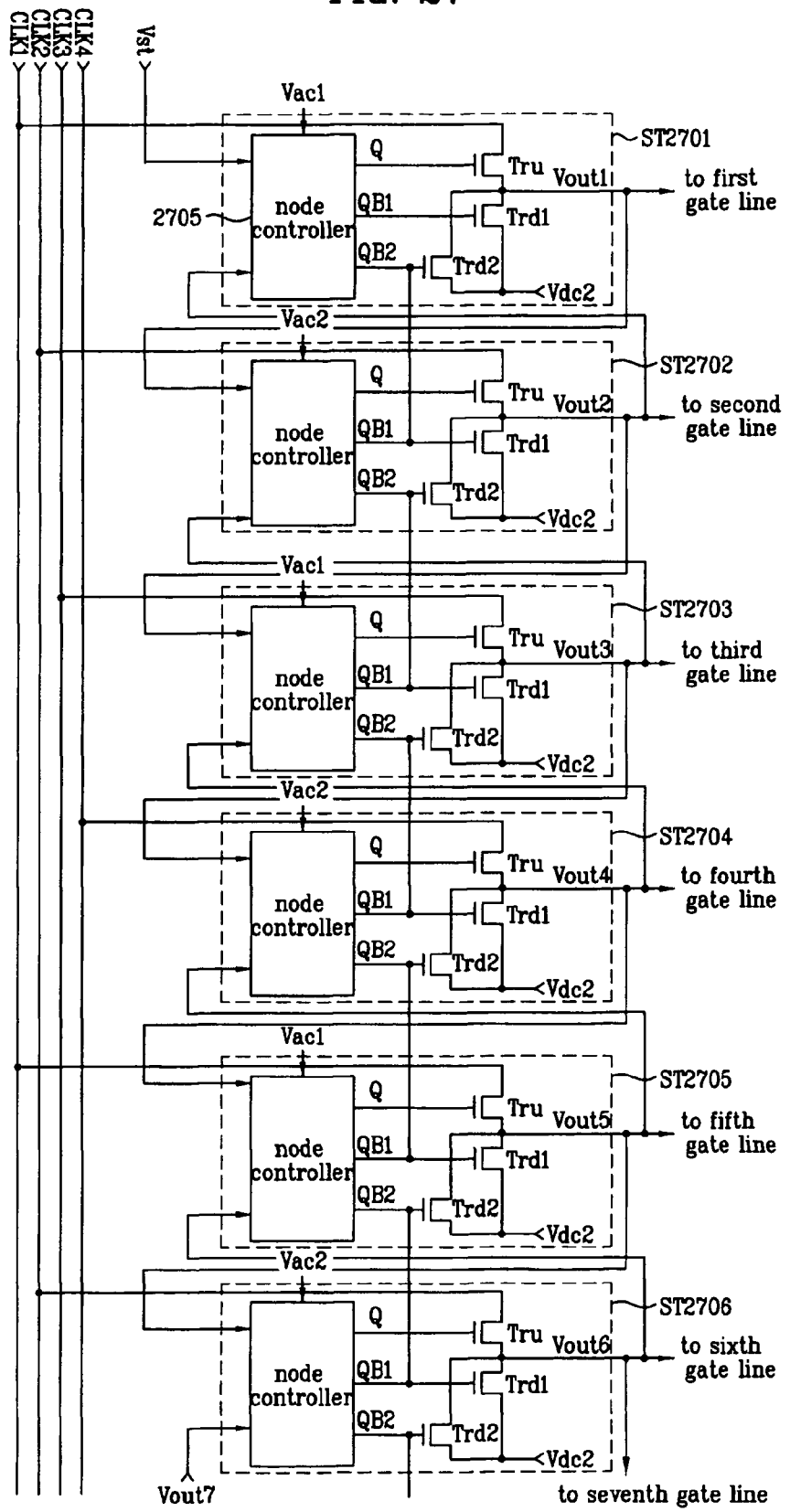
FIG. 27 is a schematic view of a sixth exemplary shift register according to another embodiment of the present invention.
Figure 28A:
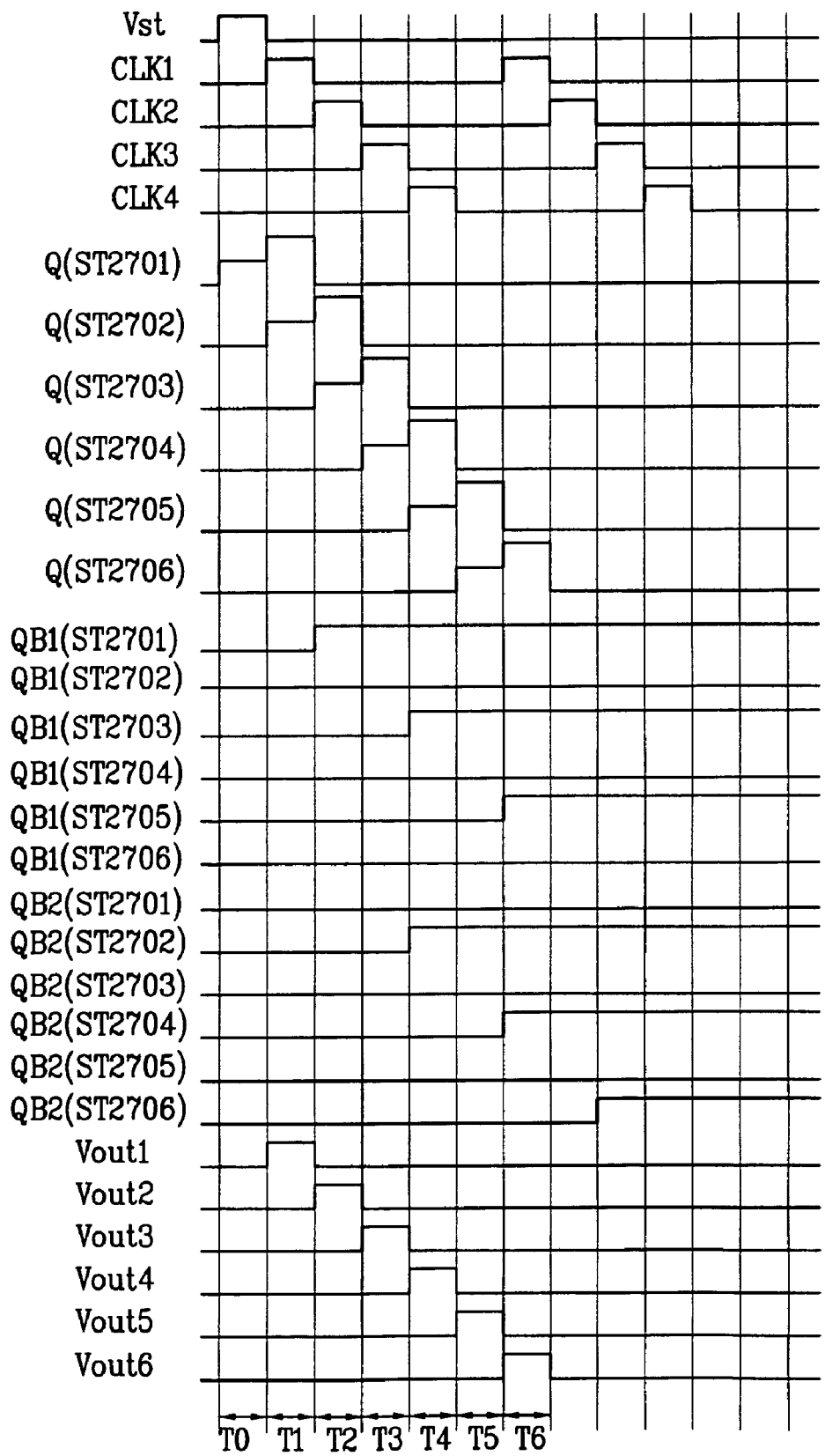
FIGS. 28A and 28B show exemplary timing diagrams of input signals into and output signals from respective stages of the shift register of FIG. 27.
Figure 28B:
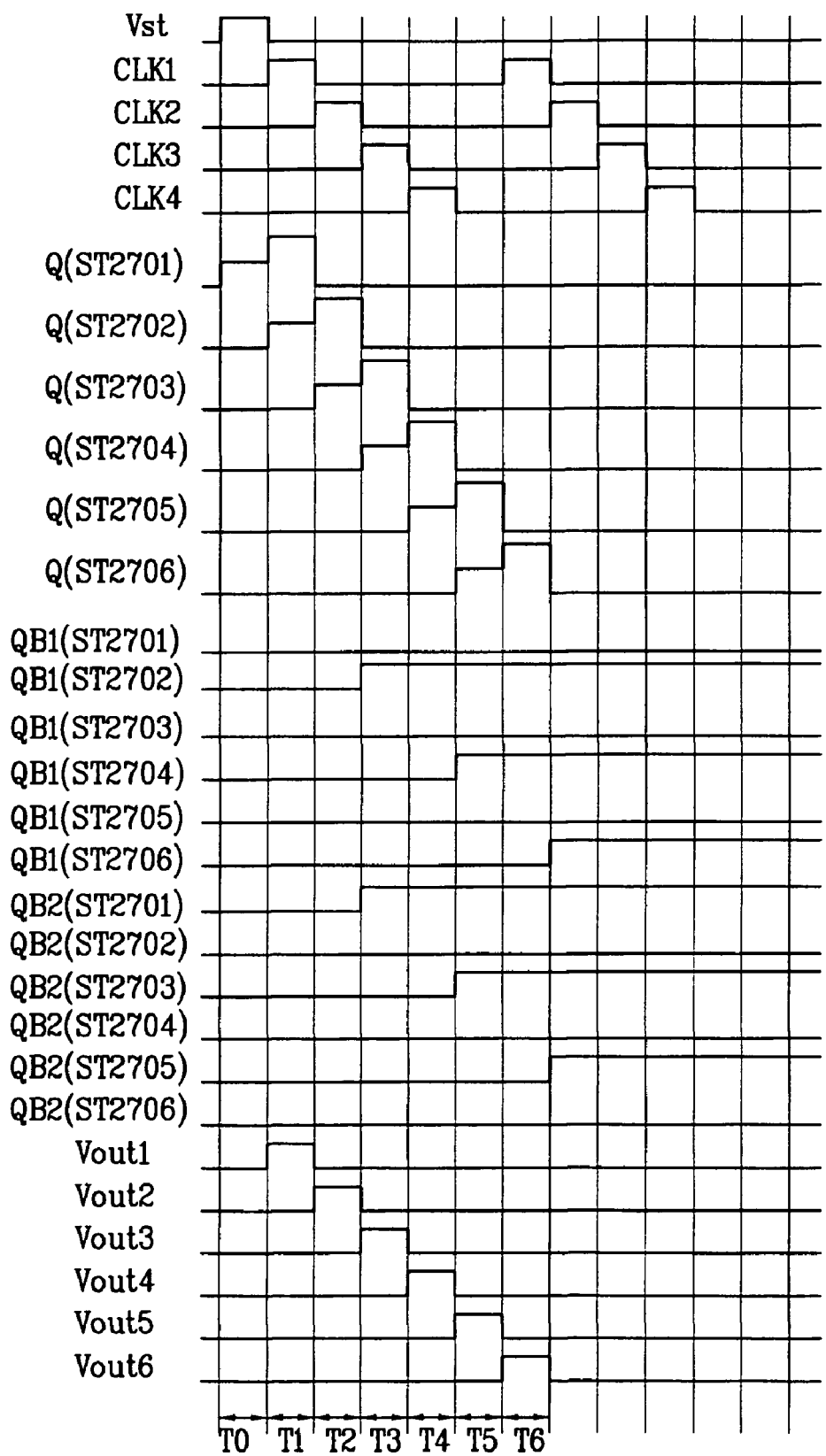

FIG. 27 is a schematic view of a sixth exemplary shift register according to another embodiment of the present invention. FIGS. 28A and 28B show exemplary timing diagrams of input signals into and output signals from respective stages of the shift register of FIG. 27. Referring to FIG. 27, the shift register has a plurality of stages ST2701, ST2702, ST2703, . . . .

Here, the configuration of each of the stages ST2701, ST2702, ST2703, . . . is substantially similar to the stages described above in reference to the first exemplary shift register, with the exception that the stages ST2701, ST2702, ST2703, . . . are connected with one another in a different manner. Therefore, a description will hereinafter be given of only the connections among the ST2701, ST2702, ST2703, . . . . Moreover, the shift register is supplied with first to fourth clock pulses CLK1 to CLK4, although it may be of course supplied with five or more clock pulses.

Here, the node controller of each of the stages ST2701, ST2702, ST2703, . . . is denoted by reference numeral 2705. The node controller 2705 of the n-th stage controls the logic stages of the enabling node Q, first disabling node QB1 and second disabling node QB2 of the n-th stage. The node controller 2705 of the n-th stage also controls the logic stage of the second disabling node QB2 of the (n−1)-th stage. The node controller 2705 of the n-th stage also controls the logic stage of the first disabling node QB1 of the (n+1)-th stage.

The first disabling nodes QB1 and second disabling nodes QB2 of the adjacent stages are electrically connected to each other. The first disabling node QB 1 of the n-th stage and the second disabling node QB2 of the (n−1)-th stage are electrically connected to each other, and the second disabling node QB2 of the n-th stage and the first disabling node QB1 of the (n+1)-th stage are electrically connected to each other.

On the other hand, there is no stage upstream from the first stage ST2701. Therefore, the node controller 2705 of the first stage ST2701 controls the logic state of the enabling node Q, first disabling node QB1 and second disabling node QB2 of the first stage ST2701 and the logic state of the first disabling node QB1 of the second stage ST2702. Each stage charges the enabling node Q thereof with the first DC voltage Vdc1 and discharges the first disabling node QB1 and second disabling node QB2 thereof with the second DC voltage Vdc2, in response to the scan pulse from the previous stage.

The n-th stage charges the enabling node Q of the n-th stage with the first DC voltage Vdc1 and discharges the first disabling node QB1 and second disabling node QB2 of the n-th stage with the second DC voltage Vdc2, in response to the (n−1)-th scan pulse from the (n−1)-th stage. Each stage discharges the enabling node Q thereof with the second DC voltage Vdc2 and charges or discharges any one of the first disabling node QB1 and second disabling node QB2 thereof, in response to the scan pulse from the next stage.

The n-th stage discharges the enabling node Q of the n-th stage with the second DC voltage Vdc2 and charges any one of the first disabling node QB1 and second disabling node QB2 of the n-th stage, in response to the (n+1)-th scan pulse from the (n+1)-th stage.

When the stages are disabled, each of the odd ones ST2701, ST2703, ST2705, . . . thereof charges or discharges the first disabling node QB1 thereof using the first AC voltage Vac1 and each of the even ones ST2702, ST2704, ST2706, . . . thereof charges or discharges the first disabling node QB1 thereof using the second AC voltage Vac2.

First, a description will be given of an operation during the period of a first frame with reference to FIG. 28A. In the first frame period, the first AC voltage Vac1 is maintained at a high state (positive polarity) and the second AC voltage Vac2 is maintained at a low state (negative polarity). In an initial period T0, the first stage ST2701 is enabled by the start pulse Vst from the timing controller. Thus, during the initial period T0, the enabling node Q of the first stage ST2701 is charged with the first DC voltage Vdc1 and the first and second disabling nodes QB1 and QB2 of the first stage ST2701 are discharged with the second DC voltage Vdc2. Hence, during the initial period T0, the pull-up switching device Tru of the first stage ST2701 is turned on and both the first and second pull-down switching devices Trd1 and Trd2 of the first stage ST2701 are turned off.

Meanwhile, because the second disabling node QB2 of the first stage ST2701 and the first disabling node QB1 of the second stage ST2702 are electrically connected to each other, they are discharged with the same voltage. For example, during the initial period T0, the first disabling node QB1 of the second stage ST2702 is also discharged with the second DC voltage Vdc2. Thus, during the initial period T0, the enabling node Q of the first stage ST2701 is charged. Also, the first and second disabling nodes QB1 and QB2 of the first stage ST2701 and the first disabling node QB1 of the second stage ST2702 are discharged.

Thereafter, in a first pulse width time T1, the first clock pulse CLK1 is supplied to the pull-up switching device Tru of the first stage ST2701. Hence, the pull-up switching device Tru outputs the first scan pulse Vout1 and supplies it to the first gate line and second stage ST2702. Accordingly, during the first pulse width time T1, the first gate line is driven and the second stage ST2702 is enabled. The enabling node Q of the second stage ST2702 is charged with the first DC voltage Vdc1 and the first and second disabling nodes QB1 and QB2 of the second stage ST2702 are discharged with the second DC voltage Vdc2. Hence, during the first pulse width time T1, the pull-up switching device Tru of the second stage ST2702 is turned on and both the first and second pull-down switching devices Trd1 and Trd2 of the second stage ST2702 are turned off.

Meanwhile, because the second disabling node QB2 of the second stage ST2702 and the first disabling node QB1 of the third stage ST2703 are electrically connected to each other, they are discharged with the same voltage. For example, during the first pulse width time T1, the first disabling node QB1 of the third stage ST2703 is also discharged with the second DC voltage Vdc2.

Thus, during the first pulse width time T1, the enabling node Q of the second stage ST2702 is charged. Also, the first and second disabling nodes QB1 and QB2 of the second stage ST2702 and the first disabling node QB1 of the third stage ST2703 are discharged. Thereafter, in a second pulse width time T2, the second clock pulse CLK2 is supplied to the pull-up switching device Tru of the second stage ST2702. Hence, the pull-up switching device Tru outputs the second scan pulse Vout2 and supplies it to the second gate line, third stage ST2703 and first stage ST2701.

Accordingly, in the second pulse width time T2, the second gate line is driven and the third stage ST2703 is enabled. Also, the first stage ST2701 is disabled. The enabling node Q and second disabling node QB2 of the first stage ST2701 are discharged with the second DC voltage Vdc2 and the first disabling node QB1 of the first stage ST2701 is charged with the first AC voltage Vac1. In other words, the first stage ST2701, which is one of the odd-numbered stages ST2701, ST2703, ST2705, . . . , is supplied with the first AC voltage Vac1, which is in the high state for the first frame period. Thus, when the first stage ST2701 is disabled, only the first disabling node QB1 thereof is maintained in its charged state.

Thus, in the second pulse width time T2, the enabling node Q of the third stage ST2703 is charged. Also, the first and second disabling nodes QB1 and QB2 of the third stage ST2703 and the first disabling node QB1 of the fourth stage ST2704 are discharged. Further, the enabling node Q and second disabling node QB2 of the first stage ST2701 are discharged and the first disabling node QB1 of the first stage ST2701 is charged. Thereafter, in a third pulse width time T3, the third clock pulse CLK3 is supplied to the pull-up switching device Tru of the third stage ST2703. Hence, the pull-up switching device Tru outputs the third scan pulse Vout3 and supplies it to the third gate line, fourth stage ST2704 and second stage ST2702.

Accordingly, during the third pulse width time T3, the third gate line is driven and the fourth stage ST2704 is enabled. Also, the second stage ST2702 is disabled. Thus, all the enabling node Q, first disabling node QB1 and second disabling node QB2 of the second stage ST2702 are discharged. In other words, the second stage ST2702, which is one of the even-numbered stages ST2702, ST2704, ST2706, . . . , is supplied with the second AC voltage Vac2, which is in the low state for the first frame period. Hence, when the second stage ST2702 is disabled, all the nodes Q, QB1 and QB2 thereof are discharged.

Thus, during the third pulse width time T3, the enabling node Q of the fourth stage ST2704 is charged. Also, the first and second disabling nodes QB1 and QB2 of the fourth stage ST2704 and the first disabling node QB1 of the fifth stage ST2705 are discharged. Further, all the nodes Q, QB1 and QB2 of the second stage ST2702 are discharged. Thereafter, in a fourth pulse width time T4, the fourth clock pulse CLK4 is supplied to the pull-up switching device Tru of the fourth stage ST2704. Hence, the pull-up switching device Tru outputs the fourth scan pulse Vout4 and supplies it to the fourth gate line, fifth stage ST2705 and third stage ST2703. Accordingly, during the fourth pulse width time T4, the fourth gate line is driven and the fifth stage ST2705 is enabled. Also, the third stage ST2703 is disabled. The enabling node Q and second disabling node QB2 of the third stage ST2703 are discharged and the first disabling node QB1 of the third stage ST2703 is charged. In other words, the third stage ST2703, which is one of the odd-numbered stages ST2701, ST2703, ST2705, . . . , is supplied with the first AC voltage Vac1, which is in the high state for the first frame period. Thus, when the third stage ST2703 is disabled, only the first disabling node QB1 thereof is maintained in its charged state.

During the fourth pulse width time T4, as the first disabling node QB1 of the third stage ST2703 is changed from its discharged state to charged state, the second disabling node QB2 of the second stage ST2702, connected to the first disabling node QB1 of the third stage ST2703, is also changed from its discharged state to charged state. Thus, during the fourth pulse width time T4, the enabling node Q of the fifth stage ST2705 is charged. Also, the first and second disabling nodes QB1 and QB2 of the fifth stage ST2705 and the first disabling node QB1 of the sixth stage ST2706 are discharged. Further, the first disabling node QB1 of the third stage ST2703 and the second disabling node QB2 of the second stage ST2702 are charged.

Hence, in the first frame period, each of the odd-numbered stages ST2701, ST2703, ST2705, . . . performs the disabling operation by charging the first disabling node QB1 thereof. Also, in the first frame period, each of the even-numbered stages ST2702, ST2704, ST2706, . . . performs the disabling operation by discharging all the nodes Q, QB1 and QB2 thereof. The second disabling node QB2 of each of the even-numbered stages ST2702, ST2704, ST2706, . . . is changed from its discharged state to charged state by the disabling operation of the odd-numbered stage ST2703, ST2705, . . . just downstream from the corresponding even-numbered stage.

Next, a description will be given of an operation during the period of a second frame with reference to FIG. 28B. In the second frame period, the first AC voltage Vac1 is maintained at a low state (negative polarity) and the second AC voltage Vac2 is maintained at a high state (positive polarity). During an initial period T0, the first stage ST2701 is enabled by the start pulse Vst from the timing controller. Thus, during the initial period T0, the enabling node Q of the first stage ST2701 is charged with the first DC voltage Vdc1 and the first and second disabling nodes QB1 and QB2 of the first stage ST2701 are discharged with the second DC voltage Vdc2.

Hence, during the initial period T0, the pull-up switching device Tru of the first stage ST2701 is turned on and both the first and second pull-down switching devices Trd1 and Trd2 of the first stage ST2701 are turned off. Meanwhile, because the second disabling node QB2 of the first stage ST2701 and the first disabling node QB1 of the second stage ST2702 are electrically connected to each other, they are discharged with the same voltage. For example, during the initial period T0, the first disabling node QB1 of the second stage ST2702 is also discharged with the second DC voltage Vdc2.

Thus, during the initial period T0, the enabling node Q of the first stage ST2701 is charged. Also, the first and second disabling nodes QB1 and QB2 of the first stage ST2701 and the first disabling node QB1 of the second stage ST2702 are discharged.

Thereafter, in a first pulse width time T1, the first clock pulse CLK1 is supplied to the pull-up switching device Tru of the first stage ST2701. Hence, the pull-up switching device Tru outputs the first scan pulse Vout1 and supplies it to the first gate line and second stage ST2702.

Accordingly, during the first pulse width time T1, the first gate line is driven and the second stage ST2702 is enabled.

The enabling node Q of the second stage ST2702 is charged with the first DC voltage Vdc1 and the first and second disabling nodes QB1 and QB2 of the second stage ST2702 are discharged with the second DC voltage Vdc2.

Hence, during the first pulse width time T1, the pull-up switching device Tru of the second stage ST2702 is turned on and both the first and second pull-down switching devices Trd1 and Trd2 of the second stage ST2702 are turned off.

Meanwhile, because the second disabling node QB2 of the second stage ST2702 and the first disabling node QB1 of the third stage ST2703 are electrically connected to each other, they are discharged with the same voltage. For example, during the first pulse width time T1, the first disabling node QB1 of the third stage ST2703 is also discharged with the second DC voltage Vdc2.

Thus, during the first pulse width time T1, the enabling node Q of the second stage ST2702 is charged. Also, the first and second disabling nodes QB1 and QB2 of the second stage ST2702 and the first disabling node QB1 of the third stage ST2703 are discharged.

Thereafter, in a second pulse width time T2, the second clock pulse CLK2 is supplied to the pull-up switching device Tru of the second stage ST2702. Hence, the pull-up switching device Tru outputs the second scan pulse Vout2 and supplies it to the second gate line, third stage ST2703 and first stage ST2701.

Accordingly, in the second pulse width time T2, the second gate line is driven and the third stage ST2703 is enabled. Also, the first stage ST2701 is disabled. Thus, all the nodes Q, QB1 and QB2 of the first stage ST2701 are discharged. In other words, the first stage ST2701, which is one of the odd-numbered stages ST2701, ST2703, ST2705, . . . , is supplied with the first AC voltage Vac1, which is in the low state for the second frame period. Thus, when the first stage ST2701 is disabled, all the nodes Q, QB1 and QB2 thereof are discharged.

Thus, in the second pulse width time T2, the enabling node Q of the third stage ST2703 is charged. Also, the first and second disabling nodes QB1 and QB2 of the third stage ST2703 and the first disabling node QB1 of the fourth stage ST2704 are discharged. Further, all the nodes Q, QB1 and QB2 of the first stage ST2701 are discharged.

Thereafter, in a third pulse width time T3, the third clock pulse CLK3 is supplied to the pull-up switching device Tru of the third stage ST2703. Hence, the pull-up switching device Tru outputs the third scan pulse Vout3 and supplies it to the third gate line, fourth stage ST2704 and second stage ST2702.

Accordingly, during the third pulse width time T3, the third gate line is driven and the fourth stage ST2704 is enabled. Also, the second stage ST2702 is disabled. The enabling node Q and second disabling node QB2 of the second stage ST2702 are discharged and the first disabling node QB1 of the second stage ST2702 is charged. In other words, the second stage ST2702, which is one of the even-numbered stages ST2702, ST2704, ST2706, . . . , is supplied with the second AC voltage Vac2, which is in the high state for the second frame period. Hence, when the second stage ST2702 is disabled, only the first disabling node QB1 thereof is charged.

During the third pulse width time T3, as the first disabling node QB1 of the second stage ST2702 is changed from its discharged state to charged state, the second disabling node QB2 of the first stage ST2701, connected to the first disabling node QB1 of the second stage ST2702, is also changed from its discharged state to charged state.

Thus, during the third pulse width time T3, the enabling node Q of the fourth stage ST2704 is charged. Also, the first and second disabling nodes QB1 and QB2 of the fourth stage ST2704 and the first disabling node QB1 of the fifth stage ST2705 are discharged. Further, the first disabling node QB1 of the second stage ST2702 and the second disabling node QB2 of the first stage ST2701 are charged.

Thereafter, in a fourth pulse width time T4, the fourth clock pulse CLK4 is supplied to the pull-up switching device Tru of the fourth stage ST2704. Hence, the pull-up switching device Tru outputs the fourth scan pulse Vout4 and supplies it to the fourth gate line, fifth stage ST2705 and third stage ST2703.

Accordingly, during the fourth pulse width time T4, the fourth gate line is driven and the fifth stage ST2705 is enabled. Also, the third stage ST2703 is disabled. Thus, all the enabling node Q, first disabling node QB1 and second disabling node QB2 of the third stage ST2703 are discharged. In other words, the third stage ST2703, which is one of the odd-numbered stages ST2701, ST2703, ST2705, . . . , is supplied with the first AC voltage Vac1, which is in the low state for the second frame period. Thus, when the third stage ST2703 is disabled, all the nodes Q, QB1 and QB2 thereof are discharged.

Thus, during the fourth pulse width time T4, the enabling node Q of the fifth stage ST2705 is charged. Also, the first and second disabling nodes QB1 and QB2 of the fifth stage ST2705 and the first disabling node QB1 of the sixth stage ST2706 are discharged. Further, all the nodes Q, QB1 and QB2 of the third stage ST2703 are discharged.

Hence, in the second frame period, each of the even-numbered stages ST2702, ST2704, ST2706, . . . performs the disabling operation by charging the first disabling node QB1 thereof.

Also, in the second frame period, each of the odd-numbered stages ST2701, ST2703, ST2705, . . . performs the disabling operation by discharging all the nodes Q, QB1 and QB2 thereof. The second disabling node QB2 of each of the odd-numbered stages ST2701, ST2703, ST2705, . . . is changed from its discharged state to charged state by the disabling operation of the even-numbered stage ST2702, ST2704, ST2706 . . . just downstream from the corresponding odd-numbered stage.

A detailed description will hereinafter be given of the configuration of the node controller 2705 of each stage.

Figure 29A:
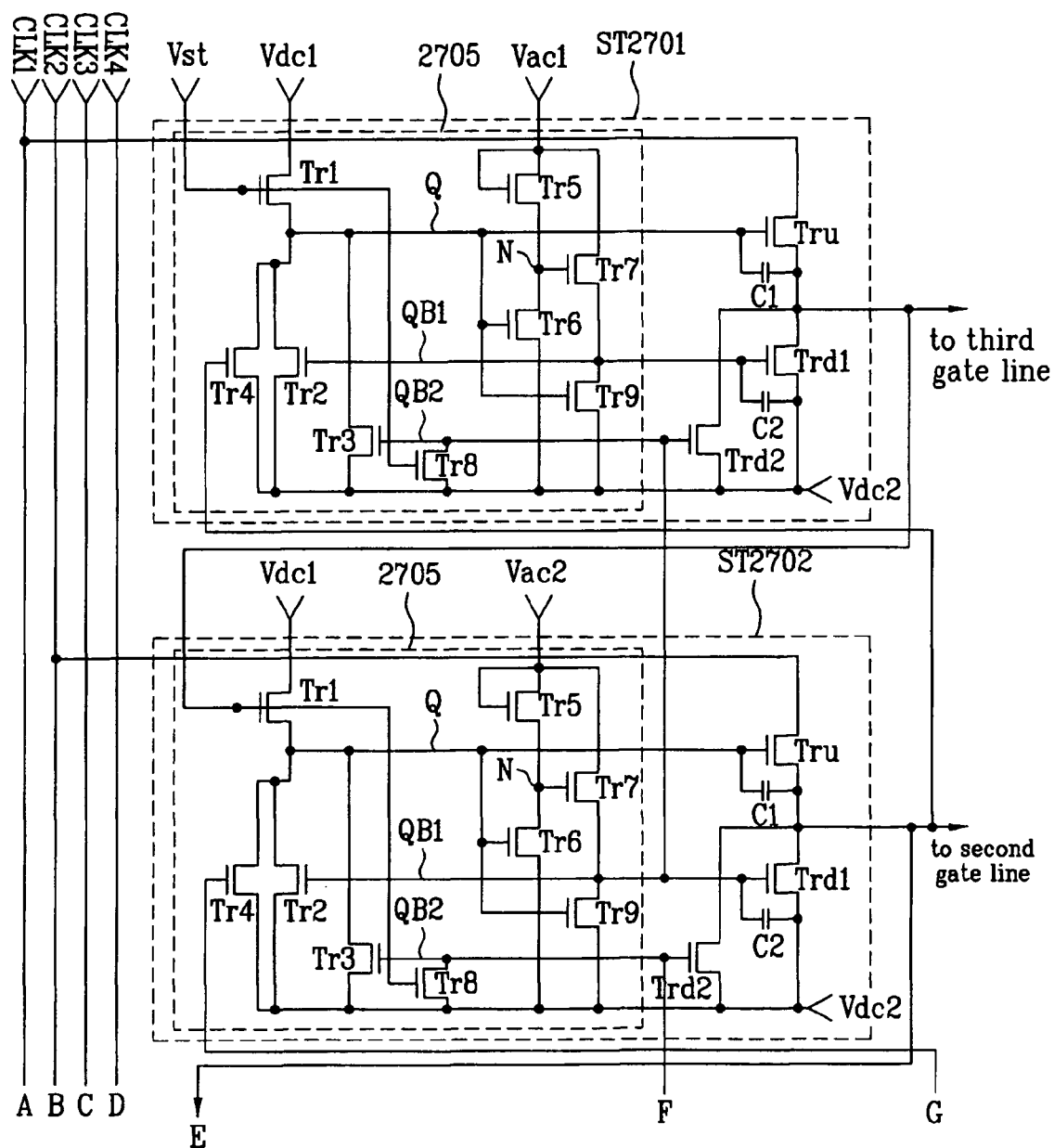
FIG. 29A is a schematic view of a first exemplary circuit configuration of node controllers for the first to fourth stages in FIG. 27 in accordance with an embodiment of the present invention.
Figure 29B:
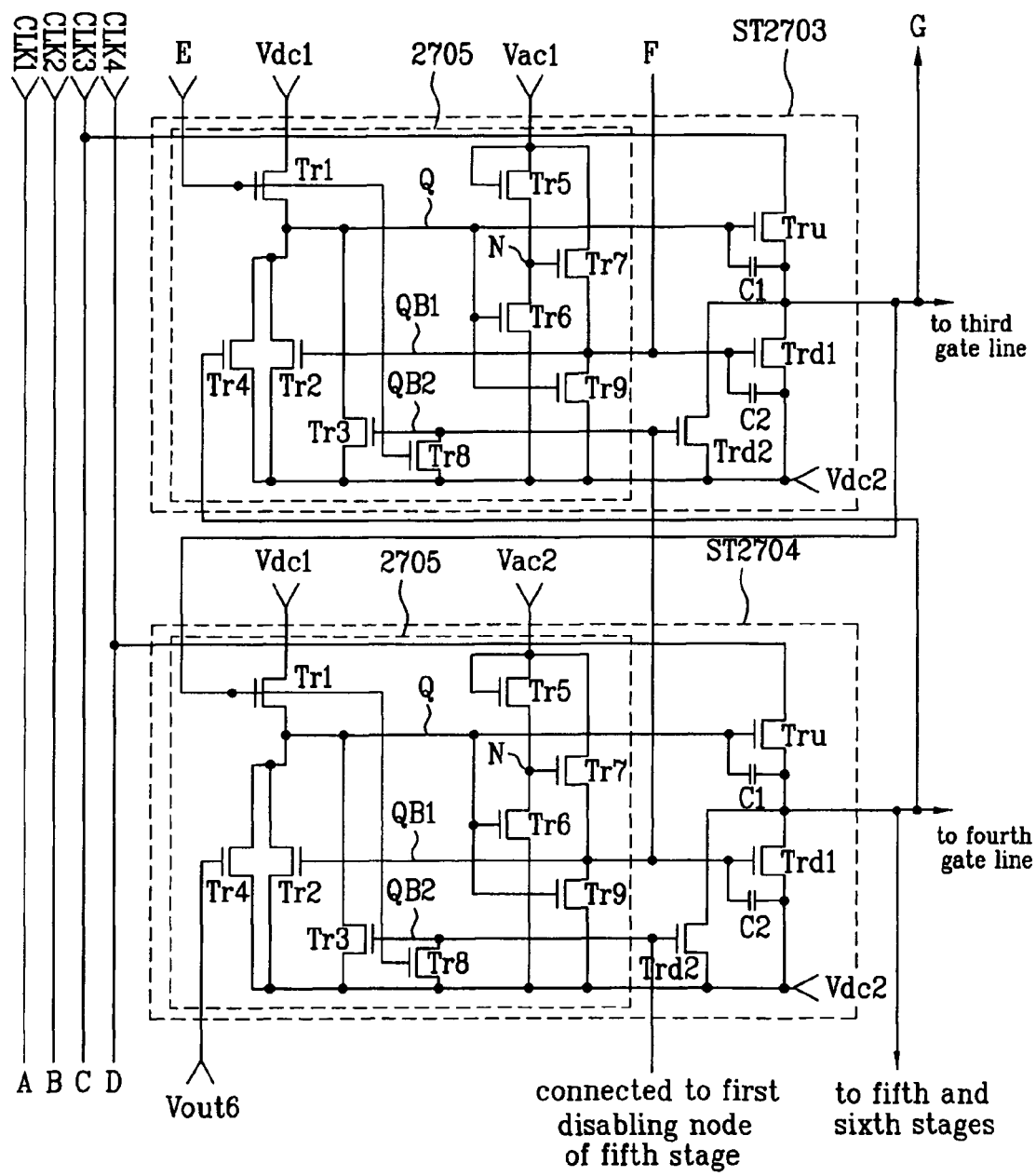
FIG. 29B is a schematic view of a second exemplary circuit configuration of node controllers for the first to fourth stages in FIG. 27 in accordance with an embodiment of the present invention.

FIGS. 29A and 29B are circuit diagrams showing the circuit configurations of one embodiment of the node controllers of the first to fourth stages in FIG. 27. The node controller 2705 of each stage includes first to ninth switching devices Tr1 to Tr9, as shown in FIGS. 29A and 29B. The first switching device Tr1 of the n-th stage is turned on or off according to the logic state of the scan pulse from the (n−1)-th stage, and supplies the first DC voltage Vdc1 to the enabling node Q of the n-th stage when being turned on.

For example, the first switching device Tr1 of the third stage ST2703 in FIG. 29B is turned on or off according to the logic state of the second scan pulse Vout2 from the second stage ST2702, and supplies the first DC voltage Vdc1 to the enabling node Q of the third stage ST2703 when being turned on. The first switching device Tr1 of the third stage ST203 has a gate terminal connected to the output terminal of the second stage ST2702, a drain terminal connected to a power supply line which transfers the first DC voltage Vdc1, and a source terminal connected to the enabling node Q of the third stage ST2703.

The second switching device Tr2 of the n-th stage is turned on or off according to the logic state of a signal supplied to the first disabling node QB1 of the n-th stage, and supplies the second DC voltage Vdc2 to the enabling node Q of the n-th stage when being turned on. For example, the second switching device Tr2 of the third stage ST2703 in FIG. 29B is turned on or off according to the logic state of a signal supplied to the first disabling node QB1 of the third stage ST2703, and supplies the second DC voltage Vdc2 to the enabling node Q of the third stage ST2703 when being turned on.

The second switching device Tr2 of the third stage ST2703 has a gate terminal connected to the first disabling node QB1 of the third stage ST2703, a drain terminal connected to the enabling node Q of the third stage ST2703, and a source terminal connected to a power supply line which transfers the second DC voltage Vdc2.

The third switching device Tr3 of the n-th stage is turned on or off according to the logic state of a signal supplied to the second disabling node QB2 of the n-th stage, and supplies the second DC voltage Vdc2 to the enabling node Q of the n-th stage when being turned on. For example, the third switching device Tr3 of the third stage ST2703 in FIG. 29B is turned on or off according to the logic state of a signal supplied to the second disabling node QB2 of the third stage ST2703, and supplies the second DC voltage Vdc2 to the enabling node Q of the third stage ST2703 when being turned on.

The third switching device Tr3 of the third stage ST2703 has a gate terminal connected to the second disabling node QB2 of the third stage ST2703, a drain terminal connected to the enabling node Q of the third stage ST2703, and a source terminal connected to the power supply line which transfers the second DC voltage Vdc2.

The fourth switching device Tr4 of the n-th stage is turned on or off according to the logic state of the scan pulse from the (n+1)-th stage, and supplies the second DC voltage Vdc2 to the enabling node Q of the n-th stage when being turned on. For example, the fourth switching device Tr4 of the third stage ST2703 in FIG. 29B is turned on or off according to the logic state of the fourth scan pulse Vout4 from the fourth stage ST2704, and supplies the second DC voltage Vdc2 to the enabling node Q of the third stage ST2703 when being turned on.

The fourth switching device Tr4 of the third stage ST2703 has a gate terminal connected to the output terminal of the fourth stage ST2704, a drain terminal connected to the enabling node Q of the third stage ST2703, and a source terminal connected to the power supply line which transfers the second DC voltage Vdc2.

The fifth switching device Tr5 of the n-th stage is turned on or off according to the logic state of the first AC voltage Vac1 (or second AC voltage Vac2), and supplies the first AC voltage Vac1 (or second AC voltage Vac2) to a common node N of the n-th stage when being turned on. For example, the fifth switching device Tr5 of the third stage ST2703 in FIG. 29B is turned on or off according to the logic state of the first AC voltage Vac1, and supplies the first AC voltage Vac1 to the common node N of the third stage ST2703 when being turned on. The fifth switching device Tr5 of the third stage ST2703 has a gate terminal and drain terminal connected in common to a power supply line which transfers the first AC voltage Vac1, and a source terminal connected to the common node N of the third stage ST2703.

The sixth switching device Tr6 of the n-th stage is turned on or off according to the logic state of a signal supplied to the enabling node Q of the n-th stage, and supplies the second DC voltage Vdc2 to the common node N of the n-th stage when being turned on. For example, the sixth switching device Tr6 of the third stage ST2703 in FIG. 29B is turned on or off according to the logic state of a signal supplied to the enabling node Q of the third stage ST2703, and supplies the second DC voltage Vdc2 to the common node N of the third stage ST2703 when being turned on. The sixth switching device Tr6 of the third stage ST2703 has a gate terminal connected to the enabling node Q of the third stage ST2703, a drain terminal connected to the common node N of the third stage ST2703, and a source terminal connected to the power supply line which transfers the second DC voltage Vdc2.

The seventh switching device Tr7 of the n-th stage is turned on or off according to the logic state of a signal supplied to the common node N of the n-th stage, and supplies the first AC voltage Vac1 (or second AC voltage Vac2) to the first disabling node QB1 of the n-th stage when being turned on. For example, the seventh switching device Tr7 of the third stage ST2703 in FIG. 29B is turned on or off according to the logic state of a signal supplied to the common node N of the third stage ST2703, and supplies the first AC voltage Vac1 to the first disabling node QB1 of the third stage ST2703 when being turned on. The seventh switching device Tr7 of the third stage ST2703 has a gate terminal connected to the common node N of the third stage ST2703, a drain terminal connected to the power supply line which transfers the first AC voltage Vac1, and a source terminal connected to the first disabling node QB1 of the third stage ST2703.

The eighth switching device Tr8 of the n-th stage is turned on or off according to the logic state of the scan pulse from the (n−1)-th stage, and supplies the second DC voltage Vdc2 to the second disabling node QB2 of the n-th stage when being turned on.

For example, the eighth switching device Tr8 of the third stage ST2703 in FIG. 29B is turned on or off according to the logic state of the second scan pulse Vout2 from the second stage ST2702, and supplies the second DC voltage Vdc2 to the second disabling node QB2 of the third stage ST2703 when being turned on.

The eighth switching device Tr8 of the third stage ST2703 has a gate terminal connected to the output terminal of the second stage ST2702, a drain terminal connected to the second disabling node QB2 of the third stage ST2703, and a source terminal connected to the power supply line which transfers the second DC voltage Vdc2.

The ninth switching device Tr9 of the n-th stage is turned on or off according to the logic state of a signal supplied to the enabling node Q of the n-th stage, and supplies the second DC voltage Vdc2 to the first disabling node QB1 of the n-th stage when being turned on.

For example, the ninth switching device Tr9 of the third stage ST2703 in FIG. 29B is turned on or off according to the logic state of a signal supplied to the enabling node Q of the third stage ST2703, and supplies the second DC voltage Vdc2 to the first disabling node QB1 of the third stage ST2703 when being turned on.

The ninth switching device Tr9 of the third stage ST2703 has a gate terminal connected to the enabling node Q of the third stage ST2703, a drain terminal connected to the first disabling node QB1 of the third stage ST2703, and a source terminal connected to the power supply line which transfers the second DC voltage Vdc2.

On the other hand, there is no stage upstream from the first stage ST2701. Therefore, the first and eighth switching devices Tr1 and Tr8 of the first stage ST2701 are turned on or off in response to the start pulse Vst supplied from the timing controller.

The fifth switching device Tr5 of each of the odd-numbered stages ST2701, ST2703, ST2705, . . . is supplied with the first AC voltage Vac1, and the fifth switching device Tr5 of each of the even-numbered stages ST2702, ST2704, ST2706, . . . is supplied with the second AC voltage Vac2.

The operation of the shift register having the stages with the above-stated circuit configurations will hereinafter be described. First, a description will be given of an operation in the first frame period with reference to FIGS. 28A, 29A and 29B. In the first frame period, the first AC voltage Vac1 is maintained at the high state and the second AC voltage Vac2 is maintained at the low state. The clock pulses, the start pulse Vst and the scan pulses are in the high state unless indicated otherwise in the following description to be in the low state.

During the initial period T0, only the start pulse Vst outputted from the timing controller is maintained at the high state and the clock pulses are maintained at the low state, as shown in FIG. 28A. The start pulse Vst outputted from the timing controller is inputted to the first stage ST2701. The start pulse Vst is supplied to the gate terminals of the first switching device Tr1 and eighth switching device Tr8 of the first stage ST2701.

Hence, the first and eighth switching devices Tr1 and Tr8 are turned on and the first DC voltage Vdc1 is applied to the enabling node Q through the turned-on first switching device Tr1. Accordingly, the enabling node Q is charged, thereby causing the pull-up switching device Tru, sixth switching device Tr6 and ninth switching device Tr9, the gate terminals of which are connected to the charged enabling node Q, to be turned on.

Then, the second DC voltage Vdc2 is supplied to the first disabling node QB1 through the turned-on ninth switching device Tr9, and the second DC voltage Vdc2 is supplied to the second disabling node QB2 through the turned-on eighth switching device Tr8. Accordingly, the first and second disabling nodes QB1 and QB2 of the first stage ST2701 are discharged by the second DC voltage Vdc2. Hence, the second switching device Tr2 and first pull-down switching device Trd1, the gate terminals of which are connected to the first disabling node QB1, are turned off, and the third switching device Tr3 and second pull-down switching device Trd2, the gate terminals of which are connected to the second disabling node QB2, are turned off.

Meanwhile, because the first AC voltage Vac1 is maintained at the high state for the first frame period, the fifth switching device Tr5 of the first stage ST2701, which is supplied with the first AC voltage Vac1, is kept turned on for the first frame period. The first AC voltage Vac1 is supplied to the common node N of the first stage ST2701 through the turned-on fifth switching device Tr5. The second DC voltage Vdc2, outputted through the turned-on sixth switching device Tr6, is also supplied to the common node N of the first stage ST2701. For example, the first AC voltage Vac1 of the high state and the second DC voltage Vdc2 of the low state are simultaneously supplied to the common node N of the first stage ST2701.

Here, the sixth switching device Tr6 which supplies the second DC voltage Vdc2 has a channel width wider than that of the fifth switching device Tr5 which supplies the first AC voltage Vac1. In this regard, the common node N of the first stage ST2701 is maintained at the second DC voltage Vdc2. Accordingly, the common node N is discharged, thus turning off the seventh switching device Tr7 of the first stage ST2701 whose gate terminal is connected to the discharged common node N. Hence, the first stage ST2701 charges the enabling node Q thereof and discharges the first and second disabling nodes QB1 and QB2 thereof, in response to the start pulse Vst. The first stage ST2701 is enabled.

Here, because the second disabling node QB2 of the first stage ST2701 and the first disabling node QB1 of the second stage ST2702 are connected to each other, the first disabling node QB1 of the second stage ST2702 is also discharged with the second DC voltage Vdc2 during the initial period T0.

Next, a description will be given of an operation during the first pulse width time T1. During the first pulse width time T1, only the first clock pulse CLK1 is driven into the high state, and the start pulse Vst and the remaining clock pulses assume the low state, as shown in FIG. 28A. Here, the enabling node Q of the first stage ST2701 is kept charged by the first DC voltage Vdc1, applied thereto during the initial period T0, so that the pull-up switching device Tru of the first stage ST2701 remains turned on.

When the first clock pulse CLK1 is applied to the drain terminal of the turned-on pull-up switching device Tru, the first DC voltage Vdc1 charged at the enabling node Q of the first stage ST2701 is amplified by bootstrapping. Hence, the first clock pulse CLK1 applied to the drain terminal of the pull-up switching device Tru of the first stage ST2701 is stably outputted through the source terminal of the pull-up switching device Tru. The outputted first clock pulse CLK1 is applied to the first gate line to function as the first scan pulse Vout1 to drive the first gate line.

During the first pulse width time T1, the first scan pulse Vout1 outputted from the first stage ST2701 is also inputted to the second stage ST2702. For example, as shown in FIG. 29A, the first scan pulse Vout1 is inputted to the gate terminals of the first and eighth switching devices Tr1 and Tr8 of the second stage ST2702. Hence, the first and eighth switching devices Tr1 and Tr8 are turned on and the first DC voltage Vdc1 is applied to the enabling node Q of the second stage ST2702 through the turned-on first switching device Tr1. Accordingly, the enabling node Q is charged, thereby causing the pull-up switching device Tru, sixth switching device Tr6 and ninth switching device Tr9, the gate terminals of which are connected to the charged enabling node Q, to be turned on.

Then, the second DC voltage Vdc2 is supplied to the first disabling node QB1 through the turned-on ninth switching device Tr9, and the second DC voltage Vdc2 is supplied to the second disabling node QB2 through the turned-on eighth switching device Tr8. Accordingly, the first and second disabling nodes QB1 and QB2 of the second stage ST2702 are discharged by the second DC voltage Vdc2. Hence, the second switching device Tr2 and first pull-down switching device Trd1, the gate terminals of which are connected to the first disabling node QB1, are turned off, and the third switching device Tr3 and second pull-down switching device Trd2, the gate terminals of which are connected to the second disabling node QB2, are turned off.

On the other hand, because the second AC voltage Vac2 is maintained at the low state for the first frame period, the fifth switching device Tr5 of the second stage ST2702, which is supplied with the second AC voltage Vac2, remains OFF for the first frame period. The second DC voltage Vdc2, outputted through the turned-on sixth switching device Tr6, is supplied to the common node N of the second stage ST2702. Accordingly, the common node N of the second stage ST2702 is discharged by the second DC voltage Vdc2. Hence, the seventh switching device Tr7 of the second stage ST2702, the gate terminal of which is connected to the discharged common node N, is turned off. Hence, during the first pulse width time T1, the second stage ST2702 charges the enabling node Q thereof and discharges the first and second disabling node QB1 and QB2 thereof, in response to the first scan pulse Vout1. Because the second disabling node QB2 of the second stage ST2702 and the first disabling node QB1 of the third stage ST2703 are connected to each other, the first disabling node QB1 of the third stage ST2703 is also discharged with the second DC voltage Vdc2 during the first pulse width time T1.

During the second pulse width time T2, only the second clock pulse CLK2 is maintained at the high state, and the start pulse Vst, the first scan pulse Vout1 and the remaining clock pulses are maintained at the low state, as shown in FIG. 28A. This second clock pulse CLK2 is supplied to the second stage ST2702. For example, the second clock pulse CLK2 is supplied to the drain terminal of the pull-up switching device Tru of the second stage ST2702. Hence, the pull-up switching device Tru of the second stage ST2702 outputs the second clock pulse CLK2 as the second scan pulse Vout2. Then, the pull-up switching device Tru of the second stage ST2702 supplies the second scan pulse Vout2 to the second gate line to drive the second gate line.

During the second pulse width time T2, the second scan pulse Vout2 outputted from the second stage ST2702 is also supplied to the third stage ST2703 and first stage ST2701. The second scan pulse Vout2 supplied to the third stage ST2703 enables the third stage ST2703 in the above manner. The enabling node Q of the third stage ST2703 is charged and the first and second disabling nodes QB1 and QB2 of the third stage ST2703 are discharged. As the second disabling node QB2 of the third stage ST2703 is discharged, the first disabling node QB1 of the fourth stage ST2704, connected to the second disabling node QB2 of the third stage ST2703, is also discharged. The second scan pulse Vout2 supplied to the first stage ST2701 also disables the first stage ST2701. The disabling operation of the first stage ST2701, which is one of the odd-numbered stages ST2701, ST2703, ST2705, . . . , will hereinafter be described.

During the second pulse width time T2, the second scan pulse Vout2 outputted from the second stage ST2702 is supplied to the first stage ST2701. For example, the second scan pulse Vout2 is supplied to the gate terminal of the fourth switching device Tr4 of the first stage ST2701. Hence, the fourth switching device Tr4 is turned on and the second DC voltage Vdc2 is supplied to the enabling node Q of the first stage ST2701 through the turned-on fourth switching device Tr4. Accordingly, the enabling node Q is discharged and all the pull-up switching device Tru, sixth switching device Tr6 and ninth switching device Tr9 of the first stage ST2701, the gate terminals of which are connected to the discharged enabling node Q, are turned off.

When the sixth switching device Tr6 is turned off, the first AC voltage Vac1 outputted through the fifth switching device Tr5 is supplied to the common node N of the first stage ST2701. Hence, the common node N of the first stage ST2701 is charged and the seventh switching device Tr7 of the first stage ST2701, the gate terminal of which is connected to the charged common node N, is turned on.

Then, the first AC voltage Vac1 is supplied to the first disabling node QB1 of the first stage ST2701 through the turned-on seventh switching device Tr7. Thus, the first disabling node QB1 of the first stage ST2701 is charged and the first pull-down switching device Trd1 and second switching device Tr2 of the first stage ST2701, the gate terminals of which are connected to the charged first disabling node QB1, are turned on. The second switching device Tr2 supplies the second DC voltage Vdc2 to the enabling node Q of the first stage ST2701 to accelerate the discharging of the enabling node Q.

Hence, in the second pulse width time T2, the pull-up switching device Tru of the first stage ST2701 is turned off and the first pull-down switching device Trd1 of the first stage ST2701 is turned on, so that the first stage ST2701 outputs the second DC voltage Vdc2 through the turned-on first pull-down switching device Trd1. This second DC voltage Vdc2 is supplied to the first gate line to function as the OFF voltage to make the first gate line inactive. Thus, the first stage ST2701 discharges the enabling node Q thereof and charges the first disabling node QB1 thereof, in response to the second scan pulse Vout2. The first stage ST2701 is disabled. The second disabling node QB2 of the first stage ST2701 remains in its discharged state.

During the third pulse width time T3, only the third clock pulse CLK3 is maintained at the high state, and the start pulse Vst, the first scan pulse Vout1, the second scan pulse Vout2 and the remaining clock pulses are maintained at the low state, as shown in FIG. 28A. This third clock pulse CLK3 is supplied to the enabled third stage ST2703. For example, the third clock pulse CLK3 is supplied to the drain terminal of the pull-up switching device Tru of the third stage ST2703. Hence, the pull-up switching device Tru of the third stage ST2703 outputs the third clock pulse CLK3 as the third scan pulse Vout3. Then, the pull-up switching device Tru of the third stage ST2703 supplies the third scan pulse Vout3 to the third gate line, fourth stage ST2704 and second stage ST2702. The third scan pulse Vout3 drives the third gate line, enables the fourth stage ST2704 and disables the second stage ST2702.

Here, because the second disabling node QB2 of the fourth stage ST2704 and the first disabling node QB1 of the fifth stage ST2705 are connected to each other, the first disabling node QB1 of the fifth stage ST2705 is also discharged with the second DC voltage Vdc2 during the third pulse width time T3.

The disabling operation of the second stage ST2702, which is one of the even-numbered stages ST2702, ST2704, ST2706, . . . , will hereinafter be described. During the third pulse width time T3, the third scan pulse Vout3 outputted from the third stage ST2703 is supplied to the second stage ST2702. For example, the third scan pulse Vout3 is supplied to the gate terminal of the fourth switching device Tr4 of the second stage ST2702. Hence, the fourth switching device Tr4 is turned on and the second DC voltage Vdc2 is supplied to the enabling node Q of the second stage ST2702 through the turned-on fourth switching device Tr4.

Accordingly, the enabling node Q is discharged and all the pull-up switching device Tru, sixth switching device Tr6 and ninth switching device Tr9 of the second stage ST2702, the gate terminals of which are connected to the discharged enabling node Q, are turned off.

Meanwhile, because the fifth switching device Tr5 of the second stage ST2702, supplied with the second AC voltage Vac2, remains OFF for the first frame period as stated above, the common node N of the second stage ST2702 still remains discharged. Accordingly, the seventh switching device Tr7 with its gate terminal connected to the common node N is also kept turned off. Hence, the first disabling node QB1 of the second stage ST2702 still remains in its discharged state.

Accordingly, during the third pulse width time T3, all the nodes Q, QB1 and QB2 of the second stage ST2702, which is one of the even-numbered stages ST2702, ST2704, ST2706, . . . , are kept discharged.

Next, a description will be given of an operation during the fourth pulse width time T4. During the fourth pulse width time T4, only the fourth clock pulse CLK4 is maintained at the high state, and the start pulse Vst, the first to third scan pulses Vout1 to Vout3 and the remaining clock pulses are maintained at the low state, as shown in FIG. 28A. This fourth clock pulse CLK4 is supplied to the enabled fourth stage ST2704. For example, the fourth clock pulse CLK4 is supplied to the drain terminal of the pull-up switching device Tru of the fourth stage ST2704. Hence, the pull-up switching device Tru of the fourth stage ST2704 outputs the fourth clock pulse CLK4 as the fourth scan pulse Vout4. Then, the pull-up switching device Tru of the fourth stage ST2704 supplies the fourth scan pulse Vout4 to the fourth gate line, fifth stage ST2705 and third stage ST2703.

The fourth scan pulse Vout4 drives the fourth gate line, enables the fifth stage ST2705 and disables the third stage ST2703. Here, because the second disabling node QB2 of the fifth stage ST2705 and the first disabling node QB1 of the sixth stage ST2706 are connected to each other, the first disabling node QB1 of the sixth stage ST2706 is also discharged with the second DC voltage Vdc2 during the fourth pulse width time T4. When the third stage ST2703, which is one of the odd-numbered stages ST2701, ST2703, ST2705, . . . (namely, the stage supplied with the first AC voltage Vac1), is disabled by the fourth scan pulse Vout4 outputted from the fourth stage ST2704, it discharges the enabling node Q and second disabling node QB2 thereof and charges the first disabling node QB1 thereof with the first AC voltage Vac1.

Here, because the first disabling node QB1 of the disabled third stage ST2703 is connected with the second disabling node QB2 of the second stage ST2702, the second disabling node QB2 of the second stage ST2702 is also charged with the first AC voltage Vac1 during the fourth pulse width time T4. Thus, during the fourth pulse width time T4, the first disabling node QB1 of the third stage ST2703 and the second disabling node QB2 of the second stage ST2702 are charged with the first AC voltage Vac1. Hence, in a sixth pulse width time T6, the first disabling node QB1 of the fifth stage ST2705 and the second disabling node QB2 of the fourth stage ST2704 are charged with the first AC voltage Vac1.

FIG. 29A is a schematic view of a first exemplary circuit configuration of node controllers for the first to fourth stages in FIG. 27 in accordance with an embodiment of the present invention. FIG. 29B is a schematic view of a second exemplary circuit configuration of node controllers for the first to fourth stages in FIG. 27 in accordance with an embodiment of the present invention. In the second frame period, the first AC voltage Vac1 is maintained at the low state and the second AC voltage Vac2 is maintained at the high state. Therefore, in the second frame period, each of the even-numbered stages ST2702, ST2704, ST2706, . . . performs the disabling operation by charging the first disabling node QB1 thereof.

Also, in the second frame period, each of the odd-numbered stages ST2701, ST2703, ST2705, . . . performs the disabling operation by discharging all the nodes Q, QB1 and QB2 thereof. The second disabling node QB2 of each of the odd-numbered stages ST2701, ST2703, ST2705, . . . is changed from its discharged state to charged state by the disabling operation of the even-numbered stage ST2702, ST2704, ST2706 . . . just downstream from the corresponding odd-numbered stage.

Figure 30:
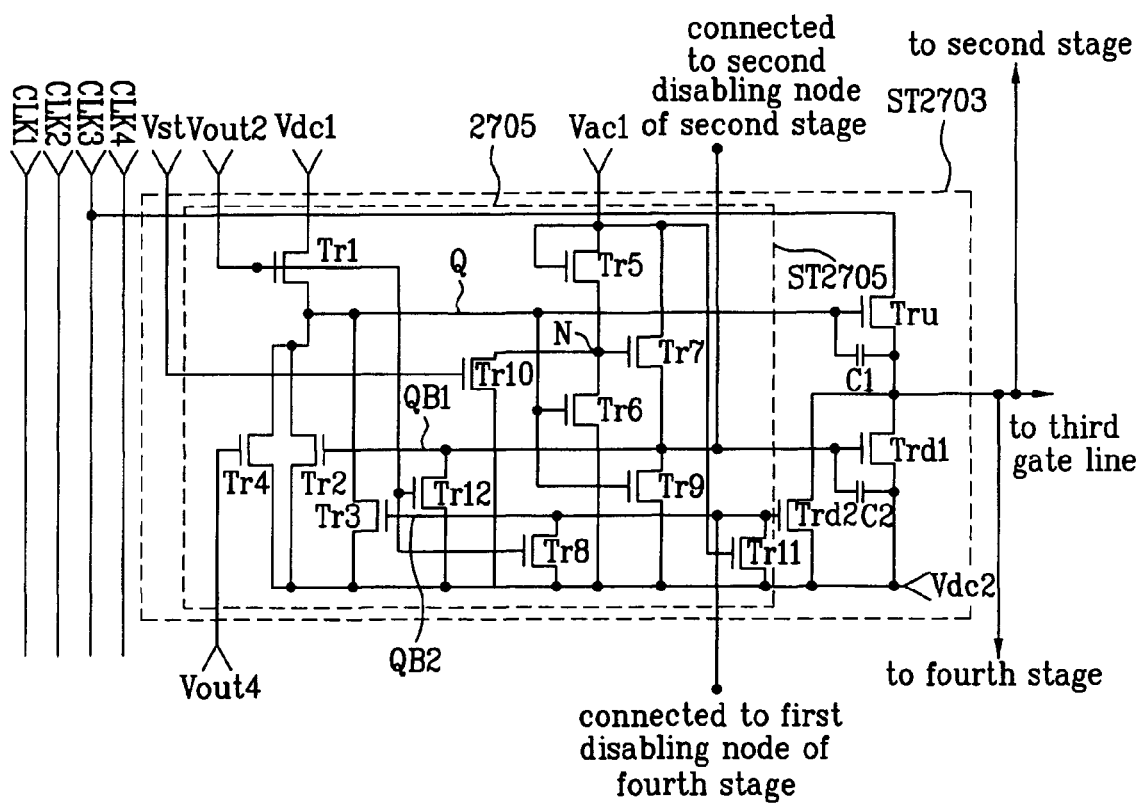
FIG. 30 is a schematic view of a first exemplary circuit configuration of a node controller for the third stage in FIG. 27 in accordance with another embodiment of the present invention.

FIG. 30 is a schematic view of a first exemplary circuit configuration of a node controller for the third stage in FIG. 27 in accordance with another embodiment of the present invention. Referring to FIG. 30, the node controller further includes tenth to twelfth switching devices TR10 to Tr12, in addition to each of the circuit configurations of FIGS. 29A and 29B. Each stage may include any one, two or all of the tenth to twelfth switching devices Tr10 to Tr12. The tenth switching device Tr10 of the n-th stage is turned on or off according to the logic state of the start pulse Vst from the timing controller, and supplies the second DC voltage Vdc2 to the common node N of the n-th stage when being turned on. For example, the tenth switching device Tr10 of the third stage ST2703 in FIG. 30 is turned on or off according to the logic state of the start pulse Vst from the timing controller, and supplies the second DC voltage Vdc2 to the common node N of the third stage ST2703 when being turned on. The tenth switching device Tr10 of the third stage ST2703 has a gate terminal connected to a clock transfer line which transfers the start pulse Vst, a drain terminal connected to the common node N of the third stage ST2703, and a source terminal connected to the power supply line which transfers the second DC voltage Vdc2.

The eleventh switching device Tr11 of the n-th stage is turned on or off according to the logic state of the first AC voltage Vac1 (or second AC voltage Vac2), and supplies the second DC voltage Vdc2 to the second disabling node QB2 of the n-th stage when being turned on. For example, the eleventh switching device Tr11 of the third stage ST2703 in FIG. 30 is turned on or off according to the logic state of the first AC voltage Vac1, and supplies the second DC voltage Vdc2 to the second disabling node QB2 of the third stage ST2703 when being turned on. The eleventh switching device Tr11 of the third stage ST2703 has a gate terminal connected to the power supply line which transfers the first AC voltage Vac1, a drain terminal connected to the second disabling node QB2 of the third stage ST2703, and a source terminal connected to the power supply line which transfers the second DC voltage Vdc2.

The twelfth switching device Tr12 of the n-th stage is turned on or off according to the logic state of the scan pulse from the (n−1)-th stage, and supplies the second DC voltage Vdc2 to the first disabling node QB1 of the n-th stage when being turned on. For example, the twelfth switching device Tr12 of the third stage ST2703 in FIG. 30 is turned on or off according to the logic state of the second scan pulse Vout2 from the second stage ST2702, and supplies the second DC voltage Vdc2 to the first disabling node QB1 of the third stage ST2703 when being turned on.

Figure 31:
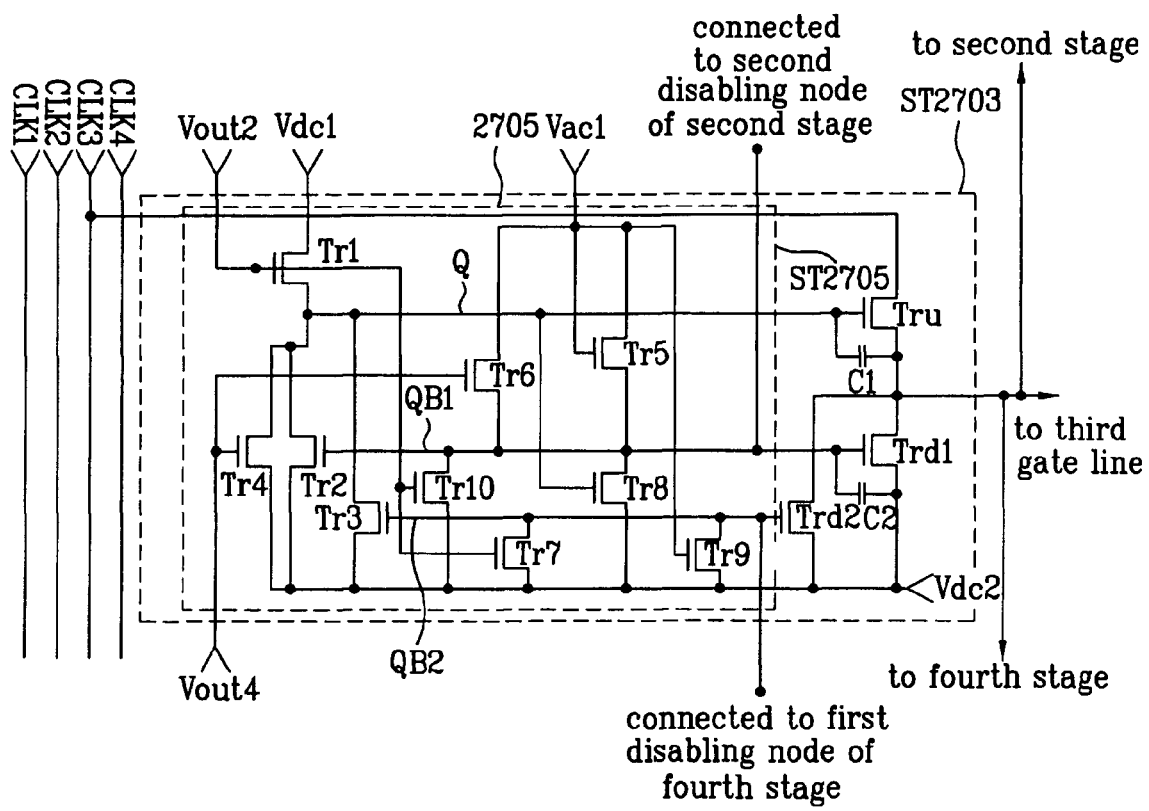
FIG. 31 is a schematic view of a second exemplary circuit configuration of a node controller for the third stage in FIG. 27 in accordance with another embodiment of the present invention.

FIG. 31 is a schematic view of a second exemplary circuit configuration of a node controller for the third stage in FIG. 27 in accordance with another embodiment of the present invention. Referring to FIG. 31, each stage includes first to tenth switching devices Tr1 to Tr10. The first to fourth switching devices Tr1 to Tr4 in FIG. 31 perform the same functions as those of the first to fourth switching devices Tr1 to Tr4 in FIGS. 29A and 29B, and a description thereof will thus be omitted. Also, the seventh switching device Tr7 in FIG. 31 performs the same function as that of the eighth switching device Tr8 in FIGS. 29A and 29B, the eighth switching device Tr8 in FIG. 31 performs the same function as that of the ninth switching device Tr9 in FIGS. 29A and 29B, the ninth switching device Tr9 in FIG. 31 performs the same function as that of the eleventh switching device Tr11 in FIG. 30, and the tenth switching device Tr10 in FIG. 31 performs the same function as that of the twelfth switching device Tr12 in FIG. 30. Therefore, a description of these switching devices will be omitted.

The fifth switching device Tr5 of the n-th stage is turned on or off according to the logic state of the first AC voltage Vac1 (or second AC voltage Vac2), and supplies the first AC voltage Vac1 (or second AC voltage Vac2) to the first disabling node QB1 of the n-th stage when being turned on. For example, the fifth switching device Tr5 of the third stage ST2703 in FIG. 31 is turned on or off according to the logic state of the first AC voltage Vac1, and supplies the first AC voltage Vac1 to the first disabling node QB1 of the third stage ST2703 when being turned on. The fifth switching device Tr5 of the third stage ST2703 has a gate terminal and drain terminal connected in common to the power supply line which transfers the first AC voltage Vac1, and a source terminal connected to the first disabling node QB1 of the third stage ST2703.

The sixth switching device Tr6 of the n-th stage is turned on or off according to the logic state of the scan pulse from the (n+1)-th stage, and supplies the first AC voltage Vac1 (or second AC voltage Vac2) to the first disabling node QB1 of the n-th stage when being turned on. For example, the sixth switching device Tr6 of the third stage ST2703 in FIG. 31 is turned on or off according to the logic state of the fourth scan pulse Vout4 from the fourth stage ST2704, and supplies the first AC voltage Vac1 to the first disabling node QB1 of the third stage ST2703 when being turned on. The sixth switching device Tr6 of the third stage ST2703 has a gate terminal connected to the output terminal of the fourth stage ST2704, a drain terminal connected to the power supply line which transfers the first AC voltage Vac1, and a source terminal connected to the first disabling node QB1 of the third stage ST2703.

Figure 32:
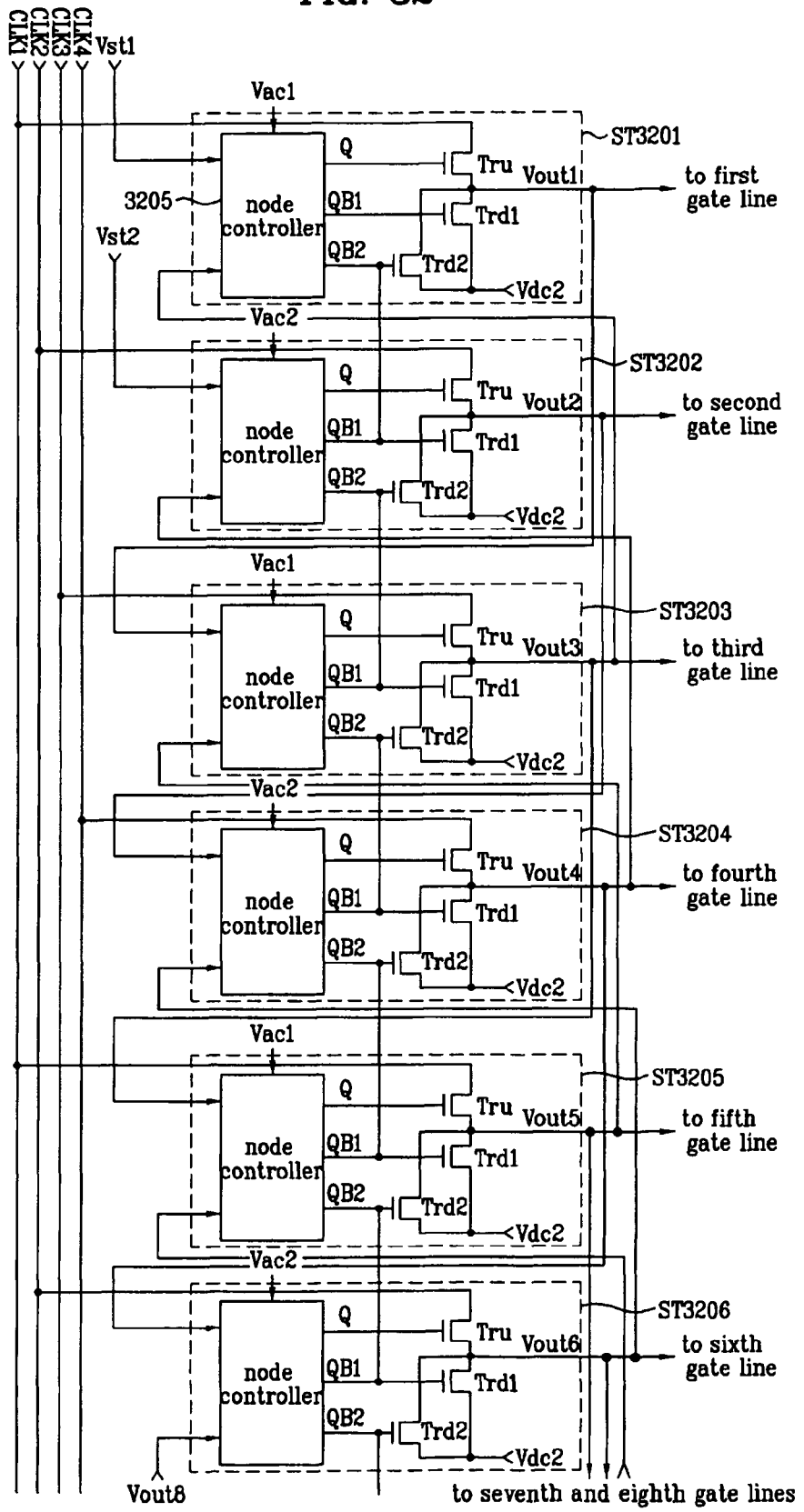
FIG. 32 is a schematic view of a seventh exemplary shift register according to another embodiment of the present invention.
Figure 33A:
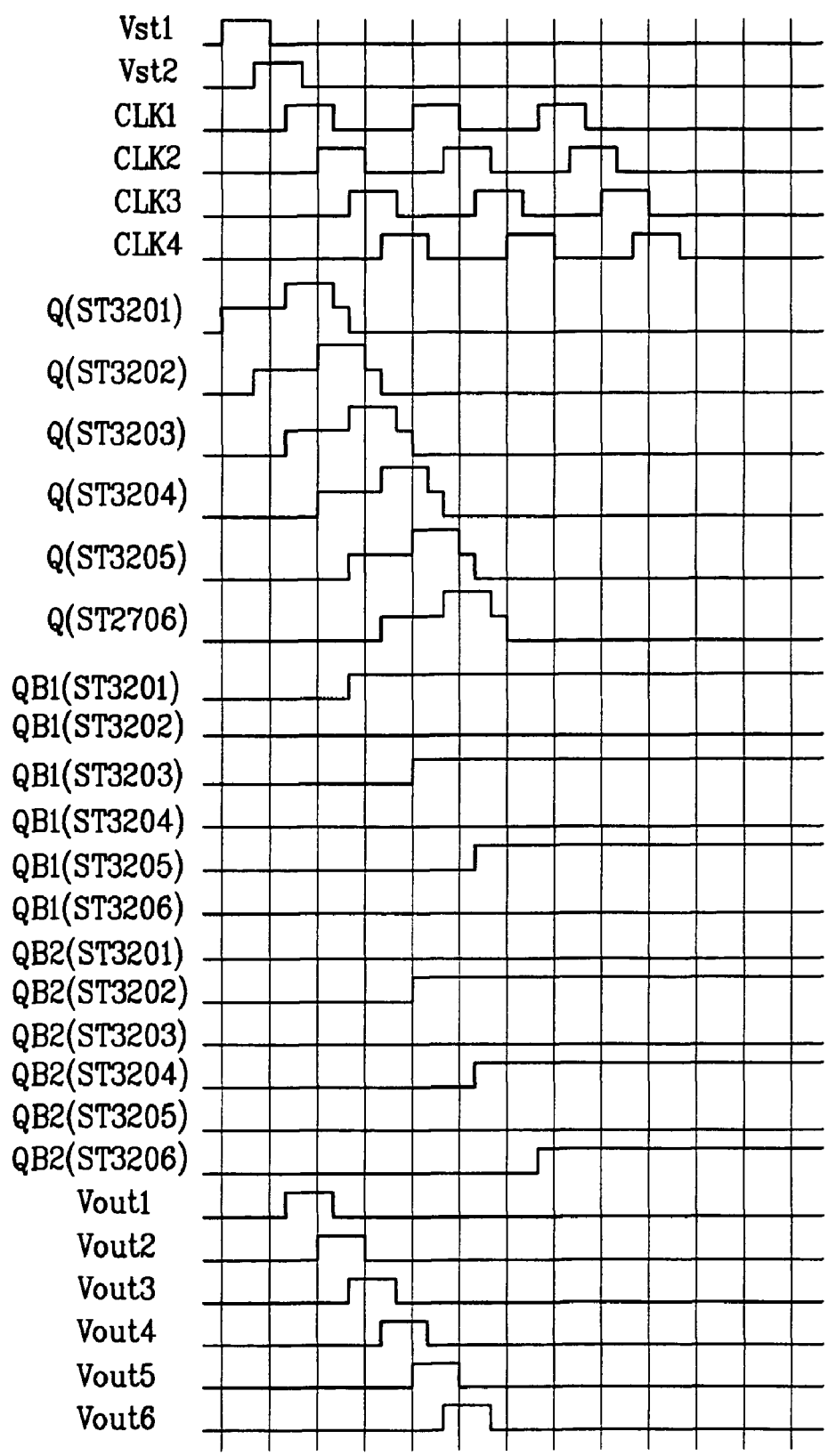
FIGS. 33A and 33B show exemplary timing diagrams of input signals into and output signals from respective stages of the shift register of FIG. 32.
Figure 33B:
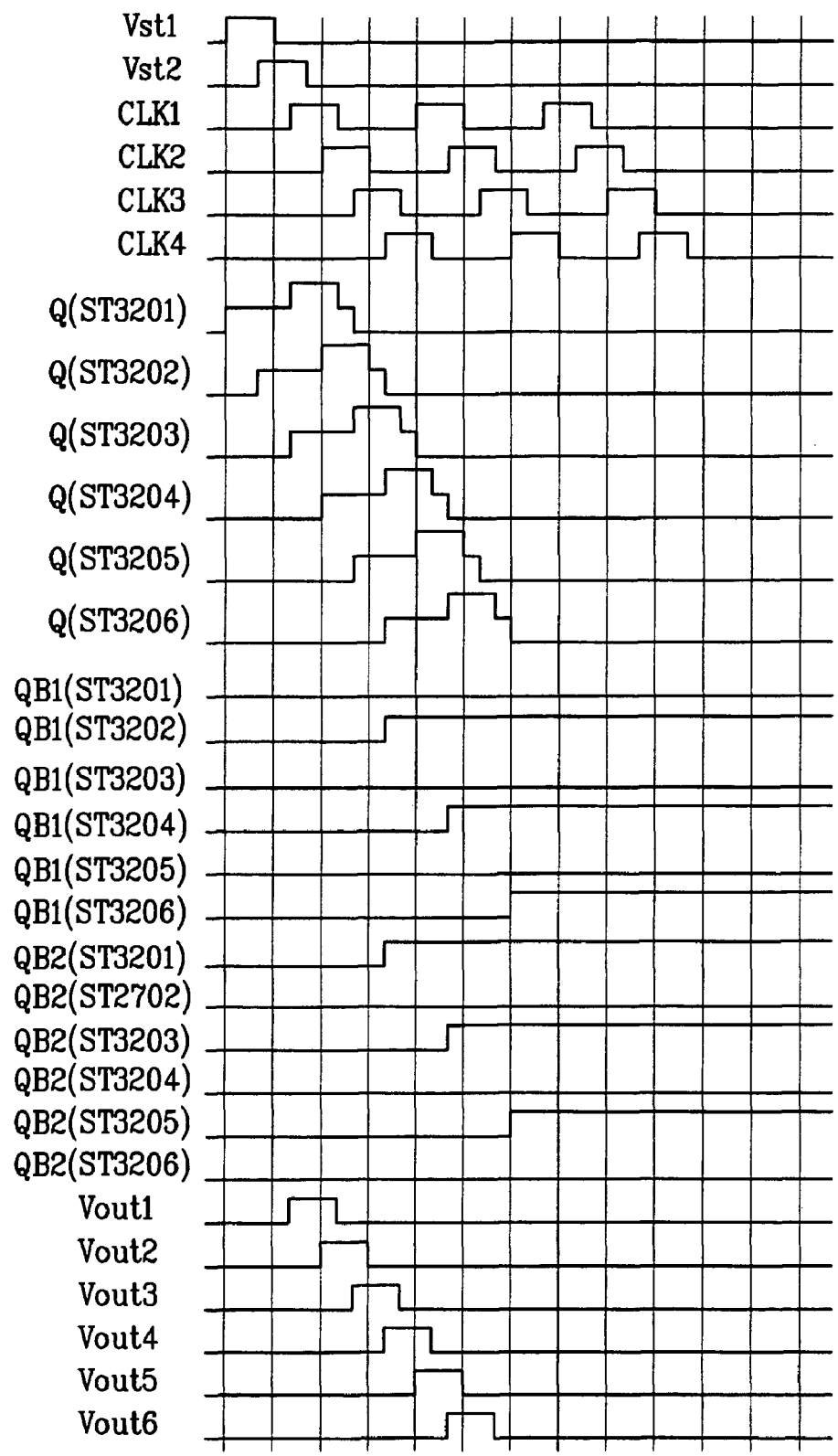

FIG. 32 is a schematic view of a seventh exemplary shift register according to another embodiment of the present invention. FIGS. 33A and 33B show exemplary timing diagrams of input signals into and output signals from respective stages of the shift register of FIG. 32. The seventh exemplary shift register has a plurality of stages ST3201, ST3202, ST3203, . . . , as shown in FIG. 32. Here, the configuration of each of the stages ST3201, ST3202, ST3203, . . . is substantially similar to the stages described above in reference to the sixth exemplary shift register, with the exception that the stages ST3201, ST3202, ST3203, . . . are connected with one another in a different manner. Therefore, a description will hereinafter be given of only the connections among the ST3201, ST3202, ST3203, . . . . The n-th stage is enabled in response to the scan pulse from the (n−2)-th stage and disabled in response to the scan pulse from the (n+2)-th stage.

On the other hand, there is no second stage upstream from the first stage ST3201. Therefore, the first stage ST3201 is enabled in response to a first start pulse Vst1 from the timing controller. Also, there is no second stage upstream from the second stage ST3202. Therefore, the second stage ST3202 is enabled in response to a second start pulse Vst2 from the timing controller.

The respective stages are supplied with first to fourth clock pulses CLK1 to CLK4. The clock pulses outputted in the adjacent periods are simultaneously maintained at an active state for a certain period. The adjacent clock pulses assume a high state simultaneously for the certain period. Accordingly, the scan pulses outputted from the adjacent stages assume the high state simultaneously for the certain period.

First, a description will be given of an operation during the period of a first frame with reference to FIG. 33A. In the first frame period, the first AC voltage Vac1 is maintained at the high state and the second AC voltage Vac2 is maintained at a low state.

In a first initial pulse width time T0A, the first stage ST3201 is enabled by the first start pulse Vst1 from the timing controller. Thus, during the first initial pulse width time T0A, the enabling node Q of the first stage ST3201 is charged with the first DC voltage Vdc1 and the first and second disabling nodes QB1 and QB2 of the first stage ST3201 are discharged with the second DC voltage Vdc2. Hence, during the first initial pulse width time T0A, the pull-up switching device Tru of the first stage ST3201 is turned on and both the first and second pull-down switching devices Trd1 and Trd2 of the first stage ST3201 are turned off.

Meanwhile, because the second disabling node QB2 of the first stage ST3201 and the first disabling node QB1 of the second stage ST3202 are electrically connected to each other, they are discharged with the same voltage. For example, during the first initial pulse width time T0A, the first disabling node QB1 of the second stage ST3202 is also discharged with the second DC voltage Vdc2. Thus, during the first initial pulse width time T0A, the enabling node Q of the first stage ST3201 is charged. Also, the first and second disabling nodes QB1 and QB2 of the first stage ST3201 and the first disabling node QB1 of the second stage ST3202 are discharged.

Thereafter, in a second initial pulse width time T0B, the second stage ST3202 is enabled by the second start pulse Vst2 from the timing controller. Thus, during the second initial pulse width time T0B, the enabling node Q of the second stage ST3202 is charged with the first DC voltage Vdc1 and the first and second disabling nodes QB1 and QB2 of the second stage ST3202 are discharged with the second DC voltage Vdc2. Hence, during the second initial pulse width time T0B, the pull-up switching device Tru of the second stage ST3202 is turned on and both the first and second pull-down switching devices Trd1 and Trd2 of the second stage ST3202 are turned off.

Meanwhile, because the second disabling node QB2 of the second stage ST3202 and the first disabling node QB1 of the third stage ST3203 are electrically connected to each other, they are discharged with the same voltage. For example, during the second initial pulse width time T0B, the first disabling node QB1 of the third stage ST3203 is also discharged with the second DC voltage Vdc2.

Thereafter, in a first pulse width time T1, the first clock pulse CLK1 is supplied to the pull-up switching device Tru of the first stage ST3201. Hence, the pull-up switching device Tru outputs the first scan pulse Vout1 and supplies it to the first gate line and third stage ST3203. Accordingly, during the first pulse width time T1, the first gate line is driven and the third stage ST3203 is enabled.

The enabling node Q of the third stage ST3203 is charged with the first DC voltage Vdc1 and the first and second disabling nodes QB1 and QB2 of the third stage ST3203 are discharged with the second DC voltage Vdc2. Hence, during the first pulse width time T1, the pull-up switching device Tru of the third stage ST3203 is turned on and both the first and second pull-down switching devices Trd1 and Trd2 of the third stage ST3203 are turned off. Meanwhile, because the second disabling node QB2 of the third stage ST3203 and the first disabling node QB1 of the fourth stage ST3204 are electrically connected to each other, they are discharged with the same voltage. For example, during the first pulse width time T1, the first disabling node QB1 of the fourth stage ST3204 is also discharged with the second DC voltage Vdc2.

Thus, during the first pulse width time T1, the enabling node Q of the third stage ST3203 is charged. Also, the first and second disabling nodes QB1 and QB2 of the third stage ST3203 and the first disabling node QB1 of the fourth stage ST3204 are discharged.

Thereafter, in a second pulse width time T2, the second clock pulse CLK2 is supplied to the pull-up switching device Tru of the second stage ST3202. Hence, the pull-up switching device Tru outputs the second scan pulse Vout2 and supplies it to the second gate line and fourth stage ST3204. Accordingly, in the second pulse width time T2, the second gate line is driven and the fourth stage ST3204 is enabled.

Hence, in the second pulse width time T2, the pull-up switching device Tru of the fourth stage ST3204 is turned on and both the first and second pull-down switching devices Trd1 and Trd2 of the fourth stage ST3204 are turned off. Meanwhile, because the second disabling node QB2 of the fourth stage ST3204 and the first disabling node QB1 of the fifth stage ST3205 are electrically connected to each other, they are discharged with the same voltage. For example, in the second pulse width time T2, the first disabling node QB1 of the fifth stage ST3205 is also discharged with the second DC voltage Vdc2.

Thus, in the second pulse width time T2, the enabling node Q of the fourth stage ST3204 is charged. Also, the first and second disabling nodes QB1 and QB2 of the fourth stage ST3204 and the first disabling node QB1 of the fifth stage ST3205 are discharged.

Thereafter, in a third pulse width time T3, the third clock pulse CLK3 is supplied to the pull-up switching device Tru of the third stage ST3203. Hence, the pull-up switching device Tru outputs the third scan pulse Vout3 and supplies it to the third gate line, fifth stage ST3205 and first stage ST3201.

Accordingly, during the third pulse width time T3, the third gate line is driven and the fifth stage ST3205 is enabled. Also, the first stage ST3201 is disabled. The enabling node Q and second disabling node QB2 of the first stage ST3201 are discharged with the second DC voltage Vdc2 and the first disabling node QB1 of the first stage ST3201 is charged with the first AC voltage Vac1. In other words, the first stage ST3201, which is one of the odd-numbered stages ST3201, ST3203, ST3205, . . . , is supplied with the first AC voltage Vac1, which is in the high state for the first frame period. Thus, when the first stage ST3201 is disabled, only the first disabling node QB1 thereof is maintained in its charged state.

Thus, during the third pulse width time T3, the enabling node Q of the fifth stage ST3205 is charged. Also, the first and second disabling nodes QB1 and QB2 of the fifth stage ST3205 and the first disabling node QB1 of the sixth stage ST3206 are discharged. Further, the enabling node Q and second disabling node QB2 of the first stage ST3201 are discharged and the first disabling node QB1 of the first stage ST3201 is charged.

Thereafter, in a fourth pulse width time T4, the fourth clock pulse CLK4 is supplied to the pull-up switching device Tru of the fourth stage ST3204. Hence, the pull-up switching device Tru outputs the fourth scan pulse Vout4 and supplies it to the fourth gate line, sixth stage ST3206 and second stage ST3202.

Accordingly, during the fourth pulse width time T4, the fourth gate line is driven and the sixth stage ST3206 is enabled. Also, the second stage ST3202 is disabled. Thus, all the enabling node Q, first disabling node QB1 and second disabling node QB2 of the second stage ST3202 are discharged. In other words, the second stage ST3202, which is one of the even-numbered stages ST3202, ST3204, ST3206, . . . , is supplied with the second AC voltage Vac2, which is in the low state for the first frame period. Hence, when the second stage ST3202 is disabled, all the nodes Q, QB1 and QB2 thereof are discharged.

Thus, during the fourth pulse width time T4, the enabling node Q of the sixth stage ST3206 is charged. Also, the first and second disabling nodes QB1 and QB2 of the sixth stage ST3206 and the first disabling node QB1 of the seventh stage are discharged. Further, all the nodes Q, QB1 and QB2 of the second stage ST3202 are discharged.

Thereafter, in a fifth pulse width time T5, the first clock pulse CLK1 is supplied to the pull-up switching device Tru of the fifth stage ST3205. Hence, the pull-up switching device Tru outputs the fifth scan pulse Vout5 and supplies it to the fifth gate line, seventh stage and third stage ST3203.

Accordingly, during the fifth pulse width time T5, the fifth gate line is driven and the seventh stage is enabled. Also, the third stage ST3203 is disabled. The enabling node Q and second disabling node QB2 of the third stage ST3203 are discharged and the first disabling node QB1 of the third stage ST3203 is charged. In other words, the third stage ST3203, which is one of the odd-numbered stages ST3201, ST3203, ST3205, . . . , is supplied with the first AC voltage Vac1, which is in the high state for the first frame period. Thus, when the third stage ST3203 is disabled, only the first disabling node QB1 thereof is maintained in its charged state.

During the fifth pulse width time T5, as the first disabling node QB1 of the third stage ST3203 is changed from its discharged state to charged state, the second disabling node QB2 of the second stage ST3202, connected to the first disabling node QB1 of the third stage ST3203, is also changed from its discharged state to charged state. Thus, during the fifth pulse width time T5, the enabling node Q of the seventh stage is charged. Also, the first and second disabling nodes QB1 and QB2 of the seventh stage and the first disabling node QB1 of the eighth stage are discharged. Further, the first disabling node QB1 of the third stage ST3203 and the second disabling node QB2 of the second stage ST3202 are charged.

Hence, in the first frame period, each of the odd-numbered stages ST3201, ST3203, ST3205, . . . performs the disabling operation by charging the first disabling node QB1 thereof. Also, in the first frame period, each of the even-numbered stages ST3202, ST3204, ST3206, . . . performs the disabling operation by discharging all the nodes Q, QB1 and QB2 thereof. The second disabling node QB2 of each of the even-numbered stages ST3202, ST3204, ST3206, . . . is changed from its discharged state to charged state by the disabling operation of the odd-numbered stage ST3203, ST3205, . . . just downstream from the corresponding even-numbered stage.

Next, a description will be given of an operation during the period of a second frame with reference to FIG. 33B. In the second frame period, the first AC voltage Vac1 is maintained at a low state and the second AC voltage Vac2 is maintained at a high state. In a first initial pulse width time T0A, the first stage ST3201 is enabled by the first start pulse Vst1 from the timing controller. Thus, during the first initial pulse width time T0A, the enabling node Q of the first stage ST3201 is charged with the first DC voltage Vdc1 and the first and second disabling nodes QB1 and QB2 of the first stage ST3201 are discharged with the second DC voltage Vdc2. Hence, during the first initial pulse width time T0A, the pull-up switching device Tru of the first stage ST3201 is turned on and both the first and second pull-down switching devices Trd1 and Trd2 of the first stage ST3201 are turned off.

Meanwhile, because the second disabling node QB2 of the first stage ST3201 and the first disabling node QB1 of the second stage ST3202 are electrically connected to each other, they are discharged with the same voltage. For example, during the first initial pulse width time T0A, the first disabling node QB1 of the second stage ST3202 is also discharged with the second DC voltage Vdc2.

Thus, during the first initial pulse width time T0A, the enabling node Q of the first stage ST3201 is charged. Also, the first and second disabling nodes QB1 and QB2 of the first stage ST3201 and the first disabling node QB1 of the second stage ST3202 are discharged.

Thereafter, in a second initial pulse width time T0B, the second stage ST3202 is enabled by the second start pulse Vst2 from the timing controller. Thus, during the second initial pulse width time T0B, the enabling node Q of the second stage ST3202 is charged with the first DC voltage Vdc1 and the first and second disabling nodes QB1 and QB2 of the second stage ST3202 are discharged with the second DC voltage Vdc2.

Hence, during the second initial pulse width time T0B, the pull-up switching device Tru of the second stage ST3202 is turned on and both the first and second pull-down switching devices Trd1 and Trd2 of the second stage ST3202 are turned off. Meanwhile, because the second disabling node QB2 of the second stage ST3202 and the first disabling node QB1 of the third stage ST3203 are electrically connected to each other, they are discharged with the same voltage. For example, during the second initial pulse width time T0B, the first disabling node QB1 of the third stage ST3203 is also discharged with the second DC voltage Vdc2.

Thereafter, in a first pulse width time T1, the first clock pulse CLK1 is supplied to the pull-up switching device Tru of the first stage ST3201. Hence, the pull-up switching device Tru outputs the first scan pulse Vout1 and supplies it to the first gate line and third stage ST3203. Accordingly, during the first pulse width time T1, the first gate line is driven and the third stage ST3203 is enabled.

The enabling node Q of the third stage ST3203 is charged with the first DC voltage Vdc1 and the first and second disabling nodes QB1 and QB2 of the third stage ST3203 are discharged with the second DC voltage Vdc2. Hence, during the first pulse width time T1, the pull-up switching device Tru of the third stage ST3203 is turned on and both the first and second pull-down switching devices Trd1 and Trd2 of the third stage ST3203 are turned off.

Meanwhile, because the second disabling node QB2 of the third stage ST3203 and the first disabling node QB1 of the fourth stage ST3204 are electrically connected to each other, they are discharged with the same voltage. For example, during the first pulse width time T1, the first disabling node QB1 of the fourth stage ST3204 is also discharged with the second DC voltage Vdc2. Thus, during the first pulse width time T1, the enabling node Q of the third stage ST3203 is charged. Also, the first and second disabling nodes QB1 and QB2 of the third stage ST3203 and the first disabling node QB1 of the fourth stage ST3204 are discharged.

Thereafter, in a second pulse width time T2, the second clock pulse CLK2 is supplied to the pull-up switching device Tru of the second stage ST3202. Hence, the pull-up switching device Tru outputs the second scan pulse Vout2 and supplies it to the second gate line and fourth stage ST3204. Accordingly, in the second pulse width time T2, the second gate line is driven and the fourth stage ST3204 is enabled. Hence, in the second pulse width time T2, the pull-up switching device Tru of the fourth stage ST3204 is turned on and both the first and second pull-down switching devices Trd1 and Trd2 of the fourth stage ST3204 are turned off.

Meanwhile, because the second disabling node QB2 of the fourth stage ST3204 and the first disabling node QB1 of the fifth stage ST3205 are electrically connected to each other, they are discharged with the same voltage. For example, in the second pulse width time T2, the first disabling node QB1 of the fifth stage ST3205 is also discharged with the second DC voltage Vdc2. Thus, in the second pulse width time T2, the enabling node Q of the fourth stage ST3204 is charged. Also, the first and second disabling nodes QB1 and QB2 of the fourth stage ST3204 and the first disabling node QB1 of the fifth stage ST3205 are discharged.

Thereafter, in a third pulse width time T3, the third clock pulse CLK3 is supplied to the pull-up switching device Tru of the third stage ST3203. Hence, the pull-up switching device Tru outputs the third scan pulse Vout3 and supplies it to the third gate line, fifth stage ST3205 and first stage ST3201. Accordingly, during the third pulse width time T3, the third gate line is driven and the fifth stage ST3205 is enabled. Also, the first stage ST3201 is disabled. The enabling node Q, first disabling node QB1 and second disabling node QB2 of the first stage ST3201 are discharged. In other words, the first stage ST3201, which is one of the odd-numbered stages ST3201, ST3203, ST3205, . . . , is supplied with the first AC voltage Vac1, which is in the low state for the second frame period. Thus, when the first stage ST3201 is disabled, all the nodes Q, QB1 and QB2 thereof are discharged.

Thus, during the third pulse width time T3, the enabling node Q of the fifth stage ST3205 is charged. Also, the first and second disabling nodes QB1 and QB2 of the fifth stage ST3205 and the first disabling node QB1 of the sixth stage ST3206 are discharged. Further, all the nodes Q, QB1 and QB2 of the first stage ST3201 are discharged.

Thereafter, in a fourth pulse width time T4, the fourth clock pulse CLK4 is supplied to the pull-up switching device Tru of the fourth stage ST3204. Hence, the pull-up switching device Tru outputs the fourth scan pulse Vout4 and supplies it to the fourth gate line, sixth stage ST3206 and second stage ST3202. Accordingly, during the fourth pulse width time T4, the fourth gate line is driven and the sixth stage ST3206 is enabled. Also, the second stage ST3202 is disabled. The enabling node Q and second disabling node QB2 of the second stage ST3202 are discharged and the first disabling node QB1 of the second stage ST3202 is charged. In other words, the second stage ST3202, which is one of the even-numbered stages ST3202, ST3204, ST3206, . . . , is supplied with the second AC voltage Vac2, which is in the high state for the second frame period. Hence, when the second stage ST3202 is disabled, only the first disabling node QB1 thereof is charged.

During the fourth pulse width time T4, as the first disabling node QB1 of the second stage ST3202 is changed from its discharged state to charged state, the second disabling node QB2 of the first stage ST3201, connected to the first disabling node QB1 of the second stage ST3202, is also changed from its discharged state to charged state. Thus, during the fourth pulse width time T4, the enabling node Q of the sixth stage ST3206 is charged. Also, the first and second disabling nodes QB1 and QB2 of the sixth stage ST3206 and the first disabling node QB1 of the seventh stage are discharged. Further, the first disabling node QB1 of the second stage ST3202 and the second disabling node QB2 of the first stage ST3201 are charged.

Thereafter, in a fifth pulse width time T5, the first clock pulse CLK1 is supplied to the pull-up switching device Tru of the fifth stage ST3205. Hence, the pull-up switching device Tru outputs the fifth scan pulse Vout5 and supplies it to the fifth gate line, seventh stage and third stage ST3203. Accordingly, during the fifth pulse width time T5, the fifth gate line is driven and the seventh stage is enabled. Also, the third stage ST3203 is disabled. The enabling node Q and first and second disabling nodes QB1 and QB2 of the third stage ST3203 are discharged. In other words, the third stage ST3203, which is one of the odd-numbered stages ST3201, ST3203, ST3205, . . . , is supplied with the first AC voltage Vac1, which is in the low state for the second frame period. Thus, when the third stage ST3203 is disabled, all the nodes Q, QB1 and QB2 thereof are discharged. Thus, during the fifth pulse width time T5, the enabling node Q of the seventh stage is charged. Also, the first and second disabling nodes QB1 and QB2 of the seventh stage and the first disabling node QB1 of the eighth stage are discharged. Further, all the nodes Q, QB1 and QB2 of the third stage ST3203 are discharged.

Hence, in the second frame period, each of the even-numbered stages ST3202, ST3204, ST3206, . . . performs the disabling operation by charging the first disabling node QB1 thereof. Also, in the second frame period, each of the odd-numbered stages ST3201, ST3203, ST3205, . . . performs the disabling operation by discharging all the nodes Q, QB1 and QB2 thereof. The second disabling node QB2 of each of the odd-numbered stages ST3201, ST3203, ST3205, . . . is changed from its discharged state to charged state by the disabling operation of the even-numbered stage ST3202, ST3204, ST3206 . . . just downstream from the corresponding odd-numbered stage.

Figure 34A:
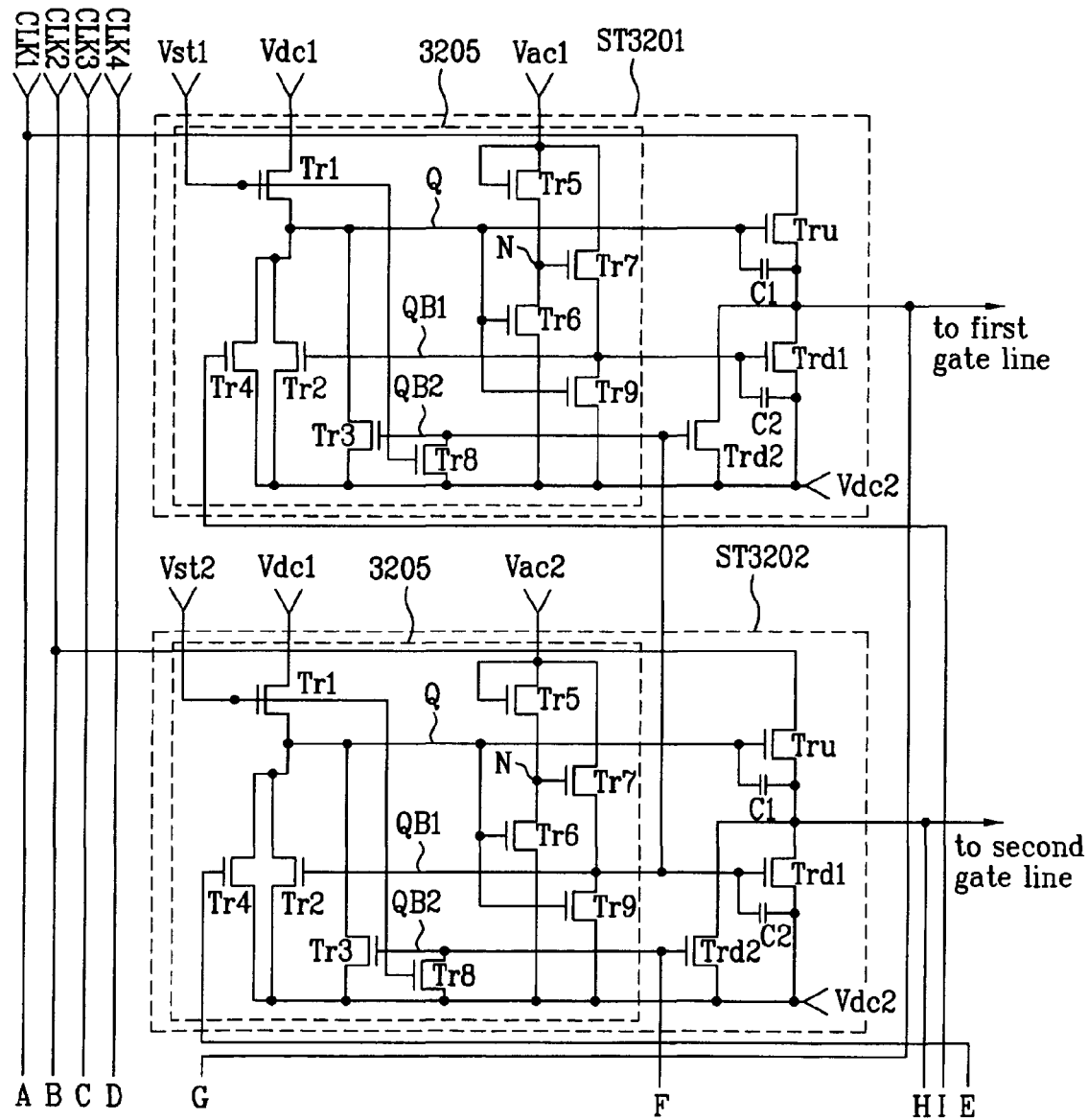
FIG. 34A is a schematic view of a first exemplary circuit configuration of node controllers for the first to fourth stages in FIG. 32 in accordance with an embodiment of the present invention.
Figure 34B:
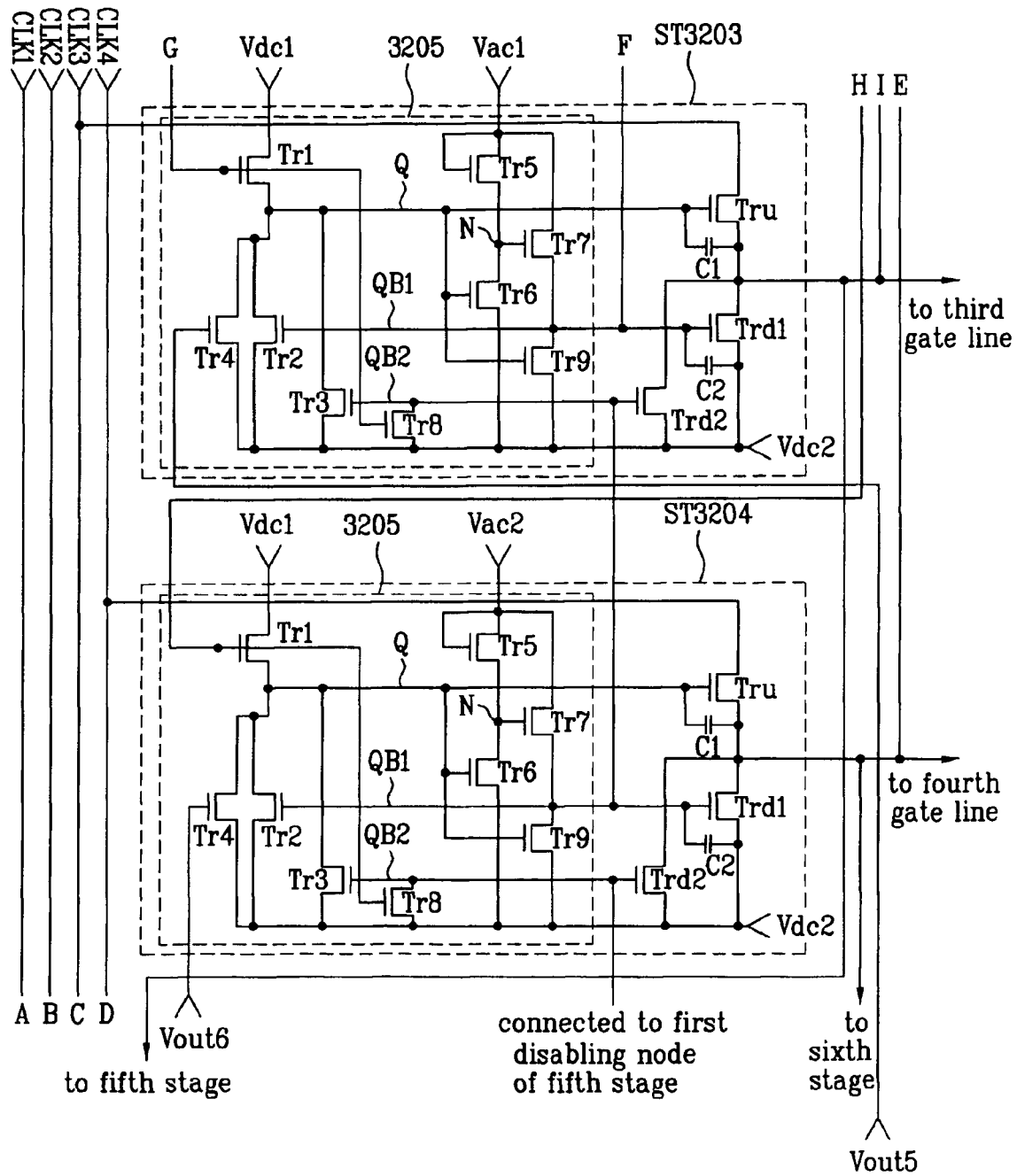
FIG. 34B is a schematic view of a second exemplary circuit configuration of node controllers for the first to fourth stages in FIG. 32 in accordance with an embodiment of the present invention.

FIG. 34A is a schematic view of a first exemplary circuit configuration of node controllers for the first to fourth stages in FIG. 32 in accordance with an embodiment of the present invention. FIG. 34B is a schematic view of a second exemplary circuit configuration of node controllers for the first to fourth stages in FIG. 32 in accordance with an embodiment of the present invention. Referring to FIGS. 34A and 34B, the node controller 3205 of each stage includes first to ninth switching devices Tr1 to Tr9, as shown in FIGS. 34A and 34B. The first to ninth switching devices Tr1 to Tr9 shown in FIGS. 34A and 34B are substantially similar to the first to ninth switching devices Tr1 to Tr9 shown in FIGS. 29A and 29B. For example, the first and eighth switching devices Tr1 and Tr8 in FIGS. 34A and 34B are controlled by a scan pulse from a second stage upstream from the corresponding stage, and the fourth switching device Tr4 in FIGS. 34A and 34B is controlled by a scan pulse from a second stage downstream from the corresponding stage.

The first switching device Tr1 of the n-th stage is turned on or off according to the logic state of the scan pulse from the (n−2)-th stage, and supplies the first DC voltage Vdc1 to the enabling node Q of the n-th stage when being turned on. For example, the first switching device Tr1 of the third stage ST3203 in FIG. 34B is turned on or off according to the logic state of the first scan pulse Vout1 from the first stage ST3201, and supplies the first DC voltage Vdc1 to the enabling node Q of the third stage ST3203 when being turned on. The first switching device Tr1 of the third stage ST3203 has a gate terminal connected to the output terminal of the first stage ST3201, a drain terminal connected to a power supply line which transfers the first DC voltage Vdc1, and a source terminal connected to the enabling node Q of the third stage ST3203.

The fourth switching device Tr4 of the n-th stage is turned on or off according to the logic state of the scan pulse from the (n+2)-th stage, and supplies the second DC voltage Vdc2 to the enabling node Q of the n-th stage when being turned on. For example, the fourth switching device Tr4 of the third stage ST3203 in FIG. 34B is turned on or off according to the logic state of the fifth scan pulse from the fifth stage ST3205, and supplies the second DC voltage Vdc2 to the enabling node Q of the third stage ST3203 when being turned on. The fourth switching device Tr4 of the third stage ST3203 has a gate terminal connected to the output terminal of the fifth stage ST3205, a drain terminal connected to the enabling node Q of the third stage ST3203, and a source terminal connected to a power supply line which transfers the second DC voltage Vdc2.

The eighth switching device Tr8 of the n-th stage is turned on or off according to the logic state of the scan pulse from the (n−2)-th stage, and supplies the second DC voltage Vdc2 to the second disabling node QB2 of the n-th stage when being turned on. For example, the eighth switching device Tr8 of the third stage ST3203 in FIG. 34B is turned on or off according to the logic state of the first scan pulse Vout1 from the first stage ST3201, and supplies the second DC voltage Vdc2 to the second disabling node QB2 of the third stage ST3203 when being turned on. The eighth switching device Tr8 of the third stage ST3203 has a gate terminal connected to the output terminal of the first stage ST3201, a drain terminal connected to the second disabling node QB2 of the third stage ST3203, and a source terminal connected to the power supply line which transfers the second DC voltage Vdc2.

On the other hand, there is no second stage upstream from the first stage ST3201 and there is no second stage upstream from the second stage ST3202. Therefore, the first and eighth switching devices Tr1 and Tr8 of the first stage ST3201 are turned on or off in response to the first start pulse Vst1 supplied from the timing controller, and the first and eighth switching devices Tr1 and Tr8 of the second stage ST3202 are turned on or off in response to the second start pulse Vst2 supplied from the timing controller.

Also, the fifth switching device Tr5 of each of the odd-numbered stages ST3201, ST3203, ST3205, . . . is supplied with the first AC voltage Vac1, and the fifth switching device Tr5 of each of the even-numbered stages ST3202, ST3204, ST3206, . . . is supplied with the second AC voltage Vac2.

The operation of the shift register having the stages with the above-stated circuit configurations is substantially similar to that of the circuit shown in FIGS. 29A and 29B. For example, in FIGS. 34A and 34B, the first and eighth switching devices Tr1 and Tr8 of the first stage ST3201 are controlled by the first start pulse Vst1, and the first and eighth switching devices Tr1 and Tr8 of the second stage ST3202 are controlled by the second start pulse Vst2. Also, the first and eighth switching devices Tr1 and Tr8 of the third stage ST3203 are controlled by the first scan pulse Vout1 from the first stage ST3201. Further, the first and eighth switching devices Tr1 and Tr8 of the fourth stage ST3204 are controlled by the second scan pulse Vout2 from the second stage ST3202.

The fourth switching device Tr4 of the first stage ST3201 is controlled by the third scan pulse Vout3 from the third stage ST3203, and the fourth switching device Tr4 of the second stage ST3202 is controlled by the fourth scan pulse Vout4 from the fourth stage ST3204. Also, the fourth switching device Tr4 of the third stage ST3203 is controlled by the fifth scan pulse Vout5 from the fifth stage ST3205, and the fourth switching device Tr4 of the fourth stage ST3204 is controlled by the sixth scan pulse Vout6 from the sixth stage ST3206.

In another embodiment, the seventh exemplary shift register according may have the above-described circuit configuration shown in FIG. 30 or FIG. 31.

Figure 35:
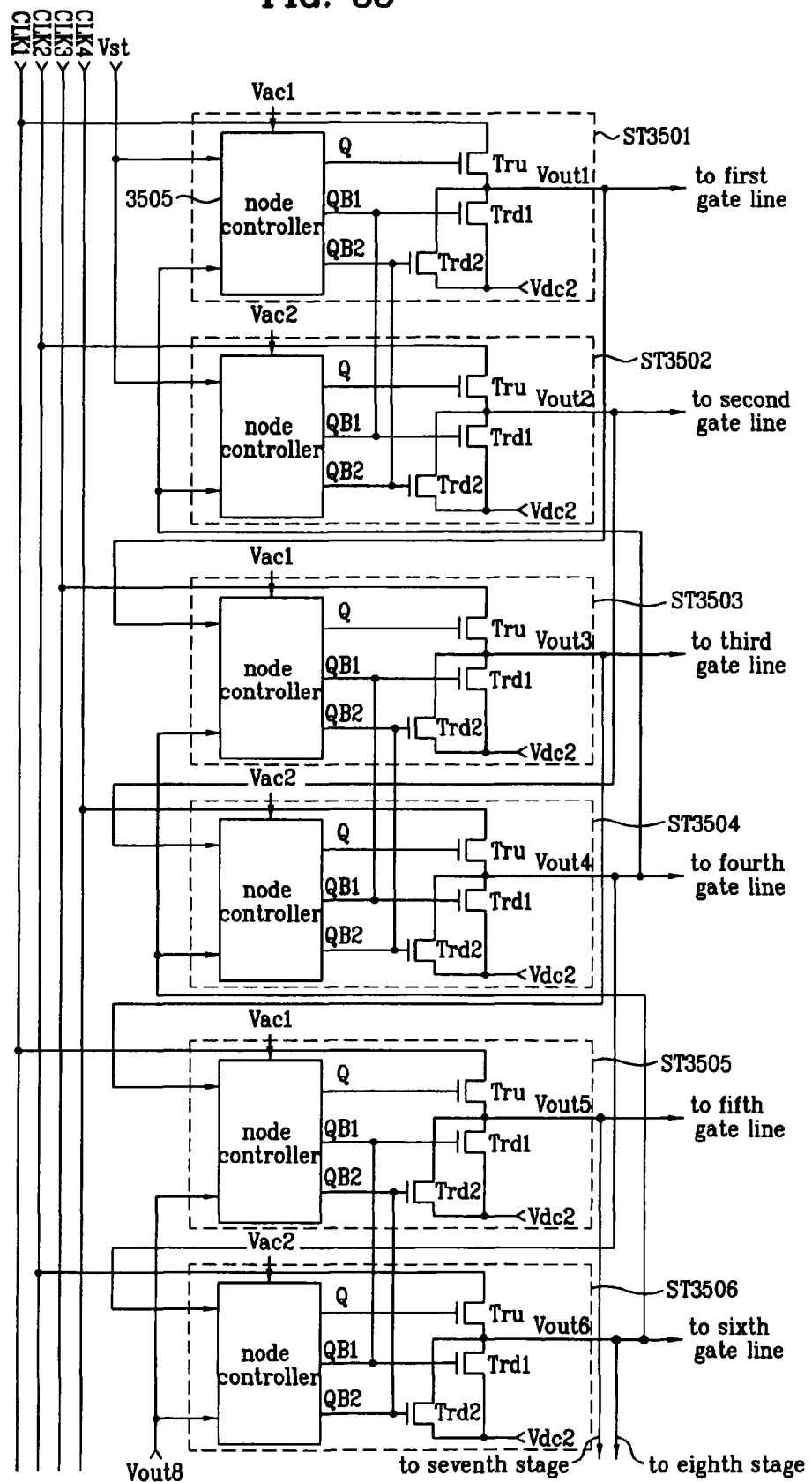
FIG. 35 is a schematic view of an eighth exemplary shift register according to another embodiment of the present invention.
Figure 36A:
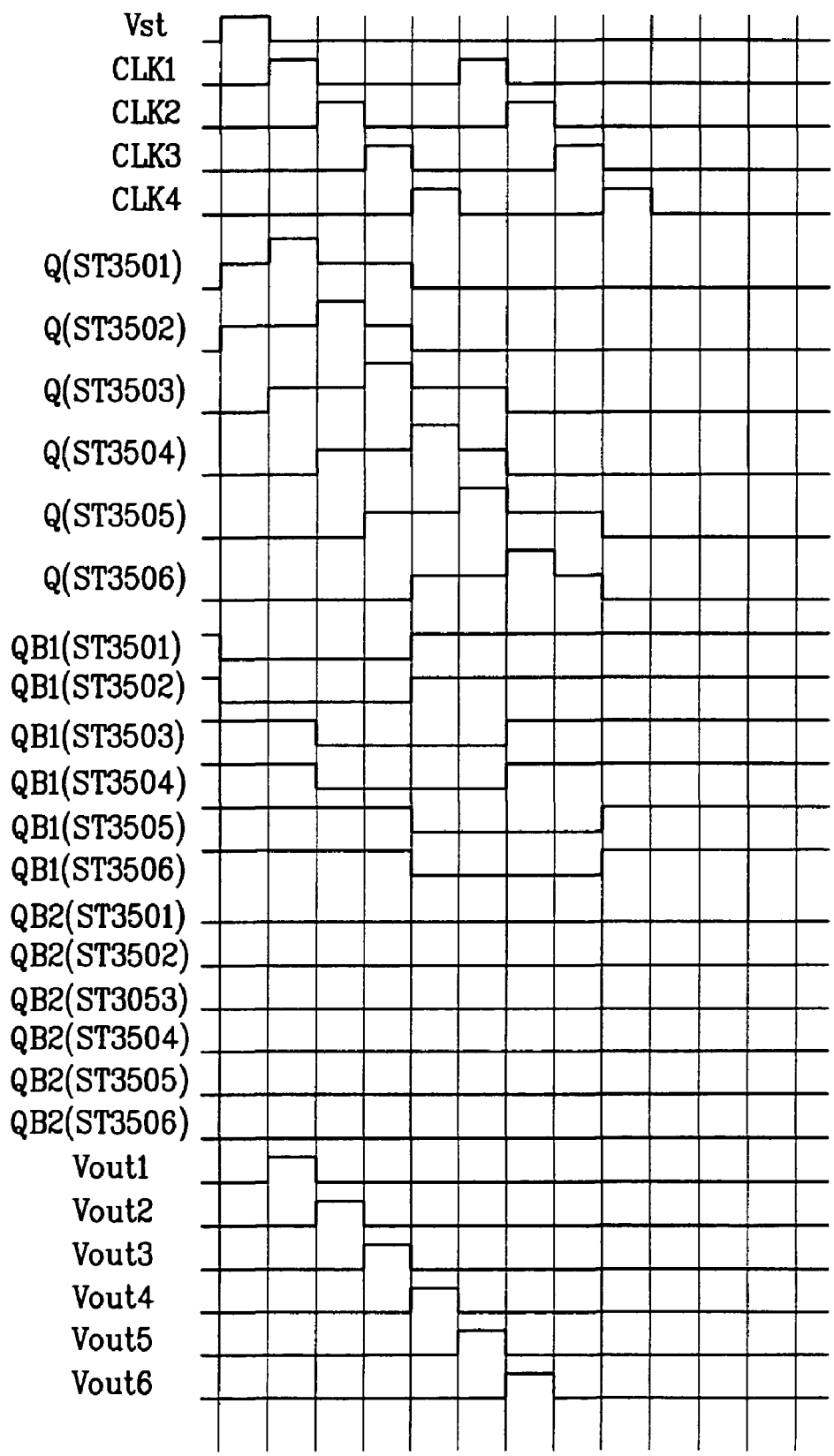
FIG. 36A shows a first exemplary timing diagram of input signals into and output signals from respective stages of the shift register of FIG. 35.
Figure 36B:
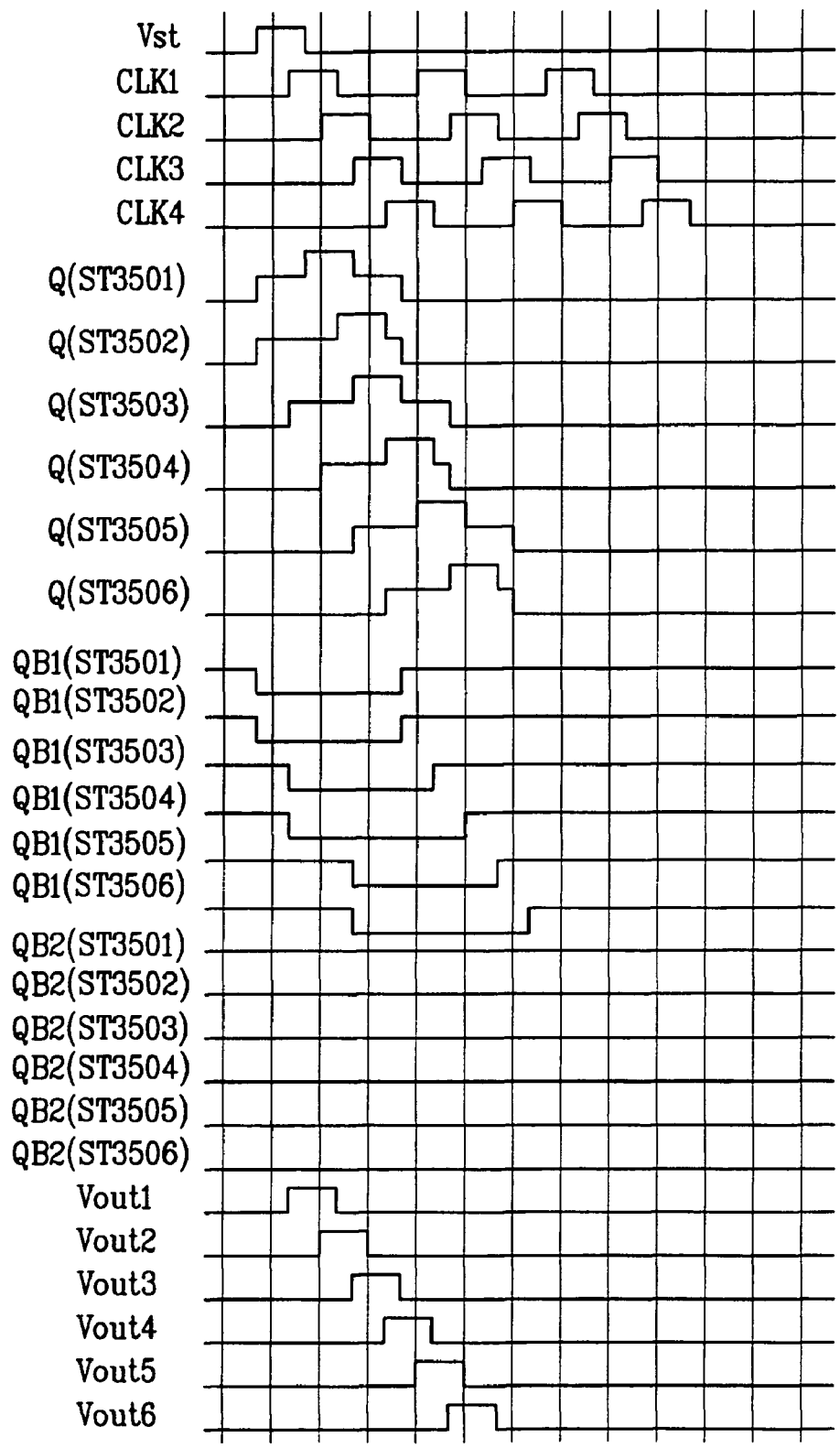
FIG. 36B shows a second exemplary timing diagram of input signals into and output signals from respective stages of the shift register of FIG. 35.

FIG. 35 is a schematic view of an eighth exemplary shift register according to another embodiment of the present invention. FIG. 36A shows a first exemplary timing diagram of input signals into and output signals from respective stages of the shift register of FIG. 35. FIG. 36B shows a second exemplary timing diagram of input signals into and output signals from respective stages of the shift register of FIG. 35. Referring to FIG. 35, the shift register has a plurality of stages ST3501, ST3502, ST3503, . . . . Here, the configuration of each of the stages ST3501, ST3502, ST3503, . . . is substantially similar to the stages described above in reference to the sixth exemplary shift register, with the exception that the stages ST3501, ST3502, ST3503, . . . are connected with one another in a different manner. Therefore, a description will hereinafter be given of only the connections among the ST3501, ST3502, ST3503, . . . .

The (2n−1)-th stage is enabled in response to the scan pulse from the (2n−3)-th stage and disabled in response to the scan pulse from the (2n+2)-th stage. The 2n-th stage is enabled in response to the scan pulse from the (2n−2)-th stage and disabled in response to the scan pulse from the (2n+2)-th stage. On the other hand, there is no second stage upstream from the first stage ST3501. Therefore, the first stage ST3501 is enabled in response to the start pulse Vst from the timing controller.

Also, there is no second stage upstream from the second stage ST3502. Therefore, the second stage ST3502 is also enabled in response to the start pulse Vst from the timing controller. The first disabling nodes QB1 of the two adjacent stages are electrically connected to each other, and the second disabling nodes QB2 of the two adjacent stages are electrically connected to each other. Alternatively, the (2n−1)-th stage may be disabled by the scan pulse from the (2n+1)-th stage instead of the (2n+2)-th stage.

Each of the stages ST3501, ST3502, ST3503, . . . with these connections is supplied with a corresponding one of first to fourth clock pulses CLK1 to CLK4 which are out of phase with one another and do not overlap with one another, as shown in FIG. 36A, and outputs the supplied clock pulse as a corresponding scan pulse. Alternatively, each of the stages ST3501, ST3502, ST3503, . . . with these connections may be supplied with a corresponding one of first to fourth clock pulses CLK1 to CLK4, each of which has an overlap of ⅓ H period with the preceding clock pulse as shown in FIG. 36B, and output the supplied clock pulse as a corresponding scan pulse.

Figure 37:
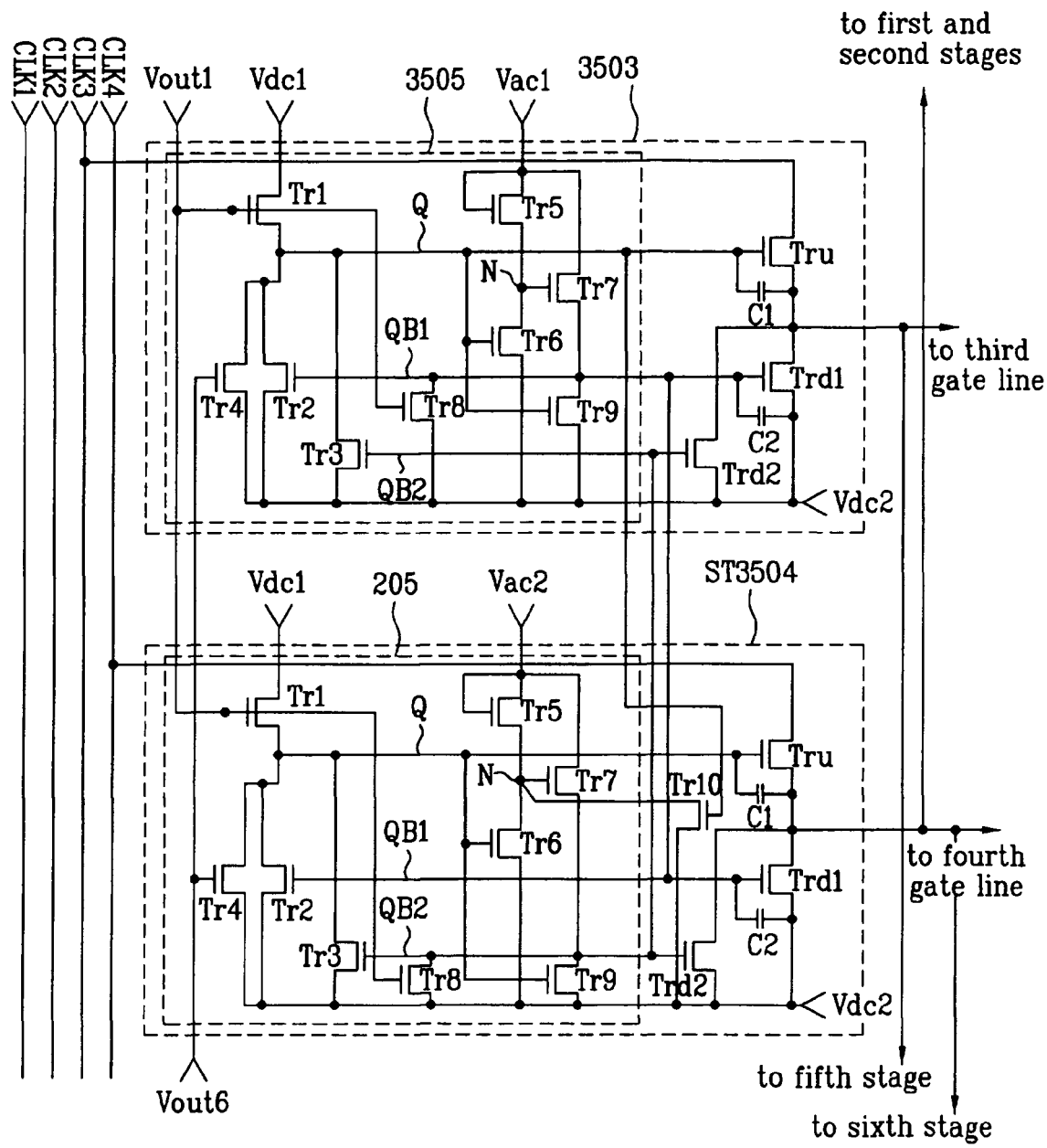
FIG. 37 is a schematic view of an exemplary circuit configuration of the third and fourth stages in FIG. 35.

FIG. 37 is a schematic view of an exemplary circuit configuration of the third and fourth stages in FIG. 35. Referring to FIG. 37, the node controller corresponding to the (2n−1)-th stage includes first to ninth switching devices Tr1 to Tr9, and the node controller corresponding to the 2n-th stage includes first to tenth switching devices Tr1 to Tr10. These first to ninth switching devices Tr1 to Tr9 are substantially similar to the first to ninth switching devices Tr1 to Tr9 in FIG. 4, and a description thereof will thus be omitted.

The tenth switching device Tr10 of the 2n-th stage is turned on or off according to the signal state of the enabling node Q of the (2n−1)-th stage, and discharges the common node N of the 2n-th stage with the second DC voltage Vdc2 when being turned on. This tenth switching device Tr10 acts to increase a bootstrapping effect of the enabling node Q of a corresponding one of the stages ST3501, ST3502, ST3503, . . . when the first to fourth clock pulses CLK1 to CLK4 with the overlap periods as shown in FIG. 36B are supplied to the circuit of FIG. 37.

Figure 38:
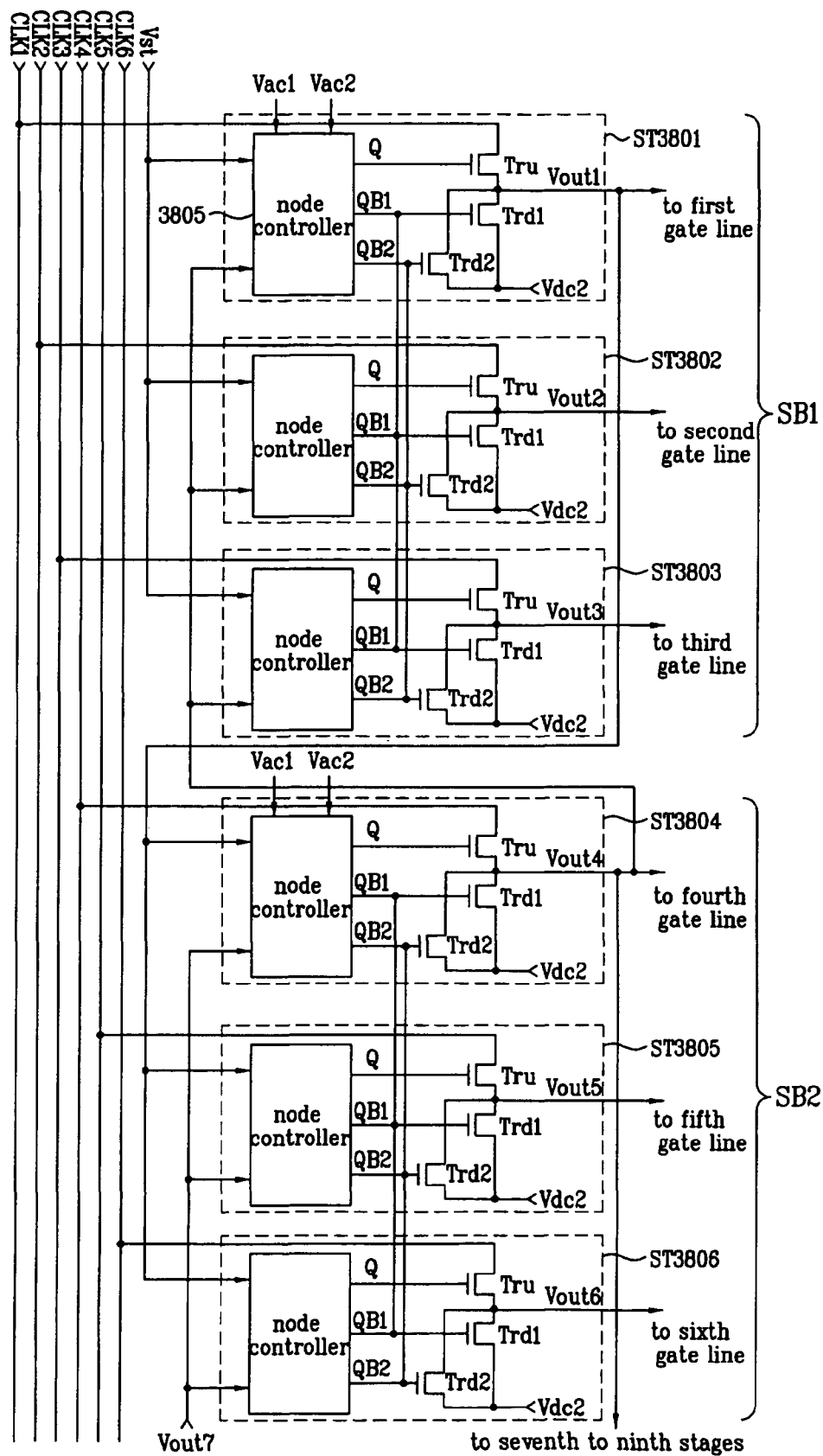
FIG. 38 is a schematic view of an ninth exemplary shift register according to another embodiment of the present invention.
Figure 39A:
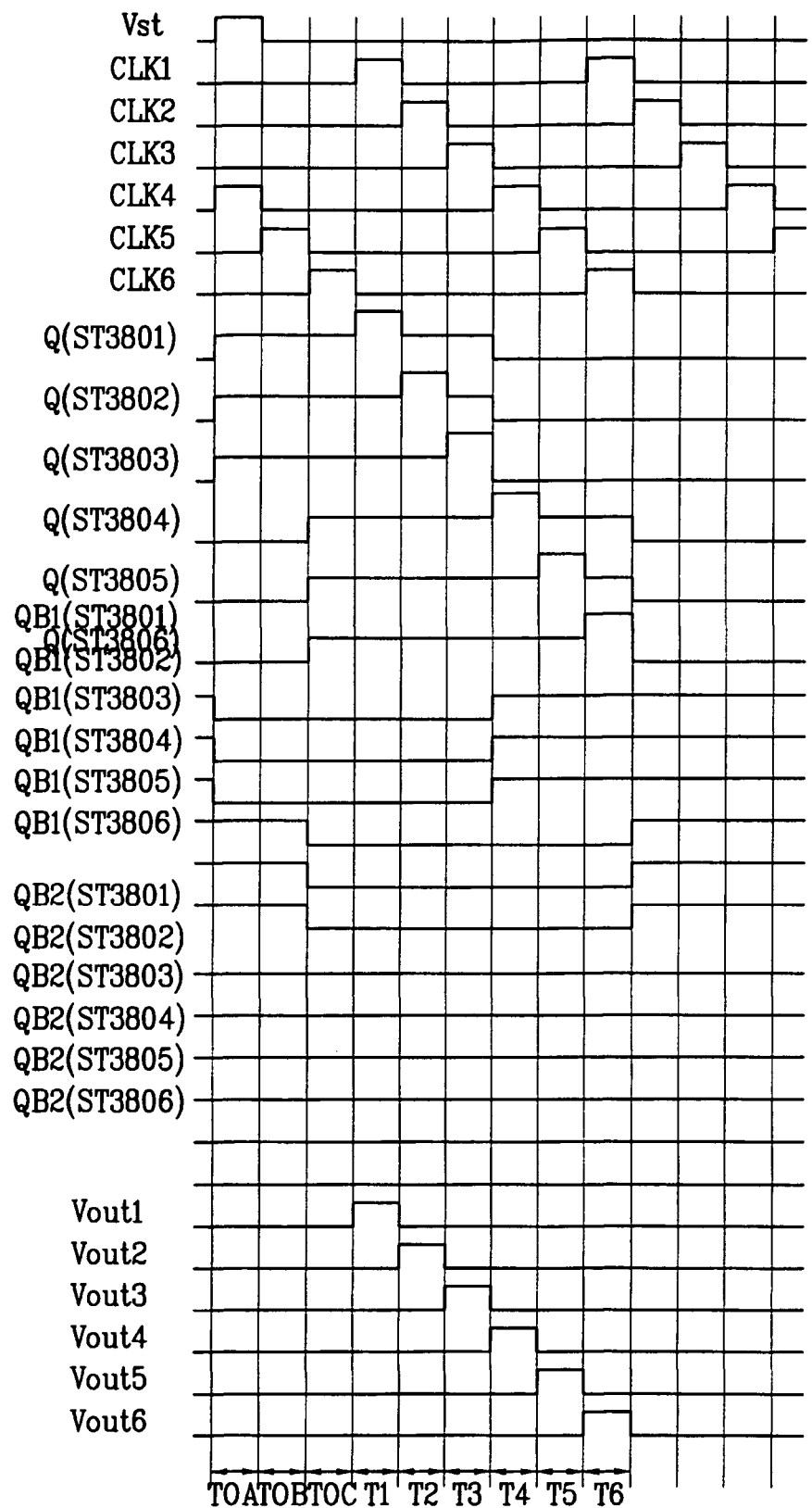
FIG. 39A shows a first exemplary timing diagram of input signals into and output signals from respective stages of the shift register of FIG. 38.

FIG. 38 is a schematic view of an ninth exemplary shift register according to another embodiment of the present invention. FIG. 39A shows a first exemplary timing diagram of input signals into and output signals from respective stages of the shift register of FIG. 38. Referring to FIG. 38, the shift register includes a plurality of stages ST3801, ST3802, ST3803, . . . for driving a plurality of gate lines. This shift register includes a plurality of stage blocks SB1, SB2, . . . , each of which includes one server stage and two client stages. Each of the server stage and client stages includes a node controller 3805, an enabling node Q, a first disabling node QB1, a second disabling node QB2, a pull-up switching device Tru, a first pull-down switching device Trd1, and a second pull-down switching device Trd2, as in the above-described embodiments. The stage blocks SB1, SB2, . . . are the same in configuration, and a description will thus be given of only the server stage, first client stage and second client stage in the first stage block SB1 as a representative.

The first disabling node QB1 of the server stage (first stage ST3801) in the first stage block SB1 is electrically connected with the first disabling node QB1 of the first client stage (second stage ST3802) in the first stage block SB1 and the first disabling node QB1 of the second client stage (third stage ST3803) in the first stage block SB1. Also, the second disabling node QB2 of the server stage in the first stage block SB1 is electrically connected with the second disabling node QB2 of the first client stage in the first stage block SB1 and the second disabling node QB2 of the second client stage in the first stage block SB1. The node controller 3805 of the server stage in the first stage block SB1 controls the signal stages of the first and second disabling nodes QB1 and QB2 of each of the client stages (second and third stages ST3802 and ST3803) in the first stage block SB1 using first and second AC voltages Vac1 and Vac2. Hence, only the server stage in the first stage block SB1 is directly supplied with the first and second AC voltages Vac1 and Vac2.

The stages in the pth stage block (where p is a natural number) are enabled in response to a scan pulse from any one of the stages in the (p−k)-th stage block (where k is a natural number smaller than p). The stages in the pth stage block (where p is a natural number) are enabled in response to a scan pulse from any one of the stages in the (p+i)-th stage block (where i is a natural number smaller than p).

For example, the server stage and client stages in the second stage block SB2 are enabled in response to a scan pulse from the server stage in the first stage block SB1. The server stage and client stages in the second stage block SB2 are enabled in response to a scan pulse from the server stage in third stage block SB3.

Here, because there is no stage upstream from the first stage block SB1, the server stage and client stages in the first stage block SB1 are enabled in response to a start pulse Vst from a timing controller. Each server stage of the ninth exemplary shift register controls the disabling nodes of the client stages one-sidedly, whereas each stage of the first to eighth exemplary shift registers described above controls the disabling nodes thereof and the disabling nodes of the stages adjacent thereto complementarily. Accordingly, the first and second disabling nodes QB1 and QB2 of each client stage follow the signal stages of the first and second disabling nodes QB1 and QB2 of the server stage in the stage block corresponding to each client stage. The stages of the shift register with this configuration receive a six-phase clock (i.e., first to sixth clock pulses CLK1 to CLK6) as shown in FIG. 39A and output the received clock pulses as scan pulses in order.

Figure 39B:
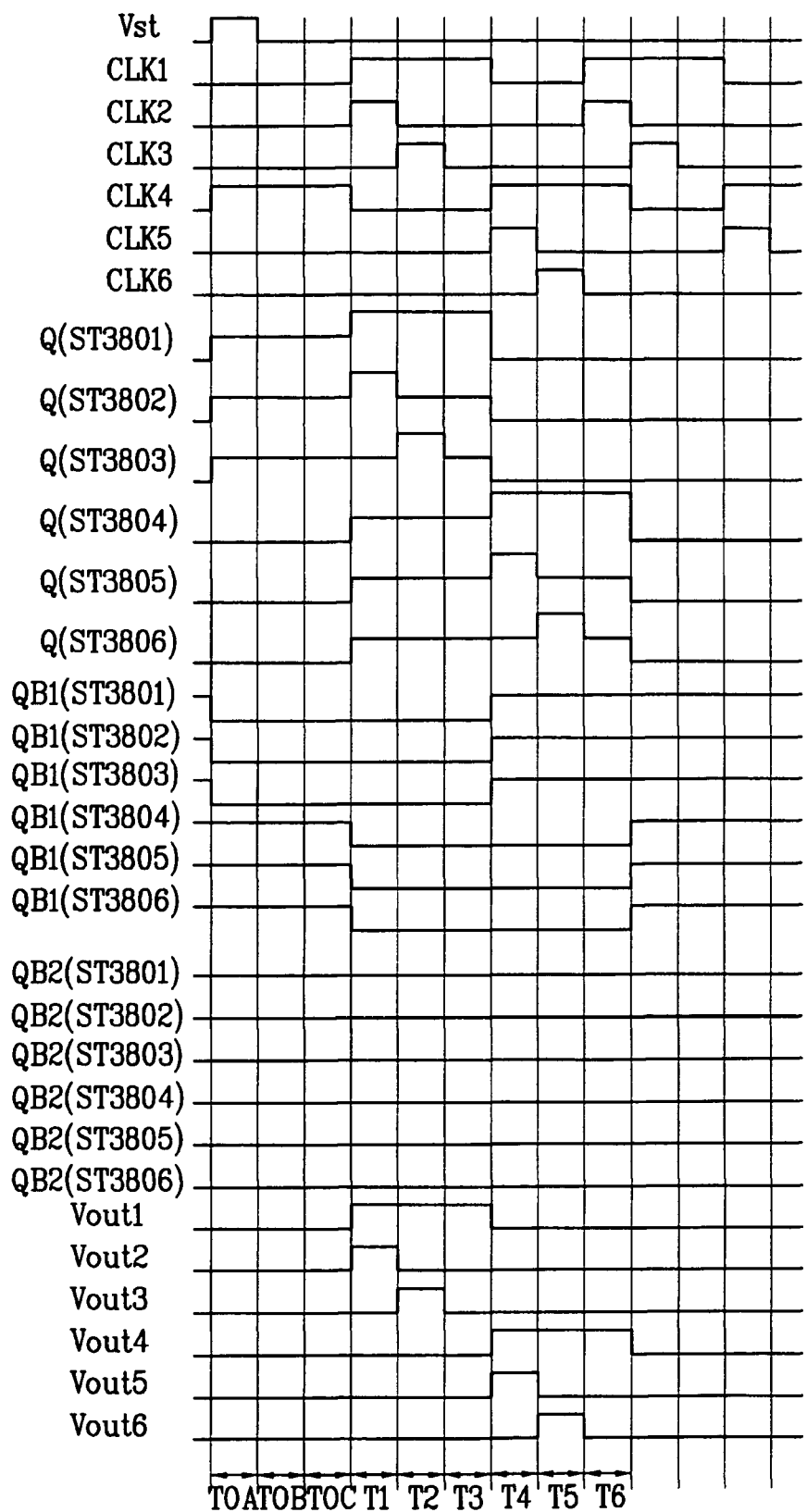
FIG. 39B shows a second exemplary timing diagram of input signals into and output signals from respective stages of the shift register of FIG. 38.

FIG. 39B shows a second exemplary timing diagram of input signals into and output signals from respective stages of the shift register of FIG. 38. Referring to FIG. 39B, the shift register shown in FIG. 38 may be supplied with first to sixth clock pulses CLK1 to CLK6. The first clock pulse CLK1 is driven into a high state for a 3 H period and a low state for the subsequent 3 H period. This first clock pulse CLK1 has the high state and the low state repeatedly.

The second clock pulse CLK2 is driven into the high state for a 1H period and the low state for the subsequent 5 H period. This second clock pulse CLK2 has the high state and the low state repeatedly. Here, the high duration of the second clock pulse CLK2 is time-aligned with a first high period of the high duration of the first clock pulse CLK1. Thus, one high duration of the first clock pulse CLK1 has a 3 H period, which may be divided into three 1 H periods. In this case, the high duration of the second clock pulse CLK2 temporally overlaps with an earliest, first one of the three periods of the high duration of the first clock pulse CLK1.

The third clock pulse CLK3 is driven into the high state for a 1 H period and the low state for the subsequent 5 H period. This third clock pulse CLK3 has the high state and the low state repeatedly. Here, the high duration of the third clock pulse CLK3 is time-aligned with a second high period of the high duration of the first clock pulse CLK1. Thus, one high duration of the first clock pulse CLK1 has a 3 H period, which may be divided into three 1 H periods. In this case, the high duration of the third clock pulse CLK3 temporally overlaps with a second earlier, second one of the three periods of the high duration of the first clock pulse CLK1.

The fourth clock pulse CLK4 has the same duty ratio as that of the first clock pulse CLK1, and is 1800 out of phase with the first clock pulse CLK1.

The fifth clock pulse CLK5 is driven into the high state for a 1 H period and the low state for the subsequent 5 H period. This fifth clock pulse CLK5 has the high state and the low state repeatedly. Here, the high duration of the fifth clock pulse CLK5 is time-aligned with a first high period of the high duration of the fourth clock pulse CLK4.

Thus, one high duration of the fourth clock pulse CLK4 has a 3 H period, which may be divided into three 1 H periods. In this case, the high duration of the fifth clock pulse CLK5 temporally overlaps with an earliest, first one of the three periods of the high duration of the fourth clock pulse CLK4.

The sixth clock pulse CLK6 is driven into the high state for a 1 H period and the low state for the subsequent 5 H period. This sixth clock pulse CLK6 has the high state and the low state repeatedly. Here, the high duration of the sixth clock pulse CLK6 is time-aligned with a second high period of the high duration of the fourth clock pulse CLK4.

Thus, one high duration of the fourth clock pulse CLK4 has a 3 H period, which may be divided into three 1 H periods. In this case, the high duration of the sixth clock pulse CLK6 temporally overlaps with a second earlier, second one of the three periods of the high duration of the fourth clock pulse CLK4.

Each stage (i.e. of the server and client stages) receives any one of the above-stated first to sixth clock pulses CLK1 to CLK6 and outputs the received clock pulse as a scan pulse. The (4n+1)-th stage receives the first clock pulse CLK1 and outputs the received first clock pulse CLK1 as a scan pulse, the (4n+2)-th stage receives the second clock pulse CLK2 and outputs the received second clock pulse CLK2 as a scan pulse, the (4n+3)-th stage receives the third clock pulse CLK3 and outputs the received third clock pulse CLK3 as a scan pulse, and the (4n+4)-th stage receives the fourth clock pulse CLK4 and outputs the received fourth clock pulse CLK4 as a scan pulse. Here, the stages in one stage block output scan pulses in order. Notably, the output order of these scan pulses does not depend on the order of positions of the stages.

Thus, seeing first to third scan pulses Vout1 to Vout3 shown in FIG. 39B, the first scan pulse Vout1 and the second scan pulse Vout2 are outputted at the same time and the third scan pulse Vout3 is thereafter outputted. The first scan pulse Vout1 is driven into the high state for a 3 H period in the same manner as the above-stated first clock pulse CLK1, the second scan pulse Vout2 is driven into the high state for a 1 H period in the same manner as the above-stated second clock pulse CLK2, and the third scan pulse Vout3 is driven into the high state for a 1 H period in the same manner as the above-stated third clock pulse CLK3.

During a period in which the first scan pulse Vout1 and the second scan pulse Vout2 are outputted simultaneously, namely, in a second pulse width time T2, a data signal synchronized with the second scan pulse Vout2 is supplied to a liquid crystal panel. During a period in which the first scan pulse Vout1 and the third scan pulse Vout3 are outputted simultaneously, namely, in a third pulse width time T3, a data signal synchronized with the third scan pulse Vout3 is supplied to the liquid crystal panel. In a fourth pulse width time T4 in which only the first scan pulse Vout1 is driven into the high state, a data signal synchronized with the first scan pulse Vout1 is supplied to the liquid crystal panel.

Here, because the first scan pulse Vout1 is driven into the high state for the first to third periods T1 to T3, a thin film transistor of one pixel supplied with the first scan pulse Vout1 is kept turned on for the first to third periods T1 to T3. Hence, although this pixel is supplied with the data signal synchronized with the second scan pulse Vout2 and the data signal synchronized with the third scan pulse Vout3, it ultimately displays an image based on the original data signal, namely, the data signal synchronized with the first scan pulse Vout1 during the third pulse width time T3. Thus, although this pixel displays images based on data signals not corresponding thereto for the first and second periods T1 and T2, it ultimately displays an image based on a data signal corresponding thereto for the third pulse width time T3.

For example, assume that the first to third stages ST3801 to ST3803 in the first stage block SB1 output the first to third scan pulses Vout1 to Vout3 and supply them to the first to third gate lines, respectively. Also, assume that a first pixel is connected to the first gate line, a second pixel is connected to the second gate line and a third pixel is connected to the third gate line. Further, assume that the first to third pixels are connected in common to one data line.

First to third data signals are sequentially supplied to the data line in synchronization with the outputs of the scan pulses. Here, assume that the first data signal is a signal for display of an image at the first pixel, the second data signal is a signal for display of an image at the second pixel and the third data signal is a signal for display of an image at the third pixel.

During the first pulse width time T1, because the first and second scan pulses Vout1 and Vout2 assume the high state simultaneously, the first and second gate lines are driven simultaneously, so that thin film transistors of the first and second pixels connected respectively to the first and second gate lines are turned on. In this first pulse width time T1, the second data signal is supplied to the data line and then simultaneously to the first and second pixels. Hence, during the first pulse width time T1, the first and second pixels display an image based on the second data signal. Because this second data signal corresponds to the second pixel, the first pixel displays a wrong image during the first pulse width time T1.

Thereafter, in the second pulse width time T2, because the first and third scan pulses Vout1 and Vout3 assume the high state simultaneously, the first and third gate lines are driven simultaneously, so that thin film transistors of the first and third pixels connected respectively to the first and third gate lines are turned on. In this second pulse width time T2, the third data signal is supplied to the data line and then simultaneously to the first and third pixels. Hence, in the second pulse width time T2, the first and third pixels display an image based on the third data signal. Because this third data signal corresponds to the third pixel, the first pixel displays a wrong image in the second pulse width time T2.

Thereafter, during the third pulse width time T3, because only the first scan pulse Vout1 is driven into the high state, only the first gate line is driven and only the thin film transistor of the first pixel connected to the first gate line is thus turned on. In this third pulse width time T3, the first data signal is supplied to the data line and then to the first pixel. Hence, during the third pulse width time T3, the first pixel displays an image based on the first data signal. Because this first data signal corresponds to the first pixel, the first pixel displays a correct image during the third pulse width time T3. Accordingly, the first pixel ultimately receives the data signal corresponding thereto and displays the correct image.

Figure 39C:
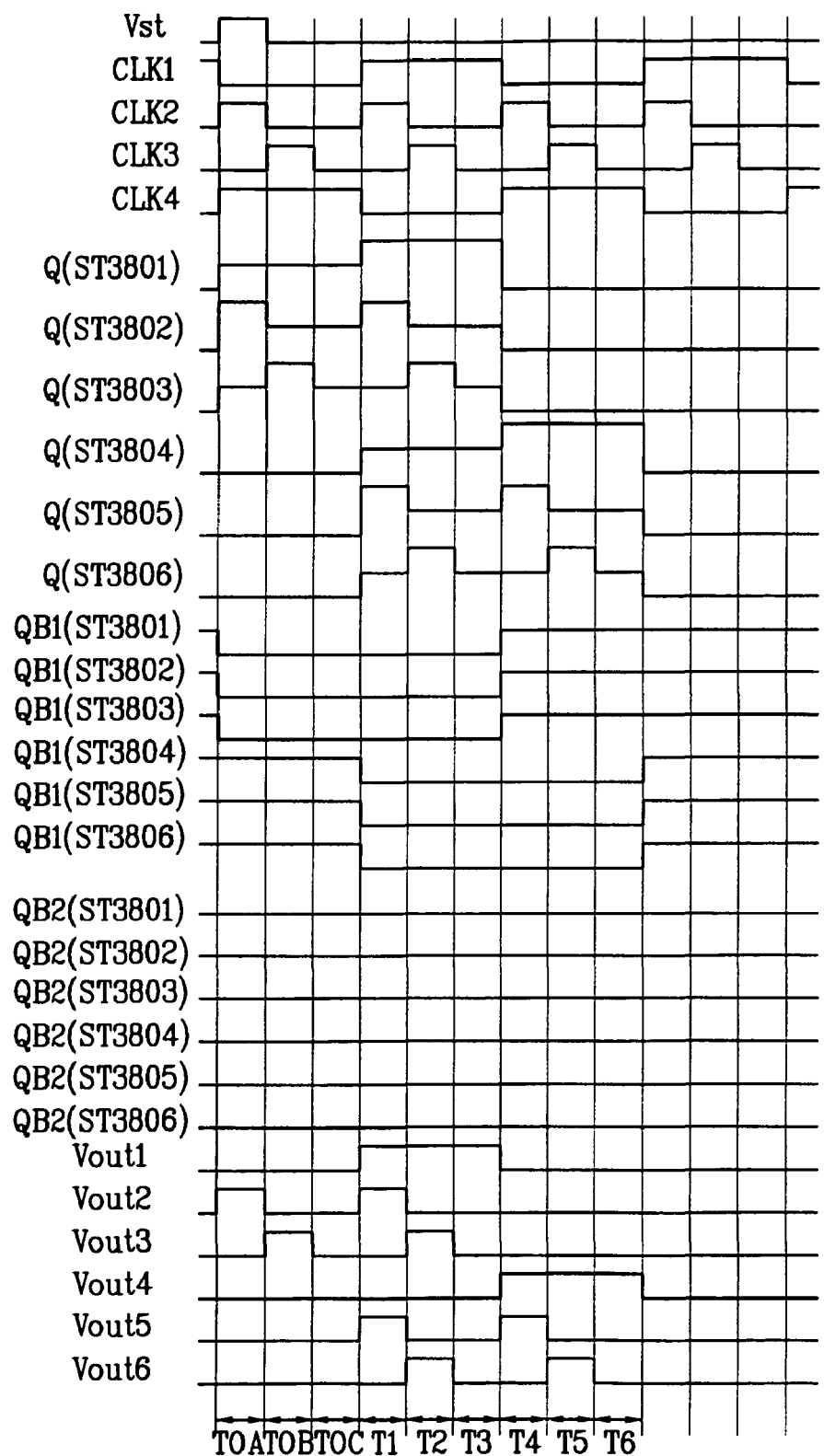
FIG. 39C shows a third exemplary timing diagram of input signals into and output signals from respective stages of the shift register of FIG. 38.

FIG. 39C shows a third exemplary timing diagram of input signals into and output signals from respective stages of the shift register of FIG. 38. Referring to FIG. 39C, the shift register shown in FIG. 38 may be supplied with first to fourth clock pulses CLK1 to CLK4. The first clock pulse CLK1 is driven into a high state for a 3 H period and a low state for the subsequent 3 H period. This first clock pulse CLK1 has the high state and the low state repeatedly. The second clock pulse CLK2 is driven into the high state for a 1 H period and the low state for the subsequent 2 H period. This second clock pulse CLK2 has the high state and the low state repeatedly. Here, a first high duration of the second clock pulse CLK2 is time-aligned with a first high period of the high duration of the first clock pulse CLK1. Also, a second high duration of the second clock pulse CLK2 is time-aligned with a first low period of the low duration of the first clock pulse CLK1. The second clock pulse CLK2 has the first high duration and the second high duration alternately.

Thus, one high duration of the first clock pulse CLK1 has a 3 H period, which may be divided into three 1 H periods. In this case, the first high duration of the second clock pulse CLK2 temporally overlaps with an earliest, first one of the three periods of the high duration of the first clock pulse CLK1. Also, one low duration of the first clock pulse CLK1 has a 3 H period, which may be divided into three 1 H periods. In this case, the second high duration of the second clock pulse CLK2 temporally overlaps with an earliest, first one of the three periods of the low duration of the first clock pulse CLK1.

The third clock pulse CLK3 is driven into the high state for a 1 H period and the low state for the subsequent 2 H period. This third clock pulse CLK3 has the high state and the low state repeatedly. Here, a first high duration of the third clock pulse CLK3 is time-aligned with a second high period of the high duration of the first clock pulse CLK1. Also, a second high duration of the third clock pulse CLK3 is time-aligned with a second low period of the low duration of the first clock pulse CLK1. The third clock pulse CLK3 has the first high duration and the second high duration alternately.

Thus, one high duration of the first clock pulse CLK1 has a 3 H period, which may be divided into three 1 H periods. In this case, the first high duration of the third clock pulse CLK3 temporally overlaps with a second earlier, second one of the three periods of the high duration of the first clock pulse CLK1. Also, one low duration of the first clock pulse CLK1 has a 3 H period, which may be divided into three 1 H periods.

In this case, the second high duration of the third clock pulse CLK3 temporally overlaps with a second earlier, second one of the three periods of the low duration of the first clock pulse CLK1. The fourth clock pulse CLK4 has the same duty ratio as that of the first clock pulse CLK1, and is 180° out of phase with the first clock pulse CLK1.

Each stage (each of the server and client stages) receives any one of the above-stated first to fourth clock pulses CLK1 to CLK4 and outputs the received clock pulse as a scan pulse. On the basis of the above-stated clock pulses, the (4n+1)-th stage outputs a first scan pulse Vout1 with a high duration of 3 H period, the (4n+2)-th stage outputs a second scan pulse Vout2 with a first high duration of 1 H period and a second high duration of 1 H period, the (4n+3)-th stage outputs a third scan pulse Vout3 with a first high duration of 1 H period and a second high duration of 1 H period, and the (4n+4)-th stage outputs a fourth scan pulse Vout4 with a high duration of 3 H period.

Since each of the second and third scan pulses Vout2 and Vout3 has the two high durations for one frame period, thin film transistors of pixels supplied with the second and third scan pulses Vout2 and Vout3 are turned on twice in the one frame period. The thin film transistor of each pixel is pre-charged with a data signal of other pixel in the first high duration and correctly charged with a data signal corresponding thereto in the second high duration.

Figure 40:
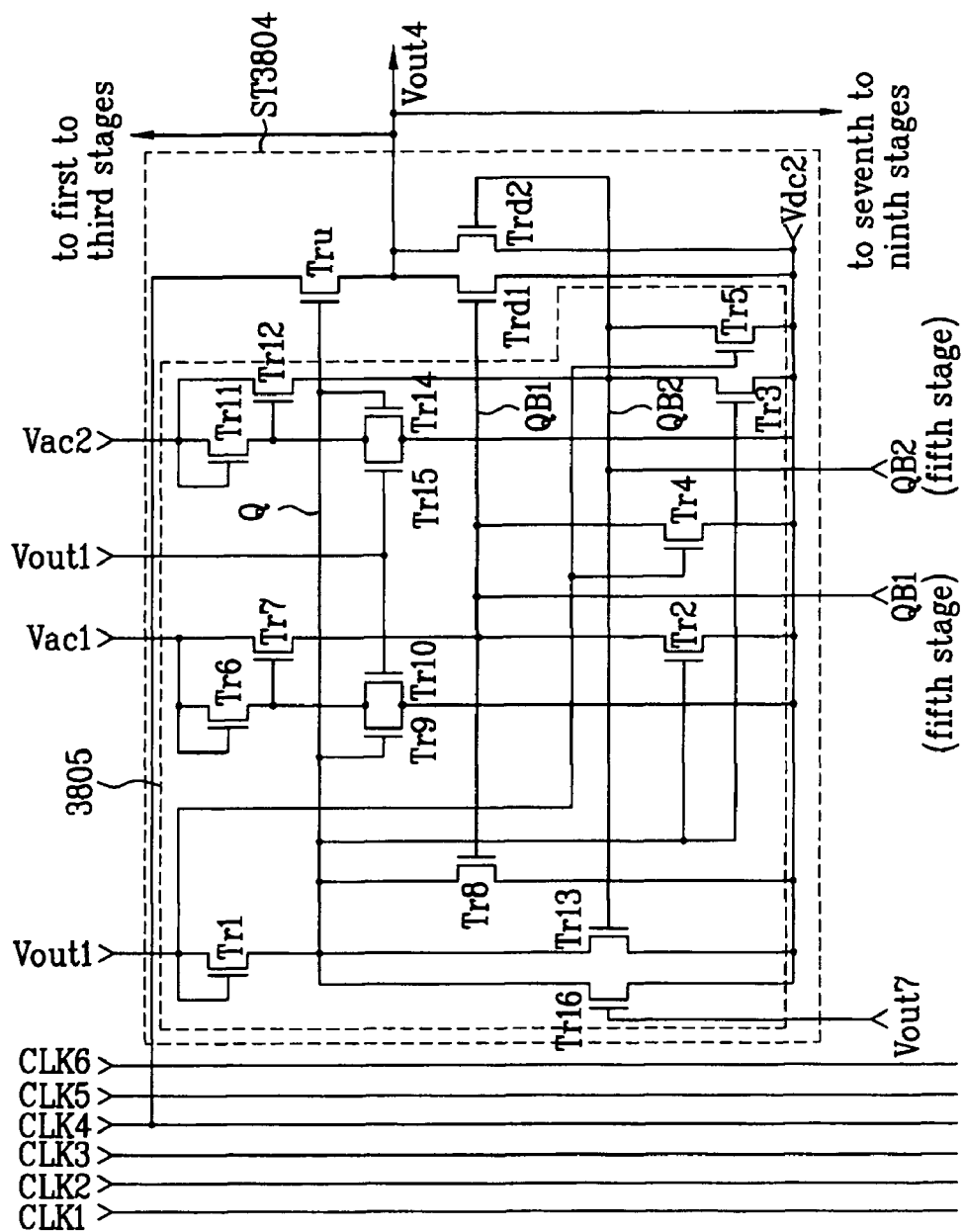
FIG. 40 is a schematic view of a first exemplary circuit configuration of a node controller for the fourth stage in FIG. 38 in accordance with an embodiment of the present invention.

FIG. 40 is a schematic view of a first exemplary circuit configuration of a node controller for the fourth stage in FIG. 38 in accordance with an embodiment of the present invention. Referring to FIG. 40. the fourth stage ST3804 is the server stage in the second stage block SB2, and the node controller 3805 of this server stage includes first to sixteenth switching devices Tr1 to Tr16. The first switching device Tr1 of the server stage in the n-th stage block charges the enabling node Q of the server stage with a first DC voltage Vdc1 in response to the scan pulse from any one of the stages in the (n−1)-th stage block.

The first switching device Tr1 of the fourth stage ST3804 charges the enabling node Q of the fourth stage ST3804 with the first DC voltage Vdc1 in response to the first scan pulse Vout1 from the first stage ST3801. The first switching device Tr1 of the fourth stage ST3804 has a gate terminal connected to the output terminal of the first stage ST3801, a drain terminal connected to a power supply line which transfers the first DC voltage Vdc1, and a source terminal connected to the enabling node Q of the fourth stage ST3804.

The second switching device Tr2 of the server stage in the n-th stage block discharges the first disabling node QB1 of the server stage with a second DC voltage Vdc2 in response to the first DC voltage Vdc1 charged at the enabling node Q of the server stage. The second switching device Tr2 of the fourth stage ST3804 discharges the first disabling node QB1 of the fourth stage ST3804 with the second DC voltage Vdc2 in response to the first DC voltage Vdc1 charged at the enabling node Q of the fourth stage ST3804. The second switching device Tr2 of the fourth stage ST3804 has a gate terminal connected to the enabling node Q of the fourth stage ST3804, a drain terminal connected to the first disabling node QB1 of the fourth stage ST3804, and a source terminal connected to a power supply line which transfers the second DC voltage Vdc2.

The third switching device Tr3 of the server stage in the n-th stage block discharges the second disabling node QB2 of the server stage with the second DC voltage Vdc2 in response to the first DC voltage Vdc1 charged at the enabling node Q of the server stage. For example, the third switching device Tr3 of the fourth stage ST3804 discharges the second disabling node QB2 of the fourth stage ST3804 with the second DC voltage Vdc2 in response to the first DC voltage Vdc1 charged at the enabling node Q of the fourth stage ST3804. The third switching device Tr3 of the fourth stage ST3804 has a gate terminal connected to the enabling node Q of the fourth stage ST3804, a drain terminal connected to the second disabling node QB2 of the fourth stage ST3804, and a source terminal connected to the power supply line which transfers the second DC voltage Vdc2.

The fourth switching device Tr4 of the server stage in the n-th stage block discharges the first disabling node QB1 of the server stage in the n-th stage block with the second DC voltage Vdc2 in response to the scan pulse from any one of the stages in the (n−1)-th stage block. The fourth switching device Tr4 of the fourth stage ST3804 discharges the first disabling node QB1 of the fourth stage ST3804 with the second DC voltage Vdc2 in response to the first scan pulse Vout1 from the first stage ST3801. The fourth switching device Tr4 of the fourth stage ST3804 has a gate terminal connected to the output terminal of the first stage ST3801, a drain terminal connected to the first disabling node QB1 of the fourth stage ST3804, and a source terminal connected to the power supply line which transfers the second DC voltage Vdc2.

The fifth switching device Tr5 of the server stage in the n-th stage block discharges the second disabling node QB2 of the server stage with the second DC voltage Vdc2 in response to the scan pulse from any one of the stages in the (n−1)-th stage block. The fifth switching device Tr5 of the fourth stage ST3804 discharges the second disabling node QB2 of the fourth stage ST3804 with the second DC voltage Vdc2 in response to the first scan pulse Vout1 from the first stage ST3801. The fifth switching device Tr5 of the fourth stage ST3804 has a gate terminal connected to the output terminal of the first stage ST3801, a drain terminal connected to the second disabling node QB2 of the fourth stage ST3804, and a source terminal connected to the power supply line which transfers the second DC voltage Vdc2.

The sixth switching device Tr6 of the server stage in the n-th stage block is turned on or off in response to the first AC voltage Vac1, and outputs the first AC voltage Vac1 when being turned on. The sixth switching device Tr6 of the fourth stage ST3804 is turned on or off in response to the first AC voltage Vac1, and outputs the first AC voltage Vac1 when being turned on. The sixth switching device Tr6 of the fourth stage ST3804 has a gate terminal and drain terminal connected in common to a power supply line which transfers the first AC voltage Vac1.

The seventh switching device Tr7 of the server stage in the n-th stage block charges the first disabling node QB1 of the server stage with the first AC voltage Vac1 in response to the first AC voltage Vac1 outputted from the sixth switching device Tr6. The seventh switching device Tr7 of the fourth stage ST3804 charges the first disabling node QB1 of the fourth stage ST3804 with the first AC voltage Vac1 in response to the first AC voltage Vac1 outputted from the sixth switching device Tr6. The seventh switching device Tr7 of the fourth stage ST3804 has a gate terminal connected to the source terminal of the sixth switching device Tr6, a drain terminal connected to a power supply line which transfers the first AC voltage Vac1, and a source terminal connected to the first disabling node QB1 of the fourth stage ST3804.

The eighth switching device Tr8 of the server stage in the n-th stage block discharges the enabling node Q of the server stage with the second DC voltage Vdc2 in response to the first AC voltage Vac1 charged at the first disabling node QB1 of the server stage. The eighth switching device Tr8 of the fourth stage ST3804 discharges the enabling node Q of the fourth stage ST3804 with the second DC voltage Vdc2 in response to the first AC voltage Vac1 charged at the first disabling node QB1 of the fourth stage ST3804. The eighth switching device Tr8 of the fourth stage ST3804 has a gate terminal connected to the first disabling node QB1 of the fourth stage ST3804, a drain terminal connected to the enabling node Q of the fourth stage ST3804, and a source terminal connected to the power supply line which transfers the second DC voltage Vdc2.

The ninth switching device Tr9 of the server stage in the n-th stage block supplies the second DC voltage Vdc2 to the gate terminal of the seventh switching device Tr7 in response to the first DC voltage Vdc1 charged at the enabling node Q of the server stage to turn off the seventh switching device Tr7. For example, the ninth switching device Tr9 of the fourth stage ST3804 supplies the second DC voltage Vdc2 to the gate terminal of the seventh switching device Tr7 in response to the first DC voltage Vdc1 charged at the enabling node Q of the fourth stage ST3804 to turn off the seventh switching device Tr7. The ninth switching device Tr9 of the fourth stage ST3804 has a gate terminal connected to the enabling node Q of the fourth stage ST3804, a drain terminal connected to the gate terminal of the seventh switching device Tr7, and a source terminal connected to the power supply line which transfers the second DC voltage Vdc2.

The tenth switching device Tr10 of the server stage in the n-th stage block supplies the second DC voltage Vdc2 to the gate terminal of the seventh switching device Tr7 in response to the scan pulse from any one of the stages in the (n−1)-th stage block to turn off the seventh switching device Tr7. For example, the tenth switching device Tr10 of the fourth stage ST3804 supplies the second DC voltage Vdc2 to the gate terminal of the seventh switching device Tr7 in response to the first scan pulse Vout1 from the first stage ST3801 to turn off the seventh switching device Tr7. The tenth switching device Tr10 of the fourth stage ST3804 has a gate terminal connected to the output terminal of the first stage ST3801, a drain terminal connected to the gate terminal of the seventh switching device Tr7, and a source terminal connected to the power supply line which transfers the second DC voltage Vdc2.

The eleventh switching device Tr11 of the server stage in the n-th stage block is turned on or off in response to the second AC voltage Vac2, and outputs the second AC voltage Vac2 when being turned on. The eleventh switching device Tr11 of the fourth stage ST3804 is turned on or off in response to the second AC voltage Vac2, and outputs the second AC voltage Vac2 when being turned on. The eleventh switching device Tr11 of the fourth stage ST3804 has a gate terminal and drain terminal connected in common to a power supply line which transfers the second AC voltage Vac2.

The twelfth switching device Tr12 of the server stage in the n-th stage block charges the second disabling node QB2 of the server stage with the second AC voltage Vac2 in response to the second AC voltage Vac2 outputted from the eleventh switching device Tr11. The twelfth switching device Tr12 of the fourth stage ST3804 charges the second disabling node QB2 of the fourth stage ST3804 with the second AC voltage Vac2 in response to the second AC voltage Vac2 outputted from the eleventh switching device Tr11. The twelfth switching device Tr12 of the fourth stage ST3804 has a gate terminal connected to the source terminal of the eleventh switching device Tr11, a drain terminal connected to the power supply line which transfers the second AC voltage Vac2, and a source terminal connected to the second disabling node QB2 of the fourth stage ST3804.

The thirteenth switching device Tr13 of the server stage in the n-th stage block discharges the enabling node Q of the server stage with the second DC voltage Vdc2 in response to the second AC voltage Vac2 charged at the second disabling node QB2 of the server stage. The thirteenth switching device Tr13 of the fourth stage ST3804 discharges the enabling node Q of the fourth stage ST3804 with the second DC voltage Vdc2 in response to the second AC voltage Vac2 charged at the second disabling node QB2 of the fourth stage ST3804. The thirteenth switching device Tr13 of the fourth stage ST3804 has a gate terminal connected to the second disabling node QB2 of the fourth stage ST3804, a drain terminal connected to the enabling node Q of the fourth stage ST3804, and a source terminal connected to the power supply line which transfers the second DC voltage Vdc2.

The fourteenth switching device Tr14 of the server stage in the n-th stage block supplies the second DC voltage Vdc2 to the gate terminal of the twelfth switching device Tr12 in response to the first DC voltage Vdc1 charged at the enabling node Q of the server stage to turn off the twelfth switching device Tr12. For example, the fourteenth switching device Tr14 of the fourth stage ST3804 supplies the second DC voltage Vdc2 to the gate terminal of the twelfth switching device Tr12 in response to the first DC voltage Vdc1 charged at the enabling node Q of the fourth stage ST3804 to turn off the twelfth switching device Tr12. The fourteenth switching device Tr14 of the fourth stage ST3804 has a gate terminal connected to the enabling node Q of the fourth stage ST3804, a drain terminal connected to the gate terminal of the twelfth switching device Tr12, and a source terminal connected to the power supply line which transfers the second DC voltage Vdc2.

The fifteenth switching device Tr15 of the server stage in the n-th stage block supplies the second DC voltage Vdc2 to the gate terminal of the twelfth switching device Tr12 in response to the scan pulse from any one of the stages in the (n−1)-th stage block to turn off the twelfth switching device Tr12. For example, the fifteenth switching device Tr15 of the fourth stage ST3804 turns off the twelfth switching device Tr12 in response to the first scan pulse Vout1 from the first stage ST3801. The fifteenth switching device Tr15 of the fourth stage ST3804 has a gate terminal connected to the output terminal of the first stage ST3801, a drain terminal connected to the gate terminal of the twelfth switching device Tr12, and a source terminal connected to the power supply line which transfers the second DC voltage Vdc2.

The sixteenth switching device Tr16 of the server stage in the n-th stage block discharges the enabling node Q of the server stage with the second DC voltage Vdc2 in response to the scan pulse from any one of the stages in the (n+1)-th stage block. The sixteenth switching device Tr16 of the fourth stage ST3804 discharges the enabling node Q of the fourth stage ST3804 with the second DC voltage Vdc2 in response to the seventh scan pulse Vout7 from the seventh stage. The sixteenth switching device Tr16 of the fourth stage ST3804 has a gate terminal connected to the output terminal of the seventh stage, a drain terminal connected to the enabling node Q of the fourth stage ST3804, and a source terminal connected to the power supply line which transfers the second DC voltage Vdc2.

On the other hand, the first, fourth, fifth, tenth and fifteenth switching devices Tr1, Tr4, Tr5, Tr10 and Tr15 of each of the first to third stages ST3801 to ST3803 in the first stage block SB1 are turned on in response to the start pulse Vst.

Figure 41:
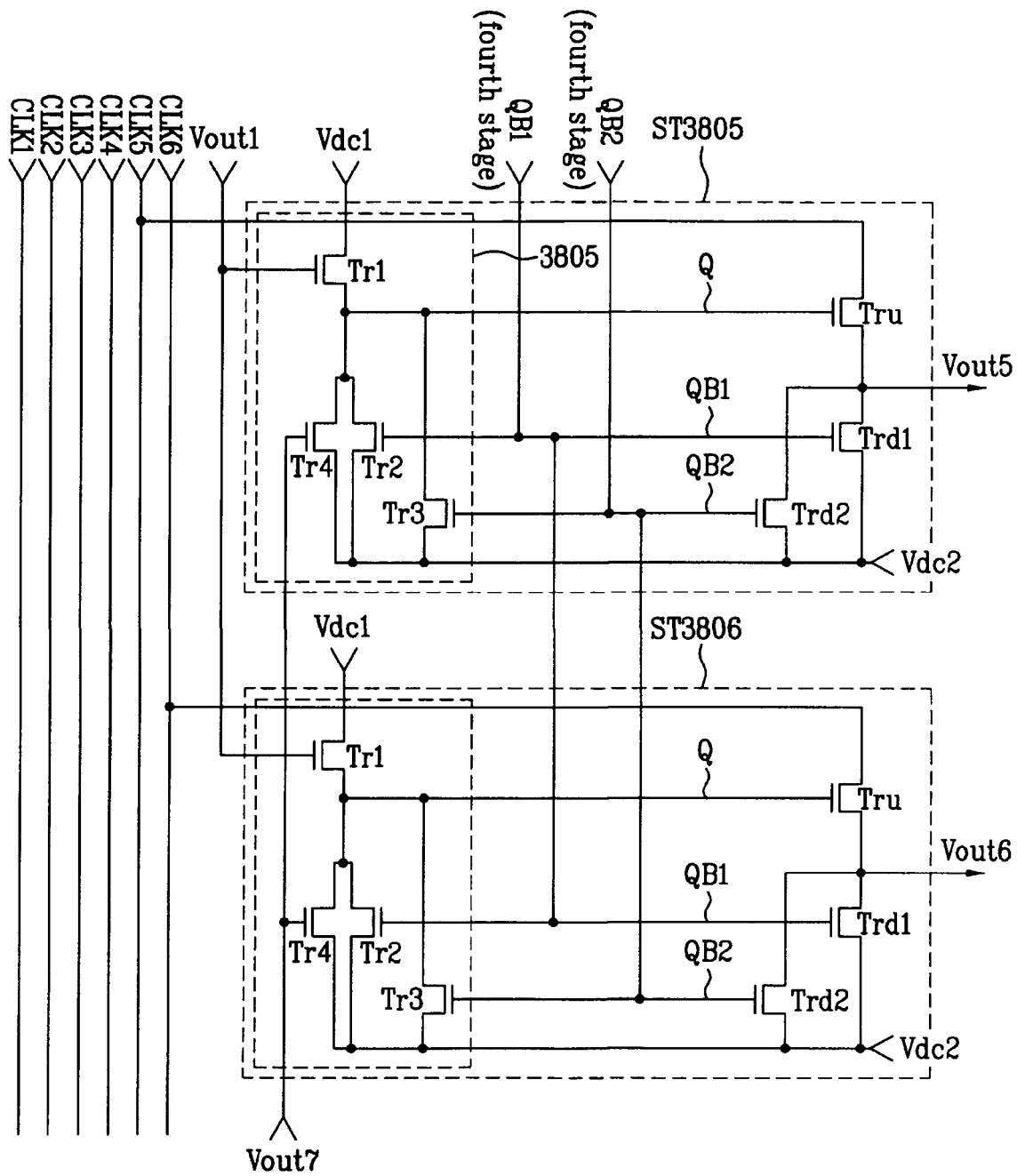
FIG. 41 is a schematic view of an exemplary circuit configuration of a node controller for the fifth and sixth stages in FIG. 38 in accordance with an embodiment of the present invention.

FIG. 41 is a schematic view of an exemplary circuit configuration of a node controller for the fifth and sixth stages in FIG. 38 in accordance with an embodiment of the present invention. Referring to FIG. 41, the fifth and sixth stages ST3805 and ST3806 are the first and second client stages in the second stage block SB2, and the node controller 3805 of each of the first and second client stages includes first to fourth switching devices Tr1 to Tr4. Here, the circuit configurations of the first and second client stages are substantially the same, and a description will thus be given of only the circuit configuration of the first client stage.

The first switching device Tr1 of the first client stage in the n-th stage block charges the enabling node Q of the first client stage with the first DC voltage Vdc1 in response to the scan pulse from any one of the stages in the (n−1)-th stage block. The first switching device Tr1 of the fifth stage ST3805 charges the enabling node Q of the fifth stage ST3805 with the first DC voltage Vdc1 in response to the first scan pulse Vout1 from the first stage ST3801. The first switching device Tr1 of the fifth stage ST3805 has a gate terminal connected to the output terminal of the first stage ST3801, a drain terminal connected to the power supply line which transfers the first DC voltage Vdc1, and a source terminal connected to the enabling node Q of the fifth stage ST3805.

The second switching device Tr2 of the first client stage in the n-th stage block discharges the enabling node Q of the first client stage with the second DC voltage Vdc2 in response to the first AC voltage Vac1 supplied to the first disabling node QB1 of the first client stage. The second switching device Tr2 of the fifth stage ST3805 discharges the enabling node Q of the fifth stage ST3805 with the second DC voltage Vdc2 in response to the first AC voltage Vac1 supplied to the first disabling node QB1 of the fifth stage ST3805. The second switching device Tr2 of the fifth stage ST3805 has a gate terminal connected to the first disabling node QB1 of the fifth stage ST3805, a drain terminal connected to the enabling node Q of the fifth stage ST3805, and a source terminal connected to the power supply line which transfers the second DC voltage Vdc2.

The third switching device Tr3 of the first client stage in the n-th stage block discharges the enabling node Q of the first client stage with the second DC voltage Vdc2 in response to the second AC voltage Vac2 supplied to the second disabling node QB2 of the first client stage. The third switching device Tr3 of the fifth stage ST3805 discharges the enabling node Q of the fifth stage ST3805 with the second DC voltage Vdc2 in response to the second AC voltage Vac2 supplied to the second disabling node QB2 of the fifth stage ST3805. The third switching device Tr3 of the fifth stage ST3805 has a gate terminal connected to the second disabling node QB2 of the fifth stage ST3805, a drain terminal connected to the enabling node Q of the fifth stage ST3805, and a source terminal connected to the power supply line which transfers the second DC voltage Vdc2.

The fourth switching device Tr4 of the first client stage in the n-th stage block discharges the enabling node Q of the first client stage with the second DC voltage Vdc2 in response to the scan pulse from any one of the stages in the (n+1)-th stage block. The fourth switching device Tr4 of the fifth stage ST3805 discharges the enabling node Q of the fifth stage ST3805 with the second DC voltage Vdc2 in response to the seventh scan pulse from the seventh stage. The fourth switching device Tr4 of the fifth stage ST3805 has a gate terminal connected to the output terminal of the seventh stage, a drain terminal connected to the enabling node Q of the fifth stage ST3805, and a source terminal connected to the power supply line which transfers the second DC voltage Vdc2.

Here, assume that the first AC voltage Vac1 is positive and the second AC voltage Vac2 is negative, during the period of a first frame, and the first AC voltage Vac1 is negative and the second AC voltage Vac2 is positive, during the period of a second frame. In other words, it is assumed that the first AC voltage Vac1 is positive and the second AC voltage Vac2 is negative, during the period of an odd frame, and the first AC voltage Vac1 is negative and the second AC voltage Vac2 is positive, during the period of an even frame.

First, the start pulse Vst turns on the first, fourth, fifth, tenth and fifteenth switching devices Tr1, Tr4, Tr5, Tr10 and Tr15 of the first stage ST3801. Hence, the first DC voltage Vdc1 is supplied to the enabling node Q through the turned-on first switching device Tr1. The enabling node Q is charged with the first DC voltage Vdc1, thereby causing the second, third, ninth and fourteenth switching devices Tr2, Tr3, Tr9 and Tr14 and the pull-up switching device Tru, the gate terminals of which are connected to the enabling node Q, to be turned on.

Then, the second DC voltage Vdc2 is supplied to the first disabling node QB1 through the turned-on second and fourth switching devices Tr2 and Tr4. Hence, the first disabling node QB1 is discharged, and the eighth switching device Tr8 and first pull-down switching device Trd1, the gate terminals of which are connected to the first disabling node QB1, are thus turned off.

The second DC voltage Vdc2 is also supplied to the second disabling node QB2 through the turned-on third and fifth switching devices Tr3 and Tr5. Hence, the second disabling node QB2 is discharged, and the thirteenth switching device Tr13 and second pull-down switching device Trd2, the gate terminals of which are connected to the second disabling node QB2, are thus turned off.

The second DC voltage Vdc2 is also supplied to the gate terminal of the seventh switching device Tr7 through the turned-on ninth and tenth switching devices Tr9 and Tr10. The first AC voltage Vac1 is also supplied to the gate terminal of the seventh switching device Tr7 through the sixth switching device Tr6 which always remains turned on for the first frame period owing to the positive, first AC voltage Vac1. Hence, the second DC voltage Vdc2 and the first AC voltage Vac1 are together supplied to the gate terminal of the seventh switching device Tr7. Because the switching devices supplying the second DC voltage Vdc2 to the gate terminal of the seventh switching device Tr7 are greater in number than the switching device supplying the first AC voltage Vac1 to the gate terminal of the seventh switching device Tr7, the gate terminal of the seventh switching device Tr7 is maintained at the second DC voltage Vdc2. Hence, the seventh switching device Tr7 is turned off.

The second DC voltage Vdc2 is also supplied to the gate terminal of the twelfth switching device Tr12 through the turned-on fourteenth and fifteenth switching devices Tr14 and Tr15. Thus, the twelfth switching device Tr12 is turned off. Meanwhile, the eleventh switching device Tr11 always remains turned off for the first frame period owing to the negative, second AC voltage Vac2.

Hence, the enabling node Q of the first stage ST3801 is charged by the start pulse Vst and the first and second disabling nodes QB1 and QB2 of the first stage ST3801 are discharged by the start pulse Vst. In other words, the first stage ST3801 is enabled by the start pulse Vst.

On the other hand, the start pulse Vst is also supplied to the second and third stages ST3802 and ST3803, so as to enable the second and third stages ST3802 and ST3803.

The start pulse Vst turns on the first switching device Tr1 of the second stage ST3802. Hence, the first DC voltage Vdc1 is supplied to the enabling node Q through the turned-on first switching device Tr1. As the enabling node Q is charged with the first DC voltage Vdc1, the pull-up switching device Tru with its gate terminal connected to the enabling node Q is turned on. Because the first disabling node QB1 of the second stage ST3802 is electrically connected with the first disabling node QB1 of the first stage ST3801, it is kept discharged. Also, because the second disabling node QB2 of the second stage ST3802 is electrically connected with the second disabling node QB2 of the first stage ST3801, it is kept discharged.

Similarly, the enabling node Q of the third stage ST3803 is charged and the first and second disabling nodes QB1 and QB2 of the third stage ST3803 are discharged. Hence, the first to third stages ST3801 to ST3803 in the first stage block SB1 are enabled by the start pulse Vst. Thereafter, when the first clock pulse CLK1 is supplied to the pull-up switching device Tru of the first stage ST3801, the pull-up switching device Tru outputs the first clock pulse CLK1 as the first scan pulse Vout1 and supplies it to the first gate line and the stages in the second stage block SB2.

The first scan pulse Vout1 outputted from the first stage ST3801 is supplied to the stages (fourth, fifth and sixth stages ST3804, ST3805 and ST3806) in the second stage block SB2, so as to function as the start pulse Vst to enable the fourth to sixth stages ST3804 to ST3806. Hence, the fourth to sixth stages ST3804 to ST3806 are simultaneously enabled through the operation as described above.

Thereafter, when the second clock pulse CLK2 is supplied to the pull-up switching device Tru of the second stage ST3802, the pull-up switching device Tru outputs the second clock pulse CLK2 as the second scan pulse Vout2 and supplies it to the second gate line.

Thereafter, when the third clock pulse CLK3 is supplied to the pull-up switching device Tru of the third stage ST3803, the pull-up switching device Tru outputs the third clock pulse CLK3 as the third scan pulse Vout3 and supplies it to the third gate line.

Thereafter, when the fourth clock pulse CLK4 is supplied to the pull-up switching device Tru of the fourth stage ST3804, the pull-up switching device Tru outputs the fourth clock pulse CLK4 as the fourth scan pulse Vout4 and supplies it to the fourth gate line and the stages in the third stage block. The fourth stage ST3804 also supplies the fourth scan pulse Vout4 to the stages (first, second and third stages ST3801, ST3802 and ST3803) in the first stage block SB1 to disable the first to third stages ST3801 to ST3803.

This disabling operation is performed in the following manner. The fourth scan pulse Vout4 outputted from the fourth stage ST3804 is also supplied to the sixteenth switching device Tr16 of the first stage ST3801. The fourth scan pulse Vout4 is supplied to the gate terminal of the sixteenth switching device Tr16 of the first stage ST3801. Hence, the first stage ST3801 is disabled. For example, the fourth scan pulse Vout4 turns on the sixteenth switching device Tr16 of the first stage ST3801. Then, the second DC voltage Vdc2 is supplied to the enabling node Q of the first stage ST3801 through the turned-on sixteenth switching device Tr16. Hence, the enabling node Q of the first stage ST3801 is discharged. Accordingly, the second, third, ninth and fourteenth switching devices Tr2, Tr3, Tr9 and Tr14 and the pull-up switching device Tru with their gate terminals connected to the enabling node Q of the first stage ST3801 are turned off. Also, the start pulse Vst makes a high to low state transition, thus turning off the first, fourth, fifth, tenth and fifteenth switching devices Tr1, Tr4, Tr5, Tr10 and Tr15 of the first stage ST3801 supplied with the start pulse Vst of the low state.

As the second, fourth, ninth and tenth switching devices Tr2, Tr4, Tr9 and Tr10 of the first stage ST3801 are turned off, the first disabling node QB1 of the first stage ST3801 is charged with the first AC voltage Vac1 applied through the seventh switching device Tr7. Hence, the eighth switching device Tr8 and first pull-down switching device Trd1 with their gate terminals connected to the first disabling node QB1 of the first stage ST3801 are turned on.

As the third and fifth switching devices Tr3 and Tr5 of the first stage ST3801 are turned off, the second disabling node QB2 of the first stage ST3801 is kept discharged. Hence, the thirteenth switching device Tr13 and second pull-down switching device Trd2 with their gate terminals connected to the second disabling node QB2 of the first stage ST3801 remain OFF.

Hence, the enabling node Q and second disabling node QB2 of the first stage ST3801 are discharged by the fourth scan pulse Vout4 from the fourth stage ST3804 and the first disabling node QB1 of the first stage ST3801 is charged by the fourth scan pulse Vout4. The first stage ST3801 is disabled in response to the fourth scan pulse Vout4 from the fourth stage ST3804. The disabled first stage ST3801 outputs the second DC voltage Vdc2 through the first pull-down switching device Trd1 thereof. The disabled first stage ST3801 then supplies the second DC voltage Vdc2 to the first gate line.

The fourth scan pulse Vout4 from the fourth stage ST3804 is also supplied to the second and third stages ST3802 and ST3803 to disable the second and third stages ST3802 and ST3803. This disabling operation is performed in the following manner. The fourth scan pulse Vout4 outputted from the fourth stage ST3804 is supplied to the fourth switching device Tr4 of the second stage ST3802. Hence, the fourth switching device Tr4 is turned on and the second DC voltage Vdc2 is supplied to the enabling node Q of the second stage ST3802 through the turned-on fourth switching device Tr4. Accordingly, the enabling node Q is discharged and the pull-up switching device Tru with its gate terminal connected to the discharged enabling node Q is thus turned off.

The first and second disabling nodes QB1 and QB2 of the second stage ST3802 have the same states as those of the first and second disabling nodes QB1 and QB2 of the first stage ST3801, respectively. Thus, when the first stage ST3801 is disabled, the first disabling node QB1 of the second stage ST3802 is charged and the second disabling node QB2 of the second stage ST3802 is discharged. Accordingly, the first pull-down switching device Trd1 of the second stage ST3802 is turned on and the second pull-down switching device Trd2 of the second stage ST3802 is turned off.

Thus, when the second stage ST3802 is disabled, the pull-up switching device Tru and second pull-down switching device Trd2 of the second stage ST3802 are turned off and the first pull-down switching device Trd1 of the second stage ST3802 is turned on. The second DC voltage Vdc2 is supplied to the second gate line through the turned-on first pull-down switching device Trd1. The third stage ST3803 supplied with the fourth scan pulse Vout4 is also disabled in the same manner as the second stage ST3802.

On the other hand, in the second frame period, the first AC voltage Vac1 is negative and the second AC voltage Vac2 is positive. Hence, when each of the stages ST3801, ST3802, ST3803, . . . is disabled, the first disabling node QB1 of each stage is discharged and the second disabling node QB2 of each stage is charged. Hence, when each stage is disabled, the second DC voltage Vdc2 is outputted through the second pull-down switching device Trd2 with its gate terminal connected to the second disabling node QB2.

Figure 42:
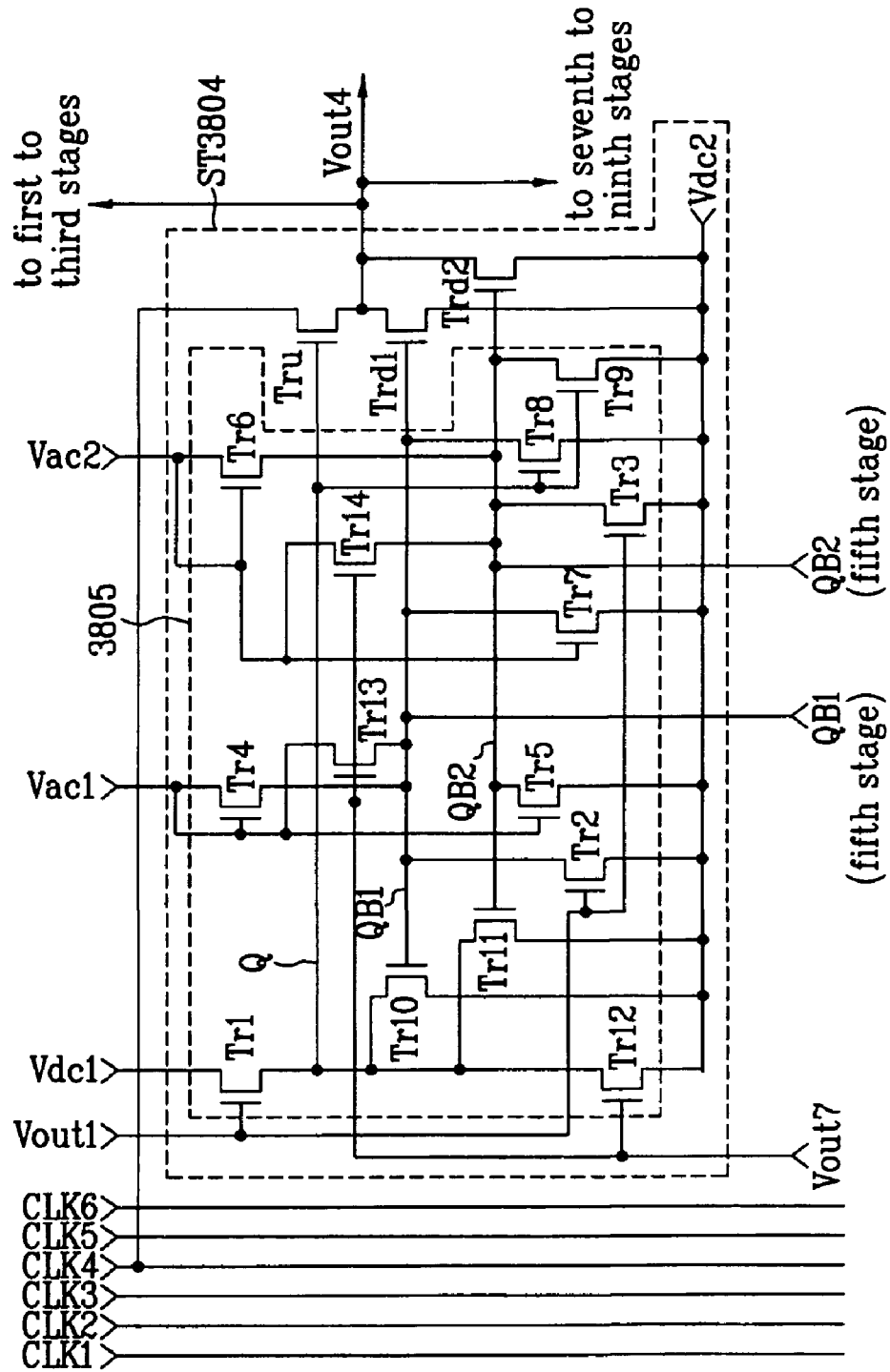
FIG. 42 is a schematic view of a second exemplary circuit configuration of a node controller for the fourth stage in FIG. 38 in accordance with an embodiment of the present invention.

FIG. 42 is a schematic view of a second exemplary circuit configuration of a node controller for the fourth stage in FIG. 38 in accordance with an embodiment of the present invention. Referring to FIG. 42, the first switching device Tr1 of the server stage in the n-th stage block charges the enabling node Q of the server stage with a first DC voltage Vdc1 in response to the scan pulse from any one of the stages in the (n−1)-th stage block. The first switching device Tr1 of the fourth stage ST3804 charges the enabling node Q of the fourth stage ST3804 with the first DC voltage Vdc1 in response to the first scan pulse Vout1 from the first stage ST3801. The first switching device Tr1 of the fourth stage ST3804 has a gate terminal connected to the output terminal of the first stage ST3801, a drain terminal connected to a power supply line which transfers the first DC voltage Vdc1, and a source terminal connected to the enabling node Q of the fourth stage ST3804.

The second switching device Tr2 of the server stage in the n-th stage block discharges the first disabling node QB1 of the server stage with a second DC voltage Vdc2 in response to the scan pulse from any one of the stages in the (n−1)-th stage block. The second switching device Tr2 of the fourth stage ST3804 discharges the first disabling node QB1 of the fourth stage ST3804 with the second DC voltage Vdc2 in response to the first scan pulse Vout1 from the first stage ST3801. The second switching device Tr2 of the fourth stage ST3804 has a gate terminal connected to the first stage ST3801, a drain terminal connected to the first disabling node QB1 of the fourth stage ST3804, and a source terminal connected to a power supply line which transfers the second DC voltage Vdc2.

The third switching device Tr3 of the server stage in the n-th stage block discharges the second disabling node QB2 of the server stage with the second DC voltage Vdc2 in response to the scan pulse from any one of the stages in the (n−1)-th stage block. For example, the third switching device Tr3 of the fourth stage ST3804 discharges the second disabling node QB2 of the fourth stage ST3804 with the second DC voltage Vdc2 in response to the first scan pulse Vout1 from the first stage ST3801. The third switching device Tr3 of the fourth stage ST3804 has a gate terminal connected to the first stage ST3801, a drain terminal connected to the second disabling node QB2 of the fourth stage ST3804, and a source terminal connected to the power supply line which transfers the second DC voltage Vdc2.

The fourth switching device Tr4 of the server stage in the n-th stage block is turned on or off in response to the first AC voltage Vac1, and charges the first disabling node QB1 of the server stage with the first AC voltage Vac1 when being turned on. The fourth switching device Tr4 of the fourth stage ST3804 is turned on or off in response to the first AC voltage Vac1, and charges the first disabling node QB1 of the fourth stage ST3804 with the first AC voltage Vac1 when being turned on. The fourth switching device Tr4 of the fourth stage ST3804 has a gate terminal connected to a power supply line which transfers the first AC voltage Vac1, a drain terminal connected to the power supply line which transfers the first AC voltage Vac1, and a source terminal connected the first disabling node QB1 of the fourth stage ST3804.

The fifth switching device Tr5 of the server stage in the n-th stage block discharges the second disabling node QB2 of the server stage with the second DC voltage Vdc2 in response to the first AC voltage Vac1. The fifth switching device Tr5 of the fourth stage ST3804 discharges the second disabling node QB2 of the fourth stage ST3804 with the second DC voltage Vdc2 in response to the first AC voltage Vac1. The fifth switching device Tr5 of the fourth stage ST3804 has a gate terminal connected to the power supply line which transfers the first AC voltage Vac1, a drain terminal connected to the second disabling node QB2 of the fourth stage ST3804, and a source terminal connected to the power supply line which transfers the second DC voltage Vdc2.

The sixth switching device Tr6 of the server stage in the n-th stage block is turned on or off in response to the second AC voltage Vac2, and charges the second disabling node QB2 of the server stage with the second AC voltage Vac2 when being turned on. The sixth switching device Tr6 of the fourth stage ST3804 is turned on or off in response to the second AC voltage Vac2, and charges the second disabling node QB2 of the fourth stage ST3804 with the second AC voltage Vac2 when being turned on. The sixth switching device Tr6 of the fourth stage ST3804 has a gate terminal connected to a power supply line which transfers the second AC voltage Vac2, a drain terminal connected to the power supply line which transfers the second AC voltage Vac2, and a source terminal connected to the second disabling node QB2 of the fourth stage ST3804.

The seventh switching device Tr7 of the server stage in the n-th stage block discharges the first disabling node QB1 of the server stage with the second DC voltage Vdc2 in response to the second AC voltage Vac2. The seventh switching device Tr7 of the fourth stage ST3804 discharges the first disabling node QB1 of the fourth stage ST3804 with the second DC voltage Vdc2 in response to the second AC voltage Vac2. The seventh switching device Tr7 of the fourth stage ST3804 has a gate terminal connected to the power supply line which transfers the second AC voltage Vac2, a drain terminal connected to the first disabling node QB1 of the fourth stage ST3804, and a source terminal connected to the power supply line which transfers the second DC voltage Vdc2.

The eighth switching device Tr8 of the server stage in the n-th stage block discharges the first disabling node QB1 of the server stage with the second DC voltage Vdc2 in response to the first DC voltage Vdc1 charged at the enabling node Q of the server stage. For example, the eighth switching device Tr8 of the fourth stage ST3804 discharges the first disabling node QB1 of the fourth stage ST3804 with the second DC voltage Vdc2 in response to the first DC voltage Vdc1 charged at the enabling node Q of the fourth stage ST3804. The eighth switching device Tr8 of the fourth stage ST3804 has a gate terminal connected to the enabling node Q of the fourth stage ST3804, a drain terminal connected to the first disabling node QB1 of the fourth stage ST3804, and a source terminal connected to the power supply line which transfers the second DC voltage Vdc2.

The ninth switching device Tr9 of the server stage in the n-th stage block discharges the second disabling node QB2 of the server stage with the second DC voltage Vdc2 in response to the first DC voltage Vdc1 charged at the enabling node Q of the server stage. For example, the ninth switching device Tr9 of the fourth stage ST3804 discharges the second disabling node QB2 of the fourth stage ST3804 with the second DC voltage Vdc2 in response to the first DC voltage Vdc1 charged at the enabling node Q of the fourth stage ST3804. The ninth switching device Tr9 of the fourth stage ST3804 has a gate terminal connected to the enabling node Q of the fourth stage ST3804, a drain terminal connected to the second disabling node QB2 of the fourth stage ST3804, and a source terminal connected to the power supply line which transfers the second DC voltage Vdc2.

The tenth switching device Tr10 of the server stage in the n-th stage block discharges the enabling node Q of the server stage with the second DC voltage Vdc2 in response to the first AC voltage Vac1 charged at the first disabling node QB1 of the server stage. The tenth switching device Tr10 of the fourth stage ST3804 discharges the enabling node Q of the fourth stage ST3804 with the second DC voltage Vdc2 in response to the first AC voltage Vac1 charged at the first disabling node QB1 of the fourth stage ST3804. The tenth switching device Tr10 of the fourth stage ST3804 has a gate terminal connected to the first disabling node QB1 of the fourth stage ST3804, a drain terminal connected to the enabling node Q of the fourth stage ST3804, and a source terminal connected to the power supply line which transfers the second DC voltage Vdc2.

The eleventh switching device Tr11 of the server stage in the n-th stage block discharges the enabling node Q of the server stage with the second DC voltage Vdc2 in response to the second AC voltage Vac2 charged at the second disabling node QB2 of the server stage. The eleventh switching device Tr11 of the fourth stage ST3804 discharges the enabling node Q of the fourth stage ST3804 with the second DC voltage Vdc2 in response to the second AC voltage Vac2 charged at the second disabling node QB2 of the fourth stage ST3804. The eleventh switching device Tr11 of the fourth stage ST3804 has a gate terminal connected to the second disabling node QB2 of the fourth stage ST3804, a drain terminal connected to the enabling node Q of the fourth stage ST3804, and a source terminal connected to the power supply line which transfers the second DC voltage Vdc2.

The twelfth switching device Tr12 of the server stage in the n-th stage block discharges the enabling node Q of the server stage with the second DC voltage Vdc2 in response to the scan pulse from any one of the stages in the (n+1)-th stage block. The twelfth switching device Tr12 of the fourth stage ST3804 discharges the enabling node Q of the fourth stage ST3804 with the second DC voltage Vdc2 in response to the seventh scan pulse from the seventh stage. The twelfth switching device Tr12 of the fourth stage ST3804 has a gate terminal connected to the output terminal of the seventh stage, a drain terminal connected to the enabling node Q of the fourth stage ST3804, and a source terminal connected to the power supply line which transfers the second DC voltage Vdc2.

The thirteenth switching device Tr13 of the server stage in the n-th stage block supplies the first AC voltage Vac1 to the first disabling node QB1 of the server stage in response to the scan pulse from any one of the stages in the (n+1)-th stage block. The thirteenth switching device Tr13 of the fourth stage ST3804 supplies the first AC voltage Vac1 to the first disabling node QB1 of the fourth stage ST3804 in response to the seventh scan pulse from the seventh stage. The thirteenth switching device Tr13 of the fourth stage ST3804 has a gate terminal connected to the output terminal of the seventh stage, a drain terminal connected to the power supply line which transfers the first AC voltage Vac1, and a source terminal connected to the first disabling node QB1 of the fourth stage ST3804. Here, the first disabling node QB1 is charged or discharged depending on the polarity of the first AC voltage Vac1.

The fourteenth switching device Tr14 of the server stage in the n-th stage block supplies the second AC voltage Vac2 to the second disabling node QB2 of the server stage in response to the scan pulse from any one of the stages in the (n+1)-th stage block. The fourteenth switching device Tr14 of the fourth stage ST3804 supplies the second AC voltage Vac2 to the second disabling node QB2 of the fourth stage ST3804 in response to the seventh scan pulse from the seventh stage. The fourteenth switching device Tr14 of the fourth stage ST3804 has a gate terminal connected to the output terminal of the seventh stage, a drain terminal connected to the power supply line which transfers the second AC voltage Vac2, and a source terminal connected to the second disabling node QB2 of the fourth stage ST3804. Here, the second disabling node QB2 is charged or discharged depending on the polarity of the second AC voltage Vac2.

Figure 43:
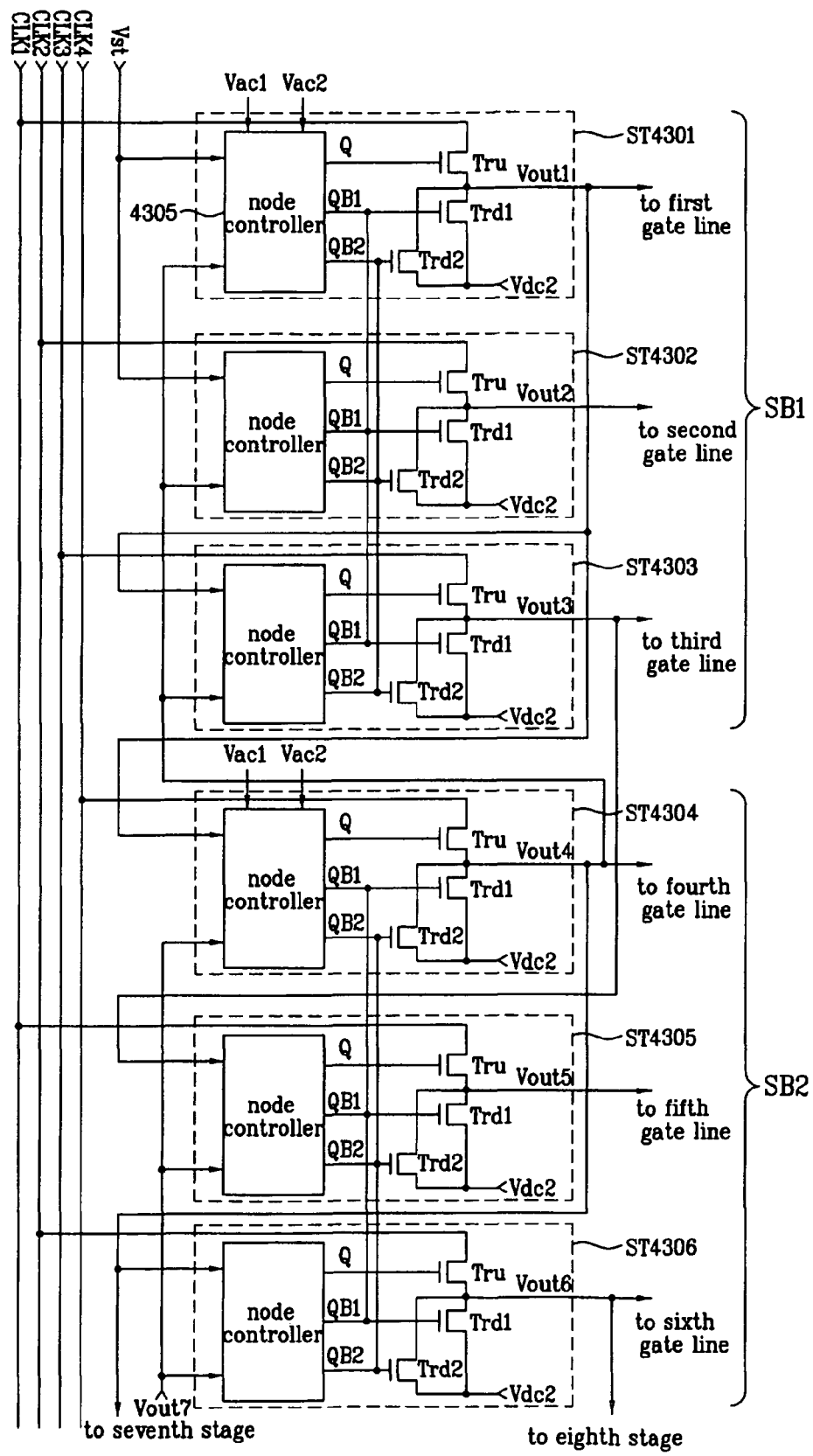
FIG. 43 is a schematic view of an tenth exemplary shift register according to another embodiment of the present invention.
Figure 44:
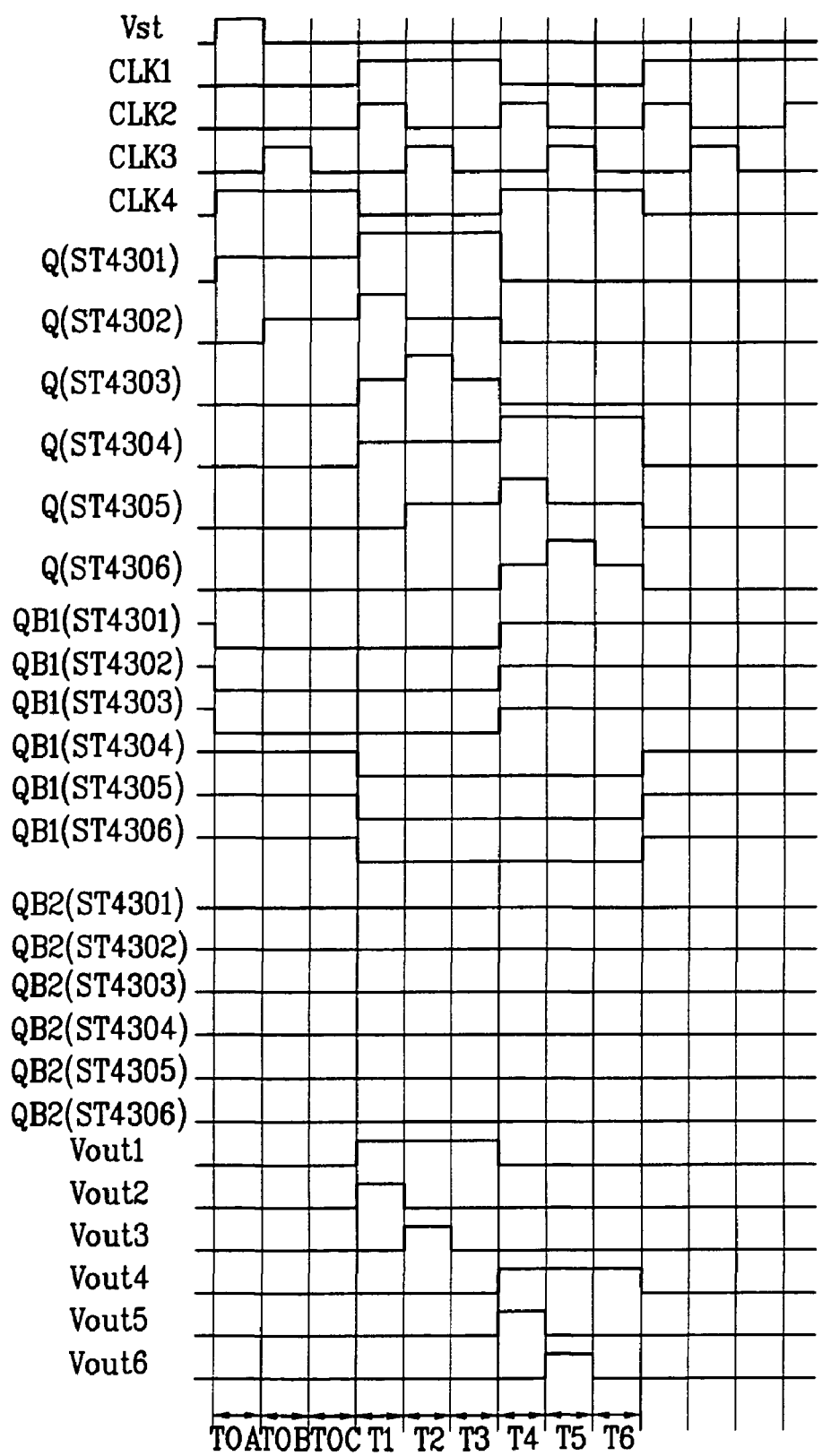
FIG. 44 shows an exemplary timing diagram of input signals into and output signals from respective stages of the shift register of FIG. 43.

FIG. 43 is a schematic view of an tenth exemplary shift register according to another embodiment of the present invention. FIG. 44 shows an exemplary timing diagram of input signals into and output signals from respective stages of the shift register of FIG. 43. Referring to FIG. 43, the tenth exemplary shift register includes a plurality of stages ST4301, ST4302, ST4303, . . . for driving a plurality of gate lines. This shift register includes a plurality of stage blocks SB1, SB2, . . . , each of which includes one server stage and two client stages. Each of the server stage and client stages includes a node controller 4305, an enabling node Q, a first disabling node QB1, a second disabling node QB2, a pull-up switching device Tru, a first pull-down switching device Trd1, and a second pull-down switching device Trd2, as in the above-described embodiments. The stage blocks SB1, SB2, . . . are the same in configuration, and a description will thus be given of only the server stage, first client stage and second client stage in the first stage block SB1 as a representative. The first disabling node QB1 of the server stage (first stage ST4301) in the first stage block SB1 is electrically connected with the first disabling node QB1 of the first client stage (second stage ST4302) in the first stage block SB1 and the first disabling node QB1 of the second client stage (third stage ST4303) in the first stage block SB1.

The first stage in the n-th stage block is enabled in response to a scan pulse from the first stage in the (n−1)-th stage block. The enabled first stage in the n-th stage block receives a clock pulse, outputs the received clock pulse as a scan pulse and supplies it to the corresponding gate line, the third stage in the n-th stage block, the first stage in the (n+1)-th stage block and all the stages in the (n−1)-th stage block.

The second stage in the n-th stage block is enabled in response to a scan pulse from the third stage in the (n−1)-th stage block. The enabled second stage in the n-th stage block receives a clock pulse, outputs the received clock pulse as a scan pulse and supplies it to the corresponding gate line.

The third stage in the n-th stage block is enabled in response to the scan pulse from the first stage in the n-th stage block. The enabled third stage in the n-th stage block receives a clock pulse, outputs the received clock pulse as a scan pulse and supplies it to the corresponding gate line and the second stage in the (n+1)-th stage block.

Each of the stages of the shift register with this configuration receives any one of first to fourth clock pulses CLK1 to CLK4 and outputs the received clock pulse as a scan pulse. These first to fourth clock pulses CLK1 to CLK4 are substantially similar to the first to fourth clock pulses CLK1 to CLK4 shown in FIG. 39C, and a description thereof will thus be omitted.

Each stage may have any one of the above-stated circuit configurations. On the other hand, because the server stage has a larger number of switching devices than the client stage, it cannot help being larger in size than the client stage. When these server stage and client stage are arranged in one direction, the width of the shift register including the server stage and client stage depends on the width of the larger server stage. The width of the server stage can be reduced by migrating some switching devices from the server stage to the client stage. This can in turn reduce the width of the shift register.

Figure 45:
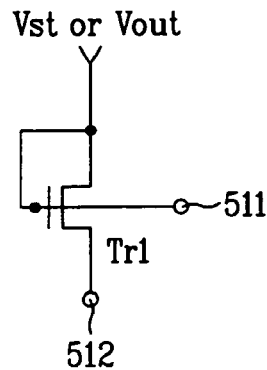
FIGS. 45A to 45C show exemplary circuit diagrams of a first switching device in accordance to embodiments of the present invention.
Figure 45:
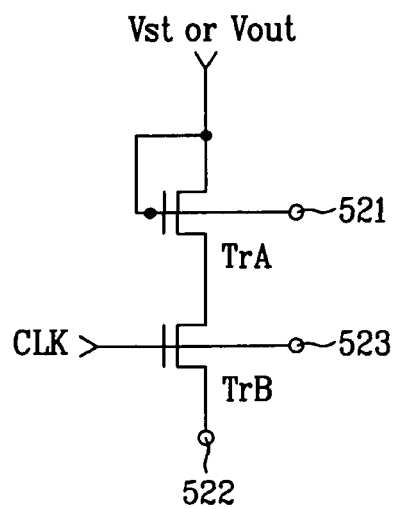
Figure 45:
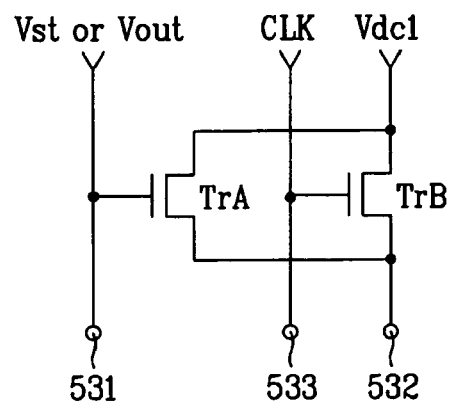

FIGS. 45A to 45C show exemplary circuit diagrams of a first switching device in accordance to embodiments of the present invention. Referring to FIGS. 45A to 45C, the first switching device Tr1 shown in FIGS. 4, 6, 29a, 29b, 30, 31, 34a, 34b, 37, 40, 41 and 42 may be modified as follows. The first switching device Tr1 may have a diode structure, as shown in FIG. 45A. In this case, the first switching device Tr1 charges the enabling node Q with the start pulse from the timing controller or the scan pulse from the upstream stage in response to the start pulse or scan pulse. A first terminal 511 shown in FIG. 45A is connected to the gate terminal of the eighth switching device Tr8 shown in FIG. 4 (or the gate terminal of the sixth switching device Tr6 shown in FIG. 6), and a second terminal 512 shown in FIG. 45A is connected to the enabling node Q. In the case where this structure is adopted, the first DC voltage Vdc1 is not necessary in the present invention.

Alternatively, the first switching device Tr1 may be made up of A and B switching devices TrA and TrB connected in series, as shown in FIG. 45B. Here, the A switching device TrA has the above-stated diode structure, and the drain terminal of the B switching device TrB is connected to the source terminal of the A switching device TrA. The start pulse Vst from the timing controller or the scan pulse from the upstream stage is supplied to the gate terminal and drain terminal of the A switching device TrA. The start pulse supplied to the A switching device TrA or the clock pulse synchronized with the scan pulse is supplied to the gate terminal of the B switching device TrB. In this case, the first switching device Tr1 charges the enabling node Q with the start pulse or scan pulse in response to the start pulse and clock pulse or the scan pulse and clock pulse.

A first terminal 521 shown in FIG. 45B is connected to the gate terminal of the eighth switching device Tr8 shown in FIG. 4 (or the gate terminal of the sixth switching device Tr6 shown in FIG. 6), and a second terminal 522 shown in FIG. 45B is connected to the enabling node Q. In the case where this structure is adopted, the first DC voltage Vdc1 is not necessary in the present invention. Alternatively, a third terminal 523, instead of the first terminal 521, may be connected to the gate terminal of the eighth switching device Tr8 (or the gate terminal of the sixth switching device Tr6).

As another alternative, the first switching device Tr1 shown in FIGS. 4 and 6 may be made up of A and B switching devices TrA and TrB connected in parallel, as shown in FIG. 45C. Here, the A switching device TrA outputs the first DC voltage Vdc1 in response to the start pulse Vst from the timing controller or the scan pulse from the upstream stage. The B switching device TrB outputs the first DC voltage Vdc1 in response to the clock pulse. The drain terminal of the A switching device TrA and the drain terminal of the B switching device TrB are connected to each other and the source terminal of the A switching device TrA and the source terminal of the B switching device TrB are connected to each other. The clock pulse is synchronized with the start pulse Vst or the scan pulse.

A first terminal 531 shown in FIG. 45C is connected to the gate terminal of the eighth switching device Tr8 shown in FIG. 4 (or the gate terminal of the sixth switching device Tr6 shown in FIG. 6), and a second terminal 532 shown in FIG. 45C is connected to the enabling node Q. Alternatively, a third terminal 533, instead of the first terminal 531, may be connected to the gate terminal of the eighth switching device Tr8 (or the gate terminal of the sixth switching device Tr6).

In accordance with an embodiment of the present invention, the node controller of each stage can control the states of nodes of a corresponding stage along with the states of nodes of a different stage. Accordingly, the number of switching devices in each node controller can be reduced, thereby the area of each stage can also be reduced.

It will be apparent to those skilled in the art that various modifications and variations can be made in the shift register of embodiments of the present invention. Thus, it is intended that embodiments of the present invention cover the modifications and variations of the embodiments described herein provided they come within the scope of the appended claims and their equivalents.

What is claimed is:

1. A shift register, comprising:

first and second stages for sequentially outputting scan pulses to drive first and second gate lines, one of the first and second stages comprising:

a pull-up switching device connected to an enabling node of the one of the first and second stages;

a first pull-down switching device connected to a first disabling node of the one of the first and second stages;

a second pull-down switching device connected to a second disabling node of the one of the first and second stages, wherein one terminal of source and drain terminals at the pull-up switching device, one terminal of source and drain terminals at the first pull-down switching device and one terminal of source and drain terminals at the second pull-down switching device are commonly connected to one of the gate lines; and a node controller, wherein the node controller of the first stage controls the logic state of the enabling node of the first stage, the first disabling node of the first stage and the first disabling node of the second stage, wherein the node controller of the second stage controls the logic state of the enabling node of the second stage, the second disabling node of the second stage and the second disabling node of the first stage.

2. The shift register according to claim 1, wherein the stages are partitioned into a plurality of stage blocks, each of the stage blocks including a plurality of stages, wherein the stages of each of the stage blocks include:

at least one client stage; and at least one server stage for controlling logic states of the enabling node and disabling nodes thereof together with logic states of the disabling nodes of the client stage.

3. The shift register according to claim 2, wherein the server stage outputs the scan pulse earliest of all the stages included in each of the stage blocks.

4. The shift register according to claim 2, wherein:

the stages in a pth one of the stage blocks (where p is a natural number) are enabled in response to the scan pulse from any one of the stages in a (p−k)-th one of the stage blocks (where k is a natural number smaller than p); and the stages in the pth stage block (where p is a natural number) are enabled in response to the scan pulse from any one of the stages in a (p+i)-th one of the stage blocks (where i is a natural number).

5. The shift register according to claim 2, wherein: each of the stage blocks includes three stages for outputting the scan pulses in order;

a first one of the stages in a pth one of the stage blocks is enabled in response to the scan pulse from a first one of the stages in a (p−i)-th one of the stage blocks;

a second one of the stages in the pth stage block is enabled in response to the scan pulse from a third one of the stages in the (p−i)-th stage block; and a third one of the stages in the pth stage block is enabled in response to the scan pulse from the first stage in the pth stage block.

6. The shift register according to claim 2, wherein each of the server stage and client stage comprises a first disabling node, a first pull-down switching device connected to the first disabling node, a second disabling node, and a second pull-down switching device connected to the second disabling node, wherein the node controller of the server stage controls logic states of the enabling node, first disabling node and second disabling node of the server stage and logic states of the first and second disabling nodes of the client stage.

7. The shift register according to claim 6, wherein:

the first disabling node of the server stage is electrically connected with the first disabling node of the client stage; and the second disabling node of the server stage is electrically connected with the second disabling node of the client stage.

8. The shift register according to claim 6, wherein the server stage is supplied with first and second AC voltages which are 180° out of phase with each other, wherein the node controller of the server stage controls the logic state of the first disabling node of the server stage and the logic state of the first disabling node of the client stage with the first AC voltage; and wherein the node controller of the server stage controls the logic state of the second disabling node of the server stage and the logic state of the second disabling node of the client stage with the second AC voltage.

9. The shift register according to claim 8, wherein the node controller of the server stage comprises:

a first switching device for charging the enabling node of the server stage with a first DC voltage in response to a start pulse or a scan pulse from a stage in a previous stage block;

a second switching device for discharging the first disabling nodes of the server stage and client stage with a second DC voltage in response to the first DC voltage charged at the enabling node of the server stage;

a third switching device for discharging the second disabling nodes of the server stage and client stage with a second DC voltage in response to the first DC voltage charged at the enabling node of the server stage;

a fourth switching device for discharging the first disabling nodes of the server stage and client stage with the second DC voltage in response to the start pulse or the scan pulse from the stage in the previous stage block;

a fifth switching device for discharging the second disabling nodes of the server stage and client stage with the second DC voltage in response to the start pulse or the scan pulse from the stage in the previous stage block;

a sixth switching device turned on or off in response to the first AC voltage, the sixth switching device outputting the first AC voltage when being turned on;

a seventh switching device for charging the first disabling nodes of the server stage and client stage with the first AC voltage in response to the first AC voltage outputted from the sixth switching device;

an eighth switching device for discharging the enabling node of the server stage with the second DC voltage in response to the first AC voltage charged at the first disabling node of the server stage;

a ninth switching device for supplying the second DC voltage to a gate terminal of the seventh switching device in response to the first DC voltage charged at the enabling node of the server stage;

a tenth switching device for supplying the second DC voltage to the gate terminal of the seventh switching device in response to the start pulse or the scan pulse from the stage in the previous stage block;

an eleventh switching device turned on or off in response to the second AC voltage, the eleventh switching device outputting the second AC voltage when being turned on;

a twelfth switching device for charging the second disabling node of the server stage with the second AC voltage in response to the second AC voltage outputted from the eleventh switching device;
a thirteenth switching device for discharging the enabling node of the server stage with the second DC voltage in response to the second AC voltage charged at the second disabling node of the server stage;
a fourteenth switching device for supplying the second DC voltage to a gate terminal of the twelfth switching device in response to the first DC voltage charged at the enabling node of the server stage;
a fifteenth switching device for supplying the second DC voltage to the gate terminal of the twelfth switching device in response to the start pulse or the scan pulse from the stage in the previous stage block; and
a sixteenth switching device for discharging the enabling node of the server stage with the second DC voltage in response to a scan pulse from a stage in a next stage block.

10. The shift register according to claim 9, wherein the node controller of the client stage comprises:
a first switching device for charging the enabling node of the client stage with the first DC voltage in response to the start pulse or the scan pulse from the stage in the previous stage block;
a second switching device for discharging the enabling node of the client stage with the second DC voltage in response to the first AC voltage supplied to the first disabling node of the client stage through the first disabling node of the server stage;
a third switching device for discharging the enabling node of the client stage with the second DC voltage in response to the second AC voltage supplied to the second disabling node of the client stage through the second disabling node of the server stage; and
a fourth switching device for discharging the enabling node of the client stage with the second DC voltage in response to the scan pulse from the stage in the next stage block.

11. The shift register according to claim 8, wherein the node controller of the server stage comprises:
a first switching device for charging the enabling node of the server stage with a first DC voltage in response to a start pulse or a scan pulse from a stage in a previous stage block;
a second switching device for discharging the first disabling nodes of the server stage and client stage with a second DC voltage in response to the start pulse or the scan pulse from the stage in the previous stage block;
a third switching device for discharging the second disabling nodes of the server stage and client stage with a second DC voltage in response to the start pulse or the scan pulse from the stage in the previous stage block;
a fourth switching device turned on or off in response to the first AC voltage, the fourth switching device charging the first disabling nodes of the server stage and client stage with the first AC voltage when being turned on;
a fifth switching device turned on or off in response to the first AC voltage, the fifth switching device discharging the second disabling nodes of the server stage and client stage with the second DC voltage when being turned on;
a sixth switching device turned on or off in response to the second AC voltage, the sixth switching device charging the second disabling nodes of the server stage and client stage with the second AC voltage when being turned on;
a seventh switching device turned on or off in response to the second AC voltage, the seventh switching device discharging the first disabling nodes of the server stage and client stage with the second DC voltage when being turned on;
an eighth switching device for discharging the first disabling nodes of the server stage and client stage with the second DC voltage in response to the first DC voltage applied to the enabling node of the server stage;
a ninth switching device for discharging the second disabling nodes of the server stage and client stage with the second DC voltage in response to the first DC voltage applied to the enabling node of the server stage;
a tenth switching device for discharging the enabling node of the server stage with the second DC voltage in response to the first AC voltage charged at the first disabling node of the server stage;
an eleventh switching device for discharging the enabling node of the server stage with the second DC voltage in response to the second AC voltage charged at the second disabling node of the server stage;
a twelfth switching device for discharging the enabling node of the server stage with the second DC voltage in response to a scan pulse from a stage in a next stage block;
a thirteenth switching device for charging or discharging the first disabling node of the server stage with the first AC voltage in response to the scan pulse from the stage in the next stage block; and
a fourteenth switching device for charging or discharging the second disabling node of the server stage with the second AC voltage in response to the scan pulse from the stage in the next stage block.

12. The shift register according to claim 6, wherein:
each stage block includes one server stage and two client stages; and
the pull-up switching device of each stage receives any one of first to sixth clock pulses with different phases which are outputted in order and outputs the received clock pulse as the corresponding scan pulse.

13. The shift register according to claim 6, wherein:
each stage block includes one server stage and two client stages;
the pull-up switching device of each stage receives any one of first to sixth clock pulses with different phases and outputs the received clock pulse as the corresponding scan pulse;
the first clock pulse and the second clock pulse have the same amplitude and pulse width and are 180° out of phase with each other; and
the third to sixth clock pulses have the same amplitude and pulse width and are outputted in order, the pulse width of each of the third to sixth clock pulses being narrower than that of each of the first and second clock pulses.

14. The shift register according to claim 6, wherein:
each stage block includes one server stage and two client stages;
the pull-up switching device of each stage receives any one of first to fourth clock pulses with different phases and outputs the received clock pulse as the corresponding scan pulse;
the first clock pulse and the second clock pulse have the same amplitude and pulse width and are 180° out of phase with each other; and
the third clock pulse and the fourth clock pulse have the same amplitude and pulse width and are outputted in order, the pulse width of each of the third and fourth clock pulses being narrower than that of each of the first and second clock pulses.

15. A shift register, comprising:

a plurality of stages for sequentially outputting scan pulses to drive a plurality of conductive lines, one of the plurality of the stages comprising:

a pull-up switching device connected to an enabling node of the one of the plurality of stages;

a first pull-down switching device connected to a first disabling node of the one of the plurality of stages;

a second pull-down switching device connected to a second disabling node of the one of the plurality of stages, wherein one terminal of source and drain terminals at the pull-up switching device, one terminal of source and drain terminals at the first pull-down switching device and one terminal of source and drain terminals at the second pull-down switching device are commonly connected to one of the gate lines; and a node controller, wherein the node controller of a (2n−3)-th stage of the plurality of stages controls the logic state of the enabling node of the (2n−3)-th stage, the first disabling node of the (2n−3)-th stage and the first disabling node of a (2n−2)-th stage, the node controller of the (2n−2)-th stage controls the logic state of the enabling node of the (2n−2)-th stage, the second disabling node of the (2n−2)-th stage and the second disabling node of the (2n−3)-th stage, and n is a natural number greater than or equal to 2.

16. The shift register according to claim 15, wherein:

the first disabling node of the (2n−3)-th stage and the first disabling node of the (2n−2)-th stage are electrically connected to each other; and the second disabling node of the (2n−2)-th stage and the second disabling node of the (2n−3)-th stage are electrically connected to each other.

17. The shift register according to claim 15, wherein:

the node controller of the (2n−3)-th stage controls the logic state of the first disabling node of the (2n−3)-th stage and the logic state of the first disabling node of the (2n−2)-th stage with a first alternating current (AC) voltage; and the node controller of the (2n−2)-th stage controls the logic state of the second disabling node of the (2n−2)-th stage and the logic state of the second disabling node of the (2n−3)-th stage with a second AC voltage, the second AC voltage being 180° out of phase with the first AC voltage.

18. The shift register according to claim 17, wherein:

a (2n−1)-th one of the stages and a 2n-th one of the stages are simultaneously enabled in response to the scan pulse from the (2n−3)-th stage and simultaneously disabled in response to the scan pulse from a (2n+2)-th one of the stages;

the (2n−3)-th stage and the (2n−2)-th stage are disabled in response to the scan pulse from the 2n-th stage; and a (2n+1)-th one of the stages and the (2n+2)-th stage are enabled in response to the scan pulse from the (2n−1)-th stage.

19. The shift register according to claim 18, wherein the node controller of the (2n−1)-th stage comprises:

a first switching device for charging the enabling node of the (2n−1)-th stage with a first direct current (DC) voltage in response to the scan pulse from the (2n−3)-th stage;

a second switching device for discharging the enabling node of the (2n−1)-th stage with a second DC voltage in response to the first AC voltage supplied to the first disabling node of the (2n−1)-th stage;

a third switching device for discharging the enabling node of the (2n−1)-th stage with the second DC voltage in response to the second AC voltage supplied to the second disabling node of the (2n−1)-th stage through the 2n-th stage;

a fourth switching device for discharging the enabling node of the (2n−1)-th stage with the second DC voltage in response to the scan pulse from the (2n+2)-th stage;

a fifth switching device turned on or off in response to the first AC voltage, the fifth switching device charging a common node of the (2n−1)-th stage with the first AC voltage when being turned on;

a sixth switching device for discharging the common node of the (2n−1)-th stage with the second DC voltage in response to the first DC voltage charged at the enabling node of the (2n−1)-th stage;

a seventh switching device for charging the first disabling node of the (2n−1)-th stage and the first disabling node of the 2n-th stage with the first AC voltage in response to the first AC voltage supplied to the common node of the (2n−1)-th stage;

an eighth switching device for discharging the first disabling node of the (2n−1)-th stage and the first disabling node of the 2n-th stage with the second DC voltage in response to the scan pulse from the (2n−3)-th stage; and a ninth switching device for discharging the first disabling node of the (2n−1)-th stage and the first disabling node of the 2n-th stage with the second DC voltage in response to the first DC voltage charged at the enabling node of the (2n−1)-th stage.

20. The shift register according to claim 19, wherein the node controller of the (2n−1)-th stage further comprises a tenth switching device for discharging the common node of the (2n−1)-th stage with the second DC voltage in response to an external start pulse.

21. The shift register according to claim 19, wherein the node controller of the (2n−1)-th stage further comprises a tenth switching device turned on or off in response to the first AC voltage, the tenth switching device discharging the second disabling node of the (2n−1)-th stage with the second DC voltage when being turned on.

22. The shift register according to claim 19, wherein the node controller of the 2n-th stage comprises:

a first switching device for charging the enabling node of the 2n-th stage with the first DC voltage in response to the scan pulse from the (2n−3)-th stage;

a second switching device for discharging the enabling node of the 2n-th stage with the second DC voltage in response to the first AC voltage supplied to the first disabling node of the 2n-th stage through the (2n−1)-th stage;

a third switching device for discharging the enabling node of the 2n-th stage with the second DC voltage in response to the second AC voltage supplied to the second disabling node of the 2n-th stage;

a fourth switching device for discharging the enabling node of the 2n-th stage with the second DC voltage in response to the scan pulse from the (2n+2)-th stage;

a fifth switching device turned on or off in response to the second AC voltage, the fifth switching device charging a common node of the 2n-th stage with the second AC voltage when being turned on;

a sixth switching device for discharging the common node of the 2n-th stage with the second DC voltage in response to the first DC voltage charged at the enabling node of the 2n-th stage;

a seventh switching device for charging the second disabling node of the 2n-th stage and the second disabling node of the (2n−1)-th stage with the second AC voltage in response to the second AC voltage supplied to the common node of the 2n-th stage;

an eighth switching device for discharging the second disabling node of the 2n-th stage and the second disabling node of the (2n−1)-th stage with the second DC voltage in response to the scan pulse from the (2n−3)-th stage; and a ninth switching device for discharging the second disabling node of the 2n-th stage and the second disabling node of the (2n−1)-th stage with the second DC voltage in response to the first DC voltage charged at the enabling node of the 2n-th stage.

23. The shift register according to claim 22, wherein the node controller of the 2n-th stage further comprises a tenth switching device for discharging the common node of the 2n-th stage with the second DC voltage in response to an external start pulse.

24. The shift register according to claim 22, wherein the node controller of the 2n-th stage further comprises a tenth switching device turned on or off in response to the second AC voltage, the tenth switching device discharging the first disabling node of the 2n-th stage with the second DC voltage when being turned on.

25. The shift register according to claim 18, wherein the node controller of the (2n−1)-th stage comprises:
a first switching device for charging the enabling node of the (2n−1)-th stage with a first DC voltage in response to the scan pulse from the (2n−3)-th stage;
a second switching device turned on or off in response to the first AC voltage supplied to the first disabling node of the (2n−1)-th stage, the second switching device discharging the enabling node of the (2n−1)-th stage with a second DC voltage when being turned on;
a third switching device turned on or off in response to the second AC voltage supplied to the second disabling node of the (2n−1)-th stage through the 2n-th stage, the third switching device discharging the enabling node of the (2n−1)-th stage with the second DC voltage when being turned on;
a fourth switching device for discharging the enabling node of the (2n−1)-th stage with the second DC voltage in response to the scan pulse from the (2n+2)-th stage;
a fifth switching device turned on or off in response to the first AC voltage, the fifth switching device charging the first disabling node of the (2n−1)-th stage and the first disabling node of the 2n-th stage with the first AC voltage when being turned on;
a sixth switching device for discharging the first disabling node of the (2n−1)-th stage and the first disabling node of the 2n-th stage with the second DC voltage in response to the scan pulse from the (2n−3)-th stage; and
a seventh switching device for discharging the first disabling node of the (2n−1)-th stage and the first disabling node of the 2n-th stage with the second DC voltage in response to the first DC voltage charged at the enabling node of the (2n−1)-th stage.

26. The shift register according to claim 25, wherein the node controller of the (2n−1)-th stage further comprises an eighth switching device for charging or discharging the first disabling node of the (2n−1)-th stage and the first disabling node of the 2n-th stage with the first AC voltage in response to the scan pulse from the (2n+2)-th stage.

27. The shift register according to claim 25, wherein the node controller of the (2n−1)-th stage further comprises an eighth switching device turned on or off in response to the first AC voltage, the eighth switching device discharging the second disabling node of the (2n−1)-th stage with the second DC voltage when being turned on.

28. The shift register according to claim 25, wherein the node controller of the 2n-th stage comprises:
a first switching device for charging the enabling node of the 2n-th stage with the first DC voltage in response to the scan pulse from the (2n−3)-th stage;
a second switching device turned on or off in response to the first AC voltage supplied to the first disabling node of the 2n-th stage through the (2n−1)-th stage, the second switching device discharging the enabling node of the 2n-th stage with the second DC voltage when being turned on;
a third switching device turned on or off in response to the second AC voltage supplied to the second disabling node of the 2n-th stage, the third switching device discharging the enabling node of the 2n-th stage with the second DC voltage when being turned on;
a fourth switching device for discharging the enabling node of the 2n-th stage with the second DC voltage in response to the scan pulse from the (2n+2)-th stage;
a fifth switching device turned on or off in response to the second AC voltage, the fifth switching device charging the second disabling node of the 2n-th stage and the second disabling node of the (2n−1)-th stage with the second AC voltage when being turned on;
a sixth switching device for discharging the second disabling node of the 2n-th stage and the second disabling node of the (2n−1)-th stage with the second DC voltage in response to the scan pulse from the (2n−3)-th stage; and
a seventh switching device for discharging the second disabling node of the 2n-th stage and the second disabling node of the (2n−1)-th stage with the second DC voltage in response to the first DC voltage charged at the enabling node of the 2n-th stage.

29. The shift register according to claim 28, wherein the node controller of the 2n-th stage further comprises an eighth switching device for charging or discharging the second disabling node of the 2n-th stage and the second disabling node of the (2n−1)-th stage with the second AC voltage in response to the scan pulse from the (2n+2)-th stage.

30. The shift register according to claim 28, wherein the node controller of the 2n-th stage further comprises an eighth switching device turned on or off in response to the second AC voltage, the eighth switching device discharging the first disabling node of the 2n-th stage with the second DC voltage when being turned on.

31. The shift register according to claim 17, wherein:
a (2n−1)-th one of the stages and a 2n-th one of the stages are simultaneously enabled in response to the scan pulse from the (2n−2)-th stage and simultaneously disabled in response to the scan pulse from a (2n+2)-th one of the stages;
the (2n−3)-th stage and the (2n−2)-th stage are disabled in response to the scan pulse from the 2n-th stage; and
a (2n+1)-th one of the stages and the (2n+2)-th stage are enabled in response to the scan pulse from the 2n-th stage.

32. The shift register according to claim 31, wherein the node controller of the (2n−1)-th stage comprises:
a first switching device for charging the enabling node of the (2n−1)-th stage with a first DC voltage in response to the scan pulse from the (2n−2)-th stage;
a second switching device for discharging the enabling node of the (2n−1)-th stage with a second DC voltage in response to the first AC voltage supplied to the first disabling node of the (2n−1)-th stage;

a third switching device for discharging the enabling node of the (2n−1)-th stage with the second DC voltage in response to the second AC voltage supplied to the second disabling node of the (2n−1)-th stage through the 2n-th stage;

a fourth switching device for discharging the enabling node of the (2n−1)-th stage with the second DC voltage in response to the scan pulse from the (2n+2)-th stage;

a fifth switching device turned on or off in response to the first AC voltage, the fifth switching device charging a common node of the (2n−1)-th stage with the first AC voltage when being turned on;

a sixth switching device for discharging the common node of the (2n−1)-th stage with the second DC voltage in response to the first DC voltage charged at the enabling node of the (2n−1)-th stage;

a seventh switching device for charging the first disabling node of the (2n−1)-th stage and the first disabling node of the 2n-th stage with the first AC voltage in response to the first AC voltage supplied to the common node of the (2n−1)-th stage;

an eighth switching device for discharging the first disabling node of the (2n−1)-th stage and the first disabling node of the 2n-th stage with the second DC voltage in response to the scan pulse from the (2n−2)-th stage; and a ninth switching device for discharging the first disabling node of the (2n−1)-th stage and the first disabling node of the 2n-th stage with the second DC voltage in response to the first DC voltage charged at the enabling node of the (2n−1)-th stage.

33. The shift register according to claim 32, wherein the node controller of the (2n−1)-th stage further comprises a tenth switching device for discharging the common node of the (2n−1)-th stage with the second DC voltage in response to an external start pulse.

34. The shift register according to claim 32, wherein the node controller of the (2n−1)-th stage further comprises a tenth switching device turned on or off in response to the first AC voltage, the tenth switching device discharging the second disabling node of the (2n−1)-th stage with the second DC voltage when being turned on.

35. The shift register according to claim 32, wherein the node controller of the 2n-th stage comprises:

a first switching device for charging the enabling node of the 2n-th stage with the first DC voltage in response to the scan pulse from the (2n−2)-th stage;

a second switching device for discharging the enabling node of the 2n-th stage with the second DC voltage in response to the first AC voltage supplied to the first disabling node of the 2n-th stage through the (2n−1)-th stage;

a third switching device for discharging the enabling node of the 2n-th stage with the second DC voltage in response to the second AC voltage supplied to the second disabling node of the 2n-th stage;

a fourth switching device for discharging the enabling node of the 2n-th stage with the second DC voltage in response to the scan pulse from the (2n+2)-th stage;

a fifth switching device turned on or off in response to the second AC voltage, the fifth switching device charging a common node of the 2n-th stage with the second AC voltage when being turned on;

a sixth switching device for discharging the common node of the 2n-th stage with the second DC voltage in response to the first DC voltage charged at the enabling node of the 2n-th stage;

a seventh switching device for charging the second disabling node of the 2n-th stage and the second disabling node of the (2n−1)-th stage with the second AC voltage in response to the second AC voltage supplied to the common node of the 2n-th stage;

an eighth switching device for discharging the second disabling node of the 2n-th stage and the second disabling node of the (2n−1)-th stage with the second DC voltage in response to the scan pulse from the (2n−2)-th stage; and a ninth switching device for discharging the second disabling node of the 2n-th stage and the second disabling node of the (2n−1)-th stage with the second DC voltage in response to the first DC voltage charged at the enabling node of the 2n-th stage.

36. The shift register according to claim 35, wherein the node controller of the 2n-th stage further comprises a tenth switching device for discharging the common node of the 2n-th stage with the second DC voltage in response to an external start pulse.

37. The shift register according to claim 35, wherein the node controller of the 2n-th stage further comprises a tenth switching device turned on or off in response to the second AC voltage, the tenth switching device discharging the first disabling node of the 2n-th stage with the second DC voltage when being turned on.

38. The shift register according to claim 32, wherein the pull-up switching device of the 2n-th stage has a channel width wider by a factor $\alpha$ than that of the pull-up switching device of the (2n−1)-th stage, where $\alpha$ is:

$$0.1 * \{(\text{channel width of first switching device}) * 2 +$$
$$(\text{channel width of fourth switching device}) * 2\} \leq$$
$$\alpha \leq \{(\text{channel width of first switching device}) * 2 +$$
$$(\text{channel width of fourth switching device}) * 2\}.$$

39. The shift register according to claim 31, wherein the node controller of the (2n−1)-th stage comprises:

a first switching device for charging the enabling node of the (2n−1)-th stage with a first DC voltage in response to the scan pulse from the (2n−2)-th stage;

a second switching device turned on or off in response to the first AC voltage supplied to the first disabling node of the (2n−1)-th stage, the second switching device discharging the enabling node of the (2n−1)-th stage with a second DC voltage when being turned on;

a third switching device turned on or off in response to the second AC voltage supplied to the second disabling node of the (2n−1)-th stage through the 2n-th stage, the third switching device discharging the enabling node of the (2n−1)-th stage with the second DC voltage when being turned on;

a fourth switching device for discharging the enabling node of the (2n−1)-th stage with the second DC voltage in response to the scan pulse from the (2n+2)-th stage;

a fifth switching device turned on or off in response to the first AC voltage, the fifth switching device charging the first disabling node of the (2n−1)-th stage and the first disabling node of the 2n-th stage with the first AC voltage when being turned on;

a sixth switching device for discharging the first disabling node of the (2n−1)-th stage and the first disabling node of the 2n-th stage with the second DC voltage in response to the scan pulse from the (2n−2)-th stage; and a seventh switching device for discharging the first disabling node of the (2n−1)-th stage and the first disabling node of the 2n-th stage with the second DC voltage in response to the first DC voltage charged at the enabling node of the (2n−1)-th stage.

40. The shift register according to claim 39, wherein the node controller of the (2n−1)-th stage further comprises an eighth switching device for charging or discharging the first disabling node of the (2n−1)-th stage and the first disabling node of the 2n-th stage with the first AC voltage in response to the scan pulse from the (2n+2)-th stage.

41. The shift register according to claim 39, wherein the node controller of the (2n−1)-th stage further comprises an eighth switching device turned on or off in response to the first AC voltage, the eighth switching device discharging the second disabling node of the (2n−1)-th stage with the second DC voltage when being turned on.

42. The shift register according to claim 39, wherein the node controller of the 2n-th stage comprises:
a first switching device for charging the enabling node of the 2n-th stage with the first DC voltage in response to the scan pulse from the (2n−2)-th stage;
a second switching device turned on or off in response to the first AC voltage supplied to the first disabling node of the 2n-th stage through the (2n−1)-th stage, the second switching device discharging the enabling node of the 2n-th stage with the second DC voltage when being turned on;
a third switching device turned on or off in response to the second AC voltage supplied to the second disabling node of the 2n-th stage, the third switching device discharging the enabling node of the 2n-th stage with the second DC voltage when being turned on;
a fourth switching device for discharging the enabling node of the 2n-th stage with the second DC voltage in response to the scan pulse from the (2n+2)-th stage;
a fifth switching device turned on or off in response to the second AC voltage, the fifth switching device charging the second disabling node of the 2n-th stage and the second disabling node of the (2n−1)-th stage with the second AC voltage when being turned on;
a sixth switching device for discharging the second disabling node of the 2n-th stage and the second disabling node of the (2n−1)-th stage with the second DC voltage in response to the scan pulse from the (2n−2)-th stage; and
a seventh switching device for discharging the second disabling node of the 2n-th stage and the second disabling node of the (2n−1)-th stage with the second DC voltage in response to the first DC voltage charged at the enabling node of the 2n-th stage.

43. The shift register according to claim 42, wherein the node controller of the 2n-th stage further comprises an eighth switching device for charging or discharging the second disabling node of the 2n-th stage and the second disabling node of the (2n−1)-th stage with the second AC voltage in response to the scan pulse from the (2n+2)-th stage.

44. The shift register according to claim 42, wherein the node controller of the 2n-th stage further comprises an eighth switching device turned on or off in response to the second AC voltage, the eighth switching device discharging the first disabling node of the 2n-th stage with the second DC voltage when being turned on.

45. The shift register according to claim 31, wherein the pull-up switching device of the 2n-th stage has a channel width wider than that of the pull-up switching device of the (2n−1)-th stage.

46. The shift register according to claim 17, wherein:
a (2n−1)-th one of the stages and a 2n-th one of the stages are simultaneously enabled in response to the scan pulse from the (2n−3)-th stage and simultaneously disabled in response to the scan pulse from a (2n+1)-th one of the stages;
the (2n−3)-th stage and the (2n−2)-th stage are disabled in response to the scan pulse from the (2n−1)-th stage; and
the (2n+1)-th stage and a (2n+2)-th one of the stages are enabled in response to the scan pulse from the (2n−1)-th stage.

47. The shift register according to claim 46, wherein the node controller of the (2n−1)-th stage comprises:
a first switching device for charging the enabling node of the (2n−1)-th stage with a first DC voltage in response to the scan pulse from the (2n−3)-th stage;
a second switching device for discharging the enabling node of the (2n−1)-th stage with a second DC voltage in response to the first AC voltage supplied to the first disabling node of the (2n−1)-th stage;
a third switching device for discharging the enabling node of the (2n−1)-th stage with the second DC voltage in response to the second AC voltage supplied to the second disabling node of the (2n−1)-th stage through the 2n-th stage;
a fourth switching device for discharging the enabling node of the (2n−1)-th stage with the second DC voltage in response to the scan pulse from the (2n+1)-th stage;
a fifth switching device turned on or off in response to the first AC voltage, the fifth switching device charging a common node of the (2n−1)-th stage with the first AC voltage when being turned on;
a sixth switching device for discharging the common node of the (2n−1)-th stage with the second DC voltage in response to the first DC voltage charged at the enabling node of the (2n−1)-th stage;
a seventh switching device for charging the first disabling node of the (2n−1)-th stage and the first disabling node of the 2n-th stage with the first AC voltage in response to the first AC voltage supplied to the common node of the (2n−1)-th stage;
an eighth switching device for discharging the first disabling node of the (2n−1)-th stage and the first disabling node of the 2n-th stage with the second DC voltage in response to the scan pulse from the (2n−3)-th stage; and
a ninth switching device for discharging the first disabling node of the (2n−1)-th stage and the first disabling node of the 2n-th stage with the second DC voltage in response to the first DC voltage charged at the enabling node of the (2n−1)-th stage.

48. The shift register according to claim 47, wherein the node controller of the (2n−1)-th stage further comprises a tenth switching device for discharging the common node of the (2n−1)-th stage with the second DC voltage in response to an external start pulse.

49. The shift register according to claim 47, wherein the node controller of the (2n−1)-th stage further comprises a tenth switching device turned on or off in response to the first AC voltage, the tenth switching device discharging the second disabling node of the (2n−1)-th stage with the second DC voltage when being turned on.

50. The shift register according to claim 47, wherein the node controller of the 2n-th stage comprises:
a first switching device for charging the enabling node of the 2n-th stage with the first DC voltage in response to the scan pulse from the (2n−3)-th stage;
a second switching device for discharging the enabling node of the 2n-th stage with the second DC voltage in response to the first AC voltage supplied to the first disabling node of the 2n-th stage through the (2n−1)-th stage;

a third switching device for discharging the enabling node of the 2n-th stage with the second DC voltage in response to the second AC voltage supplied to the second disabling node of the 2n-th stage;

a fourth switching device for discharging the enabling node of the 2n-th stage with the second DC voltage in response to the scan pulse from the (2n+1)-th stage;

a fifth switching device turned on or off in response to the second AC voltage, the fifth switching device charging a common node of the 2n-th stage with the second AC voltage when being turned on;

a sixth switching device for discharging the common node of the 2n-th stage with the second DC voltage in response to the first DC voltage charged at the enabling node of the 2n-th stage;

a seventh switching device for charging the second disabling node of the 2n-th stage and the second disabling node of the (2n−1)-th stage with the second AC voltage in response to the second AC voltage supplied to the common node of the 2n-th stage;

an eighth switching device for discharging the second disabling node of the 2n-th stage and the second disabling node of the (2n−1)-th stage with the second DC voltage in response to the scan pulse from the (2n−3)-th stage; and a ninth switching device for discharging the second disabling node of the 2n-th stage and the second disabling node of the (2n−1)-th stage with the second DC voltage in response to the first DC voltage charged at the enabling node of the 2n-th stage.

51. The shift register according to claim 50, wherein the node controller of the 2n-th stage further comprises a tenth switching device for discharging the common node of the 2n-th stage with the second DC voltage in response to an external start pulse.

52. The shift register according to claim 50, wherein the node controller of the 2n-th stage further comprises a tenth switching device turned on or off in response to the second AC voltage, the tenth switching device discharging the first disabling node of the 2n-th stage with the second DC voltage when being turned on.

53. The shift register according to claim 47, wherein the pull-up switching device of the (2n−1)-th stage has a channel width wider by a factor $\alpha$ than that of the pull-up switching device of the 2n-th stage,
where $\alpha$ is:

$$\{0.1 * (\text{channel width of first switching device}) * 2 + (\text{channel width of fourth switching device}) * 2\} \leq$$
$$\alpha \leq \{(\text{channel width of first switching device}) * 2 + (\text{channel width of fourth switching device}) * 2\}.$$

54. The shift register according to claim 46, wherein the node controller of the (2n−1)-th stage comprises:

a first switching device for charging the enabling node of the (2n−1)-th stage with a first DC voltage in response to the scan pulse from the (2n−3)-th stage;

a second switching device turned on or off in response to the first AC voltage supplied to the first disabling node of the (2n−1)-th stage, the second switching device discharging the enabling node of the (2n−1)-th stage with a second DC voltage when being turned on;

a third switching device turned on or off in response to the second AC voltage supplied to the second disabling node of the (2n−1)-th stage through the 2n-th stage, the third switching device discharging the enabling node of the (2n−1)-th stage with the second DC voltage when being turned on;

a fourth switching device for discharging the enabling node of the (2n−1)-th stage with the second DC voltage in response to the scan pulse from the (2n+1)-th stage;

a fifth switching device turned on or off in response to the first AC voltage, the fifth switching device charging the first disabling node of the (2n−1)-th stage and the first disabling node of the 2n-th stage with the first AC voltage when being turned on;

a sixth switching device for discharging the first disabling node of the (2n−1)-th stage and the first disabling node of the 2n-th stage with the second DC voltage in response to the scan pulse from the (2n−3)-th stage; and a seventh switching device for discharging the first disabling node of the (2n−1)-th stage and the first disabling node of the 2n-th stage with the second DC voltage in response to the first DC voltage charged at the enabling node of the (2n−1)-th stage.

55. The shift register according to claim 54, wherein the node controller of the (2n−1)-th stage further comprises an eighth switching device for charging or discharging the first disabling node of the (2n−1)-th stage and the first disabling node of the 2n-th stage with the first AC voltage in response to the scan pulse from the (2n+1)-th stage.

56. The shift register according to claim 54, wherein the node controller of the (2n−1)-th stage further comprises an eighth switching device turned on or off in response to the first AC voltage, the eighth switching device discharging the second disabling node of the (2n−1)-th stage with the second DC voltage when being turned on.

57. The shift register according to claim 54, wherein the node controller of the 2n-th stage comprises:

a first switching device for charging the enabling node of the 2n-th stage with the first DC voltage in response to the scan pulse from the (2n−3)-th stage;

a second switching device turned on or off in response to the first AC voltage supplied to the first disabling node of the 2n-th stage through the (2n−1)-th stage, the second switching device discharging the enabling node of the 2n-th stage with the second DC voltage when being turned on;

a third switching device turned on or off in response to the second AC voltage supplied to the second disabling node of the 2n-th stage, the third switching device discharging the enabling node of the 2n-th stage with the second DC voltage when being turned on;

a fourth switching device for discharging the enabling node of the 2n-th stage with the second DC voltage in response to the scan pulse from the (2n+1)-th stage;

a fifth switching device turned on or off in response to the second AC voltage, the fifth switching device charging the second disabling node of the 2n-th stage and the second disabling node of the (2n−1)-th stage with the second AC voltage when being turned on;

a sixth switching device for discharging the second disabling node of the 2n-th stage and the second disabling node of the (2n−1)-th stage with the second DC voltage in response to the scan pulse from the (2n−3)-th stage; and a seventh switching device for discharging the second disabling node of the 2n-th stage and the second disabling node of the (2n−1)-th stage with the second DC voltage in response to the first DC voltage charged at the enabling node of the 2n-th stage.

58. The shift register according to claim 57, wherein the node controller of the 2n-th stage further comprises an eighth switching device for charging or discharging the second disabling node of the 2n-th stage and the second disabling node of the (2n−1)-th stage with the second AC voltage in response to the scan pulse from the (2n+1)-th stage.

59. The shift register according to claim 57, wherein the node controller of the 2n-th stage further comprises an eighth switching device turned on or off in response to the second AC voltage, the eighth switching device discharging the first disabling node of the 2n-th stage with the second DC voltage when being turned on.

60. The shift register according to claim 46, wherein the pull-up switching device of the (2n−1)-th stage has a channel width wider than that of the pull-up switching device of the 2n-th stage.

61. The shift register according to claim 17, wherein:
a (2n−1)-th one of the stages and a 2n-th one of the stages are simultaneously enabled in response to the scan pulse from the (2n−2)-th stage and simultaneously disabled in response to the scan pulse from a (2n+1)-th one of the stages;
the (2n−3)-th stage and the (2n−2)-th stage are disabled in response to the scan pulse from the (2n−1)-th stage; and
the (2n+1)-th stage and a (2n+2)-th one of the stages are enabled in response to the scan pulse from the 2n-th stage.

62. The shift register according to claim 61, wherein the node controller of the (2n−1)-th stage comprises:
a first switching device for charging the enabling node of the (2n−1)-th stage with a first DC voltage in response to the scan pulse from the (2n−2)-th stage;
a second switching device for discharging the enabling node of the (2n−1)-th stage with a second DC voltage in response to the first AC voltage supplied to the first disabling node of the (2n−1)-th stage;
a third switching device for discharging the enabling node of the (2n−1)-th stage with the second DC voltage in response to the second AC voltage supplied to the second disabling node of the (2n−1)-th stage through the 2n-th stage;
a fourth switching device for discharging the enabling node of the (2n−1)-th stage with the second DC voltage in response to the scan pulse from the (2n+1)-th stage;
a fifth switching device turned on or off in response to the first AC voltage, the fifth switching device charging a common node of the (2n−1)-th stage with the first AC voltage when being turned on;
a sixth switching device for discharging the common node of the (2n−1)-th stage with the second DC voltage in response to the first DC voltage charged at the enabling node of the (2n−1)-th stage;
a seventh switching device for charging the first disabling node of the (2n−1)-th stage and the first disabling node of the 2n-th stage with the first AC voltage in response to the first AC voltage supplied to the common node of the (2n−1)-th stage;
an eighth switching device for discharging the first disabling node of the (2n−1)-th stage and the first disabling node of the 2n-th stage with the second DC voltage in response to the scan pulse from the (2n−2)-th stage; and
a ninth switching device for discharging the first disabling node of the (2n−1)-th stage and the first disabling node of the 2n-th stage with the second DC voltage in response to the first DC voltage charged at the enabling node of the (2n−1)-th stage.

63. The shift register according to claim 62, wherein the node controller of the (2n−1)-th stage further comprises a tenth switching device for discharging the common node of the (2n−1)-th stage with the second DC voltage in response to an external start pulse.

64. The shift register according to claim 62, wherein the node controller of the (2n−1)-th stage further comprises a tenth switching device turned on or off in response to the first AC voltage, the tenth switching device discharging the second disabling node of the (2n−1)-th stage with the second DC voltage when being turned on.

65. The shift register according to claim 62, wherein the node controller of the 2n-th stage comprises:
a first switching device for charging the enabling node of the 2n-th stage with the first DC voltage in response to the scan pulse from the (2n−2)-th stage;
a second switching device for discharging the enabling node of the 2n-th stage with the second DC voltage in response to the first AC voltage supplied to the first disabling node of the 2n-th stage through the (2n−1)-th stage;
a third switching device for discharging the enabling node of the 2n-th stage with the second DC voltage in response to the second AC voltage supplied to the second disabling node of the 2n-th stage;
a fourth switching device for discharging the enabling node of the 2n-th stage with the second DC voltage in response to the scan pulse from the (2n+1)-th stage;
a fifth switching device turned on or off in response to the second AC voltage, the fifth switching device charging a common node of the 2n-th stage with the second AC voltage when being turned on;
a sixth switching device for discharging the common node of the 2n-th stage with the second DC voltage in response to the first DC voltage charged at the enabling node of the 2n-th stage;
a seventh switching device for charging the second disabling node of the 2n-th stage and the second disabling node of the (2n−1)-th stage with the second AC voltage in response to the second AC voltage supplied to the common node of the 2n-th stage;
an eighth switching device for discharging the second disabling node of the 2n-th stage and the second disabling node of the (2n−1)-th stage with the second DC voltage in response to the scan pulse from the (2n−2)-th stage; and
a ninth switching device for discharging the second disabling node of the 2n-th stage and the second disabling node of the (2n−1)-th stage with the second DC voltage in response to the first DC voltage charged at the enabling node of the 2n-th stage.

66. The shift register according to claim 65, wherein the node controller of the 2n-th stage further comprises a tenth switching device for discharging the common node of the 2n-th stage with the second DC voltage in response to an external start pulse.

67. The shift register according to claim 65, wherein the node controller of the 2n-th stage further comprises a tenth switching device turned on or off in response to the second AC voltage, the tenth switching device discharging the first disabling node of the 2n-th stage with the second DC voltage when being turned on.

68. The shift register according to claim 61, wherein the node controller of the (2n−1)-th stage comprises:
a first switching device for charging the enabling node of the (2n−1)-th stage with a first DC voltage in response to the scan pulse from the (2n−2)-th stage;

a second switching device turned on or off in response to the first AC voltage supplied to the first disabling node of the (2n−1)-th stage, the second switching device discharging the enabling node of the (2n−1)-th stage with a second DC voltage when being turned on;

a third switching device turned on or off in response to the second AC voltage supplied to the second disabling node of the (2n−1)-th stage through the 2n-th stage, the third switching device discharging the enabling node of the (2n−1)-th stage with the second DC voltage when being turned on;

a fourth switching device for discharging the enabling node of the (2n−1)-th stage with the second DC voltage in response to the scan pulse from the (2n+1)-th stage;

a fifth switching device turned on or off in response to the first AC voltage, the fifth switching device charging the first disabling node of the (2n−1)-th stage and the first disabling node of the 2n-th stage with the first AC voltage when being turned on;

a sixth switching device for discharging the first disabling node of the (2n−1)-th stage and the first disabling node of the 2n-th stage with the second DC voltage in response to the scan pulse from the (2n−2)-th stage; and a seventh switching device for discharging the first disabling node of the (2n−1)-th stage and the first disabling node of the 2n-th stage with the second DC voltage in response to the first DC voltage charged at the enabling node of the (2n−1)-th stage.

69. The shift register according to claim 68, wherein the node controller of the (2n−1)-th stage further comprises an eighth switching device for charging or discharging the first disabling node of the (2n−1)-th stage and the first disabling node of the 2n-th stage with the first AC voltage in response to the scan pulse from the (2n+1)-th stage.

70. The shift register according to claim 68, wherein the node controller of the (2n−1)-th stage further comprises an eighth switching device turned on or off in response to the first AC voltage, the eighth switching device discharging the second disabling node of the (2n−1)-th stage with the second DC voltage when being turned on.

71. The shift register according to claim 68, wherein the node controller of the 2n-th stage comprises:

a first switching device for charging the enabling node of the 2n-th stage with the first DC voltage in response to the scan pulse from the (2n−2)-th stage;

a second switching device turned on or off in response to the first AC voltage supplied to the first disabling node of the 2n-th stage through the (2n−1)-th stage, the second switching device discharging the enabling node of the 2n-th stage with the second DC voltage when being turned on;

a third switching device turned on or off in response to the second AC voltage supplied to the second disabling node of the 2n-th stage, the third switching device discharging the enabling node of the 2n-th stage with the second DC voltage when being turned on;

a fourth switching device for discharging the enabling node of the 2n-th stage with the second DC voltage in response to the scan pulse from the (2n+1)-th stage;

a fifth switching device turned on or off in response to the second AC voltage, the fifth switching device charging the second disabling node of the 2n-th stage and the second disabling node of the (2n−1)-th stage with the second AC voltage when being turned on;

a sixth switching device for discharging the second disabling node of the 2n-th stage and the second disabling node of the (2n−1)-th stage with the second DC voltage in response to the scan pulse from the (2n−2)-th stage; and a seventh switching device for discharging the second disabling node of the 2n-th stage and the second disabling node of the (2n−1)-th stage with the second DC voltage in response to the first DC voltage charged at the enabling node of the 2n-th stage.

72. The shift register according to claim 71, wherein the node controller of the 2n-th stage further comprises an eighth switching device for charging or discharging the second disabling node of the 2n-th stage and the second disabling node of the (2n−1)-th stage with the second AC voltage in response to the scan pulse from the (2n+1)-th stage.

73. The shift register according to claim 71, wherein the node controller of the 2n-th stage further comprises an eighth switching device turned on or off in response to the second AC voltage, the eighth switching device discharging the first disabling node of the 2n-th stage with the second DC voltage when being turned on.

74. The shift register according to claim 17, wherein:

a (2n−1)-th one of the stages is enabled in response to the scan pulse from the (2n−3)-th stage and disabled in response to the scan pulse from a (2n+2)-th one of the stages; and a 2n-th one of the stages is enabled in response to the scan pulse from the (2n−2)-th stage and disabled in response to the scan pulse from the (2n+2)-th stage.

75. The shift register according to claim 74, wherein the node controller of the (2n−1)-th stage comprises:

a first switching device for charging the enabling node of the (2n−1)-th stage with a first DC voltage in response to the scan pulse from the (2n−3)-th stage;

a second switching device for discharging the enabling node of the (2n−1)-th stage with a second DC voltage in response to the first AC voltage supplied to the first disabling node of the (2n−1)-th stage;

a third switching device for discharging the enabling node of the (2n−1)-th stage with the second DC voltage in response to the second AC voltage supplied to the second disabling node of the (2n−1)-th stage through the 2n-th stage;

a fourth switching device for discharging the enabling node of the (2n−1)-th stage with the second DC voltage in response to the scan pulse from the (2n+2)-th stage;

a fifth switching device turned on or off in response to the first AC voltage, the fifth switching device charging a common node of the (2n−1)-th stage with the first AC voltage when being turned on;

a sixth switching device for discharging the common node of the (2n−1)-th stage with the second DC voltage in response to the first DC voltage charged at the enabling node of the (2n−1)-th stage;

a seventh switching device for charging the first disabling node of the (2n−1)-th stage and the first disabling node of the 2n-th stage with the first AC voltage in response to the first AC voltage supplied to the common node of the (2n−1)-th stage;

an eighth switching device for discharging the first disabling node of the (2n−1)-th stage and the first disabling node of the 2n-th stage with the second DC voltage in response to the scan pulse from the (2n−3)-th stage; and a ninth switching device for discharging the first disabling node of the (2n−1)-th stage and the first disabling node of the 2n-th stage with the second DC voltage in response to the first DC voltage charged at the enabling node of the (2n−1)-th stage.

76. The shift register according to claim 75, wherein the node controller of the 2n-th stage comprises:
- a first switching device for charging the enabling node of the 2n-th stage with the first DC voltage in response to the scan pulse from the (2n−3)-th stage;
- a second switching device for discharging the enabling node of the 2n-th stage with the second DC voltage in response to the first AC voltage supplied to the first disabling node of the 2n-th stage through the (2n−1)-th stage;
- a third switching device for discharging the enabling node of the 2n-th stage with the second DC voltage in response to the second AC voltage supplied to the second disabling node of the 2n-th stage;
- a fourth switching device for discharging the enabling node of the 2n-th stage with the second DC voltage in response to the scan pulse from the (2n+2)-th stage;
- a fifth switching device turned on or off in response to the second AC voltage, the fifth switching device charging a common node of the 2n-th stage with the second AC voltage when being turned on;
- a sixth switching device for discharging the common node of the 2n-th stage with the second DC voltage in response to the first DC voltage charged at the enabling node of the 2n-th stage;
- a seventh switching device for charging the second disabling node of the 2n-th stage and the second disabling node of the (2n−1)-th stage with the second AC voltage in response to the second AC voltage supplied to the common node of the 2n-th stage;
- an eighth switching device for discharging the second disabling node of the 2n-th stage and the second disabling node of the (2n−1)-th stage with the second DC voltage in response to the scan pulse from the (2n−3)-th stage;
- a ninth switching device for discharging the second disabling node of the 2n-th stage and the second disabling node of the (2n−1)-th stage with the second DC voltage in response to the first DC voltage charged at the enabling node of the 2n-th stage; and
- a tenth switching device for discharging the common node of the 2n-th stage with the second DC voltage in response to the first DC voltage supplied to the enabling node of the (2n−1)-th stage.

77. The shift register according to claim 76, wherein:
the pull-up switching device of each of the stages receives any one of at least two clock pulses with a phase difference therebetween and outputs the received clock pulse as the corresponding scan pulse, ones of the clock pulses outputted in adjacent periods being simultaneously maintained at an active state for a certain period.

78. The shift register according to claim 17, wherein:
- a (2n−1)-th one of the stages is enabled in response to the scan pulse from the (2n−3)-th stage and disabled in response to the scan pulse from a (2n+1)-th one of the stages; and
- a 2n-th one of the stages is enabled in response to the scan pulse from the (2n−2)-th stage and disabled in response to the scan pulse from a (2n+2)-th one of the stages.

79. A shift register, comprising:
- a plurality of stages for sequentially outputting scan pulses to drive a plurality of conductive lines, one of the plurality of the stages comprising:
- a pull-up switching device connected to an enabling node of the one of the plurality of stages;
- a first pull-down switching device connected to a first disabling node of the one of the plurality of stages;
- a second pull-down switching device connected to a second disabling node of the one of the plurality of stages;
- a third pull-down switching device connected to a third disabling node of the one of the plurality of stages, wherein one terminal of source and drain terminals at the pull-up switching device, one terminal of source and drain terminals at the first pull-down switching device, one terminal of source and drain terminals at the second pull-down switching device and one terminal of source and drain terminals at the third pull-down switching device are commonly connected to one of the conductive lines; and
- a node controller, wherein the node controller of a (2n−3)-th stage of the plurality of stages controls the logic state of the enabling node of the (2n−3)-th stage, the first disabling node of the (2n−3)-th stage, the first disabling node of a (2n−2)-th stage, and the first disabling node of a (2n−1)-th stage, the node controller of the (2n−2)-th stage controls the logic state of the enabling node of the (2n−2)-th stage, the second disabling node of the (2n−2)-th stage, the second disabling node of the (2n−3)-th stage, and the second disabling node of the (2n−1)-th stage, the node controller of the (2n−1)-th stage controls the logic state of the enabling node of the (2n−1)-th stage, the third disabling node of the (2n−1)-th stage, the third disabling node of the (2n−2)-th stage, and the third disabling node of the (2n−3)-th stage, and n is a natural number greater than or equal to 2.

80. The shift register according to claim 79, wherein:
the node controller of the (2n−3)-th stage controls the logic state of the enabling node of the (2n−3)-th stage, the logic state of the first disabling node of the (2n−3)-th stage, the logic state of the first disabling node of the (2n−2)-th stage and the logic state of the first disabling node of the (2n−1)-th stage with a first AC voltage;
the node controller of the (2n−2)-th stage controls the logic state of the enabling node of the (2n−2)-th stage, the logic state of the second disabling node of the (2n−2)-th stage, the logic state of the second disabling node of the (2n−3)-th stage and the logic state of the second disabling node of the (2n−1)-th stage with a second AC voltage; and
the node controller of the (2n−1)-th stage controls the logic state of the enabling node of the (2n−1)-th stage, the logic state of the third disabling node of the (2n−1)-th stage, the logic state of the third disabling node of the (2n−2)-th stage and the logic state of the third disabling node of the (2n−3)-th stage with a third AC voltage.

81. The shift register according to claim 79, wherein:
the first disabling node of the (2n−3)-th stage, the first disabling node of the (2n−2)-th stage and the first disabling node of the (2n−1)-th stage are electrically connected to one another;
the second disabling node of the (2n−2)-th stage, the second disabling node of the (2n−3)-th stage and the second disabling node of the (2n−1)-th stage are electrically connected to one another; and
the third disabling node of the (2n−1)-th stage, the third disabling node of the (2n−2)-th stage and the third disabling node of the (2n−3)-th stage are electrically connected to one another.

82. A shift register, comprising:
- a plurality of stages for sequentially outputting scan pulses to drive a plurality of conductive lines, one of the plurality of the stages comprising:

a pull-up switching device connected to an enabling node of the one of the plurality of stages;

a first pull-down switching device connected to a first disabling node of the one of the plurality of stages;

a second pull-down switching device connected to a second disabling node of the one of the plurality of stages, wherein one terminal of source and drain terminals at the pull-up switching device, one terminal of source and drain terminals at the first pull-down switching device, one terminal of source and drain terminals at the second pull-down switching device are commonly connected to one of the conductive lines; and a node controller, wherein the node controller of an n-th stage of the plurality of stages controls the logic state of the enabling node of the n-th stage, the first disabling node of the n-th stage, the second disabling node of the n-th stage, the second disabling node of an (n−1)-th stage, and the first disabling node of an (n+1)-th stage, and n is a natural number greater than or equal to 2, wherein the logic state of the first disabling node of the n-th stage is also controlled by a node controller of the (n−1)-th stage and the logic state of the second disabling node of the n-th stage is also controlled by a node controller of the (n+1)-th stage.

83. The shift register according to claim 82, wherein:

the first disabling node of the n-th stage and the second disabling node of the (n−1)-th stage are electrically connected to each other; and the second disabling node of the n-th stage and the first disabling node of the (n+1)-th stage are electrically connected to each other.

84. The shift register according to claim 83, wherein:

the node controller of a (2n−1)-th one of the stages controls a logic state of the first disabling node of the (2n−1)-th stage and a logic state of the second disabling node of a (2n−2)-th one of the stages with a first AC voltage; and the node controller of a 2n-th one of the stages controls a logic state of the first disabling node of the 2n-th stage and a logic state of the second disabling node of the (2n−1)-th stage with a second AC voltage.

85. The shift register according to claim 84, wherein each of the stages is enabled in response to the scan pulse from a stage upstream therefrom and disabled in response to the scan pulse from a stage downstream therefrom.

86. The shift register according to claim 85, wherein the node controller of the (2n−1)-th stage comprises:

a first switching device for charging the enabling node of the (2n−1)-th stage with a first DC voltage in response to the scan pulse from the (2n−2)-th stage;

a second switching device for discharging the enabling node of the (2n−1)-th stage with a second DC voltage in response to the first AC voltage supplied to the first disabling node of the (2n−1)-th stage; a third switching device for discharging the enabling node of the (2n−1)-th stage with the second DC voltage in response to the second AC voltage supplied to the second disabling node of the (2n−1)-th stage through the 2n-th stage;

a fourth switching device for discharging the enabling node of the (2n−1)-th stage with the second DC voltage in response to the scan pulse from the 2n-th stage;

a fifth switching device turned on or off in response to the first AC voltage, the fifth switching device charging a common node of the (2n−1)-th stage with the first AC voltage when being turned on;

a sixth switching device for discharging the common node of the (2n−1)-th stage with the second DC voltage in response to the first DC voltage charged at the enabling node of the (2n−1)-th stage;

a seventh switching device for charging the first disabling node of the (2n−1)-th stage and the second disabling node of the (2n−2)-th stage with the first AC voltage in response to the first AC voltage supplied to the common node of the (2n−1)-th stage;

an eighth switching device for discharging the second disabling node of the (2n−1)-th stage and the first disabling node of the 2n-th stage with the second DC voltage in response to the scan pulse from the (2n−2)-th stage; and a ninth switching device for discharging the first disabling node of the (2n−1)-th stage and the second disabling node of the (2n−2)-th stage with the second DC voltage in response to the first DC voltage charged at the enabling node of the (2n−1)-th stage.

87. The shift register according to claim 86, wherein the node controller of the (2n−1)-th stage further comprises a tenth switching device for discharging the common node of the (2n−1)-th stage with the second DC voltage in response to an external start pulse.

88. The shift register according to claim 86, wherein the node controller of the (2n−1)-th stage further comprises a tenth switching device turned on or off in response to the first AC voltage, the tenth switching device discharging the second disabling node of the (2n−1)-th stage and the first disabling node of the 2n-th stage with the second DC voltage when being turned on.

89. The shift register according to claim 86, wherein the node controller of the (2n−1)-th stage further comprises a tenth switching device for discharging the first disabling node of the (2n−1)-th stage and the second disabling node of the (2n−2)-th stage with the second DC voltage in response to the scan pulse from the (2n−2)-th stage.

90. The shift register according to claim 85, wherein the node controller of the 2n-th stage comprises:

a first switching device for charging the enabling node of the 2n-th stage with a first DC voltage in response to the scan pulse from the (2n−1)-th stage;

a second switching device for discharging the enabling node of the 2n-th stage with a second DC voltage in response to the second AC voltage supplied to the first disabling node of the 2n-th stage;

a third switching device for discharging the enabling node of the 2n-th stage with the second DC voltage in response to the first AC voltage supplied to the second disabling node of the 2n-th stage through a (2n+1)-th one of the stages;

a fourth switching device for discharging the enabling node of the 2n-th stage with the second DC voltage in response to the scan pulse from the (2n+1)-th stage;

a fifth switching device turned on or off in response to the second AC voltage, the fifth switching device charging a common node of the 2n-th stage with the second AC voltage when being turned on;

a sixth switching device for discharging the common node of the 2n-th stage with the second DC voltage in response to the first DC voltage charged at the enabling node of the 2n-th stage;

a seventh switching device for charging the first disabling node of the 2n-th stage and the second disabling node of the (2n−1)-th stage with the second AC voltage in response to the second AC voltage supplied to the common node of the 2n-th stage;

an eighth switching device for discharging the second disabling node of the 2n-th stage and the first disabling node of the (2n+1)-th stage with the second DC voltage in response to the scan pulse from the (2n−1)-th stage; and a ninth switching device for discharging the first disabling node of the 2n-th stage and the second disabling node of the (2n−1)-th stage with the second DC voltage in response to the first DC voltage charged at the enabling node of the 2n-th stage.

91. The shift register according to claim 90, wherein the node controller of the 2n-th stage further comprises a tenth switching device for discharging the common node of the 2n-th stage with the second DC voltage in response to an external start pulse.

92. The shift register according to claim 90, wherein the node controller of the 2n-th stage further comprises a tenth switching device turned on or off in response to the second AC voltage, the tenth switching device discharging the second disabling node of the 2n-th stage and the first disabling node of the (2n+1)-th stage with the second DC voltage when being turned on.

93. The shift register according to claim 90, wherein the node controller of the 2n-th stage further comprises a tenth switching device for discharging the first disabling node of the 2n-th stage and the second disabling node of the (2n+1)-th stage with the second DC voltage in response to the scan pulse from the (2n−1)-th stage.

94. The shift register according to claim 85, wherein:

the pull-up switching device of each of the stages receives any one of at least two clock pulses with a phase difference therebetween and outputs the received clock pulse as the corresponding scan pulse, ones of the clock pulses outputted in adjacent periods being simultaneously maintained at an active state for a certain period; and the node controller of the (2n−1)-th stage comprises:

a first switching device for charging the enabling node of the (2n−1)-th stage with a first DC voltage in response to the scan pulse from the (2n−3)-th stage;

a second switching device for discharging the enabling node of the (2n−1)-th stage with a second DC voltage in response to the first AC voltage supplied to the first disabling node of the (2n−1)-th stage;

a third switching device for discharging the enabling node of the (2n−1)-th stage with the second DC voltage in response to the second AC voltage supplied to the second disabling node of the (2n−1)-th stage through the 2n-th stage;

a fourth switching device for discharging the enabling node of the (2n−1)-th stage with the second DC voltage in response to the scan pulse from a (2n+1)-th one of the stages;

a fifth switching device turned on or off in response to the first AC voltage, the fifth switching device charging a common node of the (2n−1)-th stage with the first AC voltage when being turned on;

a sixth switching device for discharging the common node of the (2n−1)-th stage with the second DC voltage in response to the first DC voltage charged at the enabling node of the (2n−1)-th stage;

a seventh switching device for charging the first disabling node of the (2n−1)-th stage and the second disabling node of the (2n−2)-th stage with the first AC voltage in response to the first AC voltage supplied to the common node of the (2n−1)-th stage;

an eighth switching device for discharging the second disabling node of the (2n−1)-th stage and the first disabling node of the 2n-th stage with the second DC voltage in response to the scan pulse from the (2n−2)-th stage; and a ninth switching device for discharging the first disabling node of the (2n−1)-th stage and the second disabling node of the (2n−2)-th stage with the second DC voltage in response to the first DC voltage charged at the enabling node of the (2n−1)-th stage.

95. The shift register according to claim 85, wherein:

the pull-up switching device of each of the stages receives any one of at least two clock pulses with a phase difference therebetween and outputs the received clock pulse as the corresponding scan pulse, ones of the clock pulses outputted in adjacent periods being simultaneously maintained at an active state for a certain period; and the node controller of the 2n-th stage comprises:

a first switching device for charging the enabling node of the 2n-th stage with a first DC voltage in response to the scan pulse from the (2n−2)-th stage;

a second switching device for discharging the enabling node of the 2n-th stage with a second DC voltage in response to the second AC voltage supplied to the first disabling node of the 2n-th stage;

a third switching device for discharging the enabling node of the 2n-th stage with the second DC voltage in response to the first AC voltage supplied to the second disabling node of the 2n-th stage through a (2n+1)-th one of the stages;

a fourth switching device for discharging the enabling node of the 2n-th stage with the second DC voltage in response to the scan pulse from a (2n+2)-th one of the stages;

a fifth switching device turned on or off in response to the second AC voltage, the fifth switching device charging a common node of the 2n-th stage with the second AC voltage when being turned on;

a sixth switching device for discharging the common node of the 2n-th stage with the second DC voltage in response to the first DC voltage charged at the enabling node of the 2n-th stage;

a seventh switching device for charging the first disabling node of the 2n-th stage and the second disabling node of the (2n−1)-th stage with the second AC voltage in response to the second AC voltage supplied to the common node of the 2n-th stage;

an eighth switching device for discharging the second disabling node of the 2n-th stage and the first disabling node of the (2n+1)-th stage with the second DC voltage in response to the scan pulse from the (2n−1)-th stage; and a ninth switching device for discharging the first disabling node of the 2n-th stage and the second disabling node of the (2n−1)-th stage with the second DC voltage in response to the first DC voltage charged at the enabling node of the 2n-th stage.

96. The shift register according to claim 85, wherein the node controller of the (2n−1)-th stage comprises:

a first switching device for charging the enabling node of the (2n−1)-th stage with a first DC voltage in response to the scan pulse from the (2n−2)-th stage;

a second switching device for discharging the enabling node of the (2n−1)-th stage with a second DC voltage in response to the first AC voltage supplied to the first disabling node of the (2n−1)-th stage;

a third switching device for discharging the enabling node of the (2n−1)-th stage with the second DC voltage in response to the second AC voltage supplied to the second disabling node of the (2n−1)-th stage through the 2n-th stage;

a fourth switching device for discharging the enabling node of the (2n−1)-th stage with the second DC voltage in response to the scan pulse from the 2n-th stage;

a fifth switching device turned on or off in response to the first AC voltage, the fifth switching device charging the first disabling node of the (2n−1)-th stage and the second disabling node of the (2n−2)-th stage with the first AC voltage when being turned on;

a sixth switching device for charging or discharging the first disabling node of the (2n−1)-th stage and the second disabling node of the (2n−2)-th stage with the first AC voltage in response to the scan pulse from the 2n-th stage;

a seventh switching device for discharging the second disabling node of the (2n−1)-th stage and the first disabling node of the 2n-th stage with the second DC voltage in response to the scan pulse from the (2n−2)-th stage; and an eighth switching device for discharging the first disabling node of the (2n−1)-th stage and the second disabling node of the (2n−2)-th stage with the second DC voltage in response to the first DC voltage charged at the enabling node of the (2n−1)-th stage.

97. The shift register according to claim 96, wherein the node controller of the (2n−1)-th stage further comprises a ninth switching device turned on or off in response to the first AC voltage, the tenth switching device discharging the second disabling node of the (2n−1)-th stage and the first disabling node of the 2n-th stage with the second DC voltage when being turned on.

98. The shift register according to claim 96, wherein the node controller of the (2n−1)-th stage further comprises a ninth switching device for discharging the first disabling node of the (2n−1)-th stage and the second disabling node of the (2n−2)-th stage with the second DC voltage in response to the scan pulse from the (2n−2)-th stage.

99. The shift register according to claim 85, wherein the node controller of the 2n-th stage comprises:

a first switching device for charging the enabling node of the 2n-th stage with a first DC voltage in response to the scan pulse from the (2n−1)-th stage;

a second switching device for discharging the enabling node of the 2n-th stage with a second DC voltage in response to the second AC voltage supplied to the first disabling node of the 2n-th stage;

a third switching device for discharging the enabling node of the 2n-th stage with the second DC voltage in response to the first AC voltage supplied to the second disabling node of the 2n-th stage through a (2n+1)-th one of the stages;

a fourth switching device for discharging the enabling node of the 2n-th stage with the second DC voltage in response to the scan pulse from the (2n+1)-th stage;

a fifth switching device turned on or off in response to the second AC voltage, the fifth switching device charging the first disabling node of the 2n-th stage and the second disabling node of the (2n−1)-th stage with the second AC voltage when being turned on;

a sixth switching device for charging or discharging the first disabling node of the 2n-th stage and the second disabling node of the (2n−1)-th stage with the second AC voltage in response to the scan pulse from the (2n+1)-th stage;

a seventh switching device for discharging the second disabling node of the 2n-th stage and the first disabling node of the (2n+1)-th stage with the second DC voltage in response to the scan pulse from the (2n−1)-th stage; and an eighth switching device for discharging the first disabling node of the 2n-th stage and the second disabling node of the (2n−1)-th stage with the second DC voltage in response to the first DC voltage charged at the enabling node of the 2n-th stage.

100. The shift register according to claim 99, wherein the node controller of the 2n-th stage further comprises a ninth switching device turned on or off in response to the second AC voltage, the tenth switching device discharging the second disabling node of the 2n-th stage and the first disabling node of the (2n+1)-th stage with the second DC voltage when being turned on.

101. The shift register according to claim 99, wherein the node controller of the 2n-th stage further comprises a ninth switching device for discharging the first disabling node of the 2n-th stage and the second disabling node of the (2n+1)-th stage with the second DC voltage in response to the scan pulse from the (2n−1)-th stage.

102. The shift register according to claim 85, wherein:

the pull-up switching device of each of the stages receives any one of at least two clock pulses with a phase difference therebetween and outputs the received clock pulse as the corresponding scan pulse, ones of the clock pulses outputted in adjacent periods being simultaneously maintained at an active state for a certain period; and the node controller of the (2n−1)-th stage comprises:

a first switching device for charging the enabling node of the (2n−1)-th stage with a first DC voltage in response to the scan pulse from the (2n−3)-th stage;

a second switching device for discharging the enabling node of the (2n−1)-th stage with a second DC voltage in response to the first AC voltage supplied to the first disabling node of the (2n−1)-th stage;

a third switching device for discharging the enabling node of the (2n−1)-th stage with the second DC voltage in response to the second AC voltage supplied to the second disabling node of the (2n−1)-th stage through the 2n-th stage;

a fourth switching device for discharging the enabling node of the (2n−1)-th stage with the second DC voltage in response to the scan pulse from a (2n+1)-th one of the stages;

a fifth switching device turned on or off in response to the first AC voltage, the fifth switching device charging the first disabling node of the (2n−1)-th stage and the second disabling node of the (2n−2)-th stage with the first AC voltage when being turned on;

a sixth switching device for charging or discharging the first disabling node of the (2n−1)-th stage and the second disabling node of the (2n−2)-th stage with the first AC voltage in response to the scan pulse from the 2n-th stage;

a seventh switching device for discharging the second disabling node of the (2n−1)-th stage and the first disabling node of the 2n-th stage with the second DC voltage in response to the scan pulse from the (2n−2)-th stage; and an eighth switching device for discharging the first disabling node of the (2n−1)-th stage and the second disabling node of the (2n−2)-th stage with the second DC voltage in response to the first DC voltage charged at the enabling node of the (2n−1)-th stage.

103. The shift register according to claim 85, wherein:

the pull-up switching device of each of the stages receives any one of at least two clock pulses with a phase difference therebetween and outputs the received clock pulse as the corresponding scan pulse, ones of the clock pulses outputted in adjacent periods being simultaneously maintained at an active state for a certain period; and the node controller of the 2n-th stage comprises:

a first switching device for charging the enabling node of the 2n-th stage with a first DC voltage in response to the scan pulse from the (2n−1)-th stage;

a second switching device for discharging the enabling node of the 2n-th stage with a second DC voltage in response to the second AC voltage supplied to the first disabling node of the 2n-th stage;

a third switching device for discharging the enabling node of the 2n-th stage with the second DC voltage in response to the first AC voltage supplied to the second disabling node of the 2n-th stage through a (2n+1)-th one of the stages;

a fourth switching device for discharging the enabling node of the 2n-th stage with the second DC voltage in response to the scan pulse from the (2n+1)-th stage;

a fifth switching device turned on or off in response to the second AC voltage, the fifth switching device charging the first disabling node of the 2n-th stage and the second disabling node of the (2n−1)-th stage with the second AC voltage when being turned on;

a sixth switching device for charging or discharging the first disabling node of the 2n-th stage and the second disabling node of the (2n−1)-th stage with the second AC voltage in response to the scan pulse from the (2n+1)-th stage;

a seventh switching device for discharging the second disabling node of the 2n-th stage and the first disabling node of the (2n+1)-th stage with the second DC voltage in response to the scan pulse from the (2n−1)-th stage; and an eighth switching device for discharging the first disabling node of the 2n-th stage and the second disabling node of the (2n−1)-th stage with the second DC voltage in response to the first DC voltage charged at the enabling node of the 2n-th stage.

* * * * *